US006785873B1

(12) United States Patent
Tseng

(10) Patent No.: US 6,785,873 B1
(45) Date of Patent: Aug. 31, 2004

(54) EMULATION SYSTEM WITH MULTIPLE ASYNCHRONOUS CLOCKS

(75) Inventor: Ping-Sheng Tseng, Sunnyvale, CA (US)

(73) Assignee: Axis Systems, Inc., Sunnyvale, CA (US)

(*) Notice: Subject to any disclaimer, the term of this patent is extended or adjusted under 35 U.S.C. 154(b) by 761 days.

(21) Appl. No.: 09/591,683

(22) Filed: Jun. 9, 2000

Related U.S. Application Data

(63) Continuation-in-part of application No. 09/546,554, filed on Apr. 10, 2000, which is a continuation-in-part of application No. 09/373,014, filed on Aug. 11, 1999, which is a continuation-in-part of application No. 09/144,222, filed on Aug. 31, 1999, now Pat. No. 6,321,366, which is a continuation-in-part of application No. 08/850,136, filed on May 2, 1997, now Pat. No. 6,009,256.

(51) Int. Cl.[7] ............................................. G06F 17/50

(52) U.S. Cl. ............................................. 716/4; 716/1

(58) Field of Search ................................ 716/4, 1, 5, 6

(56) References Cited

U.S. PATENT DOCUMENTS

| | | | | |
|---|---|---|---|---|
| 3,836,889 A | * | 9/1974 | Kotok et al. | 710/264 |
| 4,144,448 A | * | 3/1979 | Pisciotta et al. | 714/814 |
| 4,688,947 A | * | 8/1987 | Blaes et al. | 368/120 |
| 5,126,950 A | * | 6/1992 | Rees et al. | 716/4 |
| 5,425,036 A | * | 6/1995 | Liu et al. | 714/735 |
| 5,596,742 A | * | 1/1997 | Agarwal et al. | 716/16 |
| 6,084,930 A | * | 7/2000 | Dinteman | 375/354 |
| 6,204,711 B1 | * | 3/2001 | Scarlett et al. | 327/291 |

OTHER PUBLICATIONS

O'Leary et al., "Synchronous Emulation of Asynchronous Circuits", Feb. 1997, IEEE Transactions on Computer–Aided Design o Integrated Circuit and System, vol. 16, iss. 2, pp. 205–209.*

* cited by examiner

Primary Examiner—Matthew Smith
Assistant Examiner—Sun James Lin
(74) Attorney, Agent, or Firm—Burns, Doane, Swecker & Mathis LLP

(57) ABSTRACT

An emulation system includes a clock generation logic for generating multiple asynchronous clocks, where each generated clock's relative phase relationship with respect to all other generated clocks is strictly controlled to speed up the emulation logic evaluation. Unlike statically designed emulator systems known in the prior art, the speed of the logic evaluation in the emulator need not be slowed down to the worst possible evaluation time since the clocking is generated internally in the emulator and carefully controlled. The emulation system does not concern itself with the absolute time duration of each clock, because only the phase relationship among the multiple asynchronous clocks is important. By retaining the phase relationship (and the initial values) among the multiple asynchronous clocks, the speed of the logic evaluation in the emulator can be increased. The RCC clock generation logic comprises a clock generation scheduler and a set of clock generation slices, where each clock generation slice generates a clock. The clock generation scheduler compares each clock's next toggle point from the current time, toggles the clock associated with the winning next toggle point, determines the new current time, updates the next toggle point information for all of the clock generation slices, and performs the comparison again in the next evaluation cycle. In the update phase, the winning slice updates its register with a new next toggle point, while the losing slices merely updates their respective registers by adjusting for the new current time.

20 Claims, 99 Drawing Sheets

| | F11 | F12 | F13 | F14 | F21 | F22 | F23 | F24 | F31 | F32 | F33 | F34 | F41 | F42 | F43 | F44 |
|---|---|---|---|---|---|---|---|---|---|---|---|---|---|---|---|---|
| F11 | 1 | 1 | 1 | 1 | 1 | 0 | 0 | 0 | 1 | 0 | 0 | 0 | 1 | 0 | 0 | 0 |
| F12 | 1 | 1 | 1 | 1 | 0 | 1 | 0 | 0 | 0 | 1 | 0 | 0 | 0 | 1 | 0 | 0 |
| F13 | 1 | 1 | 1 | 1 | 0 | 0 | 1 | 0 | 0 | 0 | 1 | 0 | 0 | 0 | 1 | 0 |
| F14 | 1 | 1 | 1 | 1 | 0 | 0 | 0 | 1 | 0 | 0 | 0 | 1 | 0 | 0 | 0 | 1 |
| F21 | 1 | 0 | 0 | 0 | 1 | 1 | 1 | 1 | 1 | 0 | 0 | 0 | 1 | 0 | 0 | 0 |
| F22 | 0 | 1 | 0 | 0 | 1 | 1 | 1 | 1 | 0 | 1 | 0 | 0 | 0 | 1 | 0 | 0 |
| F23 | 0 | 0 | 1 | 0 | 1 | 1 | 1 | 1 | 0 | 0 | 1 | 0 | 0 | 0 | 1 | 0 |
| F24 | 0 | 0 | 0 | 1 | 1 | 1 | 1 | 1 | 0 | 0 | 0 | 1 | 0 | 0 | 0 | 1 |
| F31 | 1 | 0 | 0 | 0 | 1 | 0 | 0 | 0 | 1 | 1 | 1 | 1 | 1 | 0 | 0 | 0 |
| F32 | 0 | 1 | 0 | 0 | 0 | 1 | 0 | 0 | 1 | 1 | 1 | 1 | 0 | 1 | 0 | 0 |
| F33 | 0 | 0 | 1 | 0 | 0 | 0 | 1 | 0 | 1 | 1 | 1 | 1 | 0 | 0 | 1 | 0 |
| F34 | 0 | 0 | 0 | 1 | 0 | 0 | 0 | 1 | 1 | 1 | 1 | 1 | 0 | 0 | 0 | 1 |
| F41 | 1 | 0 | 0 | 0 | 1 | 0 | 0 | 0 | 1 | 0 | 0 | 0 | 1 | 1 | 1 | 1 |
| F42 | 0 | 1 | 0 | 0 | 0 | 1 | 0 | 0 | 0 | 1 | 0 | 0 | 1 | 1 | 1 | 1 |
| F43 | 0 | 0 | 1 | 0 | 0 | 0 | 1 | 0 | 0 | 0 | 1 | 0 | 1 | 1 | 1 | 1 |
| F44 | 0 | 0 | 0 | 1 | 0 | 0 | 0 | 1 | 0 | 0 | 0 | 1 | 1 | 1 | 1 | 1 |

FIG. 7

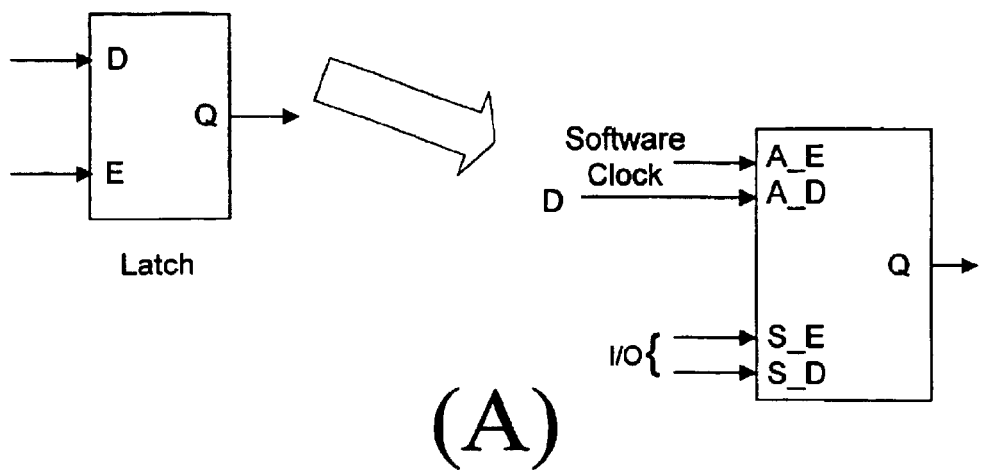
(A)
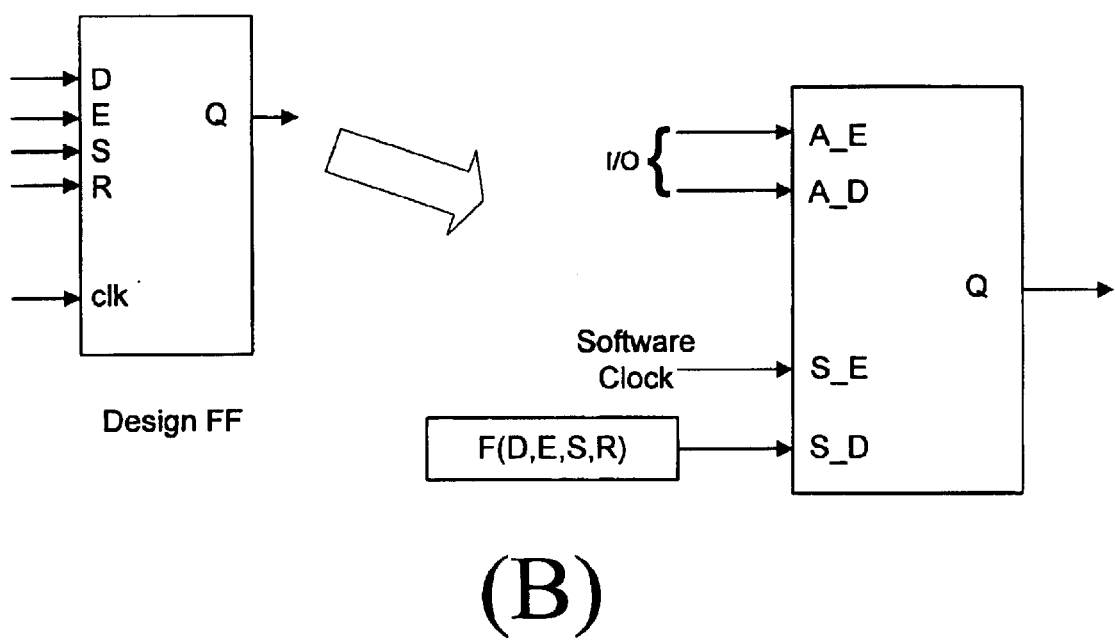
(B)
FIG 18

HARDWARE START-UP

```
module register (clock, reset, d, q);
input clock, d, reset;
output q;
reg q;

always@(posedge clock or negedge reset)
    if(!reset)
        q = 0;
    else
        q = d;

endmodule module example;
    wire d1, d2, d3;
    wire q1, q2, q3;

reg sigin;
    wire sigout;
    reg clk, reset;

register reg1 (clk, reset, d1, q1);
    register reg2 (clk, reset, d2, q2);
    register reg3 (clk, reset, d3, q3);

assign d1 = sigin ^ q3;
    assign d2 = q1 ^ q3;
    assign d3 = q2 ^ q3;
    assign sigout = q3;

// a clock generator
    always
    begin
        clk = 0;
        #5;
        clk = 1;
        #5;
    end // a signal generator
    always
    begin
        #10;
        sigin = $random;
    end // initialization
    initial
    begin
        reset = 0;
        sigin = 0;
        #1;
        reset = 1;
        #5;
        $monitor($time, " %b, %b", sigin, sigout);
        #1000 $finish;
    end
end module
```

FIG. 26

```
module register (clock, reset, d, q);
input clock, d, reset;
output q;
reg q;

always@(postedge clock or negedge reset)
    if(~reset)
        q = 0
    else
        q = d;

endmodule
```
⎫
⎬ Register Definition
⎭  ← 900

```
module example;
    wire d1, d2, d3;
    ware q1, q2, q3;
```
} wire interconnection info ← 907

```
reg sigin;    ←──── Test-bench input – 908
wire sigout;  ←──── Test-bench output – 909
reg clk, reset;
```

```
S1  register reg 1 (clk, reset, d1, q1);
S2  register reg 2 (clk, reset, d2, q2);
S3  register reg 3 (clk, reset, d3, q3);
```
} Register component ← 901

```
S4  assign d1 = sigin ^ q3;
S5  assign d2 = q1 ^ 3;
S6  assign d3 = q2 ^ q3;
S7  assign signout = q3;
```
} Combinational component ← 902

S8 {
```
// a clock generator
always
begin
    clk = 0;
    #5;
    clk = 1;
    #5;
end
```
} Clock component ← 903

S9 {
```
// a signal generator
always
begin
    #10;
    sigin = $random;
end
```
} Test-bench component (Driver) ← 904

S10 {
```
// initialization
initial
begin
    reset = 0;
    sigin = 0;
    #1;
```
} Test-bench component (initialization) ← 905

S11 {  `reset = 1;`
       `#5;`
S12 {  `$monitor($time, "%b, %b", sigin, sigout);` } Test-bench component (monitor) ← 906
       `#1000 $finish;`
       `end`
       `end module`

FIG. 28

HARDWARE MODEL (IGNORE I/O AND CLOCK EDGE REGISTER)

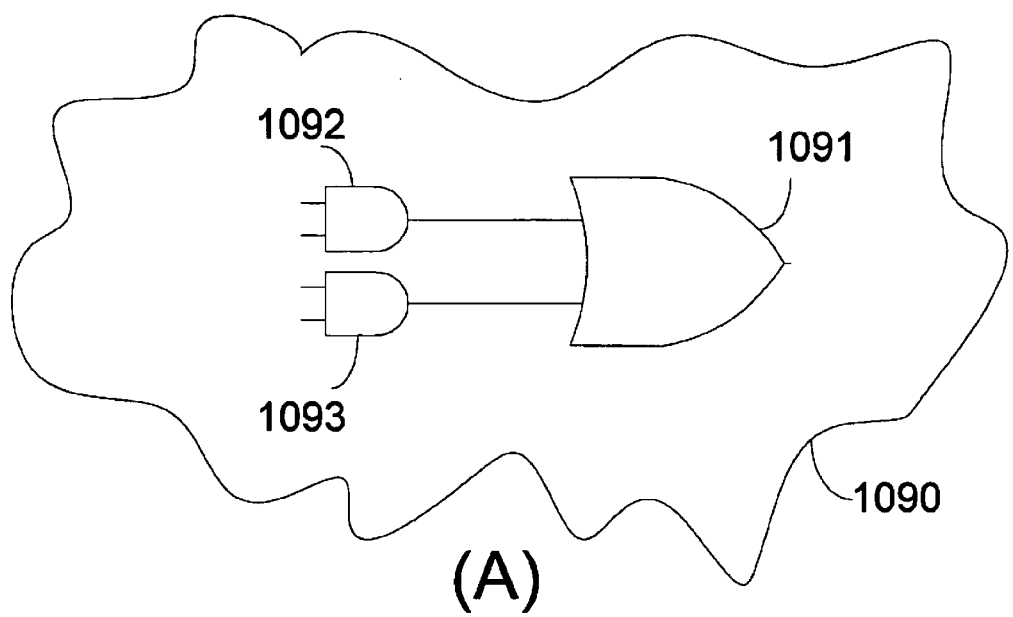
(A)
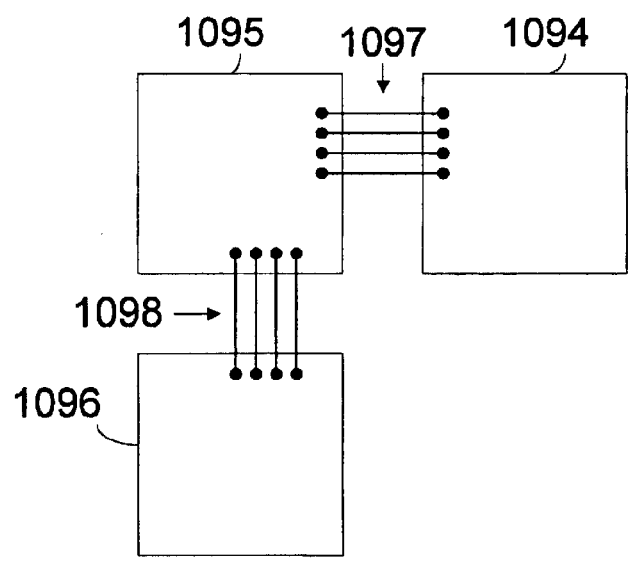
(B) FIG. 35

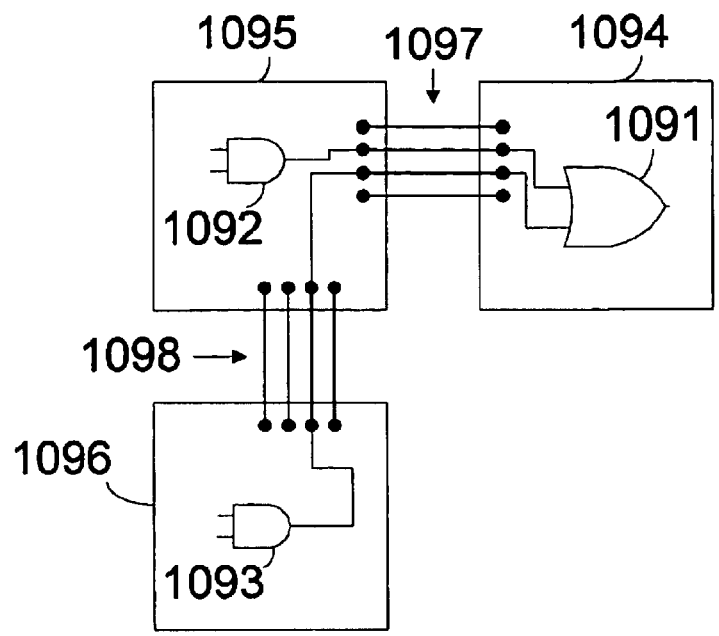
(C)
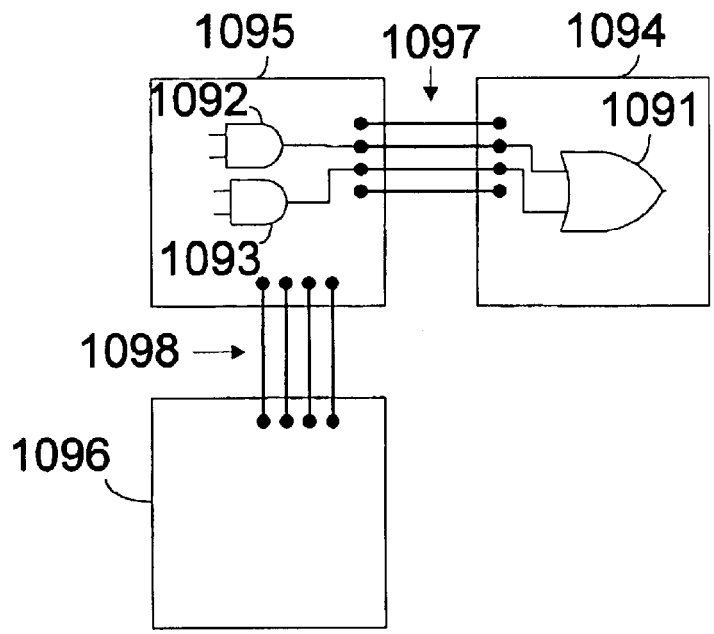
(D) FIG 35

I/O PIN OVERVIEW OF FPGA LOGIC DEVICE

FPGA : 10K130V, 10K250V with 599-pin PGA package

45 Dedicated I/O pins:

GCLK, BUS[31..0], F_RD, F_DATAXSFR, SRIWR, SPACE[F_DQUEVAL, DEV_DBREQ_N, DEV_CLRN

425 Interconnect I/O pins

FPGA INTERCONNECT BUSES

BOARD CONNECTION - SIDE VIEW

FPGA ARRAY CONNECTION BETWEEN BOARDS

1840 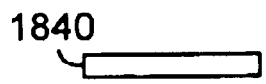 2x30 Header, SMD, component side
1841 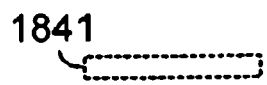 2x30 Receptacle, SMD, solder side
1842 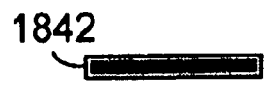 2x45, 2x30 Header, thru hole, component side
1843 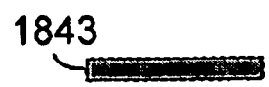 2x45, 2x30 Receptacle, thru hole, solder side
1844  R-pack, SMD, component side
1845  R-pack, SMD, solder side
FIG. 43

T2 > T1 + H2

CLOCK GLITCH PROBLEM

TIGF LATCH

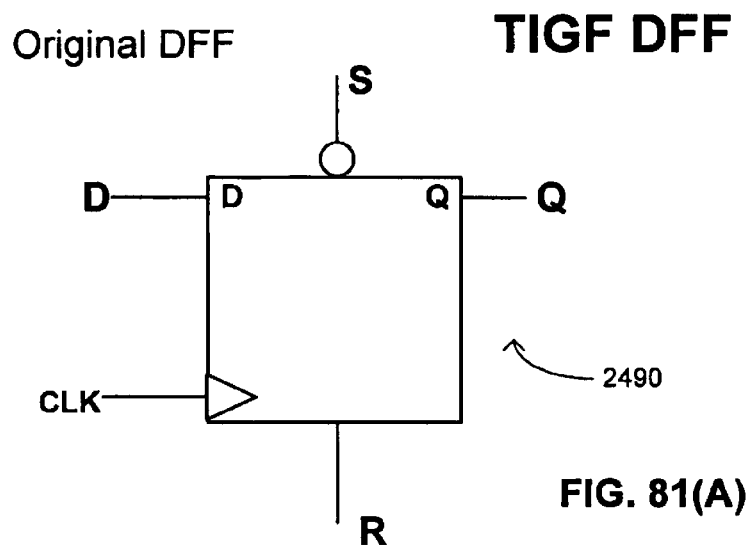
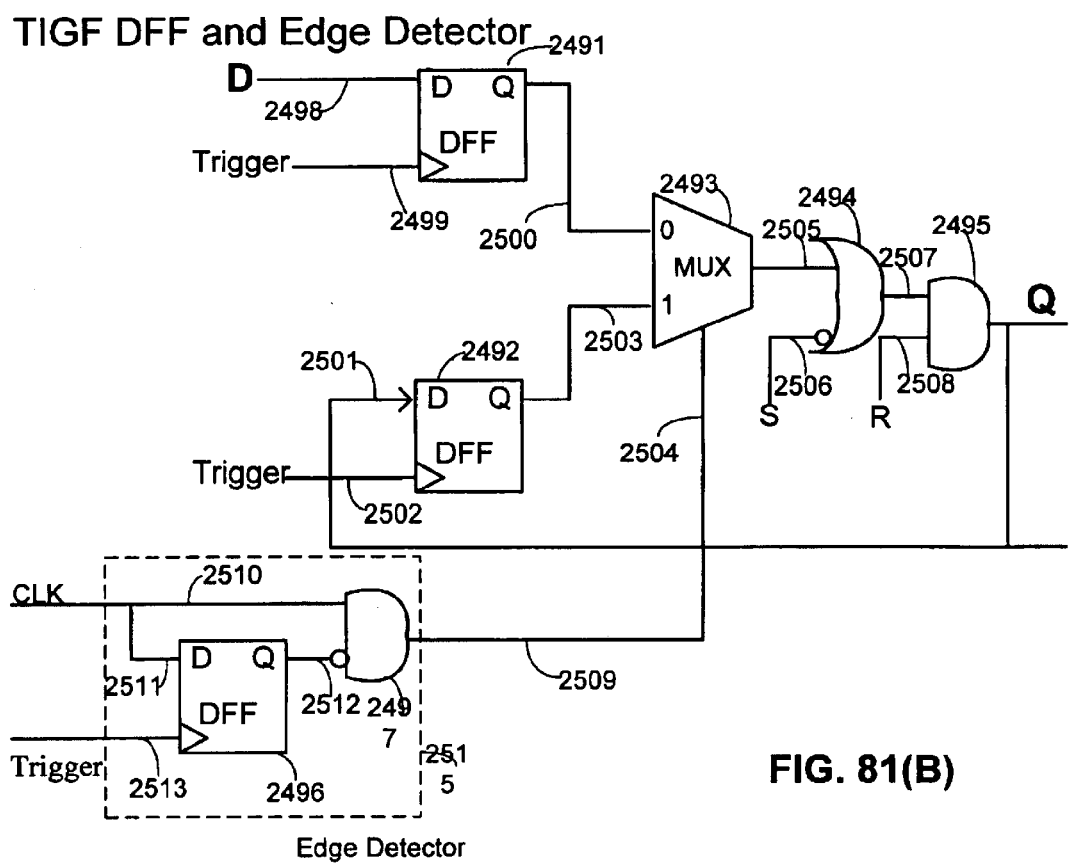

SINGLE-ROW
FPGA PER
BOARD

TWO-ROW FPGA PER BOARD

INTERCONNECT FOR THREE-ROW PER BOARD

| I/O Signals | Odd Board Connector-Group Pin-position | Even Board Connector-Group Pin-position | Common Board Connector-Group Pin-position |
|---|---|---|---|
| FPGA2_N | C1 | S1 | C1, S1 |
| FPGA2_NH | C2 | S3 | C2, S3 |
| FPGA1_NH | C3 | S2 | C3, S2 |
| FPGA0_S | S4 | C4 | C4, S4 |
| FPGA0_SH | S5 | C6 | C6, S5 |
| FPGA1_SH | S6 | C5 | C5, S6 |

FIG. 89

Clock Generation Scheduler and Slices

EMULATION SYSTEM WITH MULTIPLE ASYNCHRONOUS CLOCKS

RELATED U.S. APPLICATION

This is a continuation-in-part of U.S. patent application Ser. No. 09/546,554, filed Apr. 10, 2000, which is a continuation-in-part of U.S. patent application Ser. No. 09/373,014, filed Aug. 11, 1999, which is a continuation-in-part of U.S. application Ser. No. 09/144,222, filed Aug. 31, 1999, now U.S. Pat. No. 6,321,366, which is continuation-in-part of U.S. Ser. No. 08/850,136 filed May 2, 1997, now U.S. Pat. No. 6,009,256, issued Dec. 28, 1999.

BACKGROUND OF THE INVENTION

1. Field of the Invention

The present invention generally relates to electronic design automation (EDA). More particularly, the present invention relates to dynamically changing the evaluation period to accelerate design debug sessions.

2. Description of Related Art

In general, electronic design automation (EDA) is a computer-based tool configured in various workstations to provide designers with automated or semi-automated tools for designing and verifying user's custom circuit designs. EDA is generally used for creating, analyzing, and editing any electronic design for the purpose of simulation, emulation, prototyping, execution, or computing. EDA technology can also be used to develop systems (i.e., target systems) which will use the user-designed subsystem or component. The end result of EDA is a modified and enhanced design, typically in the form of discrete integrated circuits or printed circuit boards, that is an improvement over the original design while maintaining the spirit of the original design.

The value of software simulating a circuit design followed by hardware emulation is recognized in various industries that use and benefit from EDA technology. Nevertheless, current software simulation and hardware emulation/acceleration are cumbersome for the user because of the separate and independent nature of these processes. For example, the user may want to simulate or debug the circuit design using software simulation for part of the time, use those results and accelerate the simulation process using hardware models during other times, inspect various register and combinational logic values inside the circuit at select times, and return to software simulation at a later time, all in one debug/test session. Furthermore, as internal register and combinational logic values change as the simulation time advances, the user should be able to monitor these changes even if the changes are occurring in the hardware model during the hardware acceleration/emulation process.

Co-simulation arose out of a need to address some problems with the cumbersome nature of using two separate and independent processes of pure software simulation and pure hardware emulation/acceleration, and to make the overall system more user-friendly. However, co-simulators still have a number of drawbacks: (1) co-simulation systems require manual partitioning, (2) co-simulation uses two loosely coupled engines, (3) co-simulation speed is as slow as software simulation speed, and (4) co-simulation systems encounter race conditions.

First, partitioning between software and hardware is done manually, instead of automatically, further burdening the user. In essence, co-simulation requires the user to partition the design (starting with behavior level, then RTL, and then gate level) and to test the models themselves among the software and hardware at very large functional blocks. Such a constraint requires some degree of sophistication by the user.

Second, co-simulation systems utilize two loosely coupled and independent engines, which raise inter-engine synchronization, coordination, and flexibility issues. Co-simulation requires synchronization of two different verification engines—software simulation and hardware emulation. Even though the software simulator side is coupled to the hardware accelerator side, only external pin-out data is available for inspection and loading. Values inside the modeled circuit at the register and combinational logic level are not available for easy inspection and downloading from one side to the other, limiting the utility of these co-simulator systems. Typically, the user may have to re-simulate the whole design if the user switches from software simulation to hardware acceleration and back. Thus, if the user wanted to switch between software simulation and hardware emulation/acceleration during a single debug session while being able to inspect register and combinational logic values, co-simulator systems do not provide this capability.

Third, co-simulation speed is as slow as simulation speed. Co-simulation requires synchronization of two different verification engines—software simulation and hardware emulation. Each of the engines has its own control mechanism for driving the simulation or emulation. This implies that the synchronization between the software and hardware pushes the overall performance to a speed that is as low as software simulation. The additional overhead to coordinate the operation of these two engines adds to the slow speed of co-simulation systems.

Fourth, co-simulation systems encounter set-up, hold time, and clock glitch problems due to race conditions in the hardware logic element or hardware accelerator among clock signals. Co-simulators use hardware driven clocks, which may find themselves at the inputs to different logic elements at different times due to different wire line lengths. This raises the uncertainty level of evaluation results as some logic elements evaluate data at some time period and other logic elements evaluate data at different time periods, when these logic elements should be evaluating the data together.

Another problem encountered by a typical designer is the relatively slow speed of logic evaluators. The typical logic evaluator has a common execution flow involving:

(1) taking the input signals, both clock and data, (2) evaluating the design logic until all output signals stabilize, and (3) go to step 1 and repeat the process.

The amount of time needed in step 2 (evaluation step) determines the speed of the logic evaluator; that is, the shorter the evaluation time, the faster the logic evaluator. Several factors determine the evaluation time. These factors include the interconnect technology between the FPGA logic devices and chips, the speed of the FPGA components, and the logic evaluation method. So, if faster FPGA components are used, the evaluation time should generally decrease.

Based on these factors, current logic evaluators utilize a fixed and statically calculated evaluation time for all possible input signals. This evaluation time may vary from one logic evaluator to another based on the factors mentioned above. So, a logic evaluator designed and manufactured by one company may be faster than a logic evaluator designed and manufactured by another company. However, within a logic evaluator, the evaluation time is fixed. Thus, having selected the interconnect technology, the FPGA components, and the logic evaluation method, the designer of the logic evaluator would calculate a constant time that would be needed to evaluate the inputs to this logic evaluator. For example, the designer may have to determine the longest trace length or circuit path from input to output to determine the longest evaluation time for this logic evaluator. By compensating for the longest possible circuit path, the designer has ensured that the calculated evaluation time is sufficiently long for all of the possible inputs to be evaluated to a stable output. This constant and statically calculated evaluation time raises two problems—performance and static loop.

With respect to performance, the logic evaluator must be designed with an evaluation time that is long enough to handle the worst possible evaluation time needed for the inputs to be processed and stabilize at the output. So, for example, the longest trace length or circuit path must be considered in calculating the worst possible evaluation time. However, this approach is inefficient and sacrifices performance. Some internal studies have been done on a large number of ASIC designs and indicate that this statically calculated evaluation time is indeed inefficient and unnecessary.

For most input sequences to a given design, a very small percentage (about 1%) of the inputs requires the worst possible evaluation time. So, essentially 99% of all inputs are subject to the longer-than-necessary evaluation times. Indeed, a large percentage (about 80%) of all the inputs requires less than $\frac{1}{100}$ of the worst possible evaluation time. Similarly, a significant percentage (about 20%) of all the inputs requires between $\frac{1}{100}$ to $\frac{1}{10}$ of the worst possible evaluation time. By designing the evaluation cycle for the worst possible time, the logic evaluator is forced to execute in the slowest possible speed that is not warranted by 99% of its inputs. This is highly inefficient.

On a related matter, the worst possible evaluation time is difficult to calculate with the existence of static loops. As mentioned above, the worst possible evaluation time is typically calculated by statically analyzing the design and determining the worst possible propagation delay after the design is mapped to the logic evaluator. In many cases, a design can have many static combinational feedback loops. Generally speaking, the worst propagation time is exponential to the nesting level of the loops. This not only makes the delay calculation difficult, but the calculated worst possible delay is too long to be practical for either simulation acceleration or emulation applications. On the other hand, for most practical designs, the static feedback loops are just false paths that cannot be resolved at compile time and does not exist at run time.

The same is true when multiple asynchronous clocks are used. Current logic emulators use external clock sources to drive logic emulators. One drawback with the use of such external clock sources is that an external clock source has no knowledge of the emulator and cannot adapt itself based on the internal state of the logic emulator. As a result, both the logic emulator system and the external hardware test bench have to run the clock at the speed of the worst possible evaluation time of the logic emulator. This is known as the "slow down" process in logic emulation.

Accordingly, a need exists in the industry for a system or method that addresses problems raised above by currently known simulation systems, hardware emulation systems, hardware accelerators, co-simulation, and coverification systems.

SUMMARY OF THE INVENTION

One embodiment of the present invention provides a dynamic emulation system which includes a clock generation logic for generating multiple asynchronous clocks, where each generated clock's relative phase relationship with respect to all other generated clocks is strictly controlled to speed up the emulation logic evaluation. Unlike statically designed emulator systems known in the prior art, the speed of the logic evaluation in the emulator need not be slowed down to the worst possible evaluation time since the clocking is generated internally in the emulator and carefully controlled. The emulation system does not concern itself with the absolute time duration of each clock, because only the phase relationship among the multiple asynchronous clocks is important. By retaining the phase relationship (and the initial values) among the multiple asynchronous clocks, the speed of the logic evaluation in the emulator can be increased.

The RCC clock generation logic comprises a clock generation scheduler and a set of clock generation slices, where each clock generation slice generates a clock. The clock generation scheduler compares each clock's next toggle point from the current time, toggles the clock associated with the winning next toggle point, determines the new current time, updates the next toggle point information for all of the clock generation slices, and performs the comparison again in the next evaluation cycle. In the update phase, the winning slice updates its register with a new next toggle point, while the losing slices merely updates their respective registers by adjusting for the new current time. The clock generation scheduler performs the following algorithm for each evaluation cycle, as indicated by the EvalStart signal:

(1) set initial values for all registers;

(2) from the current time, find the next toggle point for all the clocks;

(3) toggle the clock associated with this next toggle point;

(4) adjust the current time to be the time associated with this toggle point;

(5) adjust the next toggle point for the winning clock slice, while keeping all other clock slices' respective next toggle points (the toggle points will be the same for the losing slices but the time durations will be adjusted based on the new current time).

Stated differently and using clock scheduler component terminology, the clock generation scheduler performs the following two-step algorithm:

(1) find the minimum value from the R0 registers of all the clock generation slices; and.

(2) subtract the minimum value from the R0 registers of all the clock generation slices and set the Z register to logic "1" if the result of the subtraction is "0."

When the EvalStart signal is provided, each clock generation slice will update its clock value and the finite state machine starts execution of the above two-step algorithm to determine the next clock toggle event while the RCC system performs logic evaluation with the current set of input stimulus. The finite state machine rotates the R0 ring twice—the first time to find the minimum value of all the R0s, and the second time to subtract the minimum value from the current R0s. An inner rotation of the R0, R1, and R2 registers within each clock generation slice updates the register values so that the winning clock generation slice contains the proper next toggle point information for future toggle point comparisons among all the clock slices. In essence, for each next toggle point comparison, the winning clock generation slice rotates the R0, R1, and R2 registers, while the losing clock generation slices updates their respective R0 register values based on the current time.

By coupling the selected emulator-generated clocks to the emulated design, the logic evaluation is driven by these emulator-generated and -controlled clocks. Similarly, by coupling selected emulator-generated clocks to the hardware test bench board, the evaluation of data in the test bench board components are also driven by these emulator-generated clocks.

An RCC computer system which controls the emulation system, generates the software clock, provides software test bench data, and contains a software model of the user's design can also be coupled to the emulation system.

These and other embodiments are fully discussed and illustrated in the following sections of the specification.

BRIEF DESCRIPTION OF THE FIGURES

The above objects and description of the present invention may be better understood with the aid of the following text and accompanying drawings.

FIG. 7 shows the connectivity matrix for the FPGA array shown in FIG. 8.

FIG. 9(A) presents an overview of the pin-out problem, FIG. 9(B) provides a TDM circuit for the transmission side, and FIG. 9(C) provides a TDM circuit for the receiver side.

FIGS. 18(A) and 18(B) show the register model implementation for latches and flip-flops.

FIG. 26 shows the HDL code for one example of a user circuit design to be modeled and simulated.

FIG. 28 shows the component type analysis for the HDL code of FIG. 26.

FIGS. 35(A) to 35(D) illustrate the principle of "hops" and interconnections with two examples.

FIG. 43 shows a legend of the connectors in FIGS. 41(A) to 41(F) and 42.

FIG. 81(A) shows the original design flip-flop and FIG. 81(B) shows a timing insensitive and glitch-free design type flip-flop in accordance with one embodiment of the present invention.

These figures will be discussed below with respect to several different aspects and embodiments of the present invention.

Figure 83:
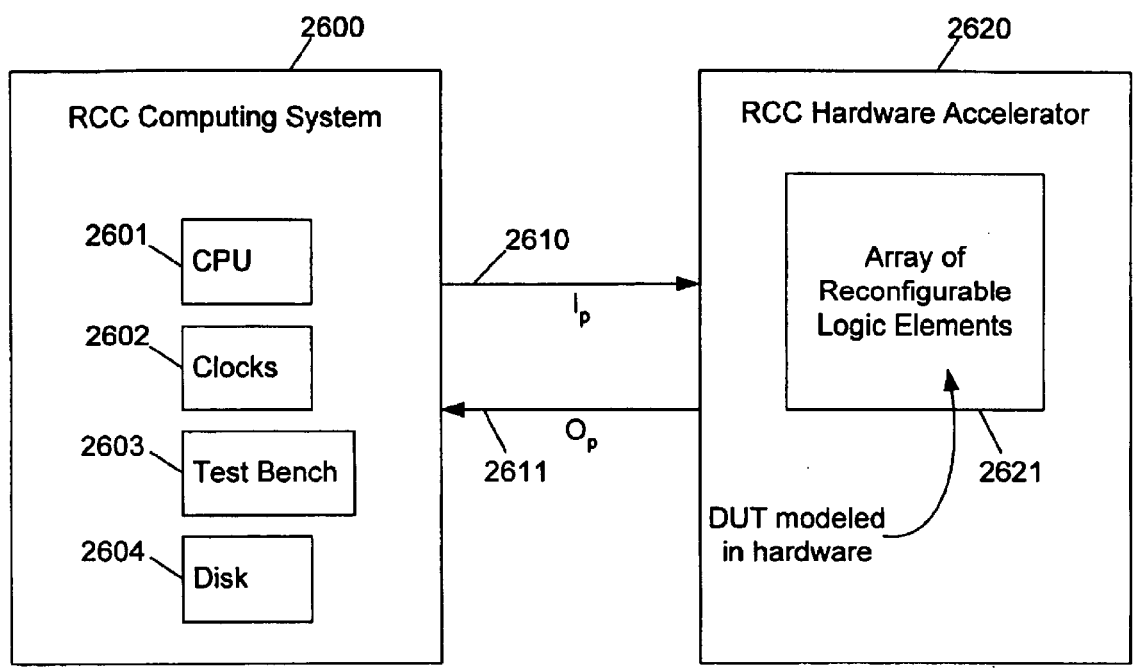

FIG. 83 shows a high level view of the components of the RCC system which incorporates one embodiment of the present invention.

Figure 84:
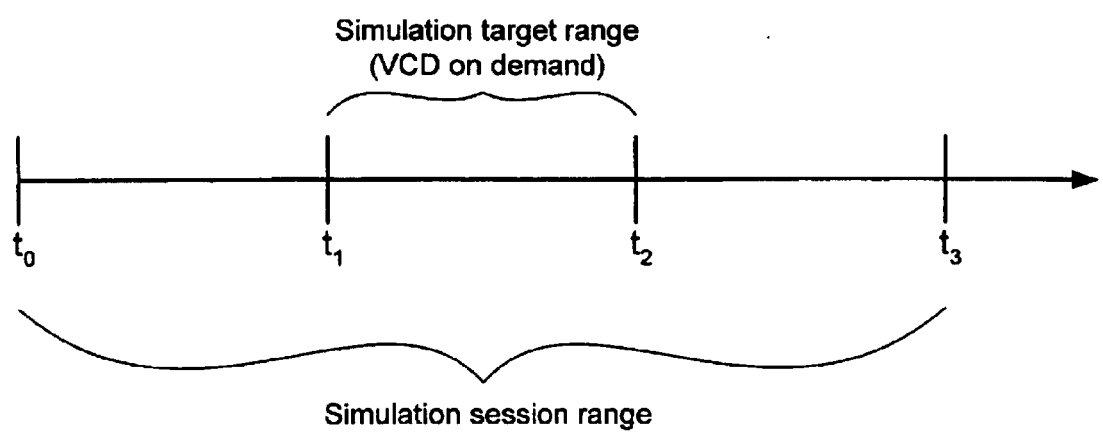

FIG. 84 shows several simulation time periods to illustrate the VCD on-demand operation in accordance with one embodiment of the present invention.

Figure 85:
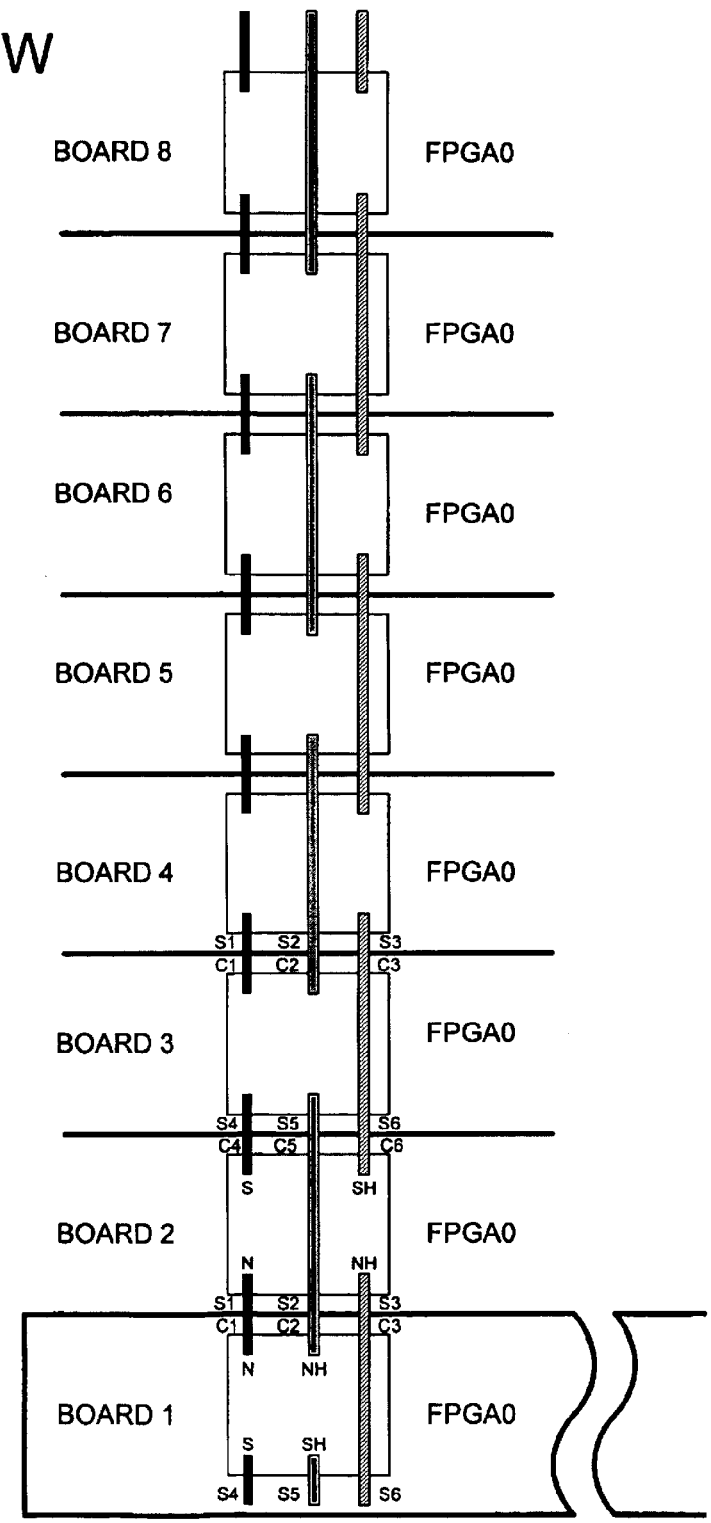

FIG. 85 shows a single row interconnect layout in accordance with one embodiment of the present invention.

Figure 86:
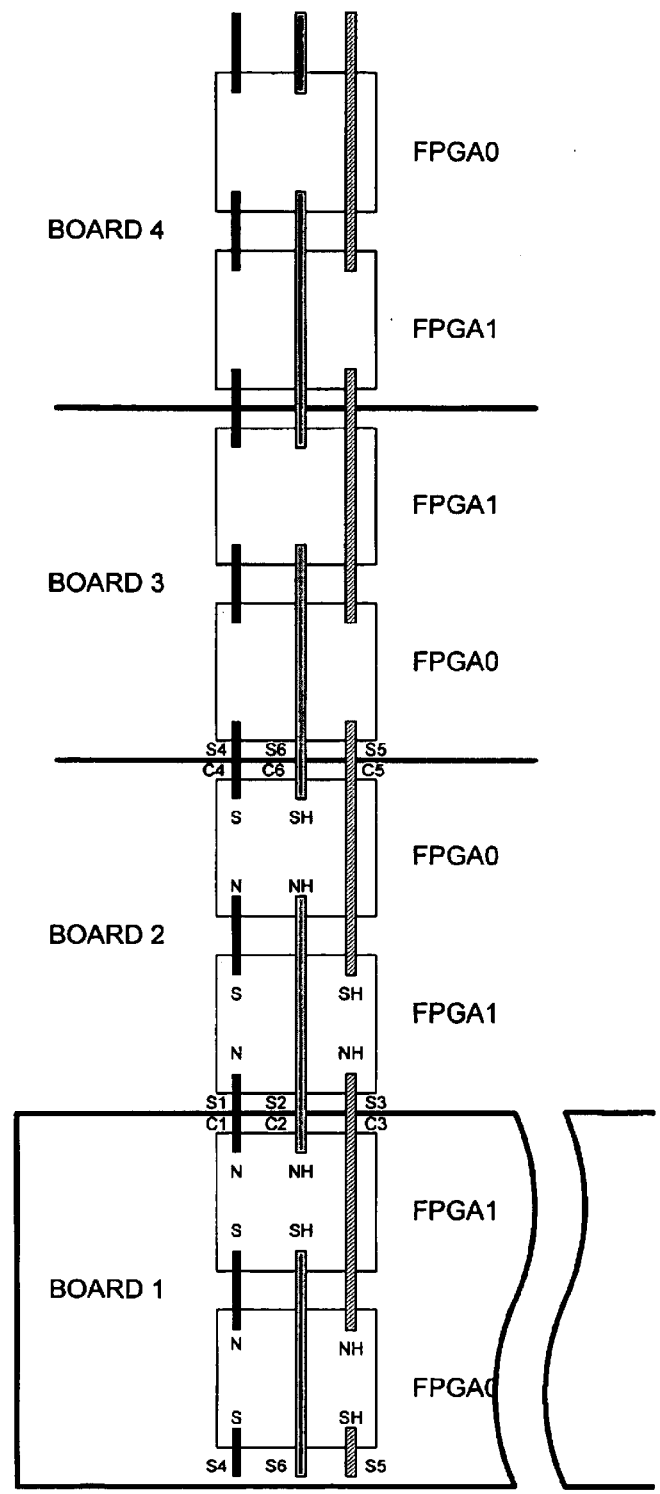

FIG. 86 shows a two-row interconnect layout in accordance with another embodiment of the present invention.

Figure 87:
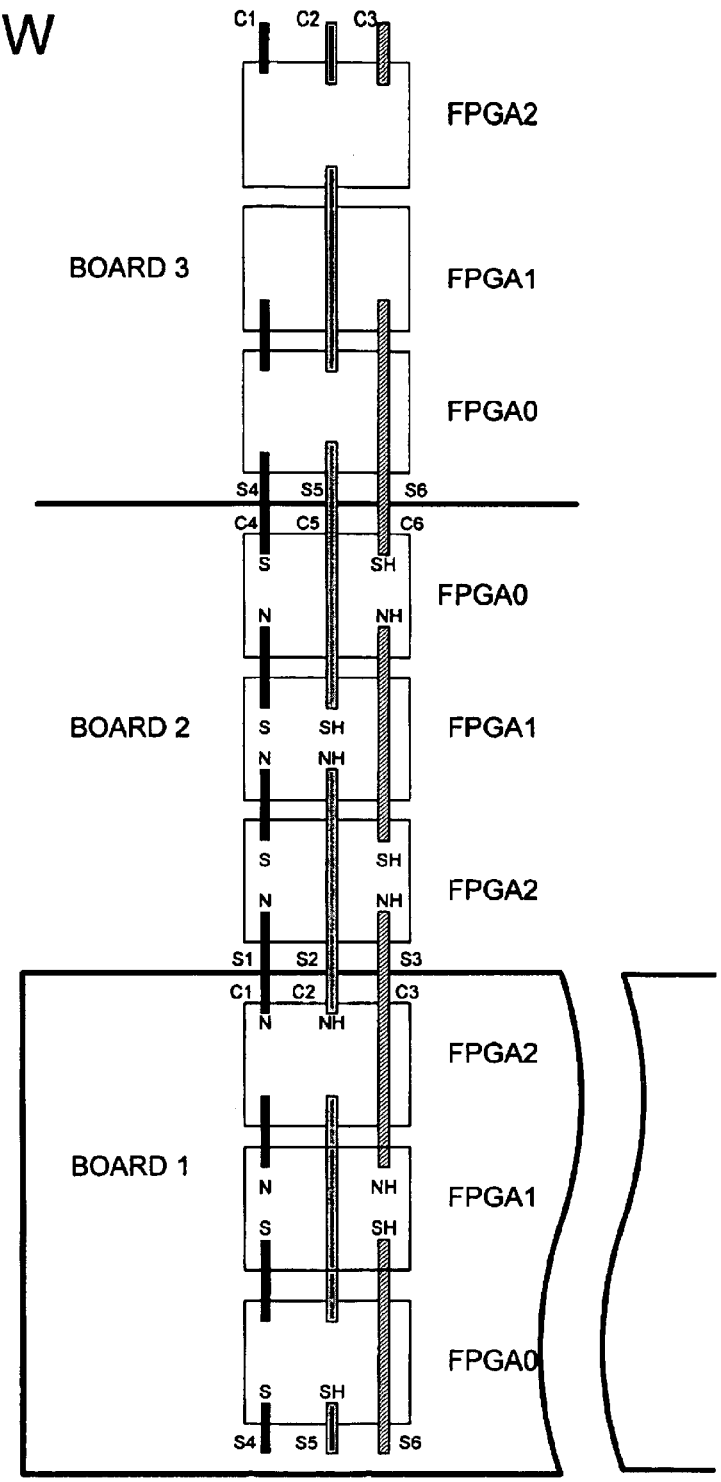

FIG. 87 shows a three-row interconnect layout in accordance with another embodiment of the present invention.

Figure 88:
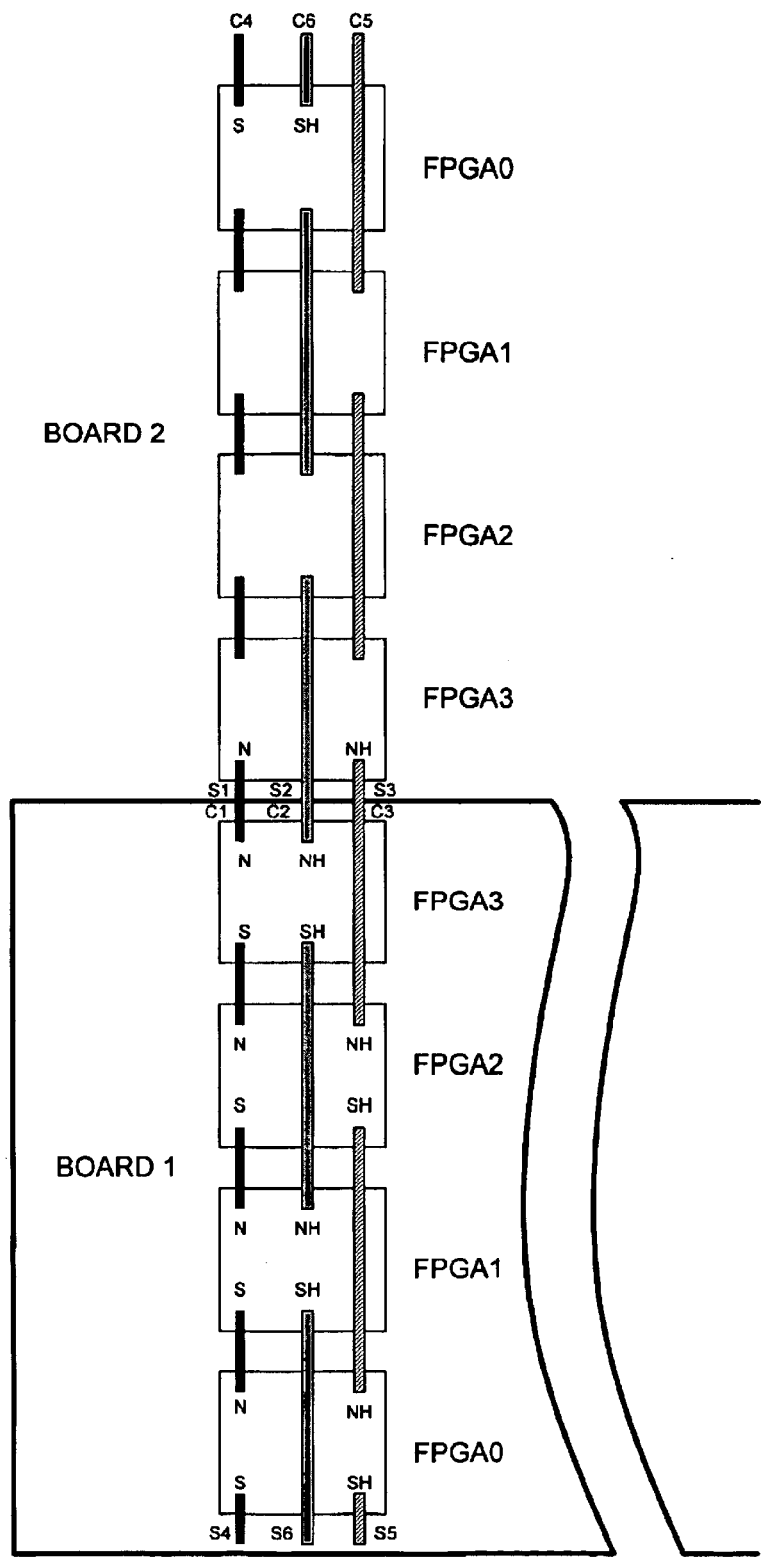

FIG. 88 shows a four-row interconnect layout in accordance with another embodiment of the present invention.

FIG. 89 shows a table that summarizes the interconnect layout scheme for a three-row board in accordance with one embodiment of the present invention.

Figure 90:
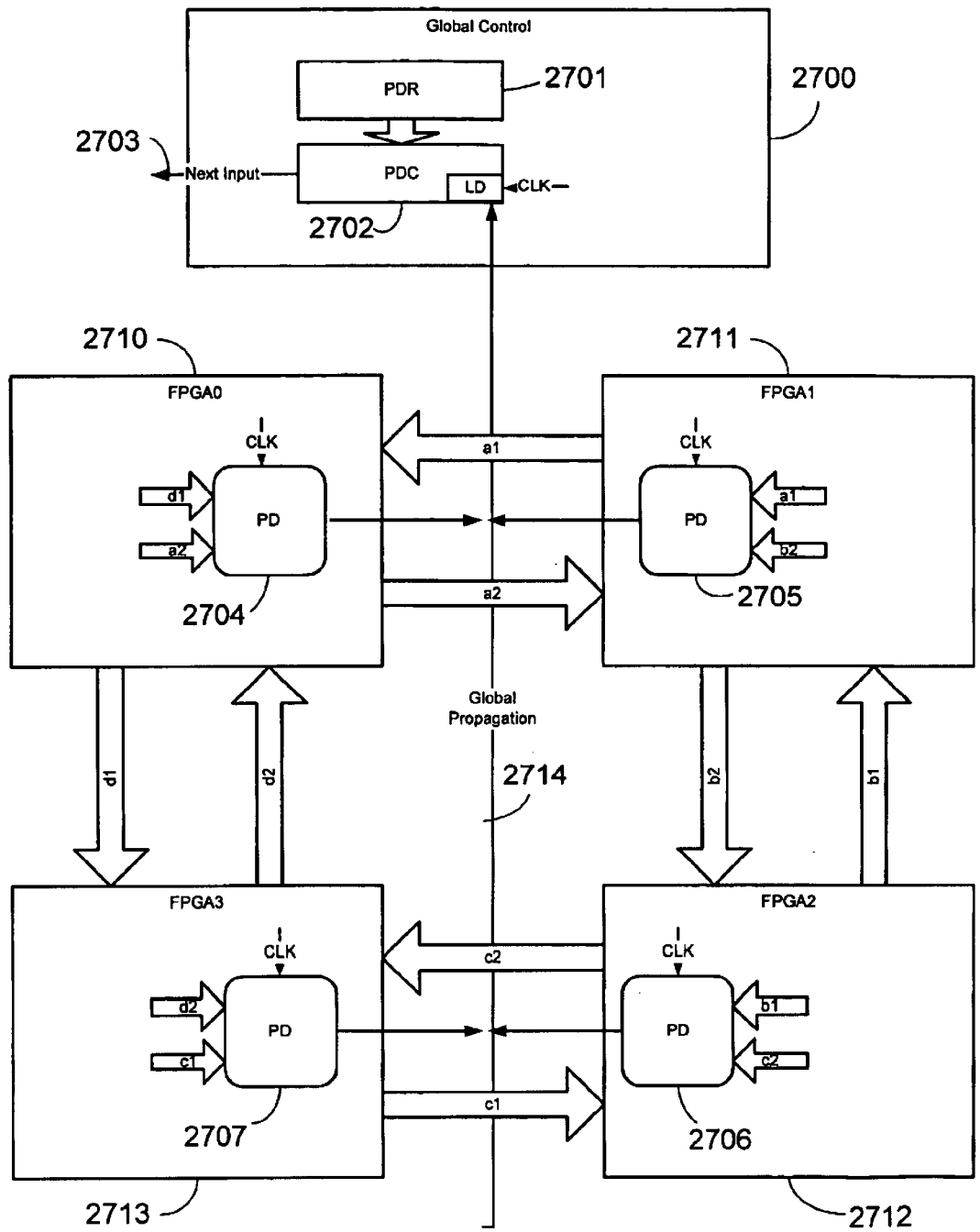

FIG. 90 shows a system diagram of the dynamic logic evaluation system and method in accordance with one embodiment of the present invention.

Figure 91:
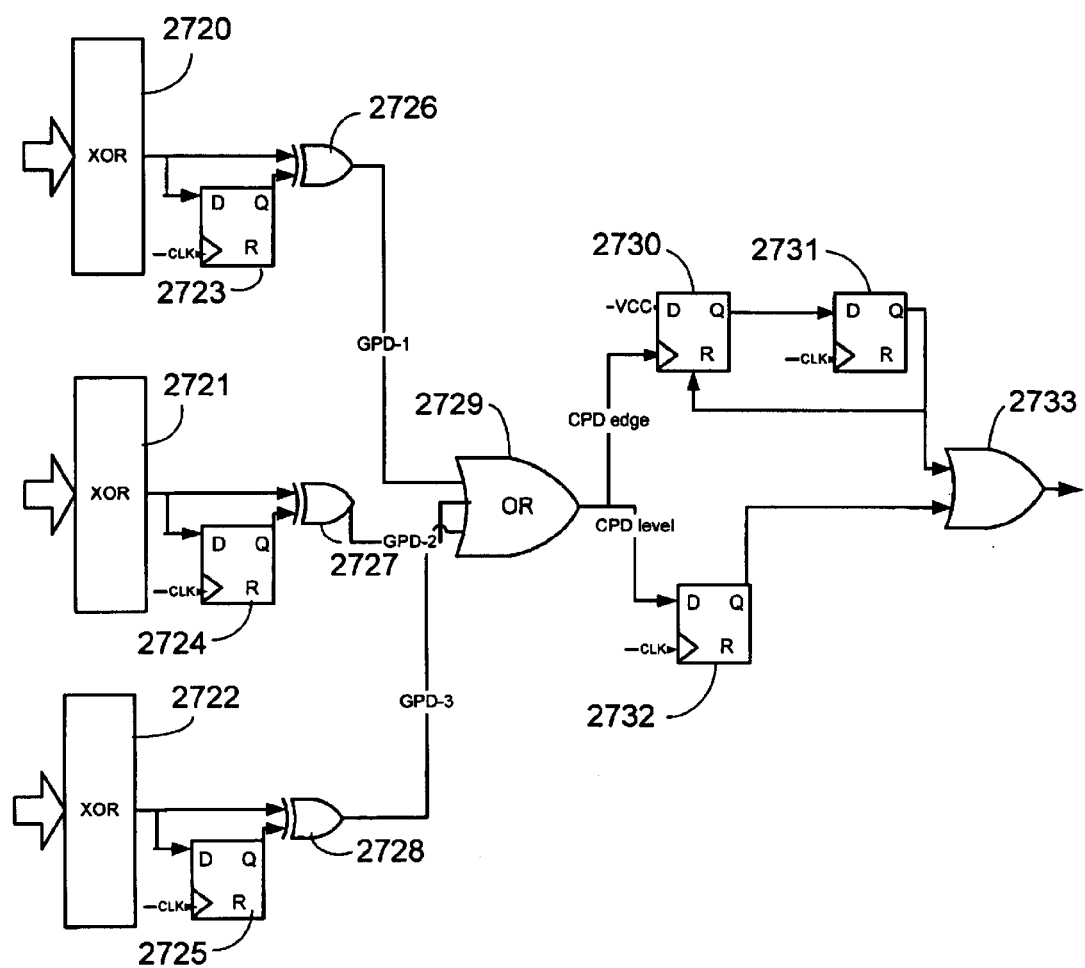

FIG. 91 shows a detailed circuit diagram of the propagation detector in accordance with one embodiment of the present invention.

Figure 92:
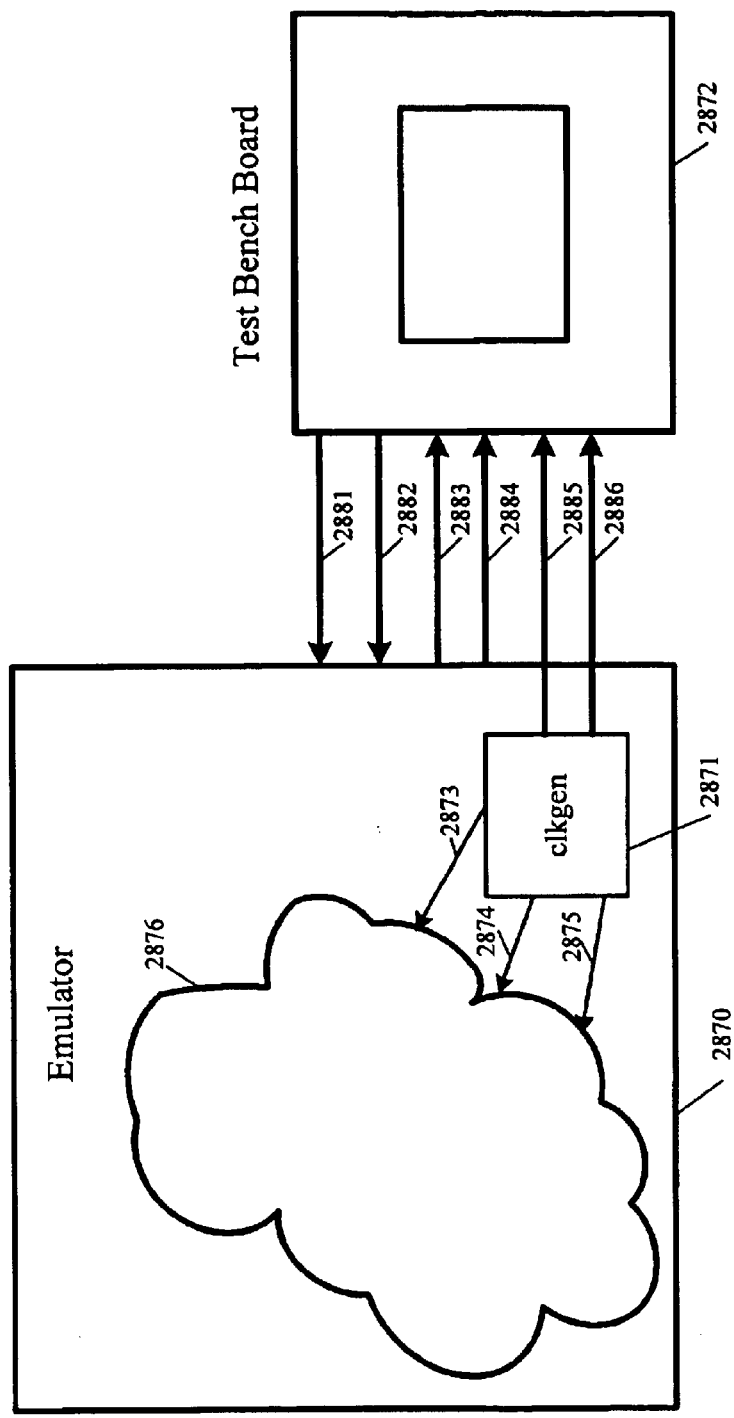

FIG. 92 shows the emulation system with the clock generator and the hardware test bench board in accordance with one embodiment of the present invention.

Figure 93:
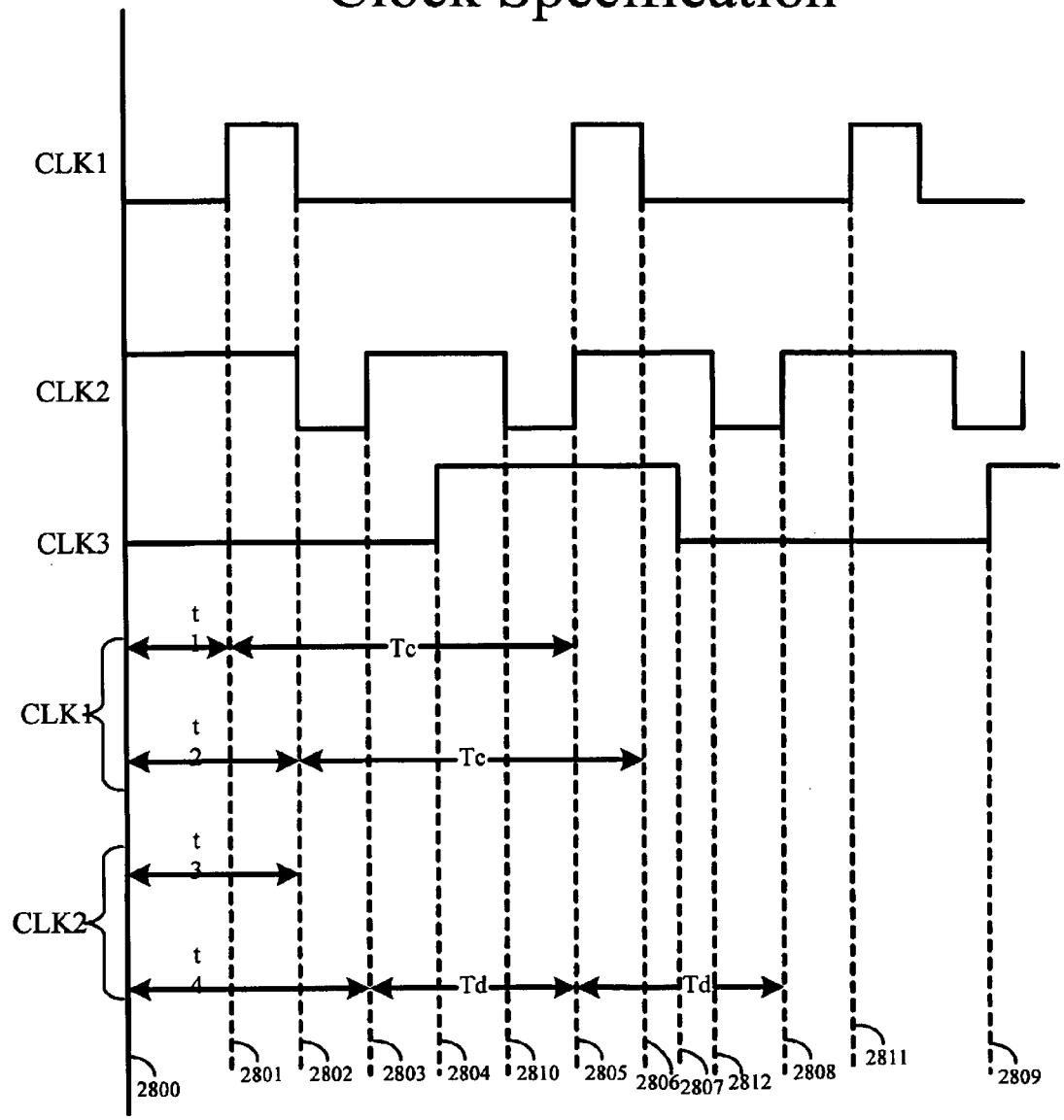

FIG. 93 shows three exemplary asynchronous clocks to illustrate the emulation system in accordance with one embodiment of the present invention.

Figure 94:
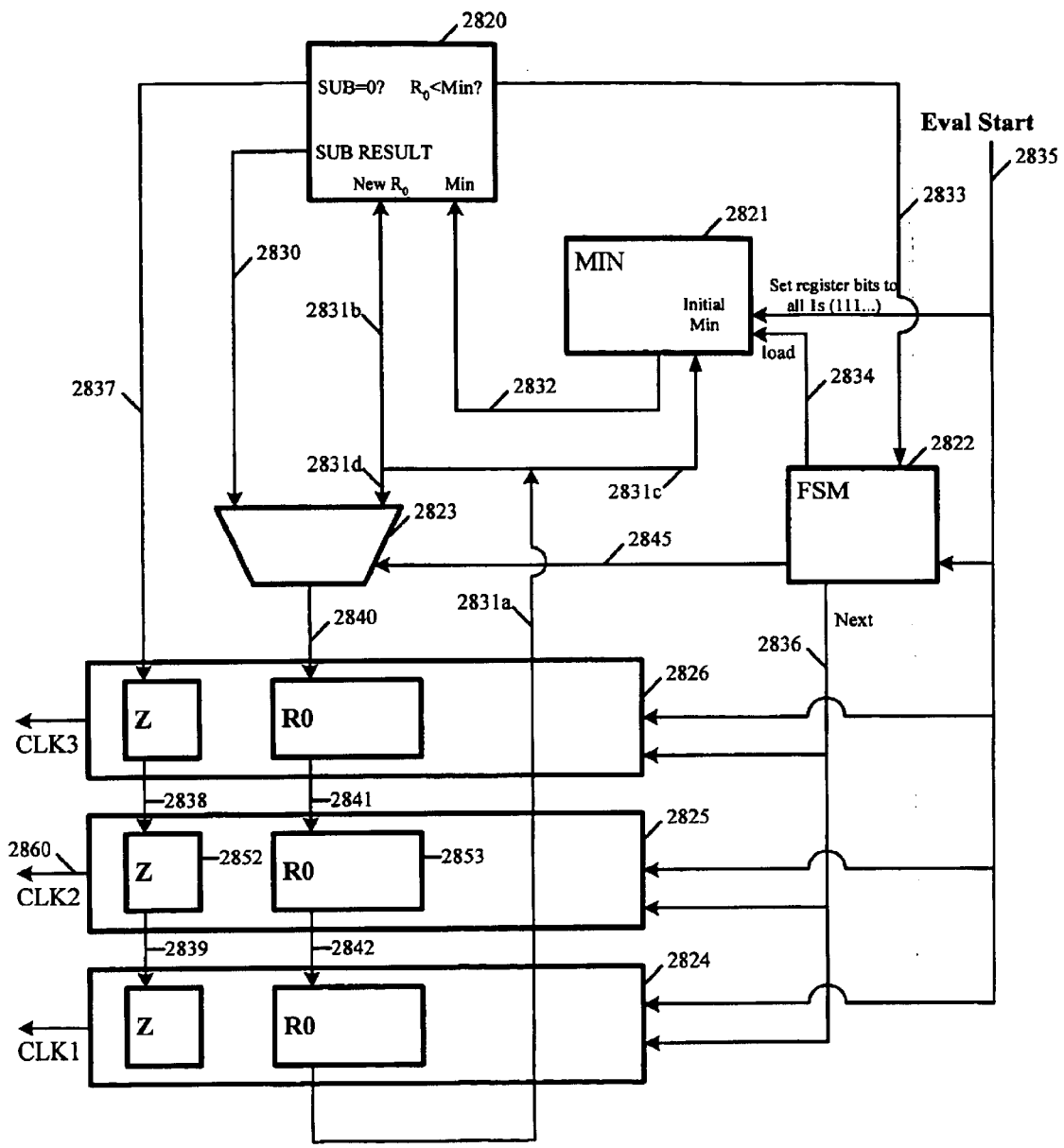

FIG. 94 shows the clock generation scheduler for the emulation system in accordance with one embodiment of the present invention.

Figure 95:
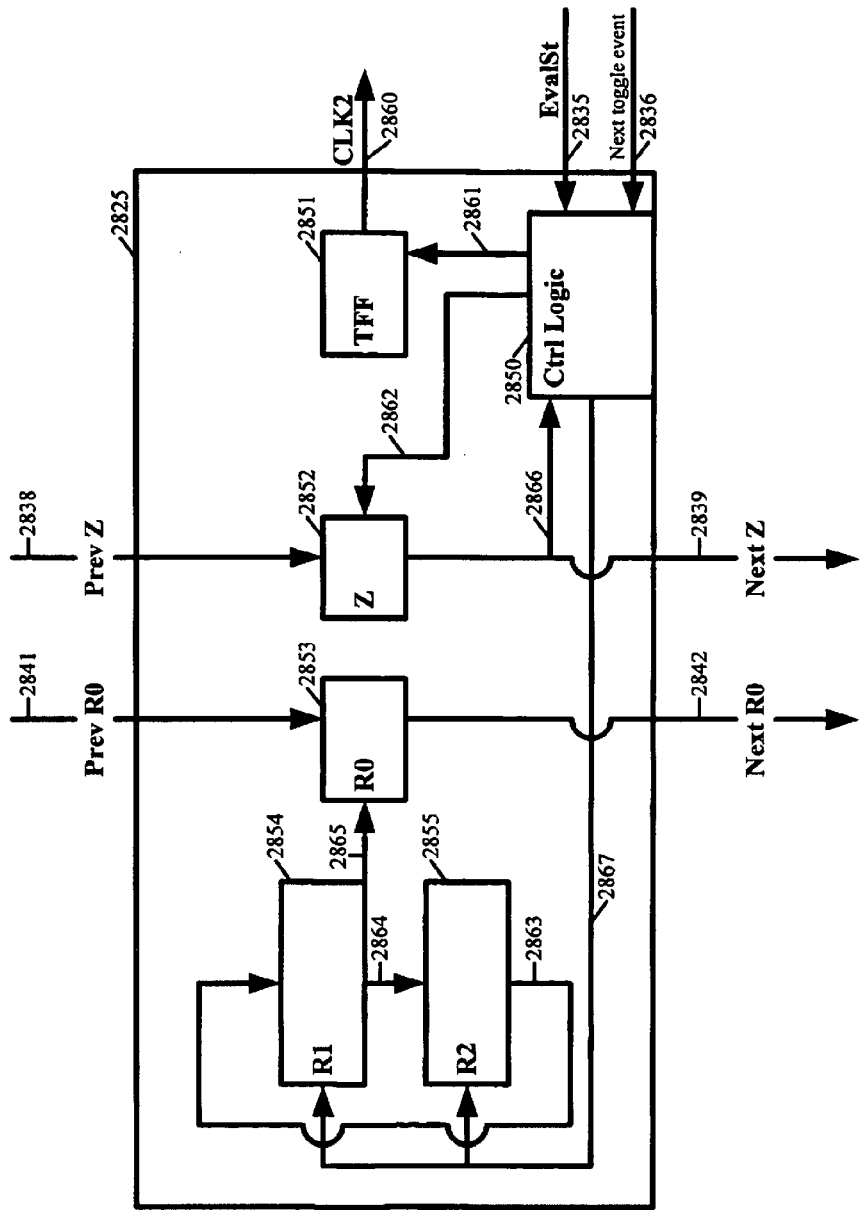

FIG. 95 shows the clock generation slice unit for the emulation system in accordance with one embodiment of the present invention.

Figure 96:
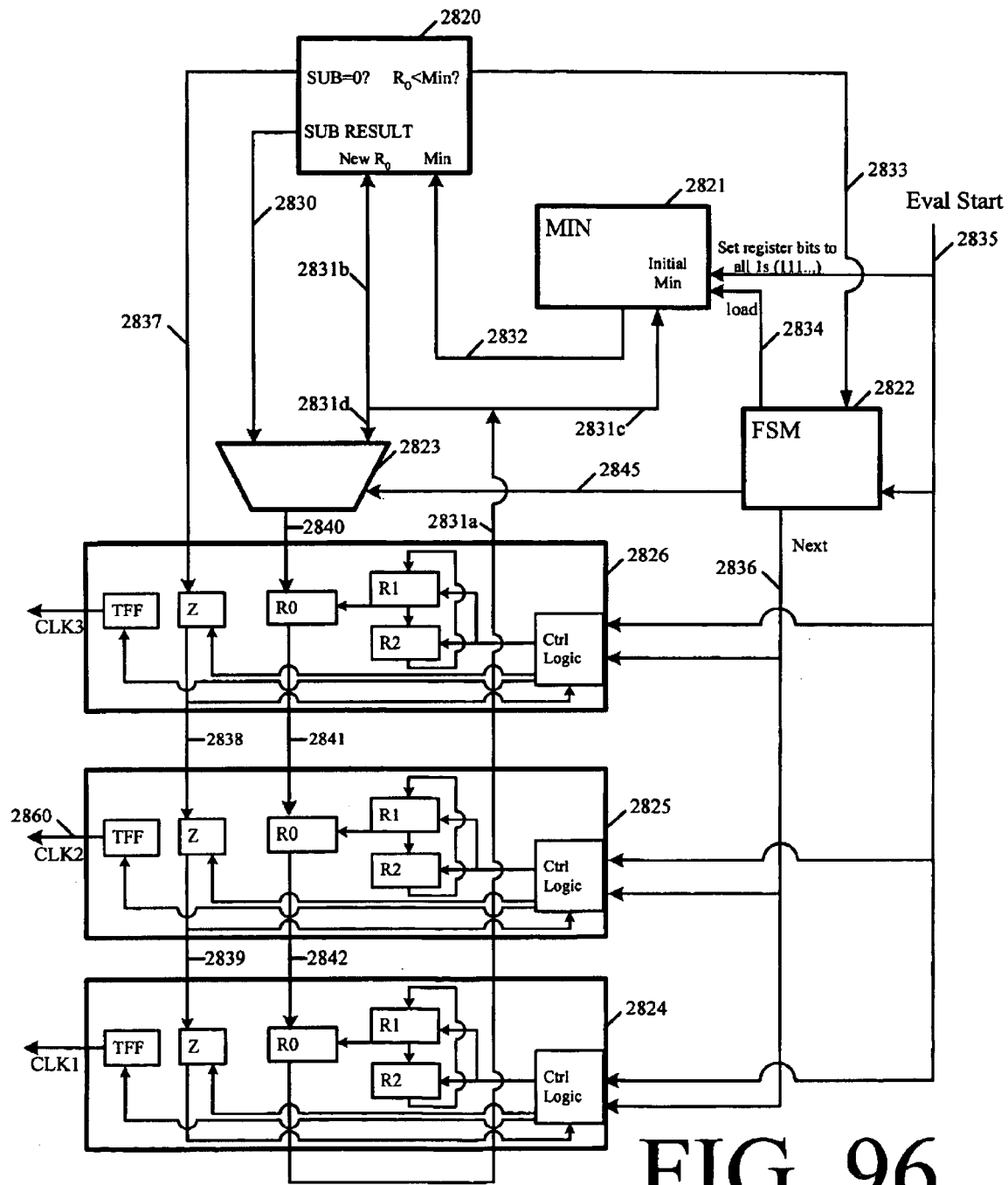

FIG. 96 shows the details of the clock generation slice units in the clock generation scheduler for the emulation system in accordance with one embodiment of the present invention.

DETAILED DESCRIPTION OF PREFERRED EMBODIMENTS

This specification will describe the various embodiments of the present invention through and within the context of a system called "SEmulator" or "SEmulation" system. Throughout the specification, the terms "SEmulation system," "SEmulator system," "SEmulator," or simply "system" may be used. These terms refer to various apparatus and method embodiments in accordance with the present invention for any combination of four operating modes: (1) software simulation, (2) simulation through hardware acceleration, (3) in-circuit emulation (ICE), and (4) post-simulation analysis, including their respective set-up or pre-processing stages. At other times, the term "SEmulation" may be used. This term refers to the novel processes described herein.

Similarly, terms such as "Reconfigurable Computing (RCC) Array System" or "RCC computing system" refers to that portion of the simulation/coverification system that contains the main processor, software kernel and the software model of the user design. Terms such as "Reconfigurable hardware array" or "RCC hardware array" refers to that portion of the simulation/coverification system that contains the hardware model of the user design and which contains the array of reconfigurable logic elements, in one embodiment.

The specification also makes references to a "user" and a user's "circuit design" or "electronic design." The "user" is a person who uses the SEmulation system through its interfaces and may be the designer of a circuit or a test/debugger who played little or no part in the design process. The "circuit design" or "electronic design" is a custom designed system or component, whether software or hardware, which can be modeled by the SEmulation system for test/debug purposes. In many cases, the "user" also designed the "circuit design" or "electronic design."

The specification also uses the terms "wire," "wire line," "wire/bus line," and "bus." These terms refer to various electrically conducting lines. Each line may be a single wire between two points or several wires between points. These terms are interchangeable in that a "wire" may comprise one or more conducting lines and a "bus" may also comprise one or more conducting lines.

This specification is presented in outline form. First, the specification presents a general overview of the SEmulator system, including an overview of the four operating modes and the hardware implementation schemes. Second, the specification provides a detailed discussion of the SEmulator system. In some cases, one figure may provide a variation of an embodiment shown in a previous figure. In these cases, like reference numerals will be used for like components/units/processes. The outline of the specification is as follows:

I. OVERVIEW
   A. SIMULATION/HARDWARE ACCELERATION MODES
   B. EMULATION WITH TARGET SYSTEM MODE
   C. POST-SIMULATION ANALYSIS MODE
   D. HARDWARE IMPLEMENTATION SCHEMES
   E. SIMULATION SERVER
   F. MEMORY SIMULATION
   G. COVERIFICATION SYSTEM
II. SYSTEM DESCRIPTION
III. SIMULATION/HARDWARE ACCELERATION MODES
IV. EMULATION WITH TARGET SYSTEM MODE
V. POST-SIMULATION ANALYSIS MODE
VI. HARDWARE IMPLEMENTATION SCHEMES
   A. OVERVIEW
   B. ADDRESS POINTER
   C. GATED DATA/CLOCK NETWORK ANALYSIS
   D. FPGA ARRAY AND CONTROL
   E. ALTERNATE EMBODIMENT USING DENSER FPGA CHIPS
   F. TIGF LOGIC DEVICES
   G. DYNAMIC LOGIC EVALUATION
   H. EMULATION SYSTEM WITH MULTIPLE ASYNCHRONOUS CLOCKS
VII. SIMULATION SERVER
VIII. MEMORY SIMULATION
IX. COVERIFICATION SYSTEM
X. EXAMPLES

I. Overview

The various embodiments of the present invention have four general modes of operation: (1) software simulation, (2) simulation through hardware acceleration, (3) in-circuit emulation, and (4) post-simulation analysis. The various embodiments include the system and method of these modes with at least some of the following features:

(1) a software and hardware model having a single tightly coupled simulation engine, a software kernel, which controls the software and hardware models cycle by cycle; (2) automatic component type analysis during the compilation process for software and hardware model generation and partitioning; (3) ability to switch (cycle by cycle) among software simulation mode, simulation through hardware acceleration mode, in-circuit emulation mode, and post-simulation analysis mode; (4) full hardware model visibility through software combinational component regeneration;

(5) double-buffered clock modeling with software clocks and gated clock/data logic to avoid race conditions; and (6) ability to re-simulate or hardware accelerate the user's circuit design from any selected point in a past simulation session. The end result is a flexible and fast simulator/emulator system and method with full HDL functionality and emulator execution performance.

A. Simulation/hardware Acceleration Modes

The SEmulator system, through automatic component type analysis, can model the user's custom circuit design in software and hardware. The entire user circuit design is modeled in software, whereas evaluation components (i.e., register component, combinational component) are modeled in hardware. Hardware modeling is facilitated by the component type analysis.

A software kernel, residing in the main memory of the general purpose processor system, serves as the SEmulator system's main program that controls the overall operation and execution of its various modes and features. So long as any test-bench processes are active, the kernel evaluates active test-bench components, evaluates clock components, detects clock edges to update registers and memories as well as propagating combinational logic data, and advances the simulation time. This software kernel provides for the tightly coupled nature of the simulator engine with the hardware acceleration engine. For the software/hardware boundary, the SEmulator system provides a number of I/O address spaces—REG (register), CLK (software clock), S2H (software to hardware), and H2S (hardware to software).

The SEmulator has the capability to selectively switch among the four modes of operation. The user of the system can start simulation, stop simulation, assert input values, inspect values, single step cycle by cycle, and switch back and forth among the four different modes. For example, the system can simulate the circuit in software for a time period, accelerate the simulation through the hardware model, and return back to software simulation mode.

Generally, the SEmulation system provides the user with the capability to "see" every modeled component, regardless of whether it's modeled in software or hardware. For a variety of reasons, combinational components are not as "visible" as registers, and thus, obtaining, combinational component data is difficult. One reason is that FPGAs, which are used in the reconfigurable board to model the hardware portion of the user's circuit design, typically model combinational components as look-up tables (LUT), instead of actual combinational components. Accordingly, the SEmulation system reads register values and then regenerates combinational components. Because some overhead is needed to regenerate the combinational components, this regeneration process is not performed all the time; rather, it is done only upon the user's request.

Because the software kernel resides in the software side, a clock edge detection mechanism is provided to trigger the generation of a so-called software clock that drives the enable input to the various registers in the hardware model. The timing is strictly controlled through a double-buffered circuit implementation so that the software clock enable signal enters the register model before the data to these models. Once the data input to these register models have stabilized, the software clock gates the data synchronously to ensure that all data values are gated together without any risk of hold-time violations:

Software simulation is also fast because the system logs all input values and only selected register values/states, thus overhead is minimized by decreasing the number of I/O operations. The user can selectively select the logging frequency.

B. Emulation with Target System Mode

The SEmulation system is capable of emulating the user's circuit within its target system environment. The target system outputs data to the hardware model for evaluation and the hardware model also outputs data to the target system. Additionally, the software kernel controls the operation of this mode so that the user still has the option to start, stop, assert values, inspect values, single step, and switch from one mode to another.

C. Post-Simulation Analysis Mode

Logs provide the user with a historical record of the simulation session. Unlike known simulation systems, the SEmulation system does not log every single value, internal state, or value change during the simulation process. The SEmulation system logs only selected values and states based on a logging frequency (i.e., log 1 record every N cycles). During the post-simulation stage, if the user wants to examine various data around point X in the just-completed simulation session, the user goes to one of the logged points, say logged point Y, that is closest and temporally located prior to point X. The user then simulates from that selected logged point Y to his desired point X to obtain simulation results.

Also, a VCD on-demand system will be described. This VCD on-demand system allows the user to view any simulation target range (i.e., simulation times) on demand without simulation rerun.

D. Hardware Implementation Schemes

The SEmulation system implements an array of FPGA chips on a reconfigurable board. Based on the hardware model, the SEmulation system partitions, maps, places, and routes each selected portion of the user's circuit design onto the FPGA chips. Thus, for example, a 4×4 array of 16 chips may be modeling a large circuit spread out across these 16 chips. The interconnect scheme allows each chip to access another chip within 2 "jumps" or links.

Each FPGA chip implements an address pointer for each of the I/O address spaces (i.e., REG, CLK, S2H, H2S). The combination of all address pointers associated with a particular address space are chained together. So, during data transfer, word data in each chip is sequentially selected from/to the main FPGA bus and PCI bus, one word at a time for the selected address space in each chip, and one chip at a time, until the desired word data have been accessed for that selected address space. This sequential selection of word data is accomplished by a propagating word selection signal. This word selection signal travels through the address pointer in a chip and then propagates to the address pointer in the next chip and continues on till the last chip or the system initializes the address pointer.

The FPGA bus system in the reconfigurable board operates at twice the PCI bus bandwidth but at half the PCI bus speed. The FPGA chips are thus separated into banks to utilize the larger bandwidth bus. The throughput of this FPGA bus system can track the throughput of the PCI bus system so performance is not lost by reducing the bus speed. Expansion is possible through piggyback boards that extend the bank length.

In another embodiment of the present invention, denser FPGA chips are used. One such denser chip is the Altera 10K130V and 10K250V chips. Use of these chips alters the board design such that only four FPGA chips, instead of eight less dense FPGA chips (e.g., Altera 10K100), are used per board.

The FPGA array in the Simulation system is provided on the motherboard through a particular board interconnect structure. Each chip may have up to eight sets of interconnections, where the interconnections are arranged according to adjacent direct-neighbor interconnects (i.e., N[73:0], S[73:0], W[73:0], E[73:0]), and one-hop neighbor interconnects (i.e., NH[27:0], SH[27:0], XH[36:0], XH[72:37]), excluding the local bus connections, within a single board and across different boards. Each chip is capable of being interconnected directly to adjacent neighbor chips, or in one hop to a non-adjacent chip located above, below, left, and right. In the X direction (east-west), the array is a torus. In the Y direction (north-south), the array is a mesh.

The interconnects alone can couple logic devices and other components within a single board. However, interboard connectors are provided to couple these boards and interconnects together across different boards to carry signals between (1) the PCI bus via the motherboard and the array boards, and (2) any two array boards.

A motherboard connector connects the board to the motherboard, and hence, to the PCI bus, power, and ground. For some boards, the motherboard connector is not used for direct connection to the motherboard. In a six-board configuration, only boards 1, 3, and 5 are directly connected to the motherboard while the remaining boards 2, 4, and 6 rely on their neighbor boards for motherboard connectivity. Thus, every other board is directly connected to the motherboard, and interconnects and local buses of these boards are coupled together via inter-board connectors arranged solder-side to component-side. PCI signals are routed through one of the boards (typically the first board) only. Power and ground are applied to the other motherboard connectors for those boards. Placed solder-side to component-side, the various inter-board connectors allow communication among the PCI bus components, the FPGA logic devices, memory devices, and various Simulation system control circuits.

E. Simulation Server

In another embodiment of the present invention, a Simulation server is provided to allow multiple users to access the same reconfigurable hardware unit. In one system configuration, multiple workstations across a network or multiple users/processes in a non-network environment can access the same server-based reconfigurable hardware unit to review/debug the same or different user circuit design. The access is accomplished via a time-shared process in which a scheduler determines access priorities for the multiple users, swaps jobs, and selectively locks hardware model access among the scheduled users. In one scenario, each user can access the server to map his/her separate user design to the reconfigurable hardware model for the first time, in which case the system compiles the design to generate the software and hardware models, performs the clustering operation, performs place-and-route operations, generates a bitstream configuration file, and reconfigures the FPGA chips in the reconfigurable hardware unit to model the hardware portion of the user's design. When one user has accelerated his design using the hardware model and downloaded the hardware state to his own memory for software simulation, the hardware unit can be released for access by another user.

The server provides the multiple users or processes to access the reconfigurable hardware unit for acceleration and hardware state swapping purposes. The Simulation server includes the scheduler, one or more device drivers, and the reconfigurable hardware unit. The scheduler in the a Simulation server is based on a preemptive round robin algorithm. The server scheduler includes a simulation job queue table, a priority sorter, and a job swapper. The restore and playback function of the present invention facilitates the non-network multiprocessing environment as well as the network multi-user environment in which previous checkpoint state data can be downloaded and the entire simulation state associated with that checkpoint can be restored for playback debugging or cycle-by-cycle stepping.

F. Memory Simulation

The Memory Simulation or memory mapping aspect of the present invention provides an effective way for the Simulation system to manage the various memory blocks associated with the configured hardware model of the user's design, which was programmed into the array of FPGA chips in the reconfigurable hardware unit. The memory Simulation aspect of the invention provides a structure and scheme where the numerous memory blocks associated with the user's design is mapped into the SRAM memory devices in the Simulation system instead of inside the logic devices, which are used to configure and model the user's design. The memory Simulation system includes a memory state machine, an evaluation state machine, and their associated logic to control and interface with: (1) the main computing system and its associated memory system, (2) the SRAM memory devices coupled to the FPGA buses in the Simulation system, and (3) the FPGA logic devices which contain the configured and programmed user design that is being debugged. The operation of the memory Simulation system in accordance with one embodiment of the present invention is generally as follows. The Simulation write/read cycle is divided into three periods—DMA data transfer, evaluation, and memory access.

The FPGA logic device side of the memory Simulation system includes an evaluation state machine, an FPGA bus driver, and a logic interface for each memory block N to interface with the user's own memory interface in the user design to handle: (1) data evaluations among the FPGA logic devices, and (2) write/read memory access between the FPGA logic devices and the SRAM memory devices. In conjunction with the FPGA logic device side, the FPGA I/O controller side includes a memory state machine and interface logic to handle DMA, write, and read operations between: (1) main computing system and SRAM memory devices; and (2) FPGA logic devices and the SRAM memory devices.

G. Coverification System

One embodiment of the present invention is a coverification system that includes a reconfigurable computing system (hereinafter "RCC computing system") and a reconfigurable computing hardware array (hereinafter "RCC hardware array"). In some embodiments, the target system and the external I/O devices are not necessary since they can be modeled in software. In other embodiments, the target system and the external I/O devices are actually coupled to the coverification system to obtain speed and use actual data, rather than simulated test bench data. Thus, a coverification system can incorporate the RCC computing system and RCC hardware array along with other functionality to debug the software portion and hardware portion of a user's design while using the actual target system and/or I/O devices.

The RCC computing system also contains clock logic (for clock edge detection and software clock generation), test bench processes for testing the user design, and device models for any I/O device that the user decides to model in software instead of using an actual physical I/O device. Of course, the user may decide to use actual I/O devices as well as modeled I/O devices in one debug session. The software clock is provided to the external interface to function as the external clock source for the target system and the external I/O devices. The use of this software clock provides the synchronization necessary to process incoming and outgoing data. Because the RCC computing system-generated software clock is the time base for the debug session, simulated and hardware-accelerated data are synchronized with any data that is delivered between the coverification system and the external interface.

When the target system and the external I/O devices are coupled to the coverification system, pin-out data must be provided between the coverification system and its external interface. The coverification system contains a control logic that provides traffic control between: (1) the RCC computing system and the RCC hardware array, and (2) the external interface (which are coupled to the target system and the external I/O devices) and the RCC hardware array. Because the RCC computing system has the model of the entire design in software, including that portion of the user design modeled in the RCC hardware array, the RCC computing system must also have access to all data that passes between the external interface and the RCC hardware array. The control logic ensures that the RCC computing system has access to these data.

II. System Description

Figure 1:
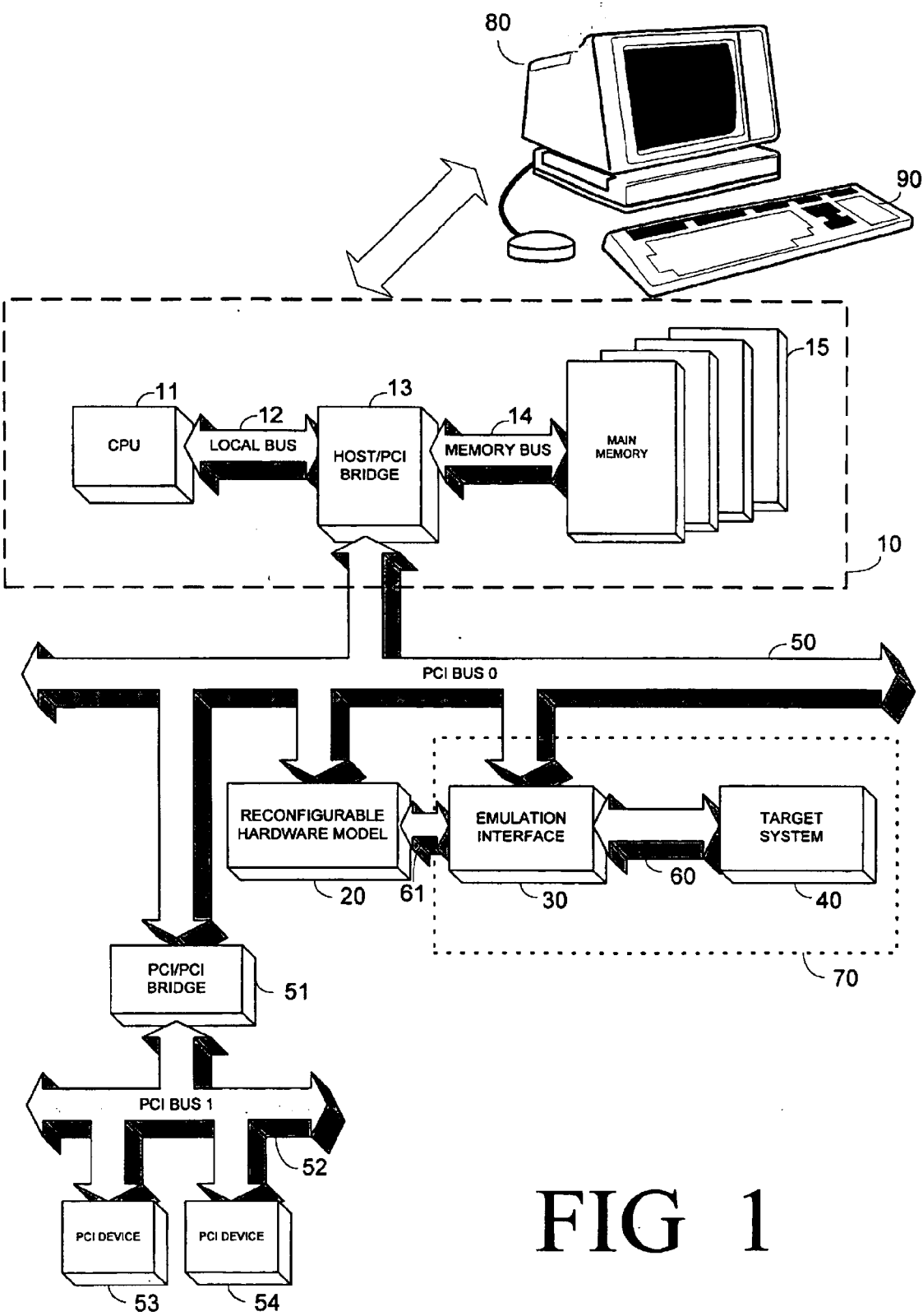
FIG. 1 shows a high level overview of one embodiment of the present invention, including the workstation, reconfigurable hardware emulation model, emulation interface, and the target system coupled to a PCI bus.

FIG. 1 shows a high level overview of one embodiment of the present invention. A workstation 10 is coupled to a reconfigurable hardware model 20 and emulation interface 30 via PCI bus system 50. The reconfigurable hardware model 20 is coupled to the emulation interface 30 via PCI bus 50, as well as cable 61. A target system 40 is coupled to the emulation interface 30 via cables 60. In other embodiments, the in-circuit emulation set-up 70 which comprises the emulation interface 30 and target system 40 (as shown in the dotted line box) are not provided in this set-up when emulation of the user's circuit design within the target system's environment is not desired during a particular test/debug session. Without the in-circuit emulation set-up 70, the reconfigurable hardware model 20 communicates with the workstation 10 via the PCI bus 50.

In combination with the in-circuit emulation set-up 70, the reconfigurable hardware model 20 imitates or mimics the user's circuit design of some electronic subsystem in the target system. To ensure the correct operation of the user's circuit design of the electronic subsystem within the target system's environment, input and output signals between the target system 40 and the modeled electronic subsystem must be provided to the reconfigurable hardware model 20 for evaluation. Hence, the input and output signals of the target system 40 to/from the reconfigurable hardware model 20 are delivered via cables 60 through the emulation interface 30 and the PCI bus 50. Alternatively, input/output signals of the target system 40 can be delivered to the reconfigurable hardware model 20 via emulation interface 30 and cables 61.

The control data and some substantive simulation data pass between the reconfigurable hardware model 20 and the workstation 10 via the PCI bus 50. Indeed, the workstation 10 runs the software kernel that controls the operation of the entire SEmulation system and must have access (read/write) to the reconfigurable hardware model 20.

A workstation 10 complete with a computer, keyboard, mouse, monitor and appropriate bus/network interface allows a user to enter and modify data describing the circuit design of an electronic system. Exemplary workstations include a Sun Microsystems SPARC or ULTRA-SPARC workstation or an Intel/Microsoft-based computing station. As known to those ordinarily skilled in the art, the workstation 10 comprises a CPU 11, a local bus 12, a host/PCI bridge 13, memory bus 14, and main memory 15. The various software simulation, simulation by hardware acceleration, in-circuit emulation, and post-simulation analysis aspects of the present invention are provided in the workstation 10, reconfigurable hardware model 20, and emulation interface 30. The algorithm embodied in software is stored in main memory 15 during a test/debug session and executed through the CPU 11 via the workstation's operating system.

As known to those ordinarily skilled in the art, after the operating system is loaded into the memory of workstation 10 by the start-up firmware, control passes to its initialization code to set up necessary data structures, and load and initialize device drivers. Control is then passed to the command line interpreter (CLI), which prompts the user to indicate the program to be run. The operating system then determines the amount of memory needed to run the program, locates the block of memory, or allocates a block of memory and accesses the memory either directly or through BIOS. After completion of the memory loading process, the application program begins execution.

One embodiment of the present invention is a particular application program for SEmulation. During the course of its execution, the application program may require numerous services from the operating system, including, but not limited to, reading from and writing to disk files, performing data communications, and interfacing with the display/keyboard/mouse.

The workstation 10 has the appropriate user interface to allow the user to enter the circuit design data, edit the circuit design data, monitor the progress of simulations and emulations while obtaining results, and essentially control the simulation and emulation process. Although not shown in FIG. 1, the user interface includes user-accessible menu-driven options and command sets which can be entered with the keyboard and mouse and viewed with a monitor. Typically, the user uses a computing station 80 with a keyboard 90.

The user typically creates a particular circuit design of an electronic system and enters a HDL (usually structured RTL level) code description of his designed system into the workstation 10. The SEmulation system of the present invention performs component type analysis, among other operations, for partitioning the modeling between software and hardware. The SEmulation system models behavior, RTL, and gate level code in software. For hardware modeling, the system can model RTL and gate level code; however, the RTL level must be synthesized to gate level prior to hardware modeling. The gate level code can be processed directly into usable source design database format for hardware modeling. Using the RTL and gate level codes, the system automatically performs component type analysis to complete the partition step. Based on the partitioning analysis during software compile time, the system maps some portion of the circuit design into hardware for fast simulation via hardware acceleration. The user can also couple the modeled circuit design to the target system for real environment in circuit emulation. Because the software simulation and the hardware acceleration engines are tightly coupled, through the software kernel, the user can then simulate the overall circuit design using software simulation, accelerate the test/debug process by using the hardware model of the mapped circuit design, return to the simulation portion, and return to the hardware acceleration until the test/debug process is complete. The ability to switch between software simulation and hardware acceleration cycle-by-cycle and at will by the user is one of the valuable features of this embodiment. This feature is particularly useful in the debug process by allowing the user to go to a particular point or cycle very quickly using the hardware acceleration mode and then using software simulation to examine various points thereafter to debug the circuit design. Moreover, the SEmulation system makes all components visible to the user whether the internal realization of the component is in hardware or software. The SEmulation system accomplishes this by reading the register values from the hardware model and then rebuilding the combinational components using the software model when the user requests such a read. These and other features will be discussed more fully later in the specification.

The workstation 10 is coupled to a bus system 50. The bus system can be any available bus system that allows various agents, such as the workstation 10, reconfigurable hardware model 20, and emulation interface 30, to be operably coupled together. Preferably, the bus system is fast enough to provide real-time or near real-time results to the user. One such bus system is the bus system described in the Peripheral Component Interconnect (PCI) standard, which is incorporated herein by reference. Currently, revision 2.0 of the PCI standard provides for a 33 MHz bus speed. Revision 2.1 provides support for 66 MHz bus speed. Accordingly, the workstation 10, reconfigurable hardware model 20, and emulation interface 30 may comply with the PCI standard.

In one embodiment, communication between the workstation 10 and the reconfigurable hardware model 20 is handled on the PCI bus. Other PCI-compliant devices may be found in this bus system. These devices may be coupled to the PCI bus at the same level as the workstation 10, reconfigurable hardware model 20, and emulation interface 30, or other levels. Each PCI bus at a different level, such as PCI bus 52, is coupled to another PCI bus level, such as PCI bus 50, if it exists at all, through a PCI-to-PCI bridge 51. At PCI bus 52, two PCI devices 53 and 54 may be coupled therewith.

The reconfigurable hardware model 20 comprises an array of field-programmable gate array (FPGA) chips that can be programmably configured and reconfigured to model the hardware portion of the user's electronic system design. In this embodiment, the hardware model is reconfigurable; that is, it can reconfigure its hardware to suit the particular computation or user circuit design at hand. If, for example, many adders or multiplexers are required, the system is configured to include many adders and multiplexers. As other computing elements or functions are needed, they may also be modeled or formed in the system. In this way, the system can be optimized to perform specialized computations or logic operations. Reconfigurable systems are also flexible, so that users can work around minor hardware defects that arise during manufacture, testing, or use. In one embodiment, the reconfigurable hardware model 20 comprises a two-dimensional array of computing elements consisting of FPGA chips to provide the computational resources for various user circuit designs and applications. More details on the hardware configuration process will be provided.

Two such FPGA chips include those sold by Altera and Xilinx. In some embodiments, the reconfigurable hardware model is reconfigurable via the use of field programmable devices. However, other embodiments of the present invention may be implemented using application specific integrated circuit (ASIC) technology. Still other embodiments may be in the form of a custom integrated circuit.

In a typical test/debug scenario, reconfigurable devices will be used to simulate/emulate the user's circuit design so that appropriate changes can be made prior to actual prototype manufacturing. In some other instances, however, an actual ASIC or custom integrated circuit can be used, although this deprives the user of the ability to quickly and cost-effectively change a possibly non-functional circuit design for re-simulation and re-emulation. At times, though, such an ASIC or custom IC has already been manufactured and readily available so that emulation with an actual non-reconfigurable chip may be preferable.

In accordance with the present invention, the software in the workstation, along with its integration with an external hardware model, provides a greater degree of flexibility, control, and performance for the end user over existing systems. To run the simulation and emulation, a model of the circuit design and the relevant parameters (e.g., input testbench stimulus, overall system output, intermediate results) are determined and provided to the simulation software system. The user can use either schematic capture tools or synthesis tools to define the system circuit design. The user starts with a circuit design of an electronic system, usually in draft schematic form, which is then converted to HDL form using synthesis tools. The HDL can also be directly written by the user. Exemplary HDL languages include Verilog and VHDL; however, other languages are also available. A circuit design represented in HDL comprises many concurrent components. Each component is a sequence of code which either defines the behavior of a circuit element or controls the execution of the simulation.

The SEmulation system analyzes these components to determine their component types and the compiler uses this component type information to build different execution models in software and hardware. Thereafter, the user can use the SEmulation system of the present invention. The designer can verify the accuracy of the circuit through simulation by applying various stimuli such as input signals and test vector patterns to the simulated model. If, during the simulation, the circuit does not behave as planned, the user re-defines the circuit by modifying the circuit schematic or the HDL file.

Figure 2:
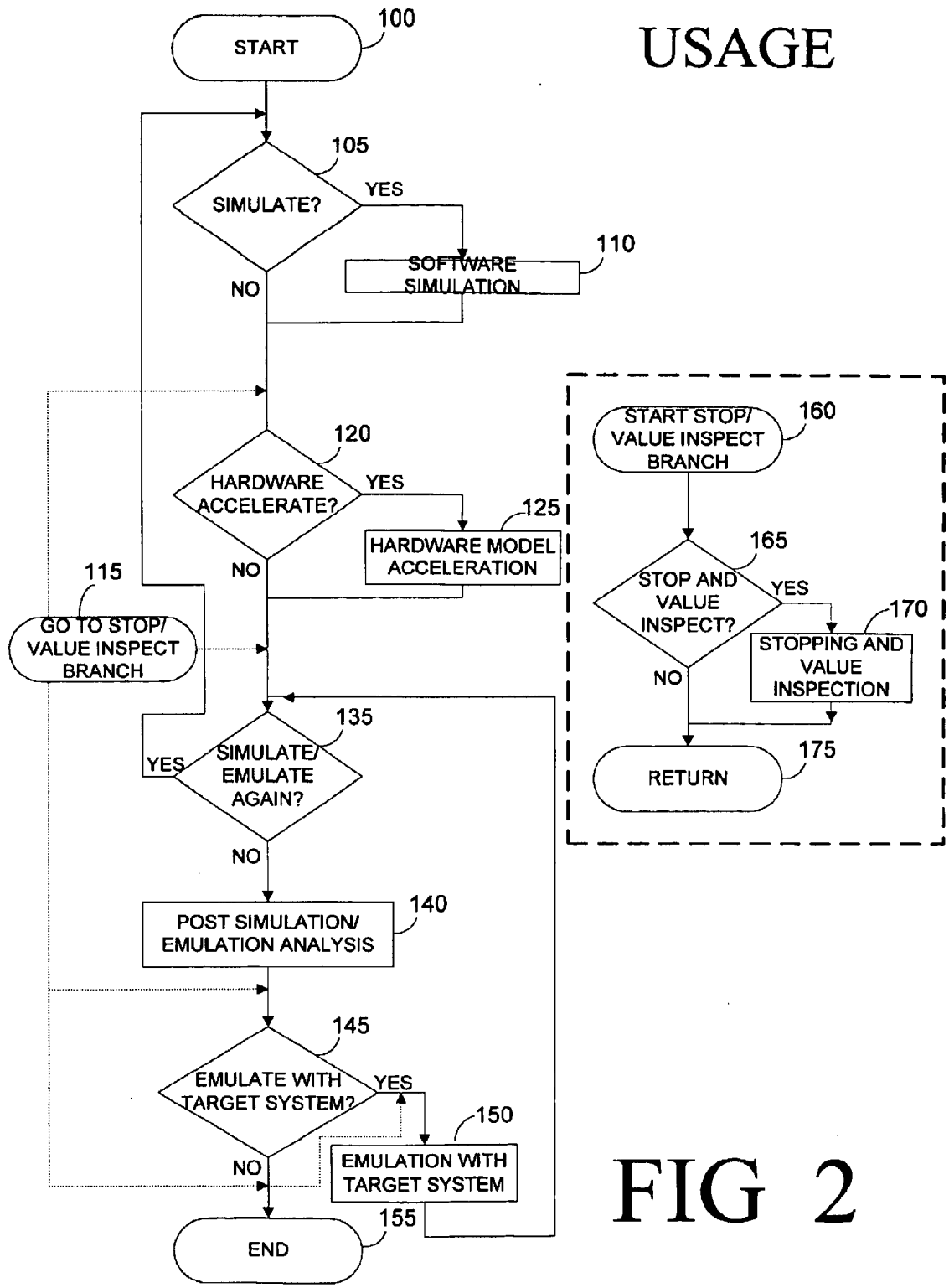
FIG. 2 shows one particular usage flow diagram of the present invention.

The use of this embodiment of the present invention is shown in the flow chart of FIG. 2. The algorithm starts at step 100. After loading the HDL file into the system, the system compiles, partitions, and maps the circuit design to appropriate hardware models. The compilation, partition, and mapping steps are discussed in more detail below.

Before the simulation runs, the system must run a reset sequence to remove all the unknown "x" values in software before the hardware acceleration model can function. One embodiment of the present invention uses a 2-bit wide data path to provide a 4-state value for the bus signal—"00" is logic low, "01" is logic high, "10" is "z," and "11" is "x." As known to those ordinarily skilled in the art, software models can deal with "0," "1," "x" (bus conflicts or unknown value), and "z" (no driver or high impedance). In contrast, hardware cannot deal with the unknown values "x," so the reset sequence, which varies depending on the particular applicable code, resets the register values to all "0" or all "1."

At step 105, the user decides whether to simulate the circuit design. Typically, a user will start the system with software simulation first. Thus, if the decision at step 105 resolves to "YES," software simulation occurs at step 110.

The user can stop the simulation to inspect values as shown in step 115. Indeed, the user can stop the simulation at any time during the test/debug session as shown by the dotted lines extending from step 115 to various nodes in the hardware acceleration mode, ICE mode, and post-simulation mode. Executing step 115 takes the user to step 160.

After stopping, the system kernel reads back the state of hardware register components to regenerate the entire software model, including the combinational components, if the user wants to inspect combinational component values. After restoring the entire software model, the user can inspect any signal value in the system. After stopping and inspection, the user can continue to run in simulation only mode or hardware model acceleration mode. As shown in the flow chart, step 115 branches to the stop/value inspect routine. The stop/value inspect routine starts at step 160. At step 165, the user must decide whether to stop the simulation at this point and inspect values. If step 165 resolves to "YES," step 170 stops the simulation that may be currently underway and inspects various values to check for correctness of the circuit design. At step 175, the algorithm returns to the point at which it branched, which is at step 115. Here, the user can continue to simulate and stop/inspect values for the remainder of the test/debug session or proceed forward to the in-circuit emulation step.

Similarly, if step 105 resolves to "NO," the algorithm will proceed to the hardware acceleration decision step 120. At step 120, the user decides whether to accelerate the test/debug process by accelerating the simulation through the hardware portion of the modeled circuit design. If the decision at step 120 resolves to "YES," then hardware model acceleration occurs at step 125. During the system compilation process, the SEmulation system mapped some portions into a hardware model. Here, when hardware acceleration is desired, the system moves register and combinational components into the hardware model and moves the input and evaluation values to the hardware model. Thus, during hardware acceleration, the evaluation occurs in the hardware model for a long time period at the accelerated speed. The kernel writes test-bench output to the hardware model, updates the software clock, then reads the hardware model output values cycle-by-cycle. If desired by the user, values from the entire software model of the user's circuit design, which is the entire circuit design, can be made available by outputting register values and combinational components by regenerating combinational components with the register values. Because of the need for software intervention to regenerate these combinational components, outputs of values for the entire software model are not provided at every cycle; rather, values are provided to the user only if the user wants such values. This specification will discuss the combinational component regeneration process later.

Again, the user can stop the hardware acceleration mode at any time as indicated by step 115. If the user wants to stop, the algorithm proceeds to steps 115 and 160 to branch to the stop/value inspect routine. Here, as in step 115, the user can stop the hardware accelerated simulation process at any time and inspect values resulting from the simulation process, or the user can continue with the hardware-accelerated simulation process. The stop/value inspect routine branches to steps 160, 165, 170, and 175, which were discussed above in the context of stopping the simulation. Returning to the main routine after step 125, the user can decide to continue with the hardware-accelerated simulation or perform pure simulation instead at step 135. If the user wants to simulate further, the algorithm proceeds to step 105. If not, the algorithm proceeds to the post-simulation analysis at step 140.

At step 140, the SEmulation system provides a number of post-simulation analysis features. The system logs all inputs to the hardware model. For hardware model outputs, the system logs all values of hardware register components at a user-defined logging frequency (e.g., 1/10,000 record/cycle). The logging frequency determines how often the output values are recorded. For a logging frequency of 1/10,000 record/cycle, output values are recorded once every 10,000 cycles. The higher the logging frequency, the more information is recorded for later post-simulation analysis. Because the selected logging frequency has a causal relationship to the SEmulation speed, the user selects the logging frequency with care. A higher logging frequency will decrease the SEmulation speed because the system must spend time and resources to record the output data by performing I/O operations to memory before further simulation can be performed.

With respect to the post-simulation analysis, the user selects a particular point at which simulation is desired. The user can then perform analysis after SEmulation by running the software simulation with input logs to the hardware model to compute the value changes and internal states of all hardware components. Note that the hardware accelerator is used to simulate the data from the selected logging point to analyze simulation results. This post-simulation analysis method can link to any simulation waveform viewer for post-simulation analysis. More detailed discussion will follow.

At step 145, the user can opt to emulate the simulated circuit design within its target system environment. If step 145 resolves to "NO," the algorithm ends and the SEmulation process ends at step 155. If emulation with the target system is desired, the algorithm proceeds to step 150. This step involves activating the emulation interface board, plugging the cable and chip pin adapter to the target system, and running the target system to obtain the system I/O from the target system. The system I/O from the target system includes signals between the target system and the emulation of the circuit design. The emulated circuit design receives input signals from the target system, processes these, sends them to the SEmulation system for further processing, and outputs the processed signals to the target system. Conversely, the emulated circuit design sends output signals to the target system, which processes these, and possibly outputs the processed signals back to the emulated circuit design. In this way, the performance of the circuit design can be evaluated in its natural target system environment. After the emulation with the target system, the user has results that validate the circuit design or reveal non-functional aspects. At this point, the user can simulate/emulate again as indicated at step 135, stop altogether to modify the circuit design, or proceed to integrated circuit fabrication based on the validated circuit design.

III. Simulation/hardware Acceleration Modes

Figure 3:
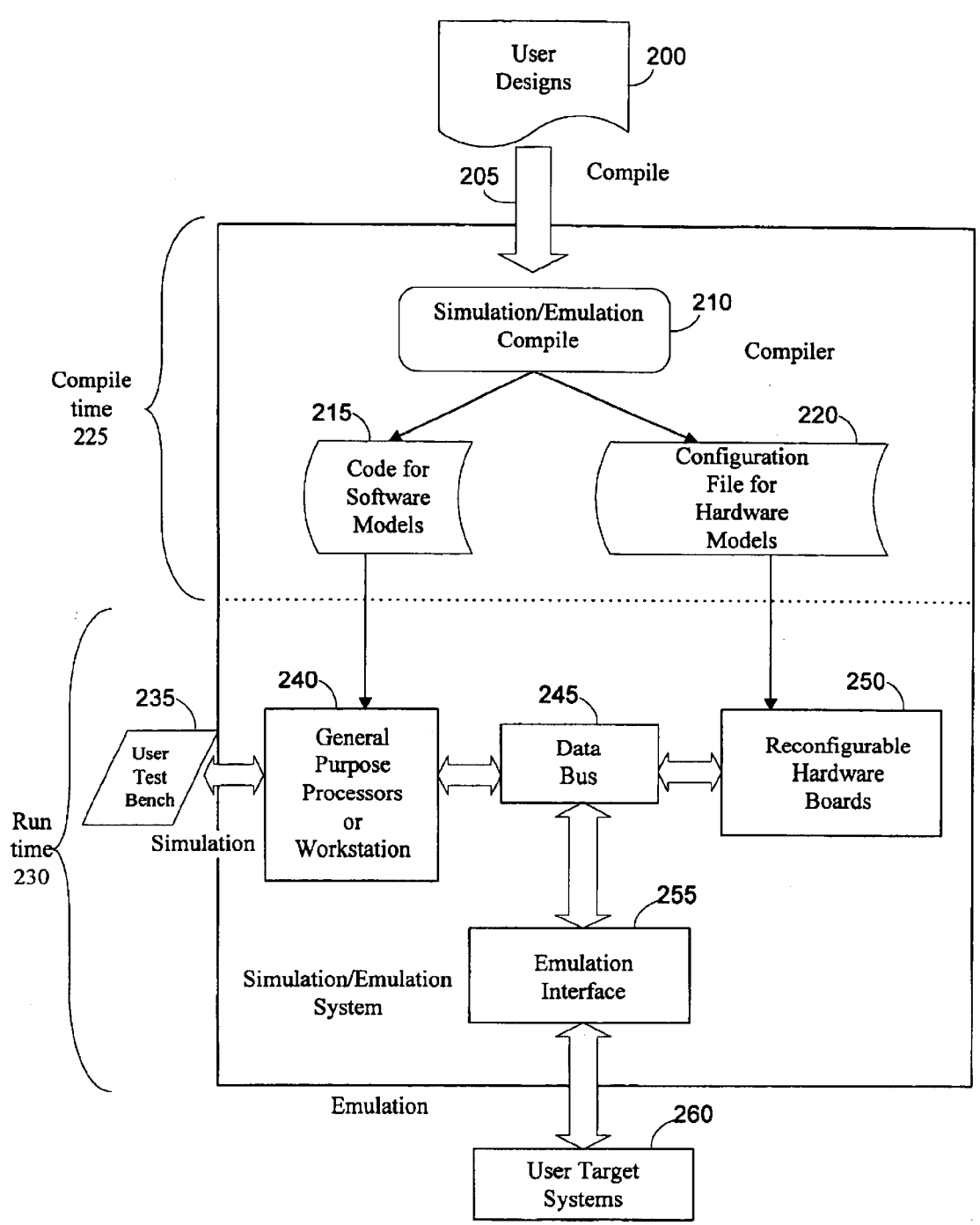
FIG. 3 shows a high level diagram of the software compilation and hardware configuration during compile time and run time in accordance with one embodiment of the present invention.

A high level diagram of the software compilation and hardware configuration during compile time and run time in accordance with one embodiment of the present invention is shown in FIG. 3. FIG. 3 shows two sets of information: one set of information distinguishes the operations performed during compile time and simulation/emulation run time; and the other set of information shows the partitioning between software models and hardware models. At the outset, the SEmulation system in accordance with one embodiment of the present invention needs the user circuit design as input data 200. The user circuit design is in some form of HDL file (e.g., Verilog, VHDL). The SEmulation system parses the HDL file so that behavior level code, register transfer level code, and gate level code can be reduced to a form usable by the SEmulation system. The system generates a source design database for front end processing step 205. The processed HDL file is now usable by the SEmulation system. The parsing process converts ASCII data to an internal binary data structure and is known to those ordinarily skilled in the art. Please refer to ALFRED V. AHO, RAVI SETHI, AND JEFFREY D. ULLMAN, COMPILERS: PRINCIPLES, TECHNIQUES, AND TOOLS (1988), which is incorporated by reference herein.

Compile time is represented by processes 225 and run time is represented by processes/elements 230. During compilation time as indicated by process 225, the SEmulation system compiles the processed HDL file by performing component type analysis. The component type analysis classifies HDL components into combinational components, register components, clock components, memory components, and test-bench components. Essentially, the system partitions the user circuit design into control and evaluation components.

The SEmulation compiler 210 essentially maps the control components of the simulation into software and the evaluation components into software and hardware. The compiler 210 generates a software model for all HDL components. The software model is cast in code 215. Additionally, the SEmulation compiler 210 uses the component type information of the HDL file, selects or generates hardware logic blocks/elements from a library or module generator, and generates a hardware model for certain HDL components. The end result is a so-called "bitstream" configuration file 220.

In preparation for run-time, the software model in code form is stored in main memory where the application program associated with the SEmulation program in accordance with one embodiment of the present invention is stored. This code is processed in the general purpose processor or workstation 240. Substantially concurrently, the configuration file 220 for the hardware model is used to map the user circuit design into the reconfigurable hardware boards 250. Here, those portions of the circuit design that have been modeled in hardware are mapped and partitioned into the FPGA chips in the reconfigurable hardware boards 250.

As explained above, user test-bench stimulus and test vector data as well as other test-bench resources 235 are applied to the general purpose processor or workstation 240 for simulation purposes. Furthermore, the user can perform emulation of the circuit design via software control. The reconfigurable hardware boards 250 contain the user's emulated circuit design. This SEmulation system has the ability to let the user selectively switch between software simulation and hardware emulation, as well as stop either the simulation or emulation process at any time, cycle-by-cycle, to inspect values from every component in the model, whether register or combinational. Thus, the SEmulation system passes data between the test-bench 235 and the processor/workstation 240 for simulation and the test-bench 235 and the reconfigurable hardware boards 250 via data bus 245 and processor/workstation 240 for emulation. If a user target system 260 is involved, emulation data can pass between the reconfigurable hardware boards 250 and the target system 260 via the emulation interface 255 and data bus 245. The kernel is found in the software simulation model in the memory of the processor/workstation 240 so data necessarily pass between the processor/workstation 240 and the reconfigurable hardware boards 250 via data bus 245.

Figure 4:
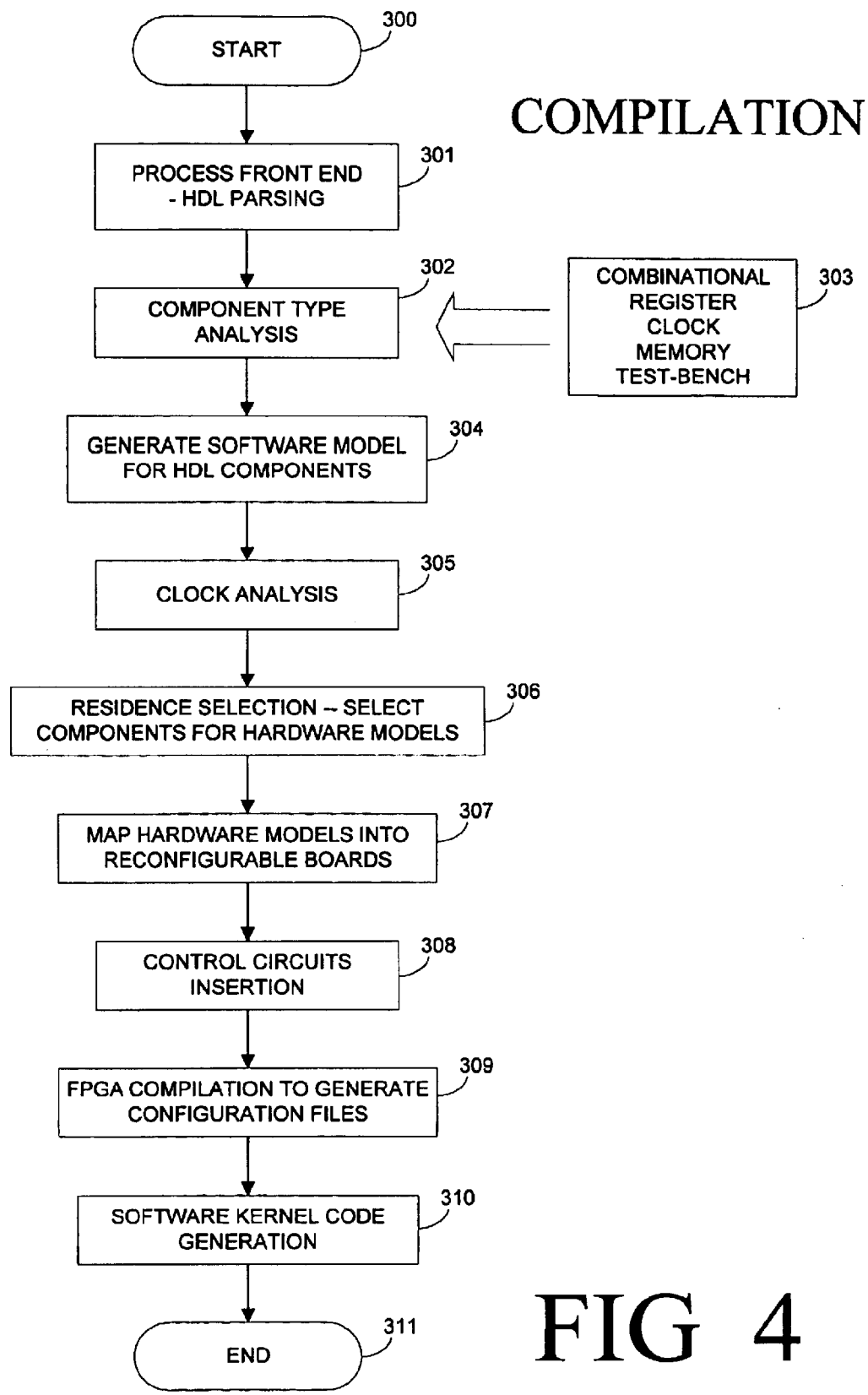
FIG. 4 shows a flow diagram of the compilation process, which includes generating the software/hardware models and the software kernel code.

FIG. 4 shows a flow chart of the compilation process in accordance with one embodiment of the present invention.

The compilation process is represented as processes 205 and 210 in FIG. 3. The compilation process in FIG. 4 starts at step 300. Step 301 processes the front end information. Here, gate level HDL code is generated. The user has converted the initial circuit design into HDL form by directly handwriting the code or using some form of schematic or synthesis tool to generate the gate level HDL representations of the code. The SEmulation system parses the HDL file (in ASCII format) into a binary format so that behavior level code, register transfer level (RTL) code, and gate level code can be reduced to an internal data structure form usable by the SEmulation system. The system generates a source design database containing the parsed HDL code.

Step 302 performs component type analysis by classifying HDL components into combinational components, register components, clock components, memory components, and test-bench components as shown in component type resource 303. The SEmulation system generates hardware models for register and combinational components, with some exceptions as discussed below. Test-bench and memory components are mapped in software. Some clock components (e.g., derived clocks) are modeled in hardware and others reside in the software/hardware boundary (e.g., software clocks).

Combinational components are stateless logic components whose output values are a function of current input values and do not depend on the history of input values. Examples of combinational components include primitive gates (e.g., AND, OR, XOR, NOT), selector, adder, multiplier, shifter, and bus drivers.

Register components are simple storage components. The state transition of a register is controlled by a clock signal. One form of register is edge-triggered which may change states when an edge is detected. Another form of register is a latch, which is level triggered. Examples include flip-flops (D-type, JK-type) and level-sensitive latches.

Clock components are components that deliver periodic signals to logic devices to control their behavior. Typically, clock signals control the update of registers. Primary clocks are generated from self-timed test-bench processes. For example, a typical test-bench process for clock generation in Verilog is as follows:

always begin

Clock=0;

5;

Clock=1;

5;

end;

According to this code, the clock signal is initially at logic "0." After 5 time units, the clock signal changes to logic "1." After 5 time units, the clock signal reverts back to logic "0." Usually, the primary clock signals are generated in software and only a few (i.e., 1–10) primary clocks are found in a typical user circuit design. Derived or gated clocks are generated from a network of combinational logic and registers that are in turn driven by the primary clocks. Many (i.e., 1,000 or more) derived clocks are found in a typical user circuit design.

Memory components are block storage components with address and control lines to access individual data in specific memory locations. Examples include ROM, asynchronous RAM, and synchronous RAM.

Test-bench components are software processes used to control and monitor the simulation processes. Accordingly, these components are not part of the hardware circuit design under test. Test-bench components control the simulation by generating clock signals, initializing simulation data, and reading simulation test vector patterns from disk/memory. Test-bench components also monitor the simulation by checking for changes in value, performing value change dump, checking asserted constraints on signal value relations, writing output test vectors to disk/memory, and interfacing with various waveform viewers and debuggers.

The SEmulation system performs component type analysis as follows. The system examines the binary source design database. Based on the source design database, the system can characterize or classify the elements as one of the above component types. Continuous assignment statements are classified as combinational components. Gate primitives are either combinational type or latch form of register type by language definition. Initialization code are treated as test-benches of initialization type.

An always process that drives nets without using the nets is a test-bench of driver type. An always process that reads nets without driving the nets is a test-bench of monitor type. An always process with delay controls or multiple event controls are test-benches of general type.

An always process with a single event control and driving a single net can be one of the following: (1) If the event control is edge-triggered event, then the process is an edge-triggered type register component. (2) If a net driven in a process is not defined in all possible execution paths, then the net is a latch type of register. (3) If a net driven in a process is defined in all possible execution paths, then the net is a combinational component.

An always process with a single event control but driving multiple nets can be decomposed into several processes driving each net separately to derive their respective component types separately. The decomposed processes can then be used to determine component type.

Step 304 generates a software model for all HDL components, regardless of component type. With the appropriate user interface, the user is capable of simulating the entire circuit design using the complete software model. Test-bench processes are used to drive the stimulus input, test vector patterns, control the overall simulation, and monitor the simulation process.

Step 305 performs clock analysis. The clock analysis includes two general steps: (1) clock extraction and sequential mapping, and (2) clock network analysis. The clock extraction and sequential mapping step includes mapping the user's register components into the SEmulation system's hardware register model and then extracting clock signals out of the system's hardware register components. The clock network analysis step includes determining primary clocks and derived clocks based on the extracted clock signals, and separating the gated clock network and gated data network. A more detailed description will be provided with respect to FIG. 16.

Step 306 performs residence selection. The system, in conjunction with the user, selects the components for hardware models; that is, of the universe of possible hardware components that can be implemented in the hardware model of the user's circuit design, some hardware components will not be modeled in hardware for a variety of reasons. These reasons include component types, hardware resource constraints (i.e., floating point operations and large multiply operations stay in software), simulation and communication overhead (i.e., small bridge logic between test-bench processes stay in software, and signals that are monitored by test-bench processes stay in software), and user preferences. For a variety of reasons including performance and simulation monitoring, the user can force certain components that would otherwise be modeled in hardware to stay in software.

Step 307 maps the selected hardware models into a reconfigurable hardware emulation board. In particular, step 307 maps takes the netlist and maps the circuit design into specific FPGA chips. This step involves grouping or clustering logic elements together. The system then assigns each group to a unique FPGA chip or several groups to a single FPGA chip. The system may also split groups to assign them to different FPGA chips. In general, the system assigns groups to FPGA chips. More detailed discussion will be provided below with respect to FIG. 6. The system places the hardware model components into a mesh of FPGA chips to minimize inter-chip communication overhead. In one embodiment, the array comprises a 4×4 array of FPGAs, a PCI interface unit, and a software clock control unit. The array of FPGAs implements a portion of the user's hardware circuit design, as determined above in steps 302–306 of this software compilation process. The PCI interface unit allows the reconfigurable hardware emulation model to communicate with the workstation via the PCI bus. The software clock avoids race conditions for the various clock signals to the array of FPGAs. Furthermore, step 307 routes the FPGA chips according to the communication schedule among the hardware models.

Step 308 inserts the control circuits. These control circuits include the I/O address pointers and data bus logic for communicating with the DMA engine to the simulator (discussed below with respect to FIGS. 11, 12, and 14), and the evaluation control logic to control hardware state transitions and wire multiplexing (discussed below with respect to FIGS. 19 and 20). As known to those ordinarily skilled in the art, a direct memory access (DMA) unit provides an additional data channel between peripherals and main memory in which the peripherals can directly access (i.e., read, write) the main memory without the intervention of the CPU. The address pointer in each FPGA chip allows data to move between the software model and the hardware model in light of the bus size limitations. The evaluation control logic is essentially a finite state machine that ensures that the clock enable inputs to registers to be asserted before the clock and data inputs enter these registers.

Step 309 generates the configuration files for mapping the hardware model to FPGA chips. In essence, step 309 assigns circuit design components to specific cells or gate level components in each chip. Whereas step 307 determines the mapping of hardware model groups to specific FPGA chips, step 309 takes this mapping result and generates a configuration file for each FPGA chip.

Step 310 generates the software kernel code. The kernel is a sequence of software code that controls the overall SEmulation system. The kernel cannot be generated until this point because portions of the code require updating and evaluating hardware components. Only after step 309 has the appropriate mapping to hardware models and FPGA chips occurred. More detailed discussion will be provided below with respect to FIG. 5. The compilation ends at step 311.

As mentioned above with respect to FIG. 4, the software kernel code is generated in step 310 after the software and hardware models have been determined. The kernel is a piece of software in the SEmulation system that controls the operation of the overall system. The kernel controls the execution of the software simulation as well as the hardware emulation. Because the kernel also resides in the center of the hardware model, the simulator is integrated with the emulator. In contrast to other known co-simulation systems, the SEmulation system in accordance with one embodiment of the present invention does not require the simulator to interact with the emulator from the outside. One embodiment of the kernel is a control loop shown in FIG. 5.

Figure 5:
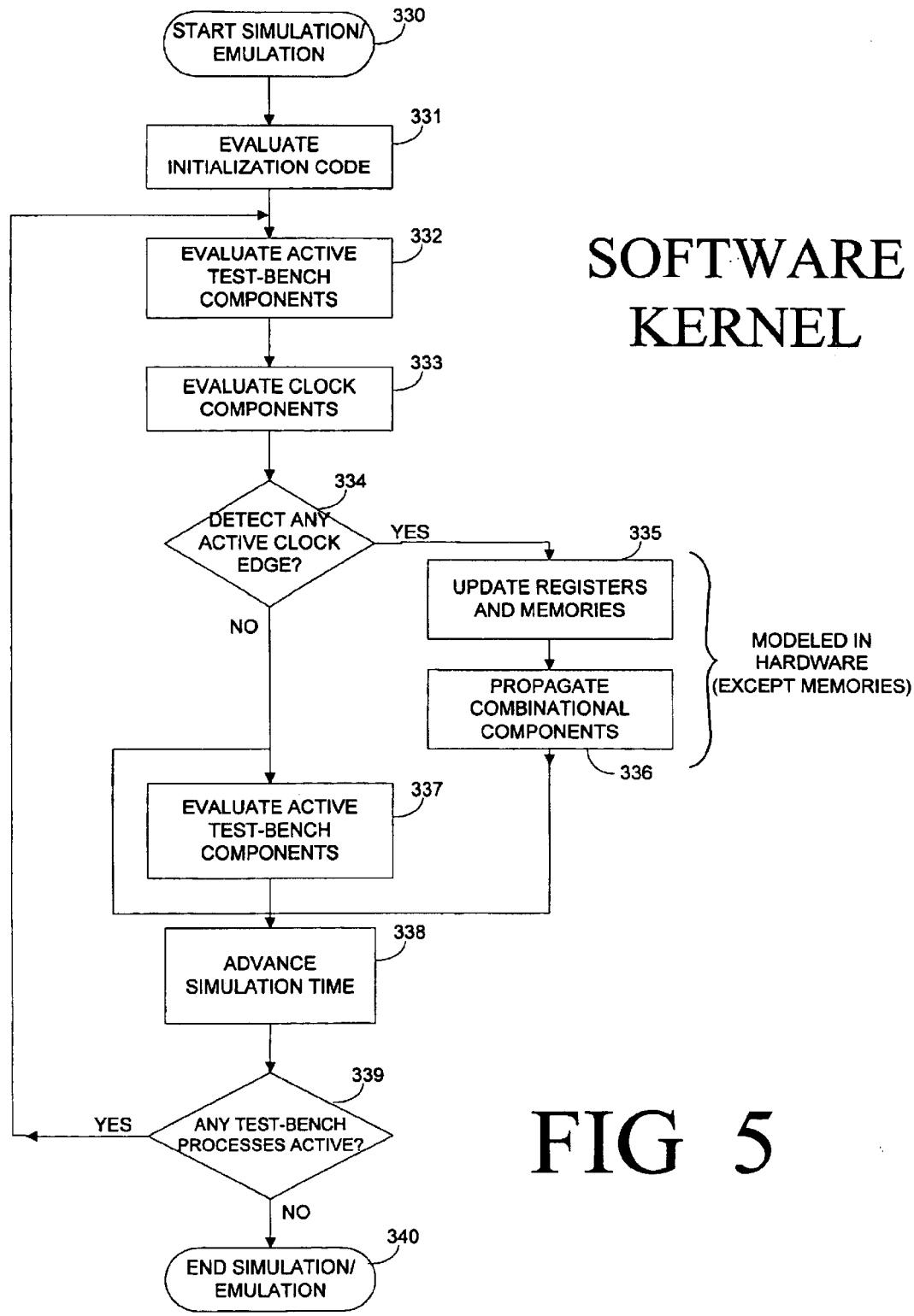
FIG. 5 shows the software kernel that controls the overall SEmulation system.

Referring to FIG. 5, the kernel begins at step 330. Step 331 evaluates the initialization code. Beginning at step 332 and bounded by the decision step 339, the control loop begins and cycles repeatedly until the system observes no active test-bench processes, in which case the simulation or emulation session has completed. Step 332 evaluates the active test-bench components for the simulation or emulation.

Step 333 evaluates clock components. These clock components are from the test-bench process. Usually, the user dictates what type of clock signal will be generated to the simulation system. In one example (discussed above with respect to component type analysis and reproduced here), a clock component as designed by a user in the test-bench process is as follows:

always begin

Clock=0;

5;

Clock=1;

end;

The user has decided, in this clock component example, that a logic "0" signal will be generated first, and then after 5 simulation times later, a logic "1" signal will be generated. This clock generation process will cycle continuously until stopped by the user. These simulation times are advanced by the kernel.

Decision step 334 inquires whether any active clock edge is detected, which would result in some kind of logic evaluation in the software and possible hardware model (if emulation is running). The clock signal, which the kernel uses to detect an active clock edge, is the clock signal from the test-bench process. If the decision step 334 evaluates to "NO," then the kernel proceeds to step 337. If the decision step 334 evaluates to "YES," resulting in step 335 updating registers and memories, and step 336 propagating combinational components. Step 336 essentially takes care of combinational logic which needs some time to propagate values through the combinational logic network after a clock signal has been asserted. Once the values have propagated through the combinational components and stabilized, the kernel proceeds to step 337.

Note that registers and combinational components are also modeled in hardware and thus, the kernel controls the emulator portion of the SEmulation system. Indeed, the kernel can accelerate the evaluation of the hardware model in steps 334 and 335 whenever any active clock edge is detected. Hence, unlike the prior art, the SEmulation system in accordance with one embodiment of the present invention can accelerate the hardware emulator through the software kernel and based on component type (e.g., register, combinational). Furthermore, the kernel controls the execution of the software and hardware model cycle by cycle. In essence, the emulator hardware model can be characterized as a simulation coprocessor to the general-purpose processor running the simulation kernel. The coprocessor speeds up the simulation task.

Step 337 evaluates active test-bench components. Step 338 advances the simulation time. Step 339 provides the boundary for the control loop that begins at step 332. Step 339 determines whether any test-bench processes are active. If so, the simulation and/or emulation is still running and more data should be evaluated. Thus, the kernel loops to step 332 to evaluate any active test-bench components. If no test-bench processes are active, then the simulation and emulation processes have completed. Step 340 ends the simulation/emulation process. In sum, the kernel is the main control loop that controls the operation of the overall SEmulation system. So long as any test-bench processes are active, the kernel evaluates active test-bench components, evaluates clocks components, detects clock edges to update registers and memories as well as propagate combinational logic data, and advances the simulation time.

Figure 6:
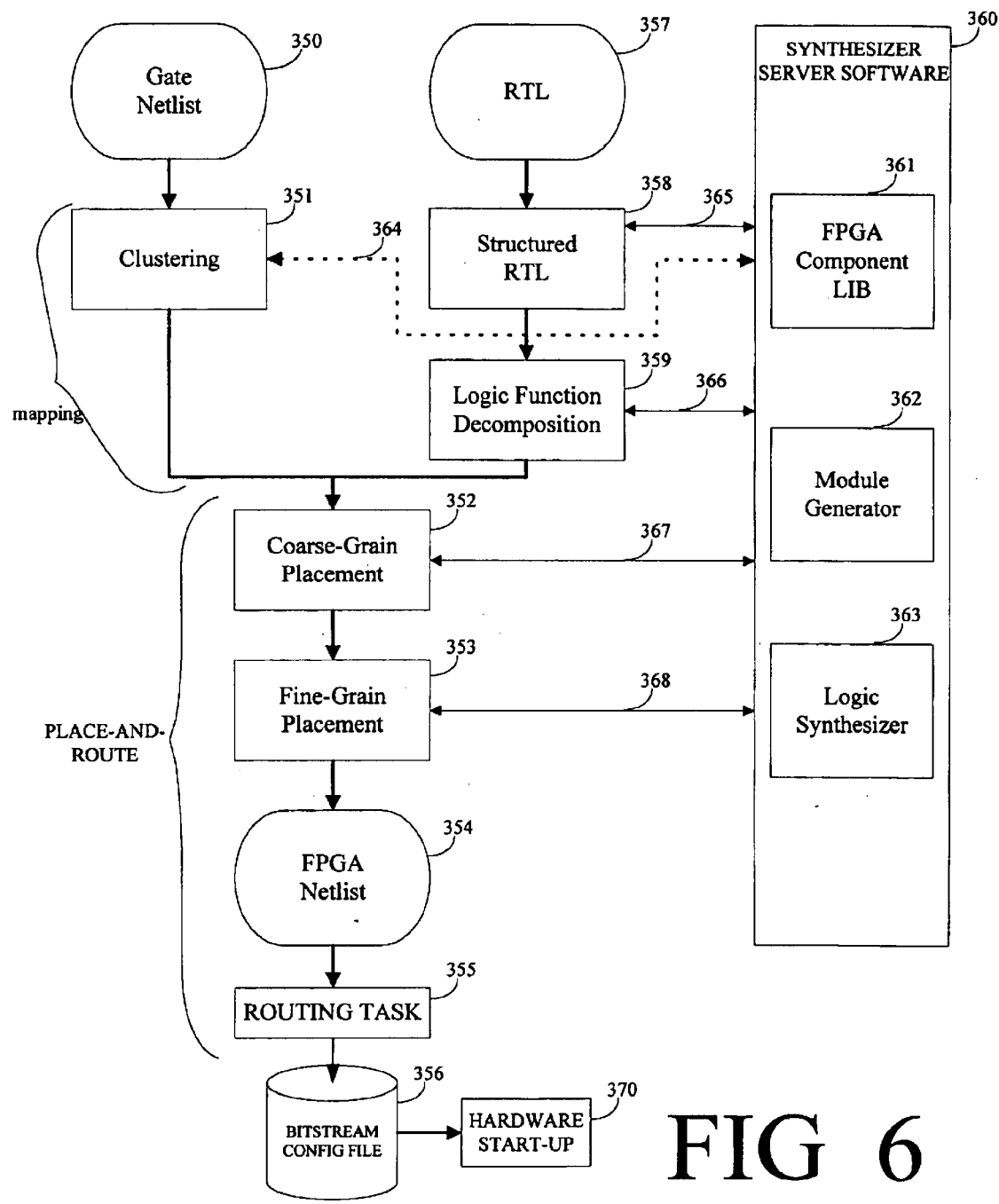
FIG. 6 shows a method of mapping hardware models to reconfigurable boards through mapping, placement, and routing.

FIG. 6 shows one embodiment of a method of automatically mapping hardware models to reconfigurable boards. A netlist file provides the input to the hardware implementation process. The netlist describes logic functions and their interconnections. The hardware model-to-FPGA implementation process includes three independent tasks: mapping, placement, and routing. The tools are generally referred to as "place-and-route" tools. The design tool used may be Viewlogic Viewdraw, a schematic capture system, and Xilinx Xact place and route software, or Altera's MAX+PLUS II system.

The mapping task partitions the circuit design into the logic blocks, I/O blocks, and other FPGA resources. Although some logic functions such as flip-flops and buffers may map directly into the corresponding FPGA resource, other logic functions such as combinational logic must be implemented in logic blocks using mapping algorithms. The user can usually select mapping for optimal density or optimal performance.

The placement task involves taking the logic and I/O blocks from the mapping task and assigning them to physical locations within the FPGA array. Current FPGA tools generally use some combination of three techniques: mincut, simulating annealing, and general force-directed relaxation (GFDR). These techniques essentially determine optimal placement based on various cost functions which depend on total net length of interconnections or the delay along a set of critical signal paths, among other variables. The Xilinx XC4000 series FPGA tools use a variation of the mincut technique for initial placement followed by a GFDR technique for fine improvement in the placement.

The routing task involves determining the routing paths used to interconnect the various mapped and placed blocks. One such router, called a maze router, seeks the shortest path between two points. Since the routing task provides for direct interconnection among the chips, the placement of the circuits with respect to the chips is critical.

At the outset, the hardware model can be described in either gate netlist 350 or RTL 357. The RTL level code can be further synthesized to gate level netlist. During the mapping process, a synthesizer server 360, such as the Altera MAX+PLUS II programmable logic development tool system and software, can be used to produce output files for mapping purposes. The synthesizer server 360 has the ability to match the user's circuit design components to any standard existing logic elements found in a library 361 (e.g., standard adders or standard multipliers), generate any parameterized and frequently used logic module 362 (e.g., non-standard multiplexers or non-standard adders), and synthesize random logic elements 363 (e.g., look-up table-based logic that implements a customized logic function). The synthesizer server also removes redundant logic and unused logic. The output files essentially synthesize or optimize the logic required by the user's circuit design.

When some or the HDL is at the RTL level, the circuit design components are at a high enough level such that the SEmulation system can easily model these components using SEmulation registers or components. When some or all of the HDL is at the gate netlist level, the circuit design components may be more circuit design-specific, making the mapping of user circuit design components to SEmulation components more difficult. Accordingly, the synthesizer server is capable of generating any logic element based on variations of standard logic elements or random logic elements that may not have any parallels in these variations or library standard logic elements.

If the circuit design is in gate netlist form, the SEmulation system will initially perform the grouping or clustering operation 351. The hardware model construction is based on the clustering process because the combinational logic and registers are separated from the clock. Thus, logic elements that share a common primary clock or gated clock signal may be better served by grouping them together and placed on a chip together. The clustering algorithm is based on connectivity driven, hierarchical extraction, and regular structure extraction. If the description is in structured RTL 358, the SEmulation system can decompose the function into smaller units as represented by the logic function decomposition operation 359. At any stage, if logic synthesis or logic optimization is required, a synthesizer server 360 is available to transform the circuit design to a more efficient representation based on user directives. For the clustering operation 351, the link to the synthesizer server is represented by dotted arrow 364. For the structured RTL 358, the link to the synthesizer server 360 is represented by arrow 365. For the logic function decomposition operation 359, the link to the synthesizer server 360 is represented by arrow 366.

The clustering operation 351 groups the logic components together in a selective manner based on function and size. The clustering may involve only one cluster for a small circuit design or several clusters for a large circuit design. Regardless, these clusters of logic elements will be used in later steps to map them into the designated FPGA chips; that is, one cluster will be targeted for a particular chip and another cluster will be targeted for a different chip or possibly the same chip as the first cluster. Usually, the logic elements in a cluster will stay together with the cluster in a chip, but for optimization purposes, a cluster may have to be split up into more than one chip.

After the clusters are formed in the clustering operation 351, the system performs a place-and-route operation. Initially, a coarse-grain placement operation 352 of the clusters into the FPGA chips is performed. The coarse-grain placement operation 352 initially places clusters of logic elements to selected FPGA chips. If necessary, the system makes the synthesizer server 360 available to the coarse-grain placement operation 352 as represented by arrow 367. A fine-grain placement operation is performed after the coarse-grain placement operation to fine-tune the initial placement. The SEmulation system uses a cost function based on pin usage requirements, gate usage requirements, and gate-to-gate hops to determine the optimal placement for both the coarse-grain and fine-grain placement operations.

Figure 8:
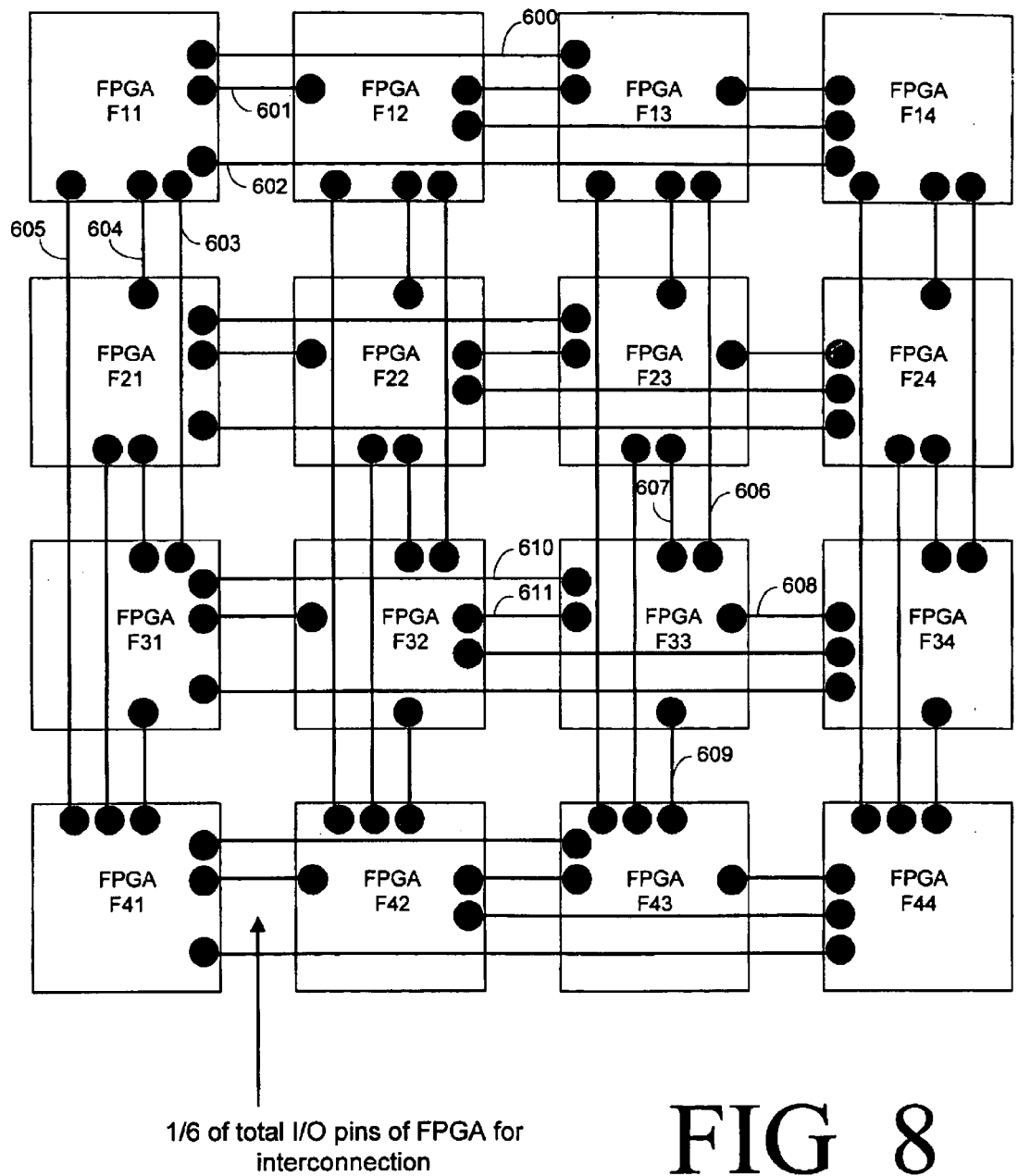
FIG. 8 shows one embodiment of the 4×4 FPGA array and their interconnections.

The determination of how clusters are placed in certain chips is based on placement cost, which is calculated through a cost function f(P, G, D) for two or more circuits (i.e., CKTQ=CKT1, CKT2, . . . , CKTN) and their respective locations in the array of FPGA chips, where P is generally the pin usage/availability, G is generally the gate usage/availability, and D is the distance or number of gate-to-gate "hops" as defined by a connectivity matrix M (shown in FIG. 7 in conjunction with FIG. 8). The user's circuit design that is modeled in the hardware model comprises the total combination of circuits CKTQ. Each cost function is defined such that the computed values of the calculated placement cost tend to generally promote: (1) a minimum number of "hops" between any two circuits CKTN-1 and CKTN in the FPGA array, and (2) placement of circuits CKTN-1 and CKTN in the FPGA array such that pin usage is minimized.

In one embodiment, the cost function F(P, G, D) is defined as:

$$f(P, G, D) = \left[C0 * \text{MAX}_{\text{each\_FPGA\_chip}}\left(\frac{P_{used}}{P_{available}}\right)\right] +$$
$$\left[C1 * \text{MAX}_{\text{each\_FPGA\_chip}}\left(\frac{G_{used}}{G_{available}}\right)\right] +$$
$$\left[C2 * \sum_{(i,j) \in CKT} DIST(FPGA_i, FPGA_j)\right]$$

This equation can be simplified to the form:

$$f(P,G,D)=C0*P+C1*G+C2*D$$

The first term (i.e., C0*P) generates a first placement cost value based on the number of pins used and the number pins available. The second term (i.e., C1*G) generates a second placement cost value based on the number of gates used and the number of gates available. The third term (i.e., C2*D) generates a placement cost value based on the number of hops present between various interconnecting gates in the circuits CKTQ (i.e., CKT1, CKT2, . . . , CKTN). The overall placement cost value is generated by iteratively summing these three placement cost values. Constants C0, C1, and C2 represent weighting constants that selectively skew the overall placement cost value generated from this cost function toward the factor or factors (i.e., pin usage, gate usage, or gate-to-gate hops) that is/are most important during any iterative placement cost calculation.

The placement cost is calculated repeatedly as the system selects different relative values for the weighting constants C0, C1, and C2. Thus, in one embodiment, during the coarse-grain placement operation, the system selects large values for C0 and C1 relative to C2. In this iteration, the system determines that optimizing pin usage/availability and gate usage/availability are more important than optimizing gate-to-gate hops in the initial placement of the circuits CKTQ in the array of FPGA chips. In a subsequent iteration, the system selects small values for C0 and C1 relative to C2. In this iteration, the system determines that optimizing gate-to-gate hops is more important than optimizing pin usage/availability and gate usage/availability.

During the fine-grain placement operation, the system uses the same cost function. In one embodiment, the iterative steps with respect to the selection of C0, C1, and C2 are the same as for the coarse-grain operation. In another embodiment, the fine-grain placement operation involves having the system select small values for C0 and C1 relative to C2.

An explanation of these variables and equations will now be discussed. In determining whether to place certain circuits CKTQ in FPGA chip x or FPGA chip y (among other FPGA chips), the cost function examines pin usage/availability (P), gate usage/availability (G), and gate-to-gate hops (D). Based on the cost function variables, P, G, and D, the cost function f(P, G, D) generates a placement cost value for placing circuits CKTQ in particular locations in the FPGA array.

Pin usage/availability P also represents the I/O capacity. $P_{used}$ is the number of used pins by the circuits CKTQ for each FPGA chip. $P_{available}$ is the number of available pins in the FPGA chip. In one embodiment, is $P_{available}$ is 264 (44 pins×6 interconnections/chip), while in another embodiment, $P_{available}$ is 265 (44 pins×6 interconnections/chip+1 extra pin). However, the specific number of available pins depends on the type of FPGA chip used, the total number of interconnections used per chip, and the number of pins used for each interconnection. Thus, $P_{available}$ can vary considerably. So, to evaluate the first term of the cost function F(P, G, D) equation (i.e., C0*P), the ratio $P_{used}/P_{available}$ is calculated for each FPGA chip. Thus, for a 4×4 array of FPGA chips, sixteen ratios $P_{used}/P_{available}$ are calculated. The more pins are used for a given number of available pins, the higher the ratio. Of the sixteen calculated ratios, the ratio yielding the highest number is selected. The first placement cost value is calculated from the first term C0*P by multiplying the selected maximum ratio $P_{used}/P_{available}$ with the weighting constant C0. Because this first term depends on the calculated ratio $P_{used/Pavailable}$ and the particular maximum ratio among the ratios calculated for each FPGA chip, the placement cost value will be higher for higher pin usage, all other factors being equal. The system selects the placement yielding the lowest placement cost. The particular placement yielding a maximum ratio $P_{used}/P_{available}$ that is the lowest among all the maximums calculated for various placements is generally considered as the optimum placement in the FPGA array, all other factors being equal.

The gate usage/availability G is based on the number of gates allowable by each FPGA chip. In one embodiment, based on the location of the circuits CKTQ in the array, if the number of gates used $G_{used}$ in each chip is above a certain threshold, then this second placement cost (C1*G) will be assigned a value indicating that the placement is not feasible. Analogously, if the number of gates used in each chip containing circuits CKTQ is at or below a certain threshold, then this second term (C1*G) will be assigned a value indicating that the placement is feasible. Thus, if the system initially wants to place circuit CKT1 in a particular chip and that chip does not have enough gates to accommodate the circuit CKT1, then the system may conclude through the cost function that this particular placement is infeasible. Generally, the high number (e.g., infinity) for G ensures that the cost function will generate a high placement cost value indicating that the desired placement of the circuits CKTQ is not feasible and that an alternative placement should be determined.

In another embodiment, based on the location of the circuits CKTQ in the array, the ratio $G_{used}/G_{available}$ is calculated for each chip, where $G_{used}$ is the number of gates used by the circuits CKTQ in each FPGA chip, and $G_{available}$ is the number of gates available in each chip. In one embodiment, the system uses the FLEX 10K100 chip for the FPGA array. The FLEX 10K100 chip contains approximately 100,000 gates. Thus, in this embodiment, $G_{available}$ is equal to 100,000 gates. Thus, for a 4×4 array of FPGA chips, sixteen ratios $G_{used}/G_{available}$ are calculated. The more gates are used for a given number of available gates, the higher the ratio. Of the sixteen calculated ratios, the ratio yielding the highest number is selected. The second placement cost value is calculated from the second term C1*G by multiplying the selected maximum ratio $G_{used}/G_{available}$ with the weighting constant C1. Because this second term depends on the calculated ratio $G_{used}/G_{available}$ and the particular maximum ratio among the ratios calculated for each FPGA chip, the placement cost value will be higher for higher gate usage, all other factors being equal. The system selects the circuit placement yielding the lowest placement cost. The particular placement yielding a maximum ratio $G_{used}/G_{available}$ that is the lowest among all the maximums calculated for various placements is generally considered as the optimum placement in the FPGA array, all other factors being equal.

In another embodiment, the system selects some value for C1 initially. If the ratio $G_{used}/G_{available}$ is greater than "1," then this particular placement is infeasible (i.e., at least one chip does not have enough gates for this particular placement of circuits). As a result, the system modifies C1 with a very high number (e.g., infinity) and accordingly, the second term C1*G will also be a very high number and the overall placement cost value f(P, G, D) will also be very high. If, on the other hand, the ratio $G_{used}/G_{available}$ is less than or equal to "1," then this particular placement is feasible (i.e., each chip has enough gates to support the circuit implementation). As a result, the system does not modify C1 and accordingly, the second term C1*G will resolve to a particular number.

The third term C2*D represents the number of hops between all gates that require. interconnection. The number of hops also depends on the interconnection matrix. The connectivity matrix provides the foundation for determining circuit paths between any two gates that need chip-to-chip interconnection. Not every gate needs the gate-to-gate interconnection. Based on the user's original circuit design and the partitioning of clusters to certain chips, some gates will not need any interconnection whatsoever because the logic element(s) connected to their respective input(s) and output(s) is/are located in the same chip. Other gates, however, need the interconnections because the logic element(s) connected to their respective input(s) and output(s) is/are located in different chips.

To understand "hops," refer to the connectivity matrix shown in tabular form in FIG. 7 and in pictorial form in FIG. 8. In FIG. 8, each interconnection between chips, such as interconnection 602 between chip F11 and chip F14, represents 44 pins or 44 wire lines. In other embodiments, each interconnection represents more than 44 pins. In still other embodiments, each interconnection represents less than 44 pins.

Using this interconnection scheme, data can pass from one chip to another chip within two "hops" or "jumps." Thus, data can pass from chip F11 to chip F12 in one hop via interconnection 601, and data can pass from chip F11 to chip F33 in two hops via either interconnections 600 and 606, or interconnections 603 and 610. These exemplary hops are the shortest path hops between these sets of chips. In some instances, signals may be routed through various chips such that the number of hops between a gate in one chip and a gate in another chip exceeds the shortest path hop. The only circuit paths that must be examined in determining the number of gate-to-gate hops are the ones that need the interconnections.

The connectivity is represented by the sum of all hops between the gates that need the inter-chip interconnections. The shortest path between any two chips can be represented by one or two "hops" using the connectivity matrix of FIGS. 7 and 8. However, for certain hardware model implementations, I/O capacity may limit the number of direct shortest path connections between any two gates in the array and hence, these signals must be routed through longer paths (and therefore more than two hops) to reach their destinations. Accordingly, the number of hops may exceed two for some gate-to-gate connections. Generally, all things being equal, a smaller number of hops results in a smaller placement cost.

The third term (i.e., C2*D) is reproduced in long form as follows:

$$f(P, G, D) = \ldots \left[ C2 * \sum_{(i,j) \in CKT} \text{DIST}(FPGA_i, FPGA_j) \right]$$

This third term is the product of a weighting constant C2 and a summation component (Σ . . . ). The summation component is essentially the sum of all hops between each gate i and gate j in the user's circuit design that require chip-to-chip interconnections. As discussed above, not all gates need inter-chip interconnections. For those gates i and gates j that need inter-chip interconnections, the number of hops is determined. For all gates i and gates j, the total number of hops is added together.

The distance calculation can also be defined as:

$$\underset{(i,j) \in CKT}{\text{DIST}}(FPGA_i, FPGA_j) = \min_k (M_{i,j}^k = 1)$$

Here, M is the connectivity matrix. One embodiment of the connectivity matrix is shown in FIG. 7. The distance is calculated for each gate-to-gate connection requiring an interconnection. Thus, for each gate i and gate j comparison, the connectivity matrix M is examined. More specifically, $$M_{i,j}^k = \bigcup_{\forall k} (m_{i,l} \cap m_{l,j})$$

A matrix is set up with all chips in the array such that each chip is identifiably numbered. These identifying numbers are set up at the top of the matrix as a column header. Similarly, these identifying numbers are set up along the side of the matrix as a row header. A particular entry at the intersection of a row and column in this matrix provides the direct connectivity data between the chip identified by the row and the chip identified by the column at which the intersections occur. For any distance calculation between chip i and chip j, an entry in the matrix $M_{ij}$ contains either a "1" for a direct connection or "0" for no direct connection. The index k refers to the number of hops necessary to interconnect any gate in chip i to any gate in chip j requiring the interconnections.

Initially, the connectivity matrix $M_{ij}$ for k=1 should be examined. If the entry is "1," a direct connection exists for this gate in chip i to the selected gate in chip j. Thus, the index or hop k=1 is designated as the result of $M_{ij}$ and this result is the distance between these two gates. At this point, another gate-to-gate connection can be examined. However, if the entry is "0," then no direct connection exists.

If no direct connection exists, the next k should be examined. This new k (i.e., k=2) can be computed by multiplying matrix $M_{ij}$ with itself; in other words, $M^2=M*M$, where k=2.

This process of multiplying M to itself until the particular row and column entry for chip i and chip j continues until the calculated result is "1" at which point the index k is selected as the number of hop. The operation includes ANDing matrices M together and then ORing the ANDed results. If the AND operation between matrix $m_{i,l}$ and $m_{l,j}$ results in a logic "1" value, then a connection exists between a selected gate in chip i and a selected gate in chip j through any chip 1 within hop k; if not, no connection exists within this particular hop k and further calculation is necessary. The matrices $m_{i,l}$ and $m_{l,j}$ are the connectivity matrix M as defined for this hardware modeling. For any given gate i and gate j requiring the interconnections, the row containing the FPGA chip for gate i in matrix $m_{i,l}$ is logically ANDed to the column containing the FPGA chip for gate j and $m_{l,j}$. The individual ANDed components are ORed to determine if the resulting $M_{i,j}$ value for index or hop k is a "1," or "0." If the result is a "1," then a connection exists and the index k is designated as the number of hops. If the result is "0," then no connection exists.

The following example illustrates these principles. Refer to FIGS. 35(A) to 35(D). FIG. 35(A) shows a user's circuit design represented as a cloud 1090. This circuit design 1090 may be simple or complex. A portion of the circuit design 1090 includes an OR gate 1091 and two AND gates 1092 and 1093. The outputs of AND gates 1092 and 1093 are coupled to the inputs of OR gate 1091. These gates 1091, 1092, and 1093 may also be coupled to other portions of the circuit design 1090.

Referring to FIG. 35(B), the components of this circuit 1090, including the portion containing the three gates 1091, 1092, and 1093, may be configured and placed in FPGA chips 1094, 1095, and 1096. This particular exemplary array of FPGA chips has the interconnection scheme as shown; that is, a set of interconnections 1097 couple chip 1094 to chip 1095, and another set of interconnections 1098 couple chip 1095 to chip 1096. No direct interconnections are provided between chip 1094 and chip 1096. When placing the components of this circuit design 1090 into chips, the system uses the pre-designed interconnection scheme to connect circuit paths across different chips.

Referring to FIG. 35(C), one possible configuration and placement is OR gate 1091 placed in chip 1094, AND gate 1092 placed in chip 1095, and AND gate 1093 placed in chip 1096. Other portions of the circuit 1090 are not shown for pedagogic purposes. The connection between OR gate 1091 and AND gate 1092 requires an interconnection because they are located in different chips so the set of interconnections 1097 is used. The number of hops for this interconnection is "1." The connection between OR gate 1091 and AND gate 1093 also requires interconnections so sets of interconnections 1097 and 1098 are used. The number of hops is "2." For this placement example, the total number of hops is "3," discounting the contribution from other gates and their interconnections in the remainder of circuit 1090 that are not shown.

FIG. 35(D) shows another placement example. Here, OR gate 1091 is placed in chip 1094, and AND gates 1092 and 1093 are placed in chip 1095. Again, other portions of the circuit 1090 are not shown for pedagogic purposes. The connection between OR gate 1091 and AND gate 1092 requires an interconnection because they are located in different chips so the set of interconnections 1097 is used. The number of hops for this interconnection is "1." The connection between OR gate 1091 and AND gate 1093 also requires interconnections so the set of interconnections 1097 is used. The number of hops is also "1." For this placement example, the total number of hops is "2," discounting the contribution from other gates and their interconnections in the remainder of circuit 1090 that are not shown. So, on the basis of the distance D parameter only and assuming all other factors are equal, the cost function calculates a lower cost function for the placement example of FIG. 35(D) than the placement example of FIG. 35(C). However, all other factors are not equal. More than likely, the cost function for FIG. 35(D) is also based on the gate usage/availability G. In FIG. 35(D), one more gate is used in chip 1095 than that used in the same chip in FIG. 35(C). Furthermore, the pin usage/availability P for chip 1095 in the placement example illustrated in FIG. 35(C) is greater than the pin usage/availability for the same chip in the other placement example illustrated in FIG. 35(D)).

After the coarse-grain placement, a fine tuning of the placement of the flattened clusters will further optimize the placement result. This fine-grain placement operation 353 refines the placement initially selected by the coarse-grain placement operation 352. Here, initial clusters may be split up if such an arrangement will increase the optimization. For example, assume logic elements X and Y are originally part of cluster A and designated for FPGA chip 1. Due to the fine-grain placement operation 353, logic elements X and Y may now be designated as a separate cluster B or made part of another cluster C and designated for placement in FPGA chip 2. An FPGA netlist 354, which ties the user's circuit design to specific FPGAs, is then generated.

The determination of how clusters are split up and placed in certain chips is also based on placement cost, which is calculated through a cost function f(P, G, D) for circuits CKTQ. In one embodiment, the cost function used for the fine-grain placement process is the same as the cost function used for the coarse-grain placement process. The only difference between the two placement processes is the size of the clusters placed, not in the processes themselves. The coarse-grain placement-process uses larger clusters than the fine-grain placement process. In other embodiments, the cost functions for the coarse-grain and fine-grain placement processes are different from each other, as described above with respect to selecting weighting constants C0, C1, and C2.

Figure 9:
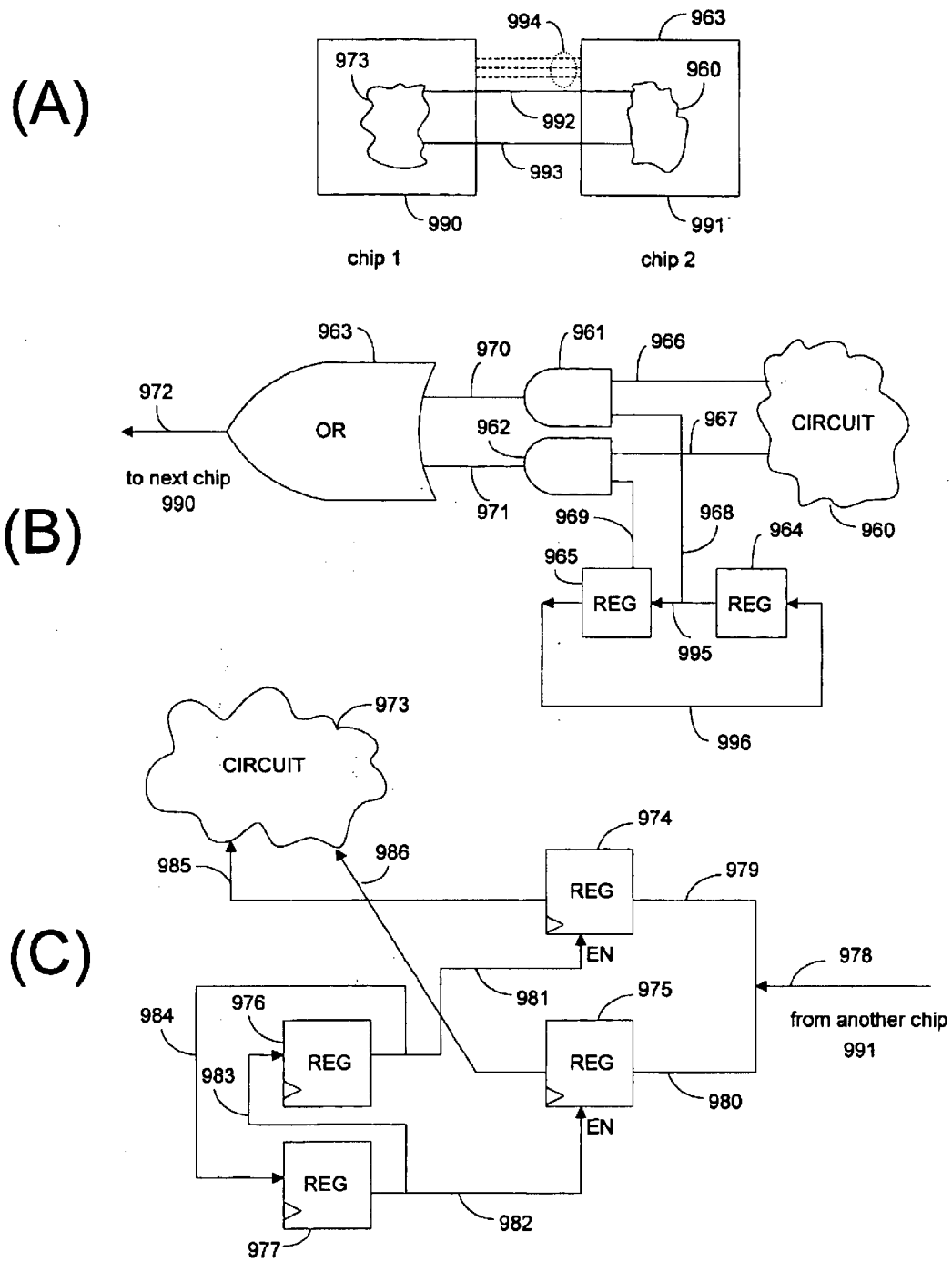
FIGS. 9(A), 9(B), and 9(C) illustrate one embodiment of the time division multiplexed (TDM) circuit which allows a group of wires to be coupled together in a time multiplexed fashion so that one pin, instead of a plurality of pins, can be used for this group of wires in a chip.

Once the placement is complete, a routing task 355 among the chips is performed. If the number of routing wires to connect circuits located in different chips exceeds the available pins in these FPGA chips allocated for the circuit-to-circuit routing, time division multiplex (TDM) circuits can be used. For example, if each FPGA chip allows only 44 pins for connecting circuits located in two different FPGA chips, and a particular model implementation requires 45 wires between chips, a special time division multiplex circuit will also be implemented in each chip. This special TDM circuit couples at least two of the wires together. One embodiment of the TDM circuit is shown in FIGS. 9(A), 9(B), and 9(C), which will be discussed later. Thus, the routing task can always be completed because the pins can be arranged into time division multiplex form among the chips.

Once the placement and routing of each FPGA is determined, each FPGA can be configured into optimized and working circuits and accordingly, the system generates a "bitstream" configuration file 356. In Altera terminology, the system generates one or more Programmer Object Files (.pof). Other generated files include SRAM Object Files (.sof), JEDEC Files (.jed), Hexadecimal (Intel-format) Files (.hex), and Tabular Text Files (.ttf). The Altera MAX+PLUS II Programmer uses POFs, SOFs, and JEDEC Files along with Altera hardware programmable devices to program the FPGA array. Alternatively, the system generates one or more raw binary files (.rbf). The CPU revises .rbf files and programs the FPGA array through the PCI bus.

At this point, the configured hardware is ready for hardware start-up 370. This completes the automatic construction of hardware models on the reconfigurable boards.

Returning to the TDM circuit that allows groups of pin outputs to be time-multiplexed together so that only one pin output is actually used, the TDM circuit is essentially a multiplexer with at least two inputs (for the two wires), one output, and a couple of registers configured in a loop as the selector signal. If the SEmulation system requires more wires to be grouped together, than more inputs and loop registers can be provided. As the selector signal to this TDM circuit, several registers configured in a loop provide the appropriate signals to the multiplexer so that at one time period, one of the inputs is selected as the output, and at another time period, another input is selected as the output. Thus, the TDM circuit manages to use only one output wire between chips so that, for this example, the hardware model of the circuit implemented in a particular chip can be accomplished using 44 pins, instead of 45 pins. Thus, the routing task can always be completed because the pins can be arranged into time division multiplex form among the chips.

FIG. 9(A) shows an overview of the pin-out problem. Since this requires the TDM circuit, FIG. 9(B) provides a TDM circuit for the transmission side, and FIG. 9(C) provides a TDM circuit for the receiver side. These figures show only one particular example in which the SEmulation system requires one wire instead of two wires between chips. If more than two wires must be coupled together in a time multiplexed arrangement, one ordinarily skilled in the art can make the appropriate modifications in light of the teachings below.

FIG. 9(A) shows one embodiment of the TDM circuit in which the SEmulation system couples two wires in a TDM configuration. Two chips, 990 and 991, are provided. A circuit 960 which is portion of a complete user circuit design is modeled and placed in chip 991. A circuit 973 which is portion of a complete user circuit design is modeled and placed in chip 990. Several interconnections, including a group of interconnections 994, interconnection 992, and interconnection 993, are provided between circuit 960 and circuit 973. The number of interconnections, in this example, total 45. If, in one embodiment, each chip provides only 44 pins at most for these interconnections, one embodiment of the present invention provides for at least two of the interconnections to be time multiplexed to require only one interconnection between these chips 990 and 991.

In this example, the group of interconnections 994 will continue to use the 43 pins. For the 44$^{th}$ and last pin, a TDM circuit in accordance with one embodiment of the present invention can be used to couple interconnections 992 and 993 together in time division multiplexed form.

FIG. 9(B) shows one embodiment of the TDM circuit. A modeled circuit (or a portion thereof) 960 within a FPGA chip 991 provides two signals on wires 966 and 967. To the circuit 960, these wires 966 and 967 are outputs. These outputs would normally be coupled to modeled circuit 973 in chip 990 (see FIGS. 9(A) and 9(C)). However, the availability of only one pin for these two output wires 966 and 967 precludes a direct pin-for-pin connection. Because the outputs 966 and 967 are unidirectionally transmitted to the other chip, appropriate transmission and receiver TDM circuits must be provided to couple these lines together. One embodiment of the transmission side TDM circuit is shown in FIG. 9(B).

The transmission side TDM circuit includes AND gates 961 and 962, whose respective outputs 970 and 971 are coupled to the inputs of OR gate 963. The output 972 of OR gate 963 is the output of the chip assigned to a pin and connected to another chip 990. One set of inputs 966 and 967 to AND gates 961 and 962, respectively, is provided by the circuit model 960. The other set of inputs 968 and 969 is provided by a looped register scheme which functions as the time division multiplexed selector signal.

The looped register scheme includes registers 964 and 965. The output 995 of register 964 is provided to the input of register 965 and the input 968 of AND gate 961. The output 996 of register 965 is coupled to the input of register 964 and the input 969 to AND gate 962. Each register 964 and 965 is controlled by a common clock source. At any given instant in time, only one of the outputs 995 or 996 provides a logic "1." The other is at logic "0." Thus, after each clock edge, the logic "1," shifts between output 995 and output 996. This in turn provides either a "1" to AND gate 961 or AND gate 962, "selecting" either the signal on wire 966 or wire 967. Thus, the data on wire 972 is from circuit 960 on either wire 966 or wire 967.

One embodiment of the receiver side portion of the TDM circuit is shown in FIG. 9(C). The signals from circuit 960 on wires 966 and wire 967 in chip 991 (FIGS. 9(A) and 9(B)) must be coupled to the appropriate wires 985 or 986 to the circuit 973 in FIG. 9(C). The time division multiplexed signals from chip 991 enter from wire/pin 978. The receiver side TDM circuit can couple these signals on wire/pin 978 to the appropriate wires 985 and 986 to circuit 973.

The TDM circuit includes input registers 974 and 975. The signals on wire/pin 978 are provided to these input registers 974 and 975 via wires 979 and 980, respectively. The output 985 of input register 974 is provided to the appropriate port in circuit 973. Similarly, the output 986 of input register 975 is provided to the appropriate port in circuit 973. These input registers 974 and 975 are controlled by looped registers 976 and 977.

The output 984 of register 976 is coupled to the input of register 977 and the clock input 981 of register 974. The output 983 of register 977 is coupled to the input of register 976 and the clock input 982 of register 975. Each register 976 and 977 is controlled by a common clock source. At any given instant in time, only one of the enable inputs 981 or 982 is a logic "1." The other is at logic "0." Thus, after each clock edge, the logic "1" shifts between enable input 981 and output 982. This in turn "selects" either the signal on wire 979 or wire 980. Thus, the data on wire 978 from circuit 960 is appropriately coupled to circuit 973 via either wire 985 or wire 986.

The address pointer in accordance with one embodiment of the present invention, as discussed briefly with respect to FIG. 4, will now be discussed in greater detail with respect to FIG. 10. To reiterate, several address pointers are located in each FPGA chip in the hardware model. Generally, the primary purpose for implementing the address pointers is to enable the system to deliver data between the software model 315 and the specific FPGA chip in the hardware model 325 via the 32-bit PCI bus 328 (refer to FIG. 10). More specifically, the primary purpose of the address pointer is to selectively control the data delivery between each of the address spaces (i.e., REG, S2H, H2S, and CLK) in the software/hardware boundary and each FPGA chip among the banks 326a–326d of FPGA chips in light of the bandwidth limitations of the 32-bit PCI bus. Even if a 64-bit PCI bus is implemented, these address pointers are still needed to control the data delivery. Thus, if the software model has 5 address spaces (i.e., REG read, REG write, S2H read, H2S write, and CLK write), each FPGA chip has 5 address pointers corresponding to these 5 address spaces. Each FPGA needs these 5 address pointers because the particular selected word in the selected address space being processed may reside in any one or more of the FPGA chips.

The FPGA I/O controller 381 selects the particular address space (i.e., REG, S2H, H2S, and CLK) corresponding to the software/hardware boundary by using a SPACE index. Once the address space is selected, the particular address pointer corresponding to the selected address space in each FPGA chip selects the particular word corresponding to the same word in the selected address space. The maximum sizes of the address spaces in the software/hardware boundary and the address pointers in each FPGA chip depend on the memory/word capacity of the selected FPGA chip. For example, one embodiment of the present invention uses the Altera FLEX 10K family of FPGA chips. Accordingly, estimated maximum sizes for each address space are: REG, 3,000 words; CLK, 1 word; S2H, 10 words; and H2S, 10 words. Each FPGA chip is capable of holding approximately 100 words.

The SEmulator system also has the feature of allowing the user to start, stop, assert input values, and inspect values at any time in the SEmulation process. To provide the flexibility of a simulator, the SEmulator must also make all the components visible to the user regardless of whether the internal realization of a component is in software or hardware. In software, combinational components are modeled and values are computed during the simulation process. Thus, these values are clearly "visible" for the user to access at any time during the simulation process.

However, combinational component values in the hardware model are not so directly "visible." Although registers are readily and directly accessible (i.e., read/write) by the software kernel, combinational components are more difficult to determine. In FPGAs, most combinational components are modeled as look-up tables in order to achieve high gate utilization. As a result, the look-up table mapping provides efficient hardware modeling but loses visibility of most of the combinational logic signals.

Despite these problems with lack of visibility of combinational components, the SEmulation system can rebuild or regenerate combinational components for inspection by the user after the hardware acceleration mode. If a user's circuit design has only combinational and register components, the values of all the combinational components can be derived from the register components. That is, combinational components are constructed from or contain registers in various arrangements in accordance with the specific logic function required by the circuit design. The SEmulator has hardware models of register and combinational components only, and as a result, the SEmulator will read all the register values from the hardware model and then rebuild or regenerate all the combinational components. Because of the overhead required to perform this regeneration process, combinational component regeneration is not performed all the time; rather, it is performed only upon request by the user. Indeed, one of the benefits of using the hardware model is to accelerate the simulation process. Determining combinational component values at every cycle (or even most cycles) further decreases the speed of simulation. In any event, inspection of register values alone should be sufficient for most simulation analyses.

The process of regenerating combinational component values from register values assumes that the SEmulation system was in the hardware acceleration mode or ICE mode. Otherwise, software simulation already provides combinational component values to the user. The SEmulation system maintains combinational component values as well as register values that were resident in the software model prior to the onset of hardware acceleration. These values remain in the software model until further over-writing action by the system. Because the software model already has register values and combinational component values from the time period immediately before the onset of the hardware acceleration run, the combinational component regeneration process involves updating some or all of these values in the software model in response to updated input register values.

The combinational component regeneration process is as follows: First, if requested by the user, the software kernel reads all the output values of the hardware register components from the FPGA chips into the REG buffer. This process involves a DMA transfer of register values in the FPGA chips via the chain of address pointers to the REG address space. Placing register values that were in the hardware model into the REG buffer, which is in the software/hardware boundary, allows the software model to access data for further processing.

Second, the software kernel compares the register values before the hardware acceleration run and after the hardware acceleration run. If the register values before the hardware acceleration run are the same as the values after the hardware acceleration run, the values in the combinational components have not changed. Instead of expending time and resources to regenerating combinational components, these values can be read from the software model, which already has combinational component values stored therein from the time immediately before the hardware acceleration run. On the other hand, if one or more of these register values have changed, one or more combinational components that depend on the changed register values may also change values. These combinational components must be regenerated through the following third step.

Third, for registers with different values from the before-acceleration and after-acceleration comparison, the software kernel schedules their fan-out combinational components into the event queue. Here, those registers that changed values during this acceleration run have detected an event. More than likely, these combinational components that depend on these changed register values will produce different values. Regardless of any change in value in these combinational components, the system ensures that these combinational components evaluate these changed register-values in the next step.

Fourth, the software kernel then executes the standard event simulation algorithms to propagate the value changes from the registers to all the combinational components in the software model. In other words, the register values that changed during the before-acceleration to after-acceleration time interval are propagated to all combinational components downstream that depend on these register values. These combinational components then evaluate these new register values. In accordance with fan-out and propagation principles, other second-level combinational components that are located downstream from the first-level combinational components that in turn directly rely on the changed register values must also evaluate the changed data, if any. This process of propagating register values to other components downstream that may be affected continues to the end of the fan-out network. Thus, only those combinational components located downstream and affected by the changed register values are updated in the software model. Not all combinational component values are affected. Thus, if only one register value changed during the before-acceleration to after-acceleration time interval, and only one combinational component is affected by this register value change, then only this combinational component will re-evaluate its value in light of this changed register value. Other portions of the modeled circuit will be unaffected. For this small change, the combinational component regeneration process will occur relatively fast.

Finally, when event propagation has completed, the system is ready for any mode of operation. Usually, the user desires to inspect values after a long run. After the combinational component regeneration process, the user will continue with pure software simulation for debug/test purposes. However, at other times, the user may wish to continue with the hardware acceleration to the next desired point. Still in other cases, the user may wish to proceed further with ICE mode.

In sum, combinational component regeneration involves using register values to update combinational component values in the software model. When any register value has changed, the changed register value will be propagated through that register's fan-out network as values are updated. When no register value has changed, the values in the software model also will not change, so the system does not need to regenerate combinational components. Usually, the hardware acceleration run will occur for some time. As a result, many register values may change, affecting many combinational component values located downstream in the fan-out network of these registers that have the changed values. In this case, the combinational component regeneration process may be relatively slow. In other cases, after a hardware acceleration run, only a few register values may change. The fan-out network for registers that had the changed register values may be small and thus, the combinational component regeneration process may be relatively fast.

IV. Emulation with Target System Mode

Figure 10:
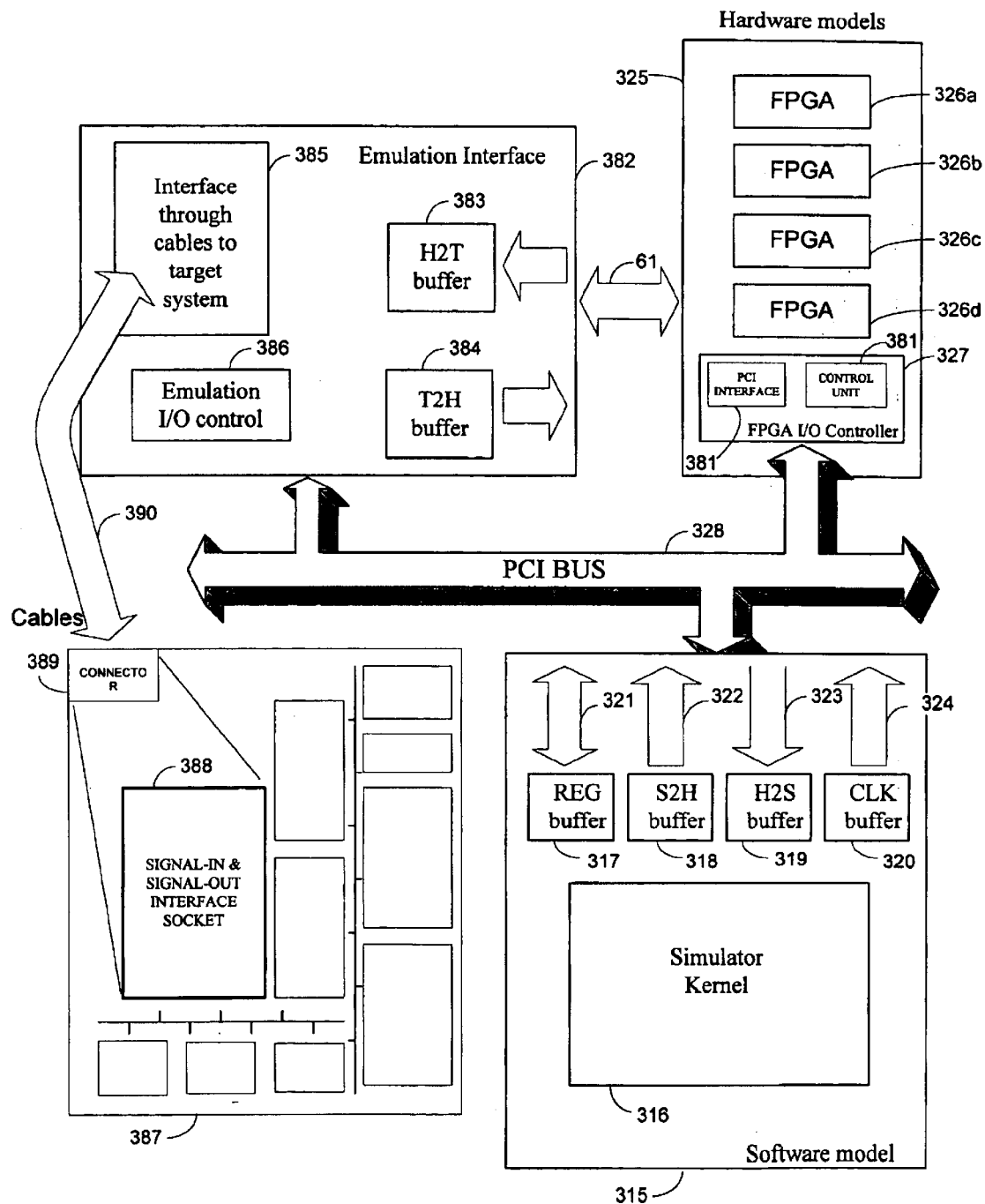
FIG. 10 shows a SEmulation system architecture in accordance with one embodiment of the present invention.

FIG. 10 shows a SEmulation system architecture in accordance with one embodiment of the present invention. FIG. 10 also shows a relationship between the software model, hardware model, the emulation interface, and the target system when the system is operating in in-circuit emulation mode. As described earlier, the SEmulation system comprises a general purpose microprocessor and a reconfigurable hardware board interconnected by a high-speed bus, such as a PCI bus. The SEmulation system compiles the user's circuit design and generates the emulation hardware configuration data for the hardware model-to-reconfigurable board mapping process. The user can then simulate the circuit through the general purpose processor, hardware accelerate the simulation process, emulate the circuit design with the target system through the emulation interface, and later perform post-simulation analysis.

The software model 315 and hardware model 325 are determined during the compilation process. The emulation interface 382 and the target system 387 are also provided in the system for in-circuit emulation mode. Under the user's discretion, the emulation interface and the target system need not be coupled to the system at the outset.

The software model 315 includes the kernel 316, which controls the overall system, and four address spaces for the software/hardware boundary—REG, S2H, H2S, and CLK. The SEmulation system maps the hardware model into four address spaces in main memory according to different component types and control functions: REG space 317 is designated for the register components; CLK space 320 is designated for the software clocks; S2H space 318 is designated for the output of the software test-bench components to the hardware model; and H2S space 319 is designated for the output of the hardware model to the software test-bench components. These dedicated I/O buffer spaces are mapped to the kernel's main memory space during system initialization time.

The hardware model includes several banks 326a–326d of FPGA chips and FPGA I/O controller 327. Each bank (e.g., 326b) contains at least one FPGA chip; In one embodiment, each bank contains 4 FPGA chips. In a 4×4 array of FPGA chips, banks 326b and 326d may be the low bank and banks 326a and 326c may be the high bank. The mapping, placement, and routing of specific hardware-modeled user circuit design elements to specific chips and their interconnections are discussed with respect to FIG. 6. The interconnection 328 between the software model 315 and the hardware model 325 is a PCI bus system. The hardware model also includes the FPGA I/O controller 327 which includes a PCI interface 380 and a control unit 381 for controlling the data traffic between the PCI bus and the banks 326a–326d of FPGA chips while maintaining the throughput of the PCI bus. Each FPGA chip further includes several address pointers, where each address pointer corresponds to each address space (i.e., REG, S2H, H2S, and CLK) in the software/hardware boundary, to couple data between each of these address spaces and each FPGA chip in the banks 326a–326d of FPGA chips.

Communication between the software model 315 and the hardware model 325 occurs through a DMA engine or address pointer in the hardware model. Alternatively, communication also occurs through both the DMA engine and the address pointer in the hardware model. The kernel initiates DMA transfers together with evaluation requests through direct mapped I/O control registers. REG space 317, CLK space 320, S2H space 318, and H2S space 319 use I/O datapath lines 321, 322, 323, and 324, respectively, for data delivery between the software model 315 and the hardware model 325.

Double buffering is required for all primary inputs to the S2H and CLK spaces because these spaces take several clock cycles to complete the updating process. Double buffering avoids disturbing the internal hardware model states which may cause race conditions.

The S2H and CLK space are the primary input from the kernel to the hardware model. As described above, the hardware model holds substantially all the register components and the combinational components of the user's circuit design. Furthermore, the software clock is modeled in software and provided in the CLK I/O address space to interface with the hardware model. The kernel advances simulation time, looks for active test-bench components, and evaluates clock components. When any clock edge is detected by the kernel, registers and memories are updated and values through combinational components are propagated. Thus, any changes in values in these spaces will trigger the hardware model to change logic states if the hardware acceleration mode is selected.

For in-circuit emulation mode, emulation interface 382 is coupled to the PCI bus 328 so that it can communicate with the hardware model 325 and the software model 315. The kernel 316 controls not only the software model, but also the hardware model during the hardware accelerated simulation mode and the in-circuit emulation mode. The emulation interface 382 is also coupled to the target system 387 via cable 390. The emulation interface 382 also includes the interface port 385, emulation I/O control 386, the target-to-hardware I/O buffer (T2H) 384, and the hardware-to-target I/O buffer (H2T) 383.

The target system 387 includes a connector 389, a signal-in/signal-out interface socket 388, and other modules or chips that are part of the target system 387. For example, the target system 387 could be an EGA video controller, and the user's circuit design may be one particular I/O controller circuit. The user's circuit design of the I/O controller for the EGA video controller is completely modeled in software model 315 and partially modeled in hardware model 325.

The kernel 316 in the software model 315 also controls the in-circuit emulation mode. The control of the emulation clock is still in the software via the software clock, the gated clock logic, and the gated data logic so no set-up and hold-time problems will arise during in-circuit emulation mode. Thus, the user can start, stop, single-step, assert values, and inspect values at any time during the in-circuit emulation process.

To make this work, all clock nodes between the target system and the hardware model are identified. Clock generators in the target system are disabled, clock ports from the target system are disconnected, or clock signals from the target system are otherwise prevented from reaching the hardware model. Instead, the clock signal originates from a test-bench process or other form of software-generated clock so that the software kernel can detect active clock edges to trigger the data evaluation. Hence in ICE mode, the SEmulation system uses the software clock to control the hardware model instead of the target system's clock.

To simulate the operation of the user's circuit design within the target system's environment, the primary input (signal-in) and output (signal-out) signals between the target system 40 and the modeled circuit design are provided to the hardware model 325 for evaluation. This is accomplished through two buffers, the target-to-hardware buffer (T2H) 384 and the hardware-to-target buffer (H2T) 383. The target system 387 uses the T2H buffer 384 to apply input signals to the hardware model 325. The hardware model 325 uses the H2T buffer 383 to deliver output signals to the target system 387. In this in-circuit emulation mode, the hardware model send and receive I/O signals through the T2H and H2T buffers instead of the S2H and H2S buffers because the system is now using the target system 387, instead of test-bench processes in the software model 315 to evaluate the data. Because the target system runs at a speed substantially higher than the speed of the software simulation, the in-circuit emulation mode will also run at a higher speed. The transmission of these input and output signals occurs on the PCI bus 328.

Furthermore, a bus 61 is provided between the emulation interface 382 and the hardware model 325. This bus is analogous to the bus 61 in FIG. 1. This bus 61 allows the emulation interface 382 and the hardware model 325 to communicate via the T2H buffer 384 and the H2T buffer 383.

Typically, the target system 387 is not coupled to the PCI bus. However, such a coupling may be feasible if the emulation interface 382 is incorporated in the design of the target system 387. In this set-up, the cable 390 will not be present. Signals between the target system 387 and the hardware model 325 will still pass through the emulation interface.

V. Post-simulation Analysis Mode

The SEmulation system of the present invention can support value change dump (VCD), a widely used simulator function for post-simulation analysis. Essentially, the VCD provides a historical record of all inputs and selected register outputs of the hardware model so that later, during post-simulation analysis, the user can review the various inputs and resulting outputs of the simulation process. To support VCD, the system logs all inputs to the hardware model. For outputs, the system logs all values of hardware register components at a user-defined logging frequency (e.g., 1/10, 000 record/cycle). The logging frequency determines how often the output values are recorded. For a logging frequency of 1/10,000 record/cycle, output values are recorded once every 10,000 cycles. The higher the logging frequency, the more information is recorded for later post-simulation analysis. The lower the logging frequency, the less information is stored for later post-simulation analysis. Because the selected logging frequency has a causal relationship to the SEmulation speed, the user should select the logging frequency with care. A higher logging frequency will decrease the SEmulation speed because the system must spend time and resources to record the output data by performing I/O operations to memory before further simulation can be performed.

With respect to the post-simulation analysis, the user selects a particular point at which simulation is desired. If the logging frequency is 1/500 records/cycle, register values are recorded for points 0, 500, 1000, 1500, and so on every 500 cycles. If the user wants results at point 610, for example, the user selects point 500, which is recorded, and simulates forward in time until the simulation reaches point 610. During the analysis stage, the analysis speed is the same as the simulation speed because the user initially accesses data for point 500 and then simulates forward to point 610. Note that at higher logging frequencies, more data is stored for post-simulation analysis. Thus, for a logging frequency of 1/300 records/cycle, data is stored for points 0, 300, 600, 900, and so on every 300 cycles. To obtain results at point 610, the user initially selects point 600, which is recorded, and simulates forward to point 610. Notice that the system can reach the desired point 610 faster during post-simulation analysis when the logging frequency is 1/300 than 1/500. However, this is not always the case. The particular analysis point in conjunction with the logging frequency determines how fast the post-simulation analysis point is reached. For example, the system can reach point 523 faster if the VCD logging frequency was 1/500 rather than 1/300.

The user can then perform analysis after SEmulation by running the software simulation with input logs to the hardware model to compute the value change dump of all hardware components. The user can also select any register log point in time and start the value change dump from that log point forward in time. This value change dump method can link to any simulation waveform viewer for post-simulation analysis.

VCD On-Demand System

One embodiment of the present invention is a system that generates VCD on demand without simulation rerun. In accordance with one embodiment of the present invention, the VCD on-demand technology as described herein incorporates the following high level attributes: (1) RCC-based parallel simulation-history compression and recording, (2) RCC-based parallel simulation history decompression and VCD file generation, and (3) On-demand software regeneration for a selected simulation target range and design review without simulation rerun. Each of these attributes will be discussed in greater detail below.

During a debug session, the EDA tool (hereinafter referred to as the RCC System, which incorporates the various aspects of the present invention) records the primary inputs from a test bench process so that any portion of the simulation can be reproduced. The user can then selectively command the EDA tool, or RCC System, to dump the hardware state information from any simulation time range into a VCD file for later analysis. Thereafter, the user can immediately begin debugging his design in the selected simulation time range. If the selected simulation time range does not include the bug that the user is seeking to fix, he can select another simulation time range for dump into the VCD file. The user can then analyze this new VCD file. With this VCD on-demand feature, the user can cease simulation at any point and request the generation of another selective VCD file on-demand from any desired simulation time starting point to any simulation time end point.

In a typical debug session, the user debugs his design using the RCC System illustrated in FIG. 83. During the first simulation run, the user fast simulates his design from a desired beginning simulation time to any desired end simulation time, referred to herein as a simulation session range. During this fast simulation run, a highly compressed form of the primary inputs is recorded in an "input history" file so that any portion of the simulation session can be reproduced. At the end of the simulation session range, the RCC System saves the hardware state information from this end point in a "simulation history" file so that the user can return to debugging the design past this end point if desired.

At the end of the fast simulation run, the user will analyze the results and invariably detect some problem with his design. The user then makes a guess that the source of the problem (i.e., bug) is located in a particular narrow simulation time range, referred to herein as the simulation target range, which is within the broader simulation session range. For example, if the simulation session range encompassed 1,000 simulation time steps, the narrower simulation target range might include only 100 simulation time steps at a particular location within the broader simulation session range.

Once the user makes a guess as to the precise location of simulation target range to isolate the bug, the RCC System fast simulates from the beginning by decompressing the compressed primary inputs in the input history file and delivering the decompressed primary inputs into the hardware model for evaluation. When the RCC System reaches the simulation target range, it dumps the evaluated results (e.g., hardware node values and register states) into a VCD file. Thereafter, the user can analyze this region more carefully by replaying his design using the VCD file starting from the beginning of the simulation target range, rather than having to rerun the simulation from the beginning of the simulation session range, or even from the very beginning of the simulation. This feature of saving the hardware states from the simulation target range as a VCD file saves the user an enormous amount of debug time—time that is not otherwise wasted on simulation rerun.

Referring now to FIG. 83, a high level view of the RCC System that incorporates one embodiment of the present invention is illustrated. The RCC System includes an RCC Computing System 2600 and an RCC Hardware Accelerator 2620. As described elsewhere in this patent specification, the RCC Computing System 2600 contains the computational resources that are necessary to allow the user to simulate the user's entire software-modeled design in software and control the hardware acceleration of the hardware-modeled portion of the design. To this end, the RCC Computing System 2600 contains the CPU 2601, various clocks 2602 (including the software clock that is described elsewhere in this patent specification) that are needed by the various components of the RCC System, test bench processes 2603, and system disk 2604. In contrast to some conventional hardware-based event history buffer, the system disk is used to record the compressed data rather than a small hardware RAM buffer. Although not shown, the RCC Computing System 2600 includes other logic components and bus subsystems that provide the circuit designer with the computational power to run diagnostics, various software, and manage files, among other tasks that a computing system performs.

The RCC Hardware Accelerator 2620, which is also referred to as the RCC Array in other sections of this patent specification, contains the reconfigurable array of logic elements (e.g., FPGA) that can model at least a portion of the user's design in hardware so that the user can accelerate the debugging process. To this end, the RCC Hardware Accelerator 2620 includes the array of reconfigurable logic elements 2621 which provides the hardware model of a portion of the user design. The RCC Computing System 2600 is tightly coupled to the RCC Hardware Accelerator 2620 via the software clock as described elsewhere in this patent specification and a bus system, a portion of which is shown as lines 2610 and 2611 in FIG. 83.

The VCD on-demand aspect of the present invention will now be discussed with respect to FIG. 84. FIG. 84 shows a timeline of several simulation times—t0, t1, t2, and t3. The simulation session range is between simulation time t0 and simulation time t3, which of course includes simulation times t1 and t2. Simulation time t0 represents the first simulation time in the simulation session range where fast simulation begins. This simulation time t0 represents the first simulation time for any separable simulation session, or simulation session range. In other words, assume that today's debug session includes an examination of the simulation session range from t=10,000 to t=12,000. The user guesses that the particular bug is located somewhere between t=10,500 and t=10,750. For this simulation session range, the simulation time $t_0$ is t=10,000. Assume that the particular bug is located and fixed for this simulation session range t=10,000 to t=12,000. Tomorrow, the user then moves on to the next simulation session range t=12,000 to t=15,000. Here, the simulation time t0 is t=12,000. In some cases, simulation time t0 represents the very first simulation time for the user design's first debug session; that is, t0 corresponds to t=0.

Analogously, simulation time t3 represents the last simulation time for the selected simulation session range. In other words, assume that today's debug session includes an examination of the simulation session range from t=14,555 to t=16,750. For this simulation session range, the simulation time t3 is t=16,750. Assume that the particular bug is located and fixed for this simulation session range t=14,555 to t=16,750. The user then moves on to the next simulation session range t=16,750 to t=19,100. Here, the simulation time t3 is t=19,100. In some cases, simulation time t3 represents the very last simulation time for the user design's last debug session.

The user may continue to simulate beyond this simulation time t3 if desired but for the moment, he is focused on debugging his design for the simulation times t0 to t3, the current simulation session range. Typically, when the bugs have been ironed out for the current simulation session range, the user will then proceed to simulate his design beyond simulation time t3 into the next simulation session range.

In this abstract representation of the simulation session range, these simulation time periods t0–t3 are not necessarily contiguous to each other; that is, simulation time t0 and t1 are not immediately adjacent to each other. Indeed, simulation times t0 and t1 may be thousands of simulation time periods apart.

Because one embodiment of the present invention will be implemented in the RCC System, references to various components of the RCC System shown in FIG. 83 will be made. First, the RCC System's input and simulation history generation operation will be discussed. This generation operation includes some form of data compression for the primary inputs and recordation of the compressed primary inputs. Second, the RCC System's VCD generation operation will be discussed. This VCD generation operation includes decompressing the primary inputs to reproduce the simulation history and dumping the hardware states into a VCD file for the simulation target range. Third, the VCD file review process is then discussed. Although the term "simulation history" is used at times, this does not mean that the entire debug session involves software simulation. Indeed, the RCC System generates VCD files from hardware states and the software model is used only for later analysis of the VCD file.

Input and Simulation History Generation—Compress and Record

At the outset, the user models the design in software in the RCC Computing System 2600 of FIG. 83. For some portion of the design, the RCC Computing System 2600 automatically generates a hardware model of the design based on the hardware description language (e.g., VHDL). The hardware model is configured in the array of reconfigurable logic elements 2621, which is a portion of the RCC Hardware Accelerator 2620. With this setup, the user can simulate the design in software in the RCC Computing System 2600, accelerate a portion (i.e., simulation time step or distinct physical section of the circuit) of the design using the RCC Hardware Accelerator 2620, or a combination of simulation and hardware acceleration.

The user has just completed his latest circuit design. It is now time to debug the design to look for flaws. If the user had previously debugged an earlier version of the design, he has some idea of where a bug might be located. On the other hand, if this is the very first debug session for this new design, the user must make some guess as to the location of a potential bug. In either case, some guess work is needed to generally locate the bug. For the purposes of this discussion, assume is debugging the design for the very first time.

In debugging the design, the user selects a simulation session range. Theoretically, this simulation session range can be any length of simulation times. In practice, however, the simulation session range should be selected to be short enough to isolate a few bugs in the design and long enough to quickly move the debugging process and minimize the number of debug sessions necessary to filly debug a design. Obviously, a simulation session range of two or three simulation time steps will not reveal the existence of any bug. Furthermore, this small simulation session range will force the user to conduct many repetitive tasks that will slow the debug process. If the selected simulation session range is a million simulation time steps, too many bugs may manifest themselves and thus, the user will be find difficulty in implementing a more focused attack of the problem.

Once the user has selected a simulation session range, he commands the RCC System to fast simulate from simulation time t0 to simulation time t3, as shown in FIG. 84. As explained above, the separation of the simulation times t0 to t3 may be any selected range, but simulation time t0 represents the beginning of the simulation and simulation time t3 represents the last simulation time for this simulation session range.

At simulation time t0, fast simulation begins in the RCC Computing System 2600. Fast simulation is performed from simulation time t0 to simulation time t3 instead of normal simulation mode because no regeneration of the software model is needed during this time period. As described elsewhere in this patent specification, the regeneration operation requires the RCC Computing System 2620 to receive hardware state information (e.g., node values, register states) so that more sophisticated logic elements (e.g., combinational logic) can be regenerated in software for further analysis by the user. Of course, some users may want to view the software model during the simulation process, in which case, the RCC Computing System 2600 does not perform fast simulation. In this case, the simulation process is much slower due to the extra time needed by the RCC Computing System 2600 to regenerate the software model from the primary outputs of the hardware model.

Initially, the full states of the design, such as the software model states and hardware model register and node values, are saved at simulation time t0 into a file, called "simulation history" file, in the system disk. This allows the user to load the states of the design into the RCC System at any time in the future for debugging purposes. During this fast simulation period for the simulation session range from simulation time t0 to simulation time t3, the RCC Computing System 2600 applies two distinct processes to the primary inputs $I_p$ in parallel. The raw primary inputs from the test bench processes 2603 are provided on line 2610 to the RCC Hardware Accelerator 2620 for evaluation. Concurrently, the same primary inputs from the test bench processes are compressed and recorded in system disk as a separate file, called an "input history" file, so that the entire history of the primary inputs can be collected to allow the user to reproduce any part of the simulation later. In particular, the primary inputs corresponding to simulation time t0 to simulation time t3 are compressed and saved in system disk.

When the RCC Hardware Accelerator 2620 receives the primary inputs $I_p$ from the test bench processes 2603, it processes the primary inputs. As a result, hardware states in the hardware model will most likely change as the various logic and other circuit devices evaluate the data. During this period from simulation time t0 to simulation time t3, the RCC System need not wait for the RCC Computing System 2600 to perform its logic regeneration since the user is not interested in finely debugging the design during this fast simulation period. The RCC System also does not save the primary outputs (e.g., hardware node values and register states) yet. Note that while the RCC Computing System 2600 compresses the primary inputs for recording into the "input history" file, the RCC Hardware Accelerator 2620 evaluates the raw and uncompressed primary inputs. In other embodiments, the RCC System does not compress the primary inputs for recording into the input history file.

Why does the RCC Computing System 2600 deliver the primary inputs to the RCC Hardware Accelerator for evaluation when these outputs will not be saved at all during the fast simulation period? The RCC System needs to save the hardware states of the design based on its evaluation of the primary inputs from the beginning of the simulation to simulation time t3. An accurate snapshot of the hardware model states cannot be obtained at simulation time t3 unless the hardware model has evaluated the entire history of primary inputs from the beginning to this point t3, not the inputs from just simulation time t3. Logic circuits have memory attributes that will affect the results of the evaluation based on the order of the inputs. Thus, if the primary inputs from just simulation time t3 (or the simulation time immediately prior to simulation time t3) are fed to the hardware model for evaluation, the hardware model will probably exhibit the wrong states at this simulation time t3.

Why is the hardware model states saved for simulation time t3? A large design with over a million gates and over a million simulation time steps cannot be debugged in a relatively short period of time. The user needs multiple simulation sessions to debug this design. To quickly move from one simulation session to the next, the RCC System saves the hardware states (along with the compressed primary inputs) from simulation time t3 so that the user can debug the next simulation session range which begins at simulation time t3. With the saved hardware model states, the user need not simulate from the very beginning of the simulation; rather, the user can quickly and conveniently return to simulation time t3 after debugging the design from simulation time t0 to simulation time t3. The hardware model states at simulation time t3, saved in the simulation history file, represent the correct snapshot of his design that is a reflection of the entire history of primary inputs up to that point.

The hardware model in the RCC Hardware Accelerator 2620 provides internal hardware states on line 2611 to the RCC Computing System 2600, so that the RCC Computing System 2600 can build or regenerate the various logic elements (e.g., combinational logic) in the software model, if necessary and desired by the user. But, as noted above, the user is not concerned with observing the software simulation during the fast simulation of the simulation session range. Accordingly, these internal hardware states from the RCC Hardware Accelerator are not saved in the system disk, since the internal hardware states will not be examined by the user for bugs for now.

At simulation time t3, or at the end of the simulation session range, this particular fast simulation operation ceases. The evaluation results or primary outputs (e.g., register values) from the design's hardware model in the RCC Hardware Accelerator 2620 corresponding to simulation time t3 are saved in the simulation history file. This is done so that when the user has debugged the design from simulation time t0 to simulation time t3, he can then proceed straight to simulation time t3 for further debugging as necessary. The user need not rerun the simulation from simulation time t0 to debug his design at some point beyond simulation time t3.

In sum, from simulation time t0 to simulation time t3 (i.e., simulation session range), the user is essentially accelerating the design by feeding the RCC Hardware Accelerator 2620 with the primary inputs from the test bench process 2603 on line 2610 while at the same time compressing the same primary inputs and saving them into system disk for future reference. The RCC Computing System 2600 needs to save the primary inputs (compressed or otherwise) in the input history file to reproduce the debug session. The compression operation also occurs in parallel with the data evaluation in the RCC Hardware Accelerator 2620. Finally, at simulation time t3 at the end of the simulation session range, the RCC System saves the state information of the hardware model into a simulation history file.

In one embodiment of the present invention, all recorded compressed primary inputs from the simulation session range are part of the same file that will be modified later for the hardware state information from simulation time t3. In another embodiment, the saved information from the simulation session range and the hardware state information from simulation time t3 are each saved as distinct files in system disk. Similarly, any of the above described files may be modified with the VCD on-demand information that is created later for the simulation target range. Alternatively, the VCD on-demand information may be saved in a distinct VCD file in system disk that is separate from the compressed primary input file and the simulation time t3 hardware state, information file. In other words, in accordance with one embodiment of the present invention, the input history file, the simulation history file, and the VCD file may be incorporated together in one file. In another embodiment, the input history file, the simulation history file, and the VCD file may be separate files. Also, the input history file and the simulation history file may be incorporated in one file that is separate from the VCD file.

The compression scheme will now be discussed. In accordance with one embodiment of the present invention, the RCC System's compression logic allows for a compression ratio of 20× for the primary input events with 10% input events per simulation time step. Thus, a large ASIC design having over a million gates may require 200 primary input events. For 10% input events per simulation time step, approximately 20 inputs need to be compressed and recorded. If each input signal is 2 bytes long, 20 input signals results in 40 bytes of data need to be processed at the primary inputs per simulation time step. For a compression ratio of 20×, the 40 bytes of data can be compressed to 2 bytes of data per simulation time step. Thus, for a design that requires about 1 million simulation timer steps, the RCC System compresses the primary inputs to 2 Mega bytes of data. A file of this size can be easily managed by any computing file system and the waveform viewer. In one embodiment, ZIP compression is used.

In accordance with one embodiment, the primary input compression is performed in parallel with the primary input evaluation by the RCC Hardware Accelerator 2620; input history file generation occurs concurrently with the primary input evaluation. Accordingly, the compression scheme provides no direct negative impact on the RCC System's performance. The only possible bottleneck is the process of recording the compressed primary inputs into the system disk. However, since the data is highly compressed, the RCC System experiences less than 5% slowdown for most designs running at 50,000 simulation time steps per second.

As for the specific manner in which recording is controlled in the RCC System, the user must first use the $rcc(record) command to initialize the RCC recording feature in accordance with one embodiment of the present invention:

$rcc(record, name, <disk space>, <checkpoint control>);

An explanation of the arguments name, <disk space>, and <checkpoint control> will now be discussed. The "name" argument is the record name for the current simulation session range. Different names are required to distinguish different simulation runs of the same design. A distinct record name is needed especially for off-line VCD on-demand debugging. The <disk space> argument is an optional parameter to specify the maximum disk space (in units of MB) allocated for the RCC System recording process. The default value is 100 MB. The RCC System only records the latest part of the current simulation session range within the specified disk space. In other words, if the <disk space> value is specified as 100 MB but the current simulation session range takes up 140 MB, the RCC System records only the last 100 MB while discarding the first 40 MB of compressed primary inputs. This aspect of the invention provides one benefit for failure analysis. In one embodiment of the present invention, the test bench process has some self-testing functions to detect simulation failures and stop the simulation. The latest history of the RCC simulation can provide most of the information for such failure analysis.

The <checkpoint control> argument is an optional parameter that specifies the number of simulation time steps needed to perform a full-state checkpoint. The default is 1,000,000 time steps. Like most conventional compression algorithm, the compressed primary inputs are also based on the state difference between successive simulation time steps. For long simulation runs, checkpoints for the full RCC states at a given low frequency can greatly facilitate simulation history extraction. For a decompression rate of 20K to 200K simulation time steps per second in the RCC System and checkpoints located once every one million steps, the RCC System can extract (i.e., reproduction of the simulation from the primary inputs and selected VCD file generations any simulation history within 5 to 50 seconds.

When this $rcc(record) command is invoked, the RCC System will record the simulation history; that is, the primary inputs will be compressed and recorded in a file for storage in the system disk. The primary outputs from the RCC Hardware Accelerator are ignored since software logic regeneration is not needed at this time. The recording process can be terminated with either the commands $rcc (stop) or $rcc(off), at which point the RCC System switches control of the simulation back to the software model. At this point, the primary outputs are processed for software logic regeneration.

VCD Generation—Decompress and Dump

As described above, the RCC System has saved the software model and hardware model at the beginning of the simulation session range at simulation time t0, recorded the compressed primary inputs for the entire simulation session range in the input history file, and saved the hardware model states for the design at the end of the simulation session range at simulation time t3 in the simulation history file. The user now has enough information to load the design at the start of the simulation session range from the design information from simulation time t0. With the compressed primary inputs, the user can software simulate any portion of his design. However, with the VCD on-demand feature, the user will probably not want to software simulate his design at this point. Rather, the user will want to generate a VCD file for the selected simulation target range for fine analysis to isolate and fix the bug. Indeed, with the recorded compressed primary inputs, the RCC System can reproduce any point within the simulation session range. Moreover, the RCC System can simulate beyond the current simulation session range if desired by loading the previously saved hardware state information from simulation time t3.

After fast simulating the design, the user reviews the results to determine if a bug exists. If no bug is apparent to the user, the design may be free of bugs for the current simulation session range. The user can then proceed to simulate beyond the current simulation session range to the next simulation session range, whatever selected range this may be. If, however, the user has determined that the design has some sort of problem, he must analyze the simulation more carefully to isolate and fix the bug. Because the entire simulation session range is too large for careful and detailed analysis, the user must target a particular narrower range for further study. Based on the user's familiarity of the design and perhaps past debugging efforts, the user makes a reasonable guess as to the location of the bug within the simulation session range. The user will focus on a selected simulation target range that should correspond with the user's guess as to the location of the bug (or where the bug will manifest itself). The user determines that the simulation target range is between simulation time t1 and simulation time t2 as shown in FIG. 84.

The RCC System loads the software model of the design in the RCC Computing System 2600 and the hardware model in the RCC Hardware Accelerator 2620 with the previously saved configuration information from simulation state t0. The RCC System then fast simulates from simulation time t0 to simulation time t1. During the fast simulation operation, the RCC Computing System loads the previously saved file containing the compressed primary inputs. The RCC Computing System decompresses the compressed primary inputs and delivers the decompressed primary inputs to the RCC Hardware Accelerator 2620 for evaluation. Like the initial fast simulation operation which compressed and saved the primary inputs for the simulation session range, the primary outputs which are the evaluated results (e.g., hardware model node values and register states) are not saved during the fast simulation operation from simulation time t0 to simulation time t1.

Once the fast simulation operation reaches the beginning of the simulation target range, or simulation time t1, the RCC System then dumps the evaluated results (i.e., primary outputs $O_p$) from the hardware model in the RCC Hardware Accelerator 2620 into a VCD file in the system disk. Unlike the initial fast simulation operation for the simulation session range, the RCC Computing System 2600 does not perform any compression. Again, the RCC Computing System 2600 does not perform any regeneration operation for the software model since the user need not view the evaluation results at this time. By not performing any regeneration operation for the software model, the RCC System can quickly generate the VCD file.

In other embodiments, however, the user may concurrently view the software model of his design for this simulation time period from t1 to t2 while saving the primary outputs. If so, the RCC Computing System 2600 performs the software model regeneration operation to allow the user to view any and all states from any aspect of his design.

At simulation time t2, the RCC Computing System 2600 ceases saving the evaluation outputs from the RCC Hardware Accelerator 2620 in the VCD file. At this point, the user can stop fast simulating. The RCC System now has the complete VCD file for the simulation target range and the user can proceed to analyze the VCD file in greater detail.

When the user wants to analyze the VCD file, he need not rerun the simulation from the very beginning (e.g., simulation time t0). Instead, the user can command the RCC System to load the saved hardware state information from the beginning of the simulation target range and view the simulated results with the software model. This will be described in more detail below in the Simulation History Review section.

Upon analyzing the VCD file, the user may or may not discover the bug. If the bug is found, the user will of course commence fixing the design. If the bug is not found, the user may have made a wrong guess of the simulation target range that he suspects has the bug. The user must employ the same process that he used above with respect to the decompress and VCD file dump. The user makes another guess with, hopefully, a better simulation target range within the simulation session range. Having done so, the RCC System fast simulates from the beginning of the simulation session range to the beginning of the new simulation target range, decompressing the primary inputs and delivering them to the RCC Hardware Accelerator 2620 for evaluation. When the RCC System reaches the beginning of the new simulation target range, the primary outputs from the RCC Hardware Accelerator 2620 are dumped into a VCD file. At the end of the new simulation target range, the RCC System ceases dumping the hardware state information into the VCD file. At this point, the user can then view the VCD file for isolating the bug.

In sum, from simulation time t0 to simulation time t1, the RCC System fast simulates the design by decompressing the previously compressed primary inputs and delivering them to the hardware model for evaluation. During the simulation target range from simulation time t1 to simulation time t2, the RCC System dumps the primary outputs from the hardware model into a VCD file. At the end of the simulation target range, the user can cease fast simulating the design. At this point, the user can then view the VCD file by going directly to simulation time t1 without rerunning the simulation from the very beginning at simulation time t0.

When the review of this simulation target range is completed and the bug has been isolated and removed, the user can then proceed to the next simulation session range. This new simulation session range begins at simulation time t3. The particular length of the new simulation target range, which can be the same length as the previous simulation session range, is selected by the user. The RCC System loads the previously saved hardware state information corresponding to simulation time t3. The RCC System is now ready for fast simulation of this new simulation session range. Note that this new simulation session range corresponds to the range from simulation time t0 to t3, where the loaded hardware state now corresponds to simulation time t0. The fast simulation, VCD on-demand dump, and VCD review process is similar to that described above.

In accordance with one embodiment of the present invention, the decompression step does not negatively impact performance. The RCC System can decompress the simulation history (i.e., compressed and recorded primary inputs) at a rate of 20,000 to 200,000 simulation time steps per second. With proper checkpoint control, the RCC System can extract (i.e., reproduction of the simulation from the primary inputs and selected VCD file generation) the simulation history within 50 seconds.

As for the specific manner in which the VCD on-demand feature is controlled in the RCC System, the user must use the $axis_rpd command. The $axis_rpd is an interactive command to extract the RCC evaluation record and create a VCD file on demand. Unlike conventional simulation rewind technologies, the execution of the $axis_rpd command neither rewinds the internal simulation state nor corrpts the external PLI and file I/O states. The user can continue simulation after invoking the $axis_rpd command in the same manner as the user is capable of simulating after the $stop command.

When no arguments are specified, the $axis_rpd command displays all available simulation time periods within the simulation session range; that is, the user can select the simulation target range. The time unit is the same time unit in the command line interface. An example of a simulation log is as follows:

C1>$rcc(record, r1);
C2>#1000 $rcc(xt0, run);
C3>#50000 $rcc(off);
C4>#50500 $rcc(run);
C5>#60000 $rcc(stop);
   Start RCC engine at 100500.
   Back to SIM: stop RCC engine at 5000000.
   Start RCC engine at 5050500.
   Back to SIM: stop RCC engine at 6000000.
Interrupt at simulation time 60000.0000 ns
C6>$axis_rpd;
available simulation history:
1005.000000 to 50000.000000
50505.000000 to 60000.000000

Interrupt at simulation time 60000.0000 ns

From this simulation log, the user used the RCC engine form the time right after 1000 to 50000 and the time right after 50500 to 60000. Thus, $axis_rpd shows the recorded simulation windows.

To generate a VCD file from the simulation history, the user uses the $axis_rpd command with the following control arguments:

$axis_rpd(start-time, end-time, "dump-file-name", <level and scope control>);

The start-time and end-time specify the simulation time window, or the simulation target range, for the VCD file. The unit of the time control arguments is the time unit used in the command line interface. The "dump-file-name" is the name of the VCD file. The dump <level and scope control> parameters are identical to the standard $dumpvars command in the IEEE Verilog.

As an example of the $axis_rpd command:

C7>$axis_rpd(50505, 50600, "f1.dump");
  start RCC VCD at 50505.010000!!
  end RCC VCD at 50600.000000!!
Interrupt at simulation time 60000.0000 ns This $axis_rpd command creates a VCD file called "f1.dump" for the simulation target range from simulation time 50505 to 50600. Just like $dumpvars, if no level and scope control parameters are provided, the $axis_rpd command will dump the entire hardware states or primary outputs.

Another example of the use of the $axis_rpd command is as follows:

C8>$axis_rpd(40444, 50600, "f1.dump", 2, dp0);
  start RCC VCD at 40000.000000!!
  skip at time 50000.000000.
  continue at time 50505.000000!!
  end RCC VCD at 50600.000000!!
Interrupt at simulation time 60000.0000 ns This $axis_rpd command creates a 2-level VCD file "f2.dump" on the scope dp0 from time 40000 to 50600. Since the simulation swaps back to software control during time 50000 to 50500, $axis_rpd skips that window because no simulation record is available.

VCD on-demand is also available after the user terminates the simulation process. To conduct off-line VCD on-demand, the user starts the simulation program named "vlg" with the +rccplay option. With this option, the RCC System is instructed to extract the simulation record instead of executing the normal initialization sequence for simulation. Once the user enters the simulation program, the user can use the same $axis_rpd command to obtain VCD on demand. An example of this procedure is as follows:

axis15:3-dp0_rt1c>vlg+rccplay+r1-s
  Start replay record ./AxisWork/r1 at time 100500
C1>$axis_rpd;
available simulation history:
1005.000000 to 50000.000000
50505.000000 to 60000.000000
Interrupt at simulation time 100500
C2>$axis_rpd(40000, 45000, "f2.dump");
  start RCC VCD at 40000.000000!!
  end RCC VCD at 45000.000000!!
Interrupt at simulation time 4500000
C3>

In the above example, the simulation record "r1" is used to extract the simulation history and produce the VCD on the entire design from time 40000 to 45000.

Simulation History Review

Once the VCD file of the simulation target range (i.e., simulation times t1 to t2) has been generated by the RCC System, the user need not fast simulate from simulation time t2 to t3. Instead, the RCC System allows the user to cease simulation and proceed directly to the beginning of the simulation target range, or simulation time t1. Thus, in contrast to the prior art, the user does not have to rerun the simulation from the very beginning (e.g., simulation time t0). The hardware states that have been dumped into the VCD file reflects the evaluation of the entire history of primary inputs from simulation time t0, including the primary inputs from simulation times t1 to t2.

The RCC System loads the VCD file. Thereafter, the saved primary outputs are delivered to the RCC Computing System 2600 so that the software model, and all of its many combinational logic circuits, can be regenerated with the correct state information. The user then views the software model with a waveform viewer for debugging. With the VCD on hand, the user can step through his software model very carefully step-by-step until the bug is isolated.

With this VCD on-demand feature, the user can select any simulation target range within the simulation session range and perform software simulation to isolate the bug. If the bug cannot be found in the selected simulation target range, the user can select another different simulation target range on demand. Because all of the primary inputs from the test bench process are recorded for the entire simulation session range, any portion of this simulation can be reproduced and viewed on demand without rerunning the simulation. This feature allows the user to repeatedly focus on multiple and different simulation target ranges until he has fixed the bug within this simulation session range.

Furthermore, this VCD on-demand feature is supported on-line in the middle of the simulation process as well as off-line after the simulation process has terminated. This on-line support is possible the hardware states at simulation time t0 can be saved in system disk and the primary inputs can be compressed and recorded for any length of the simulation session range. Thereafter, the user can then specify a simulation target range for a more focused analysis of the primary outputs.

The off-line support is possible because the hardware states at simulation time t0, the entire primary inputs for the simulation session range, and the hardware states at simulation time t1 are all saved in the system disk. Thus, the user can return to debugging his design by loading the design corresponding to simulation time t0 and then specifying the simulation target range. Also, the user can proceed directly to the next simulation target range by loading the hardware states corresponding to simulation time t3.

VI. Hardware Implementation Schemes

A. Overview

The SEmulation system implements an array of FPGA chips on a reconfigurable board. Based on the hardware model, the SEmulation system partitions, maps, places, and routes each selected portion of the user's circuit design onto the FPGA chips. Thus, for example, a 4×4 array of 16 chips may be modeling a large circuit spread out across these 16 chips. The interconnect scheme allows each chip to access another chip within 2 "jumps" or links.

Each FPGA chip implements an address pointer for each of the I/O address spaces (i.e., REG, CLK, S2H, H2S). The combination of all address pointers associated with a particular address space are chained together. So, during data transfer, word data in each chip is sequentially selected from/to the main FPGA bus and PCI bus, one word at a time for the selected address space in each chip, and one chip at a time, until the desired word data have been accessed for that selected address space. This sequential selection of word data is accomplished by a propagating word selection signal. This word selection signal travels through the address pointer in a chip and then propagates to the address pointer in the next chip and continues on till the last chip or the system initializes the address pointer.

The FPGA bus system in the reconfigurable board operates at twice the PCI bus bandwidth but at half the PCI bus speed. The FPGA chips are thus separated into banks to utilize the larger bandwidth bus. The throughput of this FPGA bus system can track the throughput of the PCI bus system so performance is not lost by reducing the bus speed. Expansion is possible through bigger boards which contains more FPGA chips or piggyback boards that extend the bank length.

B. Address Pointer

Figure 11:
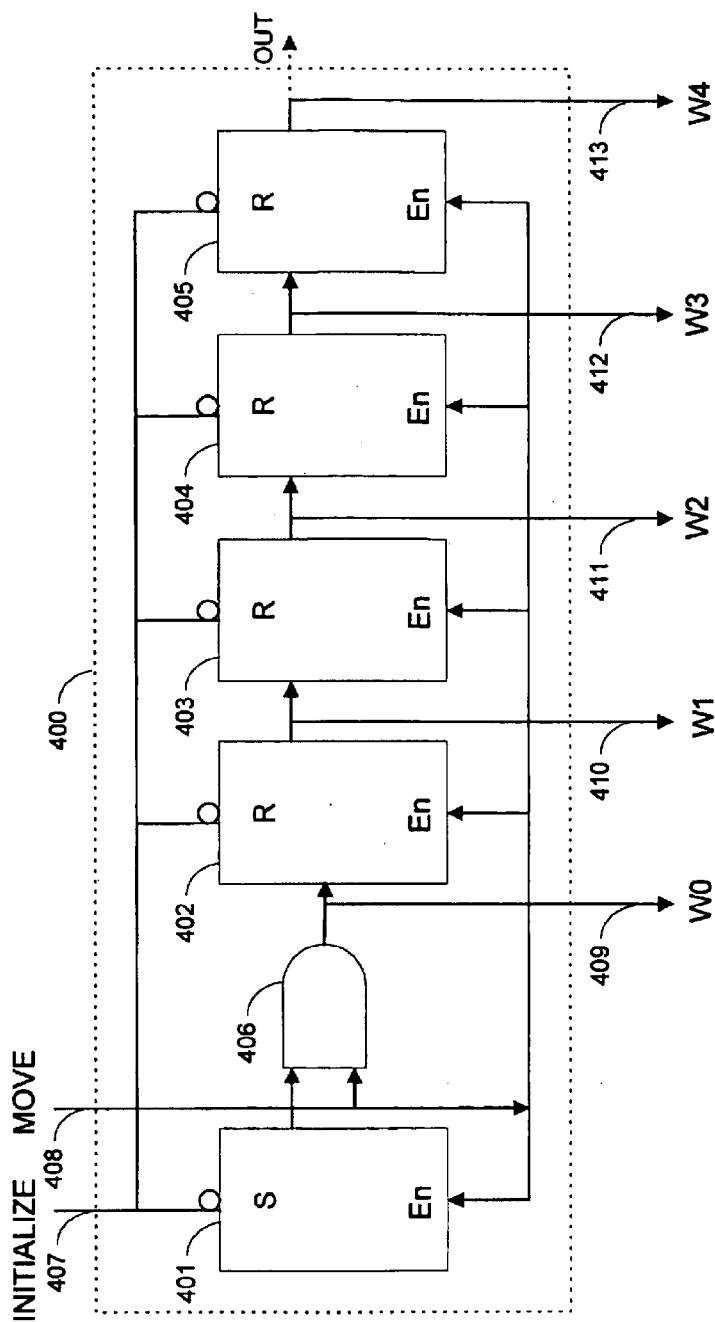
FIG. 11 shows one embodiment of address pointer of the present invention.

FIG. 11 shows one embodiment of the address pointer of the present invention. All I/O operations go through DMA streaming. Because the system has only one bus, the system accesses data sequentially one word at a time. Thus, one embodiment of the address pointer uses a shift register chain to sequentially access the selected words in these address spaces. The address pointer 400 includes flip-flops 401–405, an AND gate 406, and a couple of control signals, INITIALIZE 407 and MOVE 408.

Each address pointer has n outputs (W0, W1, W2, ..., Wn−1) for selecting a word out of n possible words in each FPGA chip corresponding to the same word in the selected address space. Depending on the particular user circuit design being modeled, the number of words n may vary from circuit design to circuit design and, for a given circuit design, n varies from FPGA chip to FPGA chip. In FIG. 11, the address pointer 400 is only a 5 word (i.e., n=5) address pointer. Thus, this particular FPGA chip which contains this 5-word address pointer for a particular address space has only 5 words to select. Needless to say, the address pointer 400 can implement any number of words n. This output signal Wn can also be called the word selection signal. When this word selection signal reaches the output of the last flip-flop in this address pointer, it is called an OUT signal to be propagated to the inputs of the address pointers of the next FPGA chip.

When the INITIALIZE signal is asserted, the address pointer is initialized. The first flip-flop 401 is set to "1" and all other flip-flops 402–405 are set to "0." At this point, the initialization of the address pointer will not enable any word selection; that is, all the Wn outputs are still at "0" after initialization. The address pointer initialization procedure will also be discussed with respect to FIG. 12.

The MOVE signal controls the advance of the pointer for word selection. This MOVE signal is derived from the READ, WRITE, and SPACE index control signals from the FPGA I/O controller. Because every operation is essentially a read or a write, the SPACE index signal essentially determines which address pointer will be applied with the MOVE signal. Thus, the system activates only one address pointer associated with a selected I/O address space at a time, and during that time, the system applies the MOVE signal only to that address pointer. The MOVE signal generation is discussed further with respect to FIG. 13. Referring to FIG. 11, when the MOVE signal is asserted, the MOVE signal is provided to an input to an AND gate 406 and the enable input of the flip-flops 401–405. Hence, a logic "1" will move from the word output Wi to Wi+1 every system clock cycle; that is, the pointer will move from Wi to Wi+1 to select the particular word every cycle. When the shifting word selection signal makes its way to the output 413 (labeled herein as "OUT") of the last flip-flop 405, this OUT signal should thereafter make its way to the next FPGA chip via a multiplexed cross chip address pointer chain, which will be discussed with respect to FIGS. 14 and 15, unless the address pointer is being initialized again.

Figure 12:
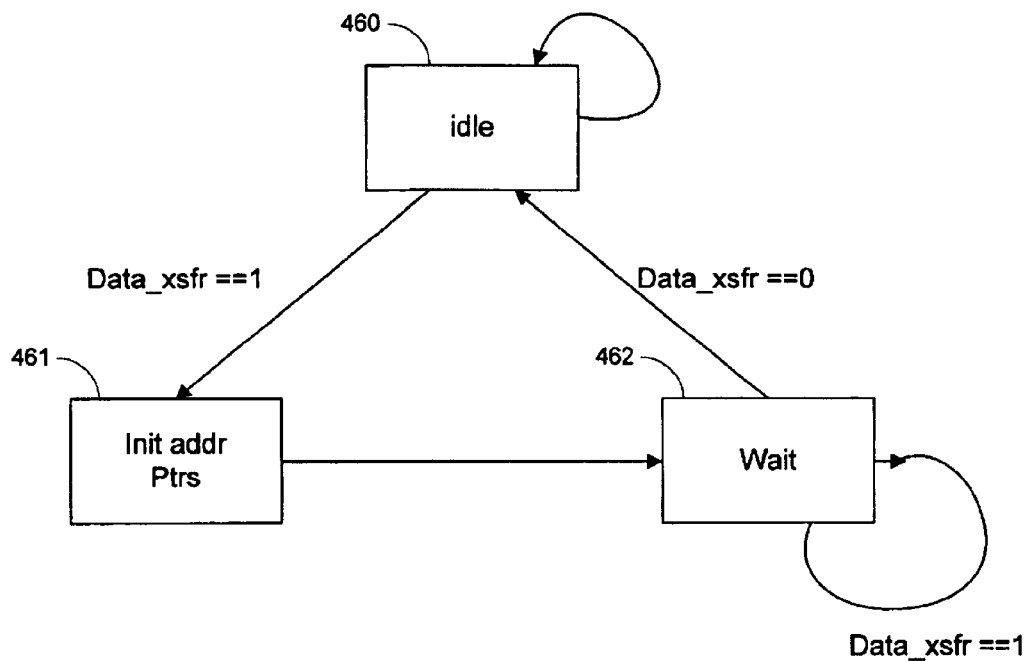
FIG. 12 shows a state transition diagram of the address pointer initialization for the address pointer of FIG. 11.

The address pointer initialization procedure will now be discussed. FIG. 12 shows a state transition diagram of the address pointer initialization for the address pointer of FIG. 11. Initially, state 460 is idle. When the DATA_XSFR is set to "1," the system goes to state 461, where the address pointer is initialized. Here, the INITIALIZE signal is asserted. The first flip-flop in each address pointer is set to "1" and all other flip-flops in the address pointer are set to "0." At this point, the initialization of the address pointer will not enable any word selection; that is, all the Wn outputs are still at "0." The next state is wait state 462 while the DATA_XSFR is still "1." When the DATA_XSFR is "0," the address pointer initialization procedure has completed and the system returns to the idle state 460.

Figure 22:
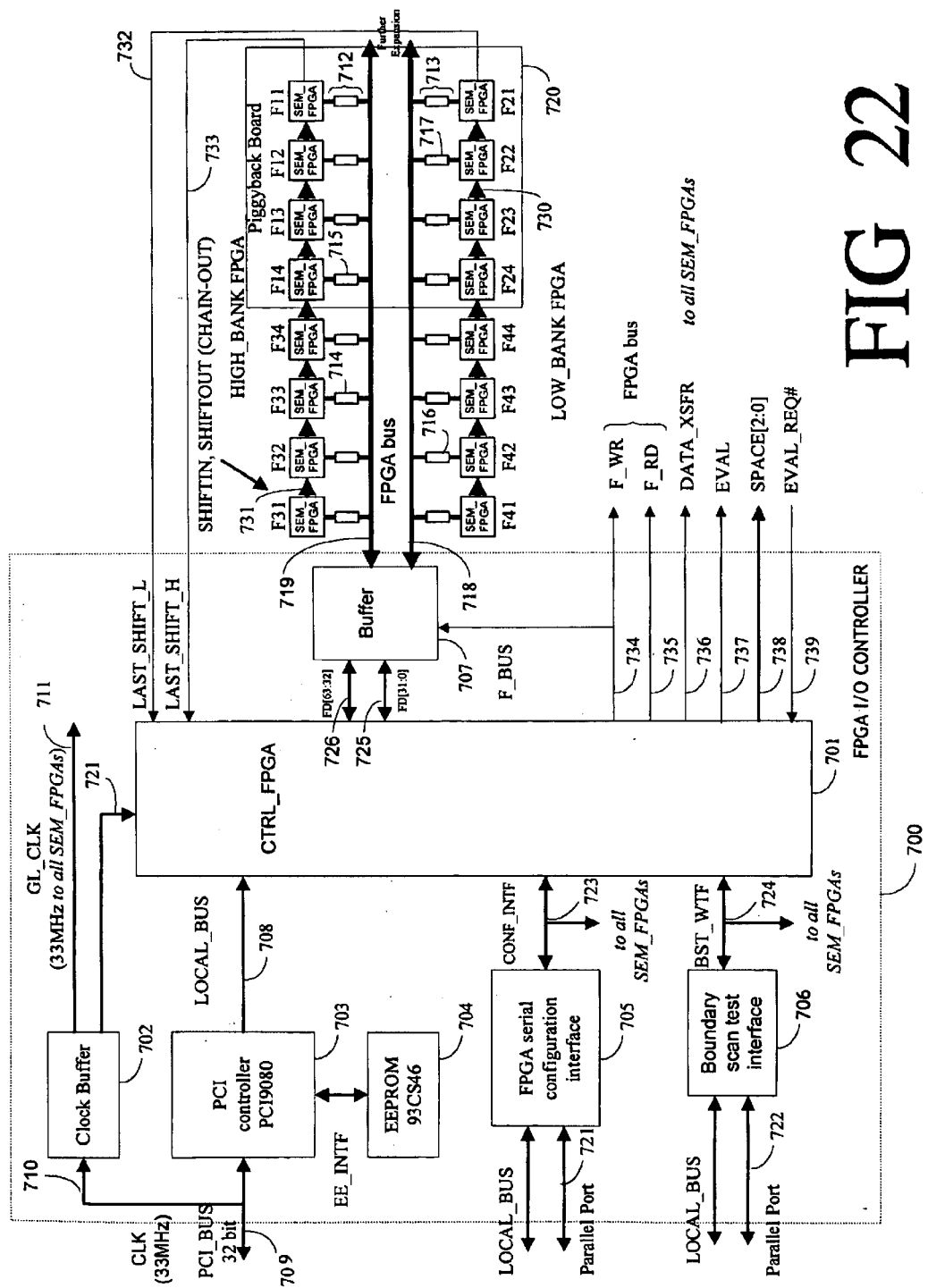
FIG. 22 shows one embodiment of the FPGA controller between the PCI bus and the FPGA array.

The MOVE signal generator for generating the various MOVE signals for the address pointer will now be discussed. The SPACE index, which is generated by the FPGA I/O controller (item 327 in FIG. 10; FIG. 22), selects the particular address space (i.e., REG read, REG write, S2H read, H2S write, and CLK write). Within this address space, the system of the present invention sequentially selects the particular word to be accessed. The sequential word selection is accomplished in each address pointer by the MOVE signal.

Figure 13:
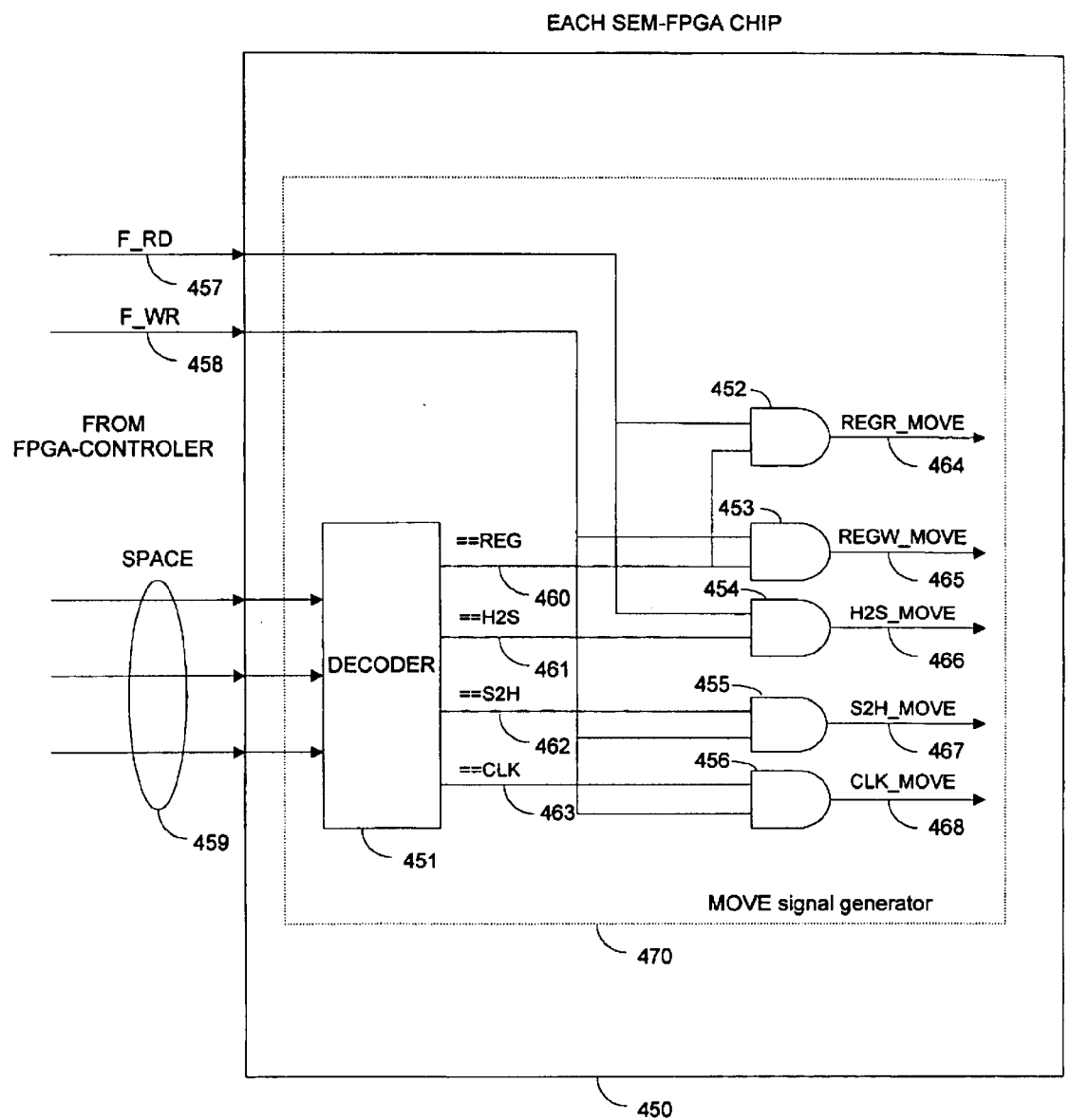
FIG. 13 shows one embodiment of the MOVE signal generator for derivatively generating the various MOVE signals for the address pointer.

One embodiment of the MOVE signal generator is shown in FIG. 13. Each FPGA chip 450 has address pointers that correspond to the various software/hardware boundary address spaces (i.e., REG, S2H, H2S, and CLK). In addition to the address pointer and the user's circuit design that is modeled and implemented in FPGA chip 450, the MOVE signal generator 470 is provided in the FPGA chip 450. The MOVE signal generator 470 includes an address space decoder 451 and several AND gates 452–456. The input signals are the FPGA read signal (F_RD) on wire line 457, FPGA write signal (F_WR) on wire line 458, and the address space signal 459. The output MOVE signal for each address pointer corresponds to REGR-move on wire line 464, REGW-move on wire line 465, S2H-move on wire line 466, H2S-move on wire line 467, and CLK-move on wire line 468, depending on which address space's address pointer is applicable. These output signals correspond to the MOVE signal on wire line 408 (FIG. 11).

The address space decoder 451 receives a 3-bit input signal 459. It can also receive just a 2-bit input signal. The 2-bit signal provides for 4 possible address spaces, whereas the 3-bit input provides for 8 possible address spaces. In one embodiment, CLK is assigned to "00," S2H is assigned to "01," H2S is assigned to "10," and REG is assigned to "11." Depending on the input signal 459, the output of the address space decoder outputs a "1" on one of the wire lines 460–463, corresponding to REG, H2S, S2H, and CLK, respectively, while the remaining wire lines are set to "0." Thus, if any of these output wire lines 460–463 is "0," the corresponding output of the AND gates 452–456 is "0." Analogously, if any of these input wire lines 460–463 is "1," the corresponding output of the AND gates 452–456 is "1." For example, if the address space signal 459 is a "10," then the address space H2S is selected. Wire line 461 is "1" while the remaining wire lines 460, 462, and 463 are "0." Accordingly, wire line 466 is "1," while the remaining output wire lines 464, 465, 467, and 468 are "0." Similarly, if wire line 460 is "1," The REG space is selected and depending on whether a read (F_RD) or write (F_WR) operation is selected, either the REGR-move signal on wire line 464 or the REGW-move signal on wire line 465 will be "1."

As explained earlier, the SPACE index is generated by the FPGA I/O controller. In code, the MOVE controls are:

REG space read pointer: REGR-move=(SPACE-index==#REG) & READ;

REG space write pointer: REGW-move=(SPACE-index==#REG) & WRITE;

S2H space read pointer: S2H-move=(SPACE-index==#S2H) & READ;

H2S space write pointer: H2S-move=(SPACE-index==#H2S) & WRITE;

CLK space write pointer: CLK-move=(SPACE-index==#CLK) & WRITE;

This is the code equivalent for the logic diagram of the MOVE signal generator on FIG. 13.

As mentioned above, each FPGA chip has the same number of address pointers as address spaces in the software/hardware boundary. If the software/hardware boundary has 4 address spaces (i.e., REG, S2H, H2S, and CLK), each FPGA chip has 4 address pointers corresponding to these 4 address spaces. Each FPGA needs these 4 address pointers because the particular selected word in the selected address space being processed may reside in any one or more of the FPGA chips, or the data in the selected address space affects the various circuit elements modeled and implemented in each FPGA chip. To ensure that the selected word is processed with the appropriate circuit element(s) in the appropriate FPGA chip(s), each set of address pointers associated with a given software/hardware boundary address space (i.e., REG, S2H, H2S, and CLK) is "chained" together across several FPGA chips. The particular shifting or propagating word selection mechanism via the MOVE signals, as explained above with respect to FIG. 11, is still utilized, except that in this "chain" embodiment, an address pointer associated with a particular address space in one FPGA chip is "chained" to an address pointer associated with the same address space in the next FPGA chip.

Implementing 4 input pins and 4 output pins to chain the address pointers would accomplish the same purpose. However, this implementation would be too costly in terms of efficient use of resources; that is, 4 wires would be needed between two chips, and 4 input pins and 4 output pins would be needed in each chip. One embodiment of the system in accordance with the present invention uses a multiplexed cross chip address pointer chain which allows the hardware model to use only-one wire between chips and only 1 input pin and 1 output pin in each chip (2 I/O pins in a chip). One embodiment of the multiplexed cross chip address pointer chain is shown in FIG. 14.

Figure 14:
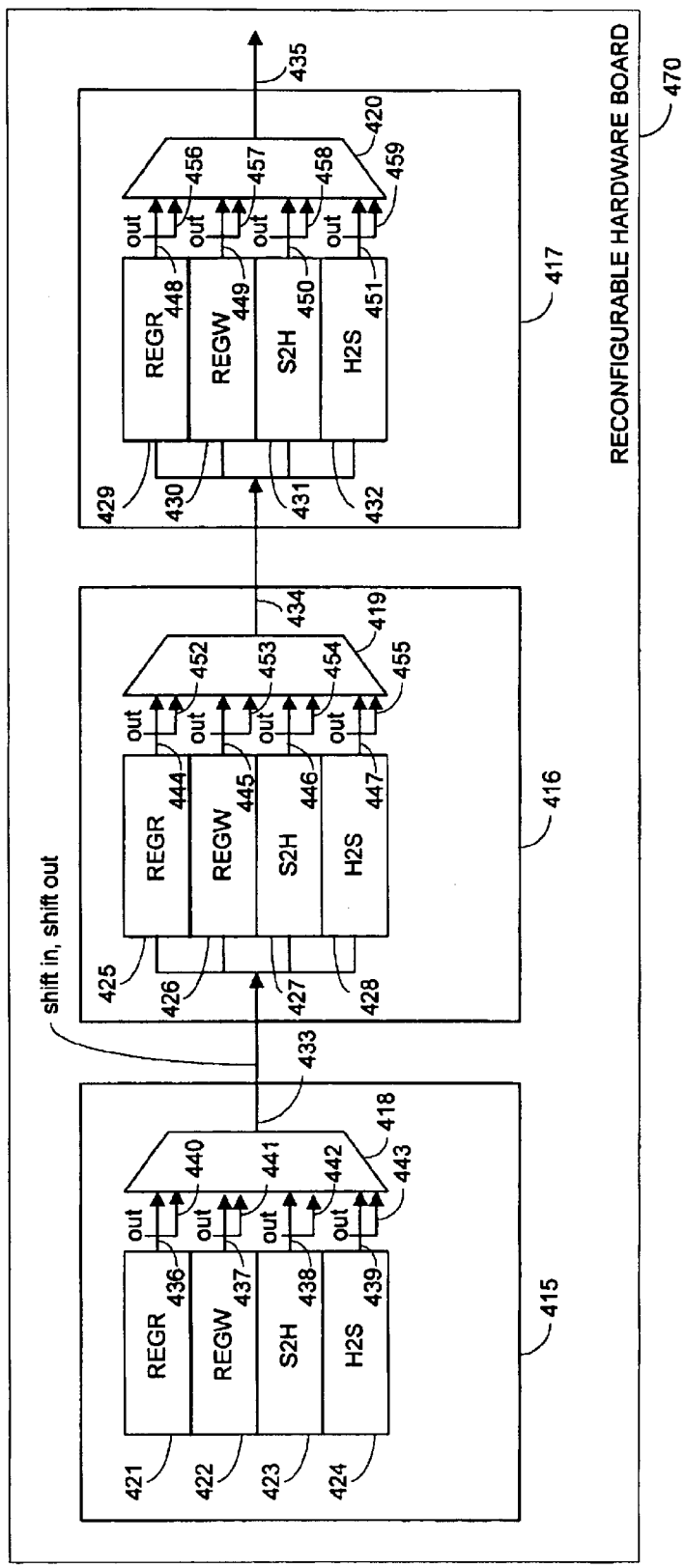
FIG. 14 shows the chain of multiplexed address pointers in each FPGA chip.

In the embodiment shown in FIG. 14, the user's circuit design had been mapped and partitioned in three FPGA chips 415–417 in the reconfigurable hardware board 470. The address pointers are shown as blocks 421–432. Each address pointer, for example address pointer 427, has a structure and function similar to the address pointer shown in FIG. 11, except that the number of words Wn and hence the number of flip-flops may vary depending on how many words are implemented in each chip for the user's custom circuit design.

For the REGR address space, the FPGA chip 415 has address pointer 421, FPGA chip 416 has address pointer 425, and FPGA chip 417 has address pointer 429. For the REGW address space, the FPGA chip 415 has address pointer 422, FPGA chip 416 has address pointer 426, and FPGA chip 417 has address pointer 430. For the S2H address space, the FPGA chip 415 has address pointer 423, FPGA chip 416 has address pointer 427, and FPGA chip 417 has address pointer 431. For the H2S address space, the FPGA chip 415 has address pointer 424, FPGA chip 416 has address pointer 428, and FPGA chip 417 has address pointer 432.

Figure 15:
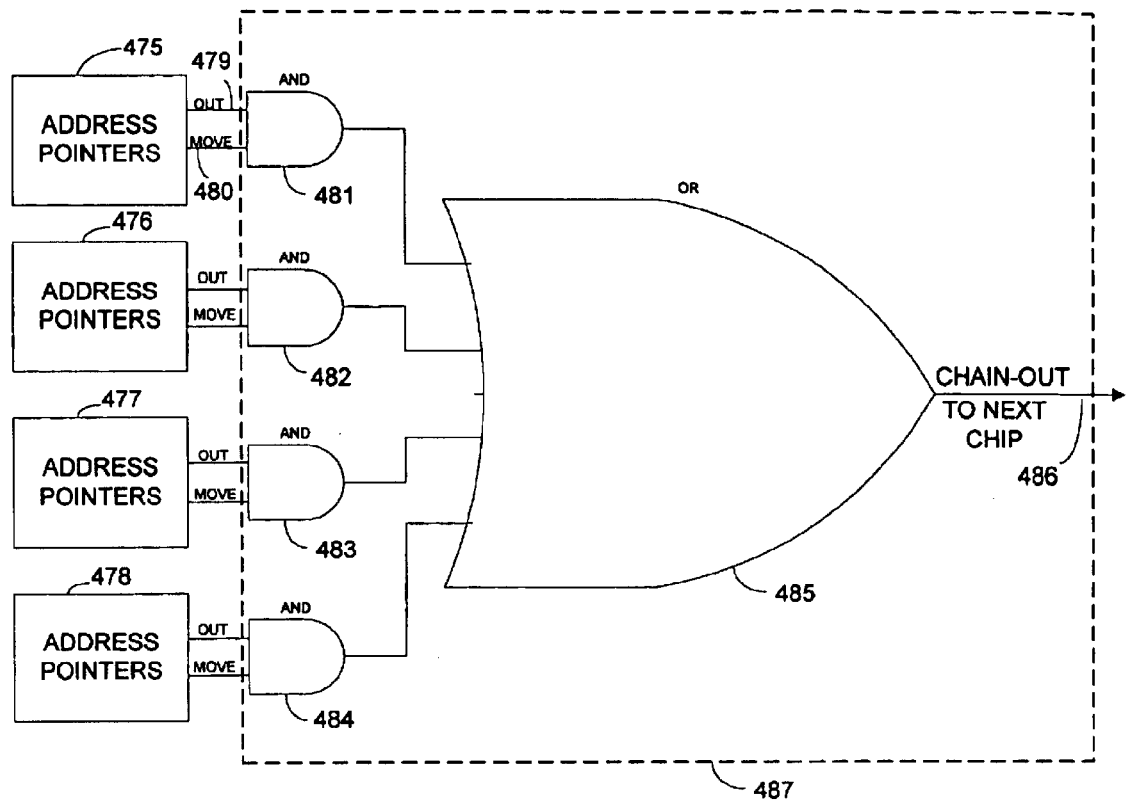
FIG. 15 shows one embodiment of the multiplexed cross chip address pointer chain in accordance with one embodiment of the present invention.

Each chip 415–417 has a multiplexer 418–420, respectively. Note that these multiplexers 418–420 may be models and the actual implementation may be a combination of registers and logic elements, as known to those ordinarily skilled in the art. For example, the multiplexer may be several AND gates feeding into an OR gate as shown in FIG. 15. The multiplexer 487 includes four AND gates 481–484 and an OR gate 485. The inputs to the multiplexer 487 are the OUT and MOVE signals from each address pointer in the chip. The output 486 of the multiplexer 487 is a chain-out signal which is passed to the inputs to the next FPGA chip.

In FIG. 15, this particular FPGA chip has four address pointers 475–478, corresponding to I/O address spaces. The outputs of the address pointers, the OUT and MOVE signals, are inputs to the multiplexer 487. For example, address pointer 475 has an OUT signal on wire line 479 and a MOVE signal on wire line 480. These signals are inputs to AND gate 481. The output of this AND gate 481 is an input to OR gate 485. The output of the OR gate 485 is the output of this multiplexer 487. In operation, the OUT signal at the output of each address pointer 475–478 in combination with their corresponding MOVE signals and the SPACE index serve as a selector signal for the multiplexer 487; that is, both the OUT and MOVE signals (which are derived from the SPACE index signals) have to be asserted active (e.g., logic "1") to propagate the word selection signal out of the multiplexer to the chain-out wire line. The MOVE signal will be asserted periodically to move the word selection signal through the flip-flops in the address pointer so that it can be characterized as the input MUX data signal.

Returning to FIG. 14, these multiplexers 418–420 have four sets of inputs and one output. Each set of inputs includes: (1) the OUT signal found on the last output Wn−1 wire line for the address pointer (e.g., wire line 413 in the address pointer shown in FIG. 11) associated with a particular address space, and (2) the MOVE signal. The output of each multiplexer 418–420 is the chain-out signal. The word selection signal Wn through the flip-flops in each address pointer becomes the OUT signal when it reaches the output of the last flip-flop in the address pointer. The chain-out signal on wire lines 433–435 will become "1", only when an OUT signal and a MOVE signal associated with the same address pointer are both asserted active (e.g., asserted "1").

For multiplexer 418, the inputs are MOVE signals 436–439 and OUT signals 440–443 corresponding to OUT and MOVE signals from address pointers 421–424, respectively. For multiplexer 419, the inputs are MOVE signals 444–447 and OUT signals 452–455 corresponding to OUT and MOVE signals from address pointers 425–428, respectively. For multiplexer 420, the inputs are MOVE signals 448–451 and OUT signals 456–459 corresponding to OUT and MOVE signals from address pointers 429–432, respectively.

In operation, for any given shift of words Wn, only those address pointers or chain of address pointers associated with a selected I/O address space in the software/hardware boundary are active. Thus, in FIG. 14, only the address pointers in chips 415, 416, and 417 associated with one of the address spaces REGR, REGW, S2H, or H2S are active for a given shift. Also, for a given shift of the word selection signal Wn through the flip-flops, the selected word is accessed sequentially because of limitations on the bus bandwidth. In one embodiment, the bus is 32 bits wide and a word is 32 bits, so only one word can be accessed at a time and delivered to the appropriate resource.

When an address pointer is in the middle of propagating or shifting the word selection signal through its flip-flops, the output chain-out signal is not activated (e.g., not "1") and thus, this multiplexer in this chip is not yet ready to propagate the word selection signal to the next FPGA chip. When the OUT signal is asserted active (e.g., "1"), the chain-out signal is asserted active (e.g., "1") indicating that the system is ready to propagate or shift the word selection signal to the next FPGA chip. Thus, accesses occur one chip at a time; that is, the word selection signal is shifted through the flip-flops in one chip before the word selection shift operation is performed for another chip. Indeed, the chain-out signal is asserted only when the word selection signal reaches the end of the address pointer in each chip. In code, the chain-out signal is:

Chain-out=(REGR-move & REGR-out)|(REGW-move & REGW-out)|(S2H-move & S2H-out)|(H2S-move & H2S-out);

In sum, for X number of I/O address spaces (i.e., REG, H2S, S2H, CLK) in the system, each FPGA has X address pointers, one address pointer for each address space. The size of each address pointer depends on the number of words required for modeling the user's custom circuit design in each FPGA chip. Assuming n words for a particular FPGA chip and hence, n words for the address pointer, this particular address pointer has n outputs (i.e., W0, W1, W2, . . . , Wn−1). These outputs Wi are also called word selection signals. When a particular word Wi is selected, the Wi signal is asserted active (i.e., "1"). This word selection signal shifts or propagates down the address pointer of this chip until it reaches the end of the address pointer in this chip, at which point, it triggers the generation of a chain-out signal that starts the propagation of the word selection signal Wi through the address pointer in the next chip. In this way, a chain of address pointers associated with a given I/O address space can be implemented across all of the FPGA chips in this reconfigurable hardware board.

C. Gate Data/clock Network Analysis

Figure 16:
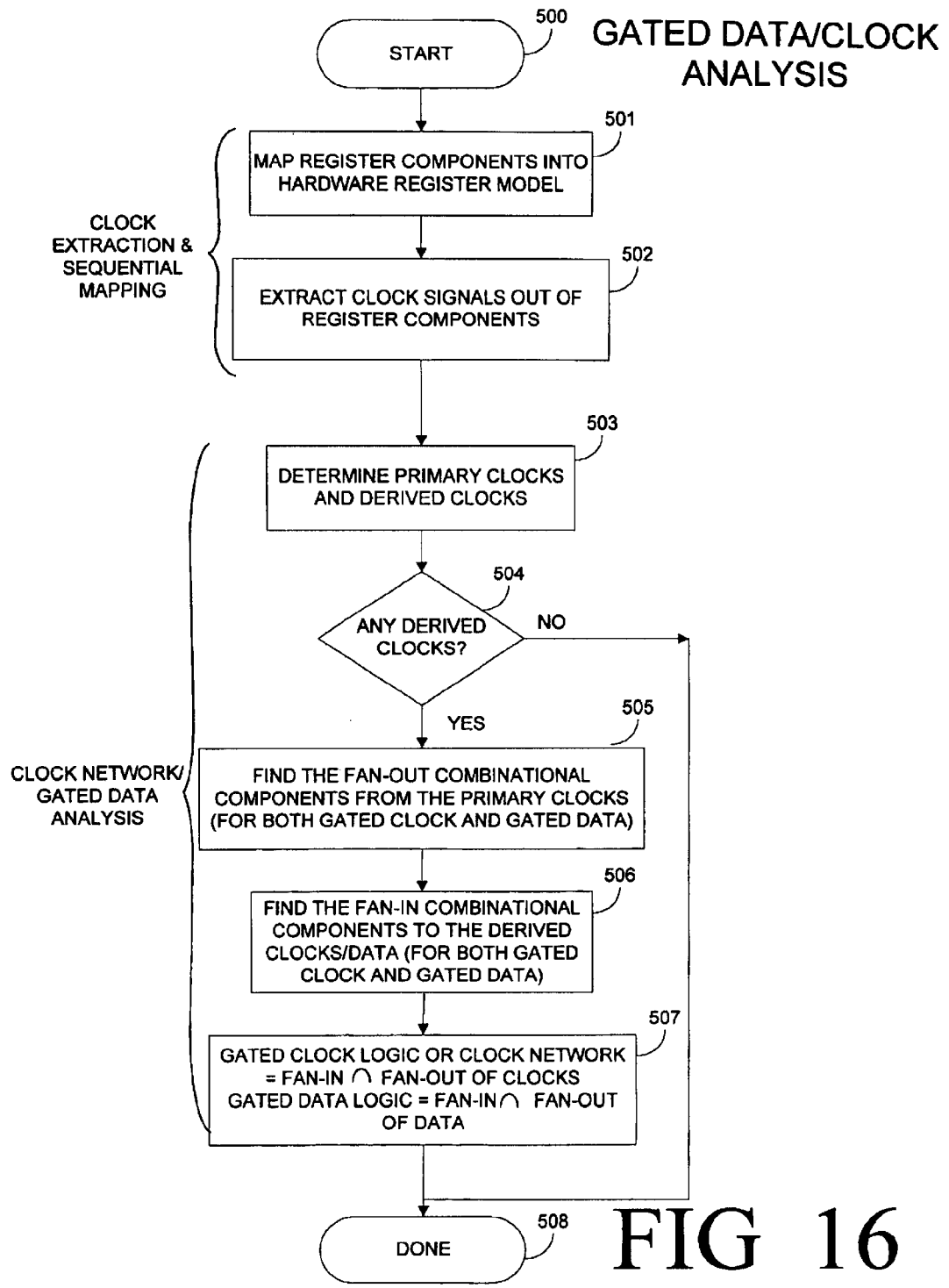
FIG. 16 shows a flow diagram of the clock/data network analysis that is critical for the software clock implementation and the evaluation of logic components in the hardware model.

The various embodiments of the present invention perform clock analysis in association with gated data logic and gated clock logic analysis. The gated clock logic (or clock network) and the gated data network determinations are critical to the successful implementation of the software clock and the logic evaluation in the hardware model during emulation. As discussed with respect to FIG. 4, the clock analysis is performed in step 305. To further elaborate on this clock analysis process, FIG. 16 shows a flow diagram in accordance with one embodiment of the present invention. FIG. 16 also shows the gated data analysis.

The SEmulation system has the complete model of the user's circuit design in software and some portions of the user's circuit design in hardware. These hardware portions include the clock components, especially the derived clocks. Clock delivery timing issues arise due to this boundary between software and hardware. Because the complete model is in software, the software can detect clock edges that affect register values. In addition to the software model of the registers, these registers are physically located in the hardware model. To ensure that the hardware registers also evaluate their respective inputs (i.e., moving the data at the D input to the Q output), the software/hardware boundary includes a software clock. The software clock ensures that the registers in the hardware model evaluate correctly. The software clock essentially controls the enable input of the hardware register rather than controlling the clock input to the hardware register components. This software clock avoids race conditions and accordingly, precise timing control to avoid hold-time violations is not needed. The clock network and gated data logic analysis process shown in FIG. 16 provides a way of modeling and implementing the clock and data delivery system to the hardware registers such that race conditions are avoided and a flexible software/hardware boundary implementation is provided.

As discussed earlier, primary clocks are clock signals from test-bench processes. All other clocks, such as those clock signals derived from combinational components, are derived or gated clocks. A primary clock can derive both gated clocks and gated data signals. For the most part, only a few (e.g., 1–10) derived or gated clocks are in the user's circuit design. These derived clocks can be implemented as software clocks and will stay in software. If a relatively large number (e.g., more than 10) of derived clocks are present in the circuit design, the SEmulation system will model them into hardware to reduce I/O overhead and maintain the SEmulation system's performance. Gated data is data or control input of a register other than the clock driven from the primary clock through some combinational logic.

The gated data/clock analysis process starts at step 500. Step 501 takes the usable source design database code generated from the HDL code and maps the user's register elements to the SEmulation system's register components. This one-to-one mapping of user registers to SEmulation registers facilitates later modeling steps. In some cases, this mapping is necessary to handle user circuit designs which describe register elements with specific primitives. Thus, for RTL level code, SEmulation registers can be used quite readily because the RTL level code is at a high enough level, allowing for varying lower level implementations. For gate level netlist, the SEmulation system will access the cell library of components and modify them to suit the particular circuit design-specific logic elements.

Step 502 extracts clock signals out of the hardware model's register components. This step allows the system to determine primary clocks and derived clocks. This step also determines all the clock signals needed by various components in the circuit design. The information from this step facilitates the software/hardware clock modeling step.

Step 503 determines primary clocks and derived clocks. Primary clocks originate from test-bench components and are modeled in software only. Derived clocks are derived from combinational logic, which are in turn driven by primary clocks. By default, the SEmulation system of the present invention will keep the derived clocks in software. If the number of derived clocks is small (e.g., less than 10), then these derived clocks can be modeled as software clocks. The number of combinational components to generate these derived clocks is small, so significant I/O overhead is not added by keeping these combinational components residing in software. If, however, the number of derived clocks is large (e.g., more than 10), these derived clocks may be modeled in hardware to minimize I/O overhead. Sometimes, the user's circuit design uses a large number of derived clock components derived from primary clocks. The system thus builds the clocks in hardware to keep the number of software clocks small.

Decision step 504 requires the system to determine if any derived clocks are found in the user's circuit design. If not, step 504 resolves to "NO" and the clock analysis ends at step 508 because all the clocks in the user's circuit design are primary clocks and these clocks are simply modeled in software. If derived clocks are found in the user's circuit design, step 504 resolves to "YES" and the algorithm proceeds to step 505.

Step 505 determines the fan-out combinational components from the primary clocks to the derived clocks. In other words, this step traces the clock signal datapaths from the primary clocks through the combinational components. Step 506 determines the fan-in combinational components from the derived clocks. In other words, this step traces the clock signal datapaths from the combinational components to the derived clocks. Determining fan-out and fan-in sets in the system is done recursively in software. The fan-in set of a net N is as follows:

```
FanIn Set of a net N:
    find all the components driving net N;
    for each component X driving net N do:
        if the component X is not a combinational component then
            return;
        else
            for each input net Y of the component X
                add the FanIn set W of net Y to the FanIn Set of net N
            end for
            add the component X into N;
        end if
endfor
```

A gated clock or data logic network is determined by recursively determining the fan-in set and fan-out set of net N, and determining their intersection. The ultimate goal here is to determine the so-called Fan-In Set of net N. The net N is typically a clock input node for determining the gated clock logic from a fan-in perspective. For determining the gated data logic from a fan-in perspective, net N is a clock input node associated with the data input at hand. If the node is on a register, the net N is the clock input to that register for the data input associated with that register. The system finds all the components driving net N. For each component X driving net N, the system determines if the component X is a combinational component or not. If each component X is not a combinational component, then the fan-in set of net N has no combinational components and net N is a primary clock.

If, however, at least one component X is a combinational component, the system then determines the input net Y of the component X. Here, the system is looking further back in the circuit design by finding the input nodes to the component X. For each input net Y of each component X, a fan-in set W may exist which is coupled to net Y. This fan-in set W of net Y is added to the Fan-In Set of net N, then the component X is added into set N.

The fan-out set of a net N is determined in a similar manner. The fan-out set of net N is determined as follows:

gated clock logic from a fan-out perspective. Thus, the set of all logic elements using net N will be determined. For determining the gated data logic from a fan-out perspective, net N is a clock output node associated with the data output at hand. If the node is on a register, the net N is the output of that register for the primary clock-driven input associated with that register. The system finds all the components using net N. For each component X using net N, the system determines component X is a combinational component or not. If each component X is not a combinational component, then the fan-out set of net N has no combinational components and net N is a primary clock.

If, however, at least one component X is a combinational component, the system then determines the output net Y of the component X. Here, the system is looking further forward from the primary clock in the circuit design by finding the output nodes from the component X. For each output net Y from each component X, a fan-out set W may exist which is coupled to net Y. This fan-out set W of net Y is added to the Fan-Out Set of net N, then the component X is added into set N.

Step 507 determines the clock network or gated clock logic. The clock network is the intersection of the fan-in and fan-out combinational components.

Analogously, the same fan-in and fan-out principle can be used to determine the gated data logic. Like the gated clocks, gated data is the data or control input of a register (except for the clock) driven by a primary clock through some combinational logic. Gated data logic is the intersection of the fan-in of the gated data and fan-out from the primary clock. Thus, the clock analysis and gated data analysis result in a gated clock network/logic through some combinational

```
FanOut Set of a net N:
    find all the components using the net N;
    for each component X using the net N do:
        if the component X is not a combinational component then
            return;
        else
            for each output net Y of component X
                add the FanOut Set of net Y to the FanOut Set of Net N
            end for
            add the component X into N;
        end if
end for
```

Again, the gated clock or data logic network is determined by recursively determining the fan-in set and fan-out set of net N, and determining their intersection. The ultimate goal here is to determine the so-called Fan-Out Set of net N. The net N is typically a clock output node for determining the logic and a gated data logic. As described later, the gated clock network and the gated data network determinations are critical to the successful implementation of the software clock and the logic evaluation in the hardware model during emulation. The clock/data network analysis ends at step 508.

Figure 17:
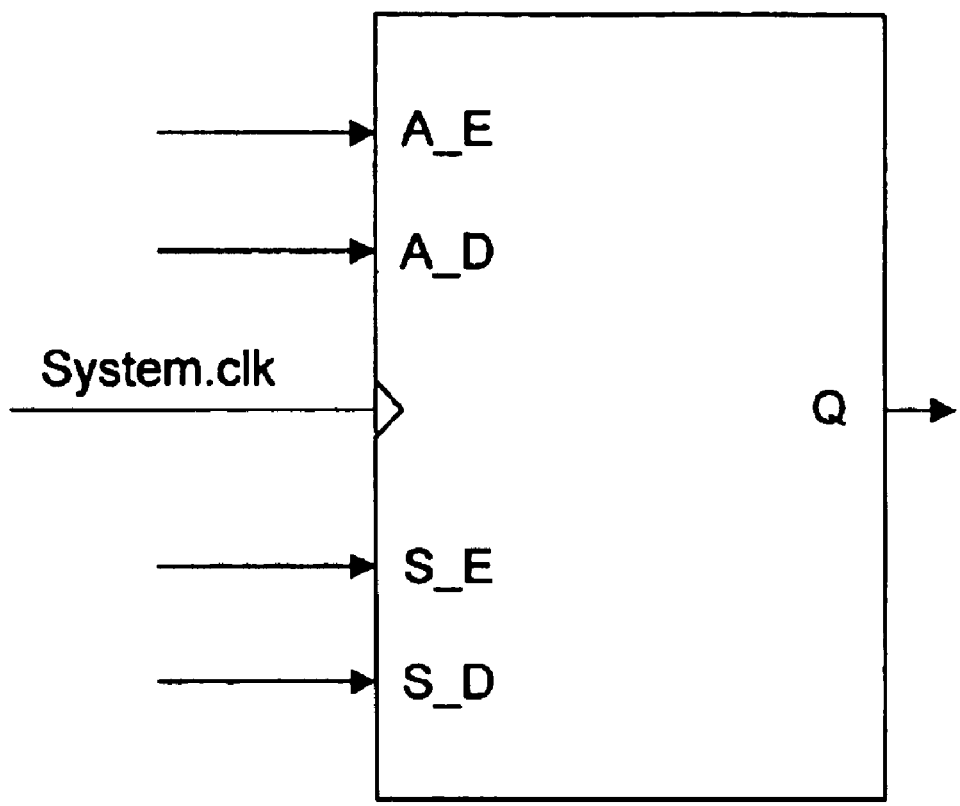
FIG. 17 shows a basic building block of the hardware model in accordance with one embodiment of the present invention.

FIG. 17 shows a basic building block of the hardware model in accordance with one embodiment of the present invention. For the register component, the SEmulation system uses a D-type flip-flop with asynchronous load control as the basic block for building both edge trigger (i.e., flip-flops) and level sensitive (i.e., latches) register hardware models. This register model building block has the following ports: Q (the output state); A_E (asynchronous enable); A_D (asynchronous data); S_E (synchronous enable); S_D (synchronous data); and of course, System.clk (system clock).

This SEmulation register model is triggered by a positive edge of the system clock or a positive level of the asynchronous enable (A_E) input. When either of these two positive edge or positive level triggering events occurs, the register model looks for the asynchronous enable (A_E) input. If the asynchronous enable (A_E) input is enabled, the output Q takes on the value of the asynchronous data (A_D); otherwise, if the synchronous enable (S_E) input is enabled, the output Q takes on the value of the synchronous data (S_D). If, on the other hand, neither the asynchronous enable (A_E) nor the synchronous enable (S_E) input is enabled, the output Q is not evaluated despite the detection of a positive edge of the system clock. In this way, the inputs to these enable ports control the operation of this basic building block register model.

The system uses software clocks, which are special enable registers, to control the enable inputs of these register models. In a complex user circuit design, millions of elements are found in the circuit design and accordingly, the SEmulator system will implement millions of elements in the hardware model. Controlling all of these elements individually is costly because the overhead of sending millions of control signals to the hardware model will take a longer time than evaluating these elements in software. However, even this complex circuit design usually calls for only a few (from 1–10) clocks and clocks alone are sufficient to control the state changes of a system with register and combinational components only. The hardware model of the SEmulator system uses only register and combinational components. The SEmulator system also controls the evaluation of the hardware model through software clocks. In the SEmulator system, the hardware models for registers do not have the clock directly connected to other hardware components; rather, the software kernel controls the value of all clocks. By controlling a few clock signals, the kernel has the full control over the evaluation of the hardware models with negligible amount of coprocessor intervention overhead.

Depending on whether the register model is used as a latch or a flip-flop, the software clock will be input to either the asynchronous enable (A_E) or synchronous enable (S_E) wire lines. The application of the software clock from the software model to the hardware model is triggered by edge detection of clock components. When the software kernel detects the edge of clock components, it sets the clock-edge register through the CLK address space. This clock-edge register controls the enable input, not the clock input, to the hardware register model. The global system clock still provides the clock input to the hardware register model. However, the clock-edge register provides the software clock signal to the hardware register model through a double-buffered interface. As will be explained later, a double-buffer interface from the software clock to the hardware model ensures that all the register models will be updated synchronously with respect to the global system clock. Thus, the use of the software clock eliminates the risk of hold time violations.

FIGS. 18(A) and 18(B) show the implementation of the building block register model for latches and flip-flops. These register models are software clock-controlled via the appropriate enable inputs. Depending on whether the register model is used as a flip-flop or latch, the asynchronous ports (A_E, A_D) and synchronous ports (S_E, S_D) are either used for the software clock or I/O operations. FIG. 18(A) shows the register model implementation if it is used as a latch. Latches are level-sensitive; that is, so long as the clock signal has been asserted (e.g., "1"), the output Q follows the input (D). Here, the software clock signal is provided to the asynchronous enable (A_E) input and the data input is the provided to the asynchronous data (A_D) input. For I/O operations, the software kernel uses the synchronous enable (S_E) and synchronous data (S_D) inputs to download values into the Q port. The S_E port is used as a REG space address pointer and the S_D is used to access data to/from the local data bus.

FIG. 18(B) shows the register model implementation if it is used as a design flip-flop. Design flip-flops use the following ports for determining the next state logic: data (D), set (S), reset (R), and enable (E). All the next state logic of a design flip-flop is factored into a hardware combinational component which feeds into the synchronous data (S_D) input. The software clock is input to the synchronous enable (S_E) input. For I/O operations, the software kernel uses the asynchronous enable (A_E) and asynchronous data (A_D) inputs to download values into the Q port. The A_E port is used as a REG space write address pointer and the A_D port is used to access data to/from the local data bus.

The software clock will now be discussed. One embodiment of the software clock of the present invention is a clock enable signal to the hardware register model such that the data at the inputs to these hardware register models are evaluated together and synchronously with the system clock. This eliminates race conditions and hold-time violations. One implementation of the software clock logic includes clock edge detection logic in software which triggers additional logic in the hardware upon clock edge detection. Such enable signal logic generates an enable signal to the enable inputs to hardware register models before the arrival of the data to these hardware register models. The gated clock network and the gated data network determinations are critical to the successful implementation of the software clock and the logic evaluation in the hardware model during hardware acceleration mode. As explained earlier, the clock network or gated clock logic is the intersection of the fan-in of the gated clock and fan-out of the primary clock. Analogously, the gated data logic is also the intersection of the fan-in of the gated data and fan-out of the primary clock for the data signals. These fan-in and fan-out concepts are discussed above with respect to FIG. 16.

As discussed earlier, primary clocks are generated by test-bench processes in software. Derived or gated clocks are generated from a network of combinational logic and registers which are in turn driven by the primary clocks. By default, the SEmulation system of the present invention will also keep the derived clocks in software. If the number of derived clocks is small (e.g., less than 10), then these derived clocks can be modeled as software clocks. The number of combinational components to generate these derived clocks is small, so significant I/O overhead is not added by modeling these combinational components in software. If, however, the number of derived clocks is large (e.g., more than 10), these derived clocks and their combinational components may be modeled in hardware to minimize I/O overhead.

Ultimately, in accordance with one embodiment of the present invention, clock edge detection occurring in software (via the input to the primary clock) can be translated to clock detection in hardware (via the input to a clock edge register). The clock edge detection in software triggers an event in hardware so that the registers in the hardware model receive the clock enable signal before the data signal to ensure that the evaluation of the data signal occurs in synchronization with the system clock to avoid hold-time violations.

As stated earlier, the SEmulation system has the complete model of the user's circuit design in software and some portions of the user's circuit design in hardware. As specified in the kernel, the software can detect clock edges that affect hardware register values. To ensure that the hardware registers also evaluate their respective inputs, the software/hardware boundary includes a software clock. The software clock ensures that the registers in the hardware model evaluate in synchronization with the system clock and without any hold-time violations. The software clock essentially controls the enable input of the hardware register components, rather than controlling the clock input to the hardware register components. The double-buffered approach to implementing the software clocks ensures that the registers evaluate in synchronization with the system clock to avoid race conditions and eliminates the need for precise timing controls to avoid hold-time violations.

Figure 19:
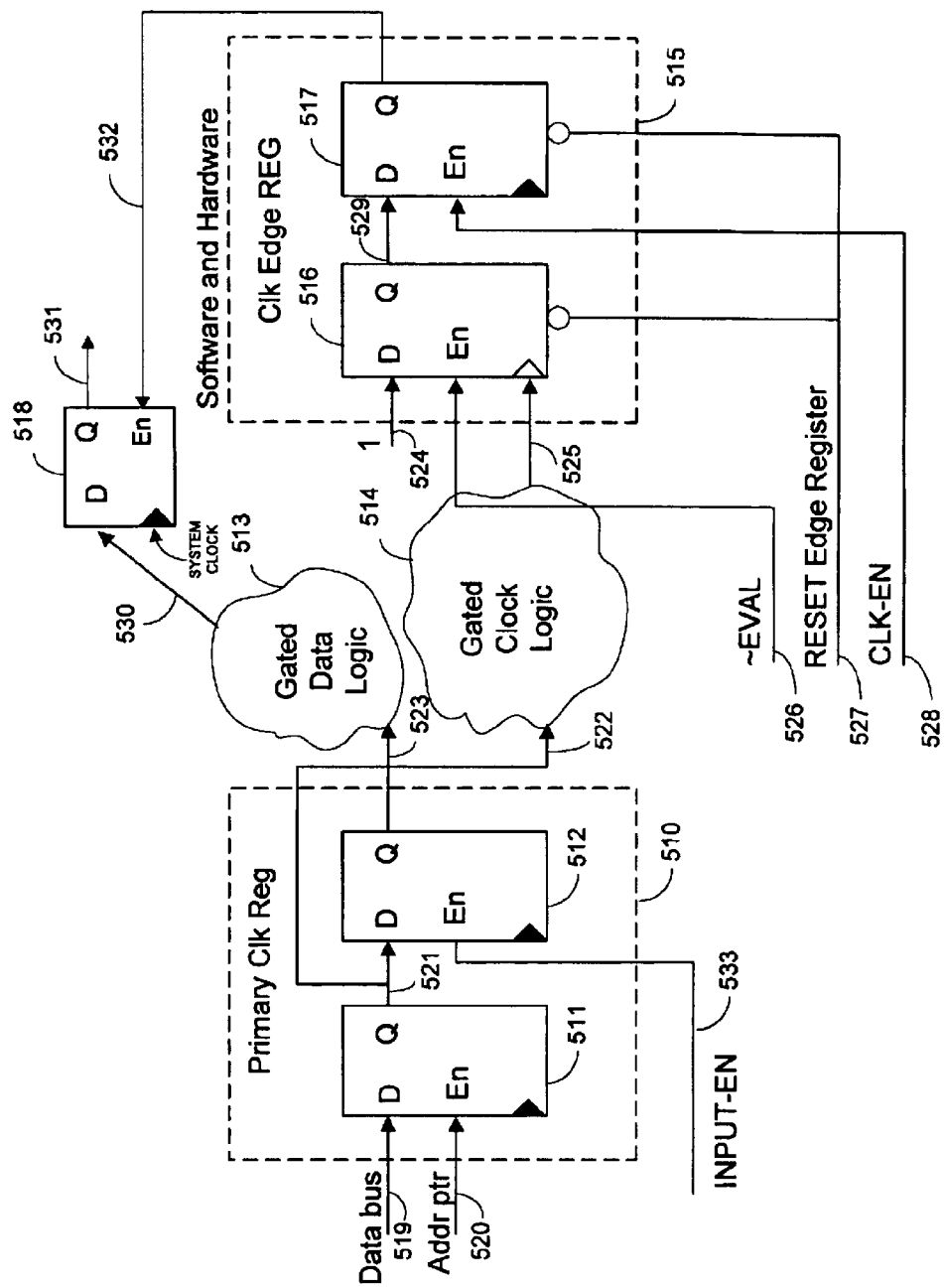
FIG. 19 shows one embodiment of the clock edge detection logic in accordance with one embodiment of the present invention.

FIG. 19 shows one embodiment of the clock implementation system in accordance with the present invention. Initially, the gated clock logic and the gated data logic are determined by the SEmulator system, as discussed above with respect to FIG. 16. The gated clock logic and the gated data logic are then separated. When implementing the double buffer, the driving source and the double-buffered primary logic must also be separated. Accordingly, the gated data logic 513 and gated clock logic 514, from the fan-in and fan-out analysis, have been separated.

The modeled primary clock register 510 includes a first buffer 511 and a second buffer 512, which are both D registers. This primary clock is modeled in software but the double-buffer implementation is modeled in both software and hardware. Clock edge detection occurs in the primary clock register 510 in software to trigger the hardware model to generate the software clock signal to the hardware model. Data and address enter the first buffer. 511 at wire lines 519 and 520, respectively. The Q output of this first buffer 511 on wire line 521 is coupled to the D input of second buffer 512. The Q output of this first buffer 511 is also provided on wire line 522 to the gated clock logic 514 to eventually drive the clock input of the first buffer 516 of the clock edge register 515. The Q output of the second buffer 512 on wire line 523 is provided to the gated data logic 513 to eventually drive the input of register 518 via wire line 530 in the user's custom-designed circuit model. The enable input to the second buffer 512 in the primary clock register 510 is the INPUT-EN signal on wire line 533 from a state machine, which determines evaluation cycles and controls various signals accordingly.

The clock edge register 515 also includes a first buffer 516 and a second buffer 517. The clock edge register 515 is implemented in hardware. When a clock edge detection occurs in software (via the input to the primary clock register 510), this can trigger the same clock edge detection in hardware (via clock edge register 515) in hardware. The D input to the first buffer 516 on wire line 524 is set to logic "1." The clock signal on wire line 525 is derived from the gated clock logic 514 and ultimately from the primary clock register 510 at the output on wire line 522 of the first buffer 511. This clock signal on wire line 525 is the gated clock signal. The enable wire line 526 for the first buffer 516 is the ~EVAL signal from the state machine that controls the I/O and evaluation cycles (to be discussed later). The first buffer 516 also has a RESET signal on wire line 527. This same RESET signal is also provided to the second buffer 517 in the clock edge register 515. The Q output of the first buffer 516 on wire line 529 is provided to the D input to the second buffer 517. The second buffer 517 also has an enable input on wire line 528 for the CLK-EN signal and a RESET input on wire line 527. The Q output of the second buffer 517 on wire line 532 is provided to the enable input of the register 518 in the user's custom-designed circuit model. Buffers 511, 512, and 517 along with register 518 are clocked by the system clock. Only buffer 516 in the clock edge register 515 is clocked by a gated clock from a gated clock logic 514.

Register 518 is a typical D-type register model that is modeled in hardware and is part of the user's custom circuit design. Its evaluation is strictly controlled by this embodiment of the clock implementation scheme of the present invention. The ultimate goal of this clock set-up is to ensure that the clock enable signal at wire line 532 arrives at the register 518 before the data signal at wire line 530 so that the evaluation of the data signal by this register will be synchronized with the system clock and without race conditions.

To reiterate, the modeled primary clock register 510 is modeled in software but its double buffer implementation is modeled in both software and hardware. The clock edge register 515 is implemented in hardware. The gated data logic 513 and gated clock logic 514, from the fan-in and fan-out analysis, have also been separated for modeling purposes, and can be modeled in software (if the number of gated data and gated clocks is small) or hardware (if the number of gated data and gated clocks is large). The gated clock network and the gated data network determinations are critical to the successful implementation of the software clock and the logic evaluation in the hardware model during hardware acceleration mode.

The software clock implementation relies primarily on the clock set-up shown on FIG. 19 along with the timing of the assertions of signals ~EVAL, INPUT-EN, CLK-EN, and RESET. The primary clock register 510 detects clock edges to trigger the software clock generation for the hardware model. This clock edge detection event triggers the "activation" of the clock edge register 515 via the clock input on wire line 525, gated clock logic 514, and wire line 522 so that the clock edge register 515 also detects the same clock edge. In this way, clock detection occurring in software (via the inputs 519 and 520 to the primary clock register 510) can be translated to clock edge detection in hardware (via the input 525 in clock edge register 515). At this point, the INPUT-EN wire line 533 to second buffer 512 in the primary clock register 510 and the CLK-EN wire line 528 to second buffer 517 in the clock edge register 515 have not been asserted and thus, no data evaluation will take place. Thus, the clock edges will be detected before the data are evaluated in the hardware register model. Note that at this stage, the data from the data bus on wire line 519 has not even propagated out to the gated data logic 513 and into the hardware-modeled user register 518. Indeed, the data have not even reached the second buffer 512 in the primary clock register 510 because the INPUT-EN signal on wire line 533 has not been asserted yet.

During the I/O stage, the ~EVAL signal on wire line 526 is asserted to enable the first buffer 516 in the clock edge register 515. The ~EVAL signal also goes through the gated clock logic 514 to monitor the gated clock signal as it makes its way through the gated clock logic to the clock input on wire line 525 of first buffer 516. Thus, as will be explained later with respect to the 4-state evaluation state machine, the ~EVAL signal can be maintained as long as necessary to stabilize the data and the clock signals through that portion of the system illustrated in FIG. 19.

When the signal has stabilized, I/O has concluded, or the system is otherwise ready to evaluate the data, the ~EVAL is deasserted to disable the first buffer 516. The CLK-EN signal is asserted and applied to second buffer 517 via wire line 528 to enable the second buffer 517 and send the logic "1" value on wire line 529 to the Q output on wire line 532 to the enable input for register 518. Register 518 is now enabled and any data present on wire line 530 will be synchronously clocked into the register 518 by the system clock. As the reader can observe, the enable signal to the register 518 runs faster than the evaluation of the data signal to this register 518.

The INPUT-EN signal on wire line 533 is not asserted to the second buffer 512. Also, the RESET edge register signal on wire line 527 is asserted to buffers 516 and 517 in the clock edge register 515 to reset these buffers and ensuring that their outputs are logic "0." Now that the INPUT-EN signal has been asserted for buffer 512, the data on wire line 521 now propagates to the gated data logic 513 to the user's circuit register 518 on wire line 530. Because the enable input to this register 518 is now logic "0," the data on wire line 530 is cannot be clocked into the register 518. The previous data, however, has already been clocked in by the previously asserted enable signal on wire line 532 before the RESET signal was asserted to disable register 518. Thus the input data to register 518, as well as the inputs to other registers that are part of the user's hardware-model circuit design stabilize to their respective register input ports. When a clock edge is subsequently detected in software, the primary clock register 510 and the clock edge register 515 in hardware activate the enable input to the register 518 so that the data waiting at the input of register 518 and other data waiting at the inputs to their respective registers are clocked in together and synchronously by the system clock.

Figure 20:
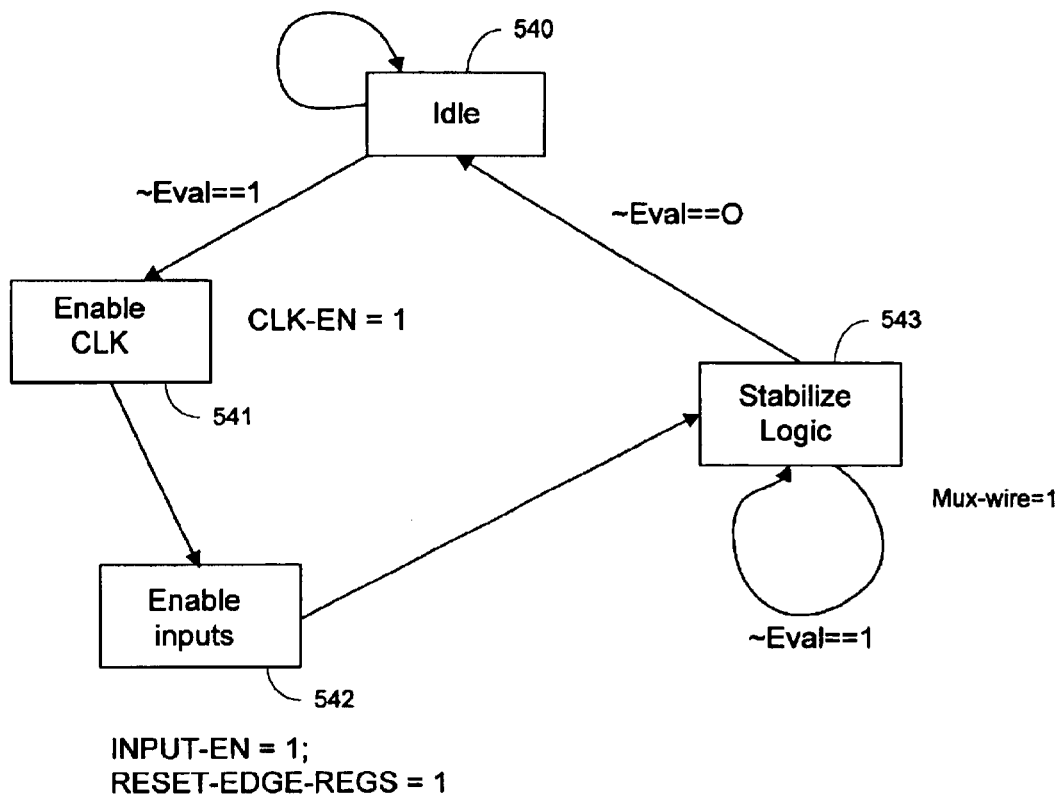
FIG. 20 shows a four state finite state machine to control the clock edge detection logic of FIG. 19 in accordance with one embodiment of the present invention.

As discussed earlier, the software clock implementation relies primarily on the clock set-up shown on FIG. 19 along with the timing of the assertions of the ~EVAL, INPUT-EN, CLK-EN, and RESET signals. FIG. 20 shows a four state finite state machine to control the software clock logic of FIG. 19 in accordance with one embodiment of the present invention.

At state 540, the system is idle or some I/O operation is under way. The ~EVAL signal is logic "0." The ~EVAL signal determines the evaluation cycle, is generated by the system controller, and lasts as many clock cycles as needed to stabilize the logic in the system. Usually, the duration of the ~EVAL signal is determined by the placement scheme during compilation and is based on the length of the longest direct wire and the length of the longest segmented multi-plexed wires (i.e., TDM circuits). During evaluation, ~EVAL signal is at logic "1."

At state 541, the clock is enabled. The CLK-EN signal is asserted at logic "1" and thus, the enable signal to the hardware register model is asserted. Here, previously gated data at the hardware register model is evaluated synchronously without risk of hold-time violation.

At state 542, the new data is enabled when INPUT-EN signal is asserted at logic "1." The RESET signal is also asserted to remove the enable signal from the hardware register model. However, the new data that had been enabled into the hardware register model through the gated data logic network continues to propagate to its intended hardware register model destination or has reached its destination and is waiting to be clocked into the hardware register model if and when the enable signal is asserted again.

At state 543, the propagating new data is stabilizing in the logic while the ~EVAL signal remain at logic "1." The muxed-wire, as discussed above for the time division multiplexed (TDM) circuit in association with FIGS. 9(A), 9(B), and 9(C), is also at logic "1." When the ~EVAL signal is deasserted or set to logic "0," the system returns to the idle state 540 and waits to evaluate upon the detection of a clock edge by the software.

D. FPGA Array and Control

The SEmulator system initially compiles the user circuit design data into software and hardware models based on a variety of controls including component type. During the hardware compilation process, the system performs the mapping, placement, and routing process as described above with respect to FIG. 6 to optimally partition, place, and interconnect the various components that make up the user's circuit design. Using known programming tools, the bit-stream configuration files or Programmer Object Files (.pof) (or alternatively, raw binary files (.rbf)) are referenced to reconfigure a hardware board containing a number of FPGA chips. Each chip contains a portion of the hardware model corresponding to the user's circuit design.

In one embodiment, the SEmulator system uses a 4×4 array of FPGA chips, totaling 16 chips. Exemplary FPGA chips include Xilinx XC4000 series family of FPGA logic devices and the Altera FLEX 10K devices.

The Xilinx XC4000 series of FPGAs can be used, including the XC4000, XC4000A, XC4000D, XC4000H, XC4000E, XC4000EX, XC4000L, and XC4000XL. Particular FPGAs include the Xilinx XC4005H, XC4025, and Xilinx 4028EX. The Xilinx XC4028EX FPGA engines approach half a million gates in capacity on a single PCI board. Details of these Xilinx FPGAs can be obtained in their data book, Xilinx, The Programmable Logic Data Book (9/96), which is incorporated herein by reference. For Altera FPGAs, details can be found in their data book, Altera, The 1996 Data Book (June 1996), which is incorporated herein by reference.

A brief general description of the XC4025 FPGA will be provided. Each array chip consists of a 240-pin Xilinx chip. The array board populated with Xilinx XC4025 chips contains approximately 440,000 configurable gates, and is capable of performing computationally-intensive tasks. The Xilinx XC4025 FPGA consists of 1024 configurable logic blocks (CLBs). Each CLB can implement 32 bits of asynchronous SRAM, or a small amount of general Boolean logic, and two strobed registers. On the periphery of the chip, unstrobed I/O registers are provided. An alternative to the XC4025 is the XC4005H. This is a relatively low-cost version of the array board with 120,000 configurable gates. The XC4005H devices have high-power 24 mA drive circuits, but are missing the input/output flip/flops of the standard XC4000 series. Details of these and other Xilinx FPGAs can be obtained through their publicly available data sheets, which are incorporated herein by reference.

The functionality of Xilinx XC4000 series FPGAs can be customized by loading configuration data into internal memory cells. The values stored in these memory cells determine the logic functions and interconnections in the FPGA. The configuration data of these FPGAs can be stored in on-chip memory and can be loaded from external memory. The FPGAs can either read configuration data from an external serial or parallel PROM, or the configuration data can be written into the FPGAs from an external device. These FPGAs can be reprogrammed an unlimited number of times, especially where hardware is changed dynamically or where users desire the hardware to be adapted to different applications.

Generally, the XC4000 series FPGAs has up to 1024 CLBs. Each CLB has two levels of look-up tables, with two four-input look-up tables (or function generators F and G) providing some of the inputs to a third three-input look-up table (or function generator H), and two flip-flops or latches. The outputs of these look-up tables can be driven independent of these flip-flops or latches. The CLB can implement the following combination of arbitrary Boolean functions: (1) any function of four or five variables, (2) any function of four variables, any second function of up to four unrelated variables, and any third function of up to three unrelated variables, (3) one function of four variables and another function of six variables, (4) any two functions of four variables, and (5) some functions of nine variables. Two D type flip-flops or latches are available for registering CLB inputs or for storing look-up table outputs. These flip-flops can be used independently from the look-up tables. DIN can be used as a direct input to either one of these two flip-flops or latches and H1 can drive the other through the H function generator.

Each four-input function generators in the CLB (i.e., F and G) contains dedicated arithmetic logic for the fast generation of carry and borrow signals, which can be configured to implement a two-bit adder with carry-in and carry-out. These function generators can also be implemented as read/write random access memory (RAM). The four-input wire lines would be used as address lines for the RAM.

The Altera FLEX 10K chips are somewhat similar in concept. These chips are SRAM-based programmable logic-devices (PLDs) having multiple 32-bit buses. In particular, each FLEX 10K100 chip contains approximately 100,000 gates, 12 embedded array blocks (EABs), 624 logic array blocks (LABs), 8 logic elements (LEs) per LAB (or 4,992 LEs), 5,392 flip-flops or registers, 406 I/O pins, and 503 total pins. The Altera FLEX 10K chips contain an embedded array of embedded array blocks (EABs) and a logic array of logic array blocks (LABs). An EAB can be used to implement various memory (e.g., RAM, ROM, FIFO) and complex logic functions (e.g., digital signal processors (DSPs), microcontrollers, multipliers, data transformation functions, state machines). As a memory function implementation, the EAB provides 2,048 bits. As a logic function implementation, the EAB provides 100 to 600 gates.

A LAB, via the LEs, can be used to implement medium sized blocks of logic. Each LAB represents approximately 96 logic gates and contains 8 LEs and a local interconnect. An LE contains a 4-input look-up table, a programmable flip-flop, and dedicated signal paths for carry and cascade functions. Typical logic functions that can be created include counters, address decoders, or small state machines.

More detailed descriptions of the Altera FLEX10K chips can be found in Altera, 1996 DATA BOOK (June 1996), which is incorporated herein by reference. The data book also contains details on the supporting programming software.

FIG. 8 shows one embodiment of the 4×4 FPGA array and their interconnections. Note that this embodiment of the SEmulator does not use cross bar or partial cross bar connections for the FPGA chips. The FPGA chips include chips F11 to F14 in the first row, chips F21 to F24 in the second row, chips F31 to F34 in the third row, and chips F41 to F44 in the fourth row. In one embodiment, each FPGA chip (e.g., chip F23) has the following pins for the interface to the FPGA I/O controller of the SEmulator system:

| Interface | Pins |
|---|---|
| Data Bus | 32 |
| SPACE index | 3 |
| READ, WRITE, EVAL | 3 |
| DATA XSFR | 1 |
| Address pointer chain | 2 |
| TOTAL | 41 |

Thus, in one embodiment, each FPGA chip uses only 41 pins for interfacing with the SEmulator system. These pins will be discussed further with respect to FIG. 22.

These FPGA chips are interconnected to each other via non-crossbar or non-partial crossbar interconnections. Each interconnection between chips, such as interconnection 602 between chip F11 and chip F14, represents 44 pins or 44 wire lines. In other embodiments, each interconnection represents more than 44 pins. Still in other embodiments, each interconnection represents less than 44 pins.

Each chip has six interconnections. For example, chip F11 has interconnections 600 to 605. Also, chip F33 has interconnections 606 to 611. These interconnections run horizontally along a row and vertically along a column. Each interconnection provides a direct connection between two chips along a row or between two chips along a column. Thus, for example, interconnection 600 directly connects chip F11 and F13; interconnection 601 directly connects chip F11 and F12; interconnection 602 directly connects chip F11 and F14; interconnection 603 directly connects chip F11 and F31, interconnection 604 directly connects chip F11 and F21; and interconnection 605 directly connects chip F11 and F41.

Similarly, for a chip F33 that is not located on the edge of the array (e.g., chip F11), interconnection 606 directly connects chip F33 and F13; interconnection 607 directly connects chip F33 and F23; interconnection 608 directly connects chip F33 and F34; interconnection 609 directly connects chip F33 and F43, interconnection 610 directly connects chip F33 and F31; and interconnection 611 directly connects chip F33 and F32.

Because chip F11 is located within one hop from chip F13, interconnection 600 is labeled as "1." Because chip F11 is located within one hop from chip F12, interconnection 601 is labeled as "1." Similarly, because chip F11 is located within one hop from chip F14, interconnection 602 is labeled as "1." Similarly, for chip F33, all interconnections are labeled as "1."

This interconnect scheme allows each chip to communicate with any other chip in the array within two "jumps" or interconnections. Thus, chip F11 is connected to chip F33 through either of the following two paths: (1) interconnection 600 to interconnection 606; or (2) interconnection 603 to interconnection 610. In short, the path can be either: (1) along a row first and then along a column, or (2) along a column first and then along a row.

Although FIG. 8 shows the FPGA chips configured in a 4×4 array with horizontal and vertical interconnections, the actual physical implementation on a board is through low and high banks with an expansion piggyback board. So, in one embodiment, chips F41–F44 and chips F21–F24 are in the low bank. Chips F31–F34 and chips F11–F14 are in the high bank. The piggyback board contains chips F11–F14 and chips F21–F24. Thus, to expand the array, piggyback boards containing a number (e.g., 8) of chips are added to the banks and hence, above the row currently containing chips F11–F14. In other embodiments, the piggyback board will expand the array below the row currently containing chips F41–F44. Further embodiments allow expansion to the right of chips F14, F24, F34, and F44. Still other embodiments allow expansion to the left of chips F11, F21, F31, and F41.

Represented in terms of "1" or "0," FIG. 7 shows a connectivity matrix for the 4×4 FPGA array of FIG. 8. This connectivity matrix is used to generate a placement cost result from a cost function used in the hardware mapping, placement, and routing process for this SEmulation system. The cost function was discussed above with respect to FIG. 6. As an example chip F11 is located within one hop from chip F13, so the connectivity matrix entry for F11–F13 is "1."

Figure 21:
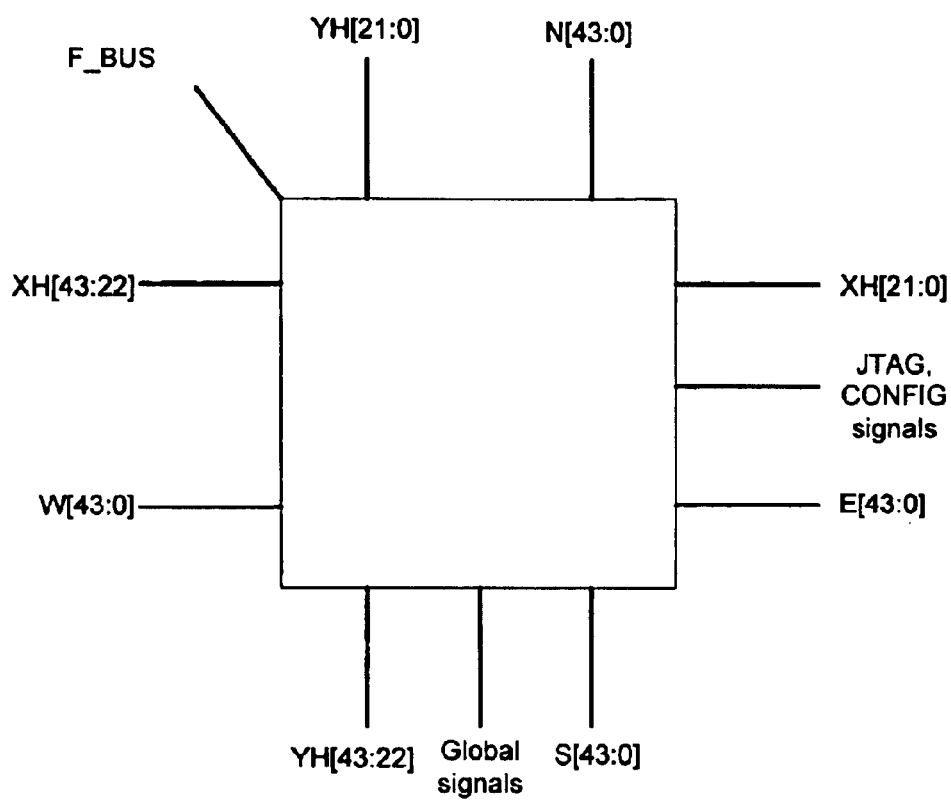
FIG. 21 shows the interconnection, JTAG, FPGA bus, and global signal pin designations for each FPGA chip in accordance with one embodiment of the present invention.

FIG. 21 shows the interconnect pin-outs for a single FPGA chip in accordance with one embodiment of the present invention. Each chip has six sets of interconnections, where each set comprises a particular number of pins. In one embodiment, each set has 44 pins. The interconnections for each FPGA chip are oriented horizontally (East-West) and vertically (North-South). The set of interconnections for the West direction is labeled as W[43:0]. The set of interconnections for the East direction is labeled as E[43:0]. The set of interconnections for the North direction is labeled as N[43:0]. The set of interconnections for the South direction is labeled as S[43:0]. These complete sets of interconnections are for the connections to adjacent chips; that is, these interconnections do not "hop" over any chip. For example, in FIG. 8, chip F33 has interconnection 607 for N[43:0], interconnection 608 for E[43:0], interconnection 609 for S[43:0], and interconnection 611 for W[43:0].

Returning to FIG. 21, two additional sets of interconnections are remaining. One set of interconnections is for the non-adjacent interconnections running vertically—YH[21:0] and YH[43:22]. The other set of interconnections is for the non-adjacent interconnections running horizontally—XH[21:0] and XH[43:22]. Each set, YH[ . . . ] and XH[ . . . ], are divided into two, where each half of a set contains 22 pins. This configuration allows each chip to be manufactured identically. Thus, each chip is capable of being interconnected in one hop to a non-adjacent chip located above, below, left, and right. This FPGA chip also shows the pin(s) for global signals, the FPGA bus, and JTAG signals.

The FPGA I/O controller will now be discussed. This controller was first briefly introduced in FIG. 10 as item 327. FPGA I/O controller manages the data and control traffic between the PCI bus and the FPGA array.

FIG. 22 shows one embodiment of the FPGA controller between the PCI bus and the FPGA array, along with the banks of FPGA chips. The FPGA I/O controller 700 includes CTRL_FPGA unit 701, clock buffer 702, PCI controller 703, EEPROM 704, FPGA serial configuration interface 705, boundary scan test interface 706, and buffer 707. Appropriate power/voltage regulating circuitry as known to those skilled in the art is provided. Exemplary sources include Vcc coupled to a voltage detector/regulator and a sense amplifier to substantially maintain the voltage in various environmental conditions. The Vcc to each FPGA chip is provided with fast acting thin-film fuses therebetween. The Vcc-HI is provided to the CONFIG# to all FPGA chips and LINTI# to a LOCAL_BUS 708.

The CTRL_FPGA unit 701 is the primary controller for FPGA I/O controller 700 to handle the various control, test, and read/write substantive data among the various units and buses. CTRL_FPGA unit 701 is coupled to the low and high banks of FPGA chips. FPGA chips F41–F44 and F21–F24 (i.e., low bank) are coupled to low FPGA bus 718. FPGA chips F31–F34 and F11–F14 (i.e., high bank) are coupled to high FPGA bus 719. These FPGA chips F11–F14, F21–F24, F31–F34, and F41–F44 correspond to the FPGA chips in FIG. 8, retaining their reference numbers.

Between these FPGA chips F11–F14, F21–F24, F31–F34, and F41–F44 and the low bank bus 718 and high bank bus 719 are thick film chip resistors for appropriate loading purposes. The group of resistors 713 coupled to the low bank bus 718, includes, for example, resistor 716 and resistor 717. The group of resistors 712 coupled to the high bank bus 719, includes, for example, resistor 714 and resistor 715.

If expansion is desired, more FPGA chips may be installed on the low bank bus 718 and the high bank bus 719 in the direction to the right of FPGA chips F11 and F21. In one embodiment, expansion is done through piggyback boards resembling piggyback board 720. Thus, if these banks of FPGA chips initially had only eight FPGA chips F41–F44 and F31–F34, further expansion is possible by adding piggyback board 720, which contains FPGA chips F24–F21 in the low bank and chips F14–F11 in the high bank. The piggyback board 720 also includes the additional low and high bank bus, and the thick film chip resistors.

The PCI controller 703 is the primary interface between the FPGA I/O controller 700 and the 32-bit PCI bus 709. If the PCI bus expands to 64 bits and/or 66 MHz, appropriate adjustments can be made in this system without departing from the spirit and scope of the present invention. These adjustments will be discussed below. One example of a PCI controller 703 that may be used in the system is PLX Technology's PCI9080 or 9060. The PCI 9080 has the appropriate local bus interface, control registers, FIFOs, and PCI interface, to the PCI bus. The data book PLX Technology, PCI 9080 Data Sheet (ver. 0.93, Feb. 28, 1997) is incorporated herein by reference.

The PCI controller 703 passes data between the CTRL_FPGA unit 701 and the PCI bus 709 via a LOCAL_BUS 708. LOCAL_BUS includes control bus portion, address bus portion, and data bus portion for control signals, address signals, and data signals, respectively. If the PCI bus expands to 64 bits, the data bus portion of LOCAL_BUS 708 can, also expand to 64 bits. The PCI controller 703 is coupled to EEPROM 704, which contains the configuration data for the PCI controller 703. An exemplary EEPROM 704 is National Semiconductor's 93CS46.

The PCI bus 709 supplies a clock signal at 33 MHz to the FPGA I/O controller 700. The clock signal is provided to clock buffer 702 via wire line 710 for synchronization purposes and for low timing skew. The output of this clock buffer 702 is the global clock (GL_CLK) signal at 33 MHz supplied to all the FPGA chips via wire line 711 and to the CTRL_FPGA unit 701 via wire line 721. If the PCI bus expands to 66 MHz, the clock buffer will also supply 66 MHz to the system.

FPGA serial configuration interface 705 provides configuration data to configure the FPGA chips F11–F14, F21–F24, F31–F34, and F41–F44. The Altera data book, Altera, 1996 DATA BOOK (June 1996), provides detailed information on the configuration devices and processes. FPGA serial configuration interface 705 is also coupled to LOCAL_BUS 708 and the parallel port 721. Furthermore, the FPGA serial configuration interface 705 is coupled to CTRL_FPGA unit 701 and the FPGA chips F11–F14, F21–F24, F31–F34, and F41–F44 via CONF_INTF wire line 723.

The boundary scan test interface 706 provides JTAG implementations of certain specified test command set to externally check a processor's or system's logic units and circuits by software. This interface 706 complies with the IEEE Std. 1149.1-1990 specification. Refer to the Altera data book, Altera, 1996 DATA BOOK (June 1996) and Application Note 39 (JTAG Boundary-Scan Testing in Altera Devices), both of which are incorporated herein by reference, for more information. Boundary scan test interface 706 is also coupled to LOCAL_BUS 708 and the parallel port 722. Furthermore, the boundary scan test interface 706 is coupled to CTRL_FPGA unit 701 and the FPGA chips F11–F14, F21–F24, F31–F34, and F41–F44 via BST_INTF wire line 724.

CTRL_FPGA unit 701 passes data to/from the low (chips F41–F44 and F21–F24) and high (chips F31–F34 and F11–F14) banks of FPGA chips via low bank 32-bit bus 718 and high bank 32-bit bus 719, respectively, along with buffer 707, and F_BUS 725 for the low bank 32 bits FD[31:0] and F_BUS 726 for the high bank 32 bits FD[63:32].

One embodiment duplicates the throughput of the PCI bus 709 in the low bank bus 718 and the high bank bus 719. The PCI bus 709 is 32 bits wide at 33 MHz. The throughput is thus 132 MB/s (=33 MHz*4 Bytes). The low bank bus 718 is 32 bits at half the PCI bus frequency (33/2 MHz= 16.5 MHz). The high bank bus 719 is also 32 bits at half the PCI bus frequency (33/2 MHz=16.5 MHz). The throughput of the 64-bit low and high bank buses is also 132 MB/s (=16.5 MHz*8 Bytes). Thus, the performance of the low and high bank buses tracks the performance of the PCI bus. In other words, the performance limitations are in the PCI bus, not in the low and high bank buses.

Address pointers, in accordance with one embodiment of the present invention, are also implemented in each FPGA chip for each software/hardware boundary address space. These address pointers are chained across several FPGA chips through the multiplexed cross chip address pointer chain. Please refer to: the address pointer discussion above with respect to FIGS. 9, 11, 12, 14, and 15. To move the word selection signal across the chain of address pointers associated with a given address space and across several chips, chain-out wire lines must be provided. These chain-out wire lines are shown as the arrows between the chips. One such chain-out wire line for the low bank is wire line 730 between chips F23 and F22. Another such chain-out wire line for the high bank is wire line 731 between chips F31 and F32. The chain-out wire line 732 at the end of low bank chip F21 is coupled to the CTRL_FPGA unit 701 as LAST_SHIFT_L. The chain-out wire line 733 at the end of high bank chip F11 is coupled to the CTRL_FPGA unit 701 as LAST_SHIFT_H. These signals LAST_SHIFT_L and LAST_SHIFT_H are the word selection signals for their respective banks as the word selection signals are propagated through the FPGA chips. When either of these signals LAST_SHIFT_L and LAST_SHIFT_H presents a logic "1" to the CTRL_FPGA unit 701, this indicates that the word selection signal has made its way to the end of its respective bank of chips.

The CTRL_FPGA unit 701 provides a write signal (F_WR) on wire line 734, a read signal (F_RD) on wire line 735, a DATA_XSFR signal on wire line 736, an ~EVAL signal on wire line 737, and a SPACE[2:0] signal on wire line 738 to and from the FPGA chips. The CTRL_FPGA unit 701 receives the EVAL_REQ# signal on wire line 739.

The write signal (F_WR), read signals (F_RD), DATA_XSFR signal, and SPACE[2:0] signal work together for the address pointers in the FPGA chips. The write signal (F_WR), read signals (F_RD), and SPACE[2:0] signal are used to generate the MOVE signal for the address pointers associated with the selected address space as determined by the SPACE index (SPACE[2:0]). The DATA_XSFR signal is used to initialize the address pointers and begin the word-by-word data transfer process.

The EVAL_REQ# signal is used to start the evaluation cycle all over again if any of the FPGA chips asserts this signal. For example, to evaluate data, data is transferred or written from main memory in the host processor's computing station to the FPGAs via the PCI bus. At the end of the transfer, the evaluation cycle begins including address pointer initialization and the operation of the software clocks to facilitate the evaluation process. However, for a variety of reasons, a particular FPGA chip may need to evaluate the data all over again. This FPGA chip asserts the EVAL_REQ# signal and the CNTL_FPGA chip 701 starts the evaluation cycle all over again.

Figure 23:
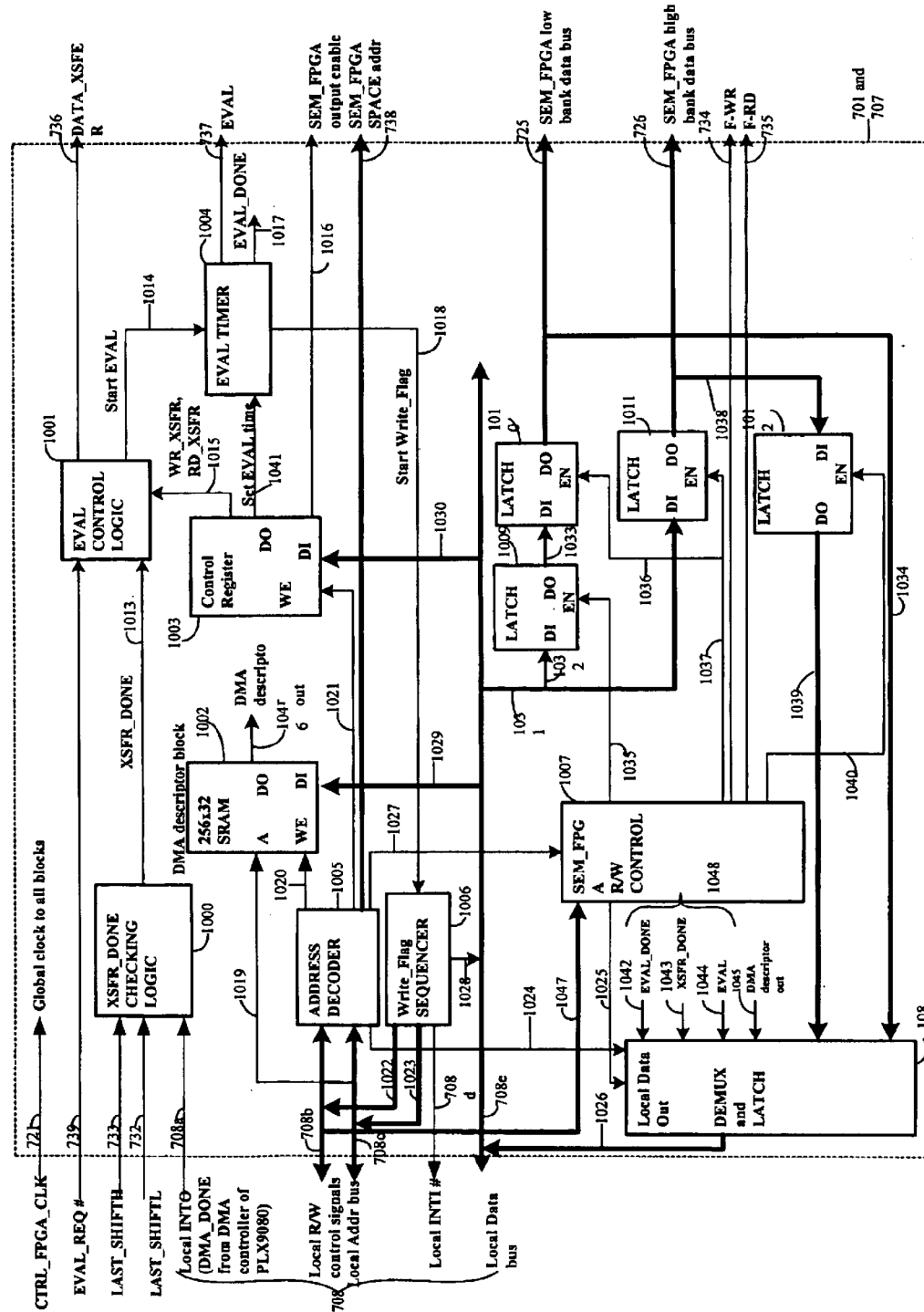
FIG. 23 shows a more detailed illustration of the CTRL_FPGA unit and data buffer which were discussed with respect to FIG. 22.

FIG. 23 shows a more detailed illustration of the CTRL_FPGA unit 701 and buffer 707 of FIG. 22. The same input/output signals and their corresponding reference numbers for CTRL_FPGA unit 701 shown in FIG. 22 are also retained and used in FIG. 23. However, additional signals and wire/bus lines not shown in FIG. 22 will be described with new reference numbers, such as SEM_FPGA output enable 1016, local interrupt output (Local INTO) 708*a*, local read/write control signals 708*b*, local address bus 708*c*, local interrupt input (Local INTI#) 708*d*, and local data bus 708*e*.

CTRL_FPGA unit 701 contains a Transfer Done Checking Logic (XSFR_DONE Logic) 1000, Evaluation Control Logic (EVAL Logic) 1001, DMA Descriptor Block 1002, Control Register 1003, Evaluation Timer Logic (EVAL timer) 1004, Address Decoder 1005, Write Flag Sequencer Logic 1006, FPGA Chip Read/Write Control Logic SEM_FPGA R/W Logic) 1007, Demultiplexer and Latch (DEMUX logic) 1008, and latches 1009–1012, which correspond to buffer 707 in FIG. 22. A global clock signal (CTRL_FPGA_CLK) on wire/bus 721 is provided to all logic elements/blocks in CTRL_FPGA unit 701.

The Transfer Done Checking Logic (XSFR_DONE) 1000 receives LAST_SHIFT_H 733, LAST_SHIFT_L 732 and local INTO 708*a*. XSFR_DONE logic 1000 outputs a transfer done signal (XSFR_DONE) on wire/bus 1013 to EVAL Logic 1001. Based on the reception of LAST_SHIFT_H 733 and LAST_SHIFT_L 732, the XSFR_DONE logic 1000 checks for the completion of the data transfer so that the evaluation cycle can begin, if desired.

The EVAL Logic 1001 receives the EVAL_REQ# signal on wire/bus 739 and WR_XSFR/RD_XSFR signal on wire/bus 1015, in addition to transfer done signal (XSFR_DONE) on wire/bus 1013. EVAL Logic 1001 generates two output signals, Start EVAL on wire/bus 1014 and DATA_XSFR on wire/bus 736. The EVAL logic indicates when data transfer between the FPGA bus and the PCI bus will begin to initialize the address pointers. It receives the XSFR_DONE signal when the data transfer is complete. The WR_XSFR/RD_XSFR signal indicates whether the transfer is a read or a write. Once the I/O cycle is complete (or before the onset of an I/O cycle), the EVAL logic can start the evaluation cycle with the start ~EVAL signal to the EVAL timer. The EVAL timer dictates the duration of the evaluation cycle and ensures the successful operation of the software clock mechanism by keeping the evaluation cycle active for as long as necessary to stabilize the data propagation to all the registers and combinational components.

DMA descriptor block 1002 receives the local bus address on wire/bus 1019, a write enable signal on wire/bus 1020 from address decoder 1005, and local bus data on wire/bus 1029 via local data bus 708e. The output is DMA descriptor output on wire/bus 1046 to DEMUX logic 1008 on wire/bus 1045. The DMA descriptor block 1002 contains the descriptor block information corresponding to that in the host memory, including PCI address, local address, transfer count, transfer direction, and address of the next descriptor block. The host will also set up the address of the initial descriptor block in the descriptor pointer register of the PCI controller. Transfers can be initiated by setting a control bit. The PCI loads the first descriptor block and initiates the data transfer. The PCI controller continues to load descriptor blocks and transfer data until it detects the end of the chain bit is set in the next descriptor pointer register.

Address decoder 1005 receives and transmits local R/W control signals on bus 708b, and receives and transmits local address signals on bus 708c. The address decoder 1005 generates a write enable signal on wire/bus 1020 to the DMA descriptor 1002, a write enable signal on wire/bus 1021 to control register 1003, the FPGA address SPACE index on wire/bus 738, a control signal on wire/bus 1027, and another control signal on wire/bus 1024 to DEMUX logic 1008.

Control register 1003 receives the write enable signal on wire/bus 1021 from address decoder 1005, and data from wire/bus 1030 via local data bus 708e. The control register 1003 generates a WR_XSFR/RD_XSFR signal on wire/bus 1015 to EVAL logic 1001, a Set EVAL time signal on wire/bus 1041 to EVAL timer 1004, and a SEM_FPGA output enable signal on wire/bus 1016 to the FPGA chips. The system uses the SEM_FPGA output enable signal to turn on or enable each FPGA chip selectively. Typically, the system enables each FPGA chip one at a time.

EVAL timer 1004 receives the Start EVAL signal on wire/bus 1014, and the Set EVAL time on wire/bus 1041. EVAL timer 1004 generates the ~EVAL signal on wire/bus 737, an evaluation done (EVAL_DONE) signal on wire/bus 1017, and a Start write flag signal on wire/bus 1018 to the Write Flag Sequencer logic 1006. In one embodiment, the EVAL timer is 6 bits long.

The Write Flag Sequencer logic 1006 receives the Start write flag signal on wire/bus 1018 from EVAL timer 1004. The Write Flag Sequencer logic 1006 generates a local R/W control signal on wire/bus 1022 to local R/W wire/bus 708b, local address signal on wire/bus 1023 to local address bus 708c, a local data signal on wire/bus 1028 to local data bus 708e, and local INTI# on wire/bus 708d. Upon receiving the start write flag signal, the write flag sequencer logic begins the sequence of control signals to begin the memory write cycles to the PCI bus.

The SEM_FPGA R/W Control logic 1007 receives control signals on wire/bus 1027 from the address decoder 1005, and local R/W control signal on wire/bus 1047 via local R/W control bus 708b. The SEM_FPGA R/W Control logic 1007 generates enable signal on wire/bus 1035 to latch 1009, a control signal on wire/bus 1025 to the DEMUX logic 1008, an enable signal on wire/bus 1037 to latch 1011, an enable signal on wire/bus 1040 to latch 1012, a F_WR signal on wire/bus 734, and a F-RD signal on wire/bus 735. The SEM_FPGA R/W Control logic 1007 controls the various write and read data transfers to/from the FPGA low bank and high bank buses.

The DEMUX logic 1008 is a multiplexer and a latch which receives four sets of input signals and outputs one set of signals on wire/bus 1026 to the local data bus 708e. The selector signals are the control signal on wire/bus 1025 from SEM_FPGA R/W control logic 1007 and the control signal on wire/bus 1024 from address decoder 1005. The DEMUX logic 1008 receives one set of inputs from EVAL_DONE signal on wire/bus 1042, XSFR_DONE signal on wire/bus 1043, and ~EVAL signal on wire/bus 1044. This single set of signals is labeled as reference number 1048. At any one time period, only one of these three signals, EVAL_DONE, XSFR_DONE, and ~EVAL will be provided to DEMUX logic 1008 for possible selection. The DEMUX logic 1008 also receives, as the other three sets of input signals, the DMA descriptor output signal on wire/bus 1045 from the DMA descriptor block 1002, a data output on wire/bus 1039 from latch 1012, and another data output on wire/bus 1034 from latch 1010.

The data buffer between the CTRL_FPGA unit 701 and the low and high FPGA bank bus comprise latches 1009 to 1012. Latch 1009 receives local bus data on wire/bus 1032 via wire/bus 1031 and local data bus 708e, and an enable signal on wire/bus 1035 from SEM_FPGA R/W Control logic 1007. Latch 1009 outputs data on wire/bus 1033 to latch 1010.

Latch 1010 receives data on wire/bus 1033 from latch 1009, and an enable signal on wire/bus 1036 via wire/bus 1037 from SEM_FPGA R/W Control logic 1007. Latch 1010 outputs data on wire/bus 725 to the FPGA low bank bus and the DEMUX logic 1008 via wire/bus 1034.

Latch 1011 receives data on wire/bus 1031 from local data bus 708e, and an enable signal on wire/bus 1037 from SEM_FPGA R/W Control logic 1007. Latch 1011 outputs data on wire/bus 726 to the FPGA high bank bus and on wire/bus 1038 to latch 1012.

Latch 1012 receives data on wire/bus 1038 from latch 1011, and an enable signal on wire/bus 1040 from SEM_FPGA R/W Control logic 1007. Latch 1012 outputs data on wire/bus 1039 to DEMUX 1008.

Figure 24:
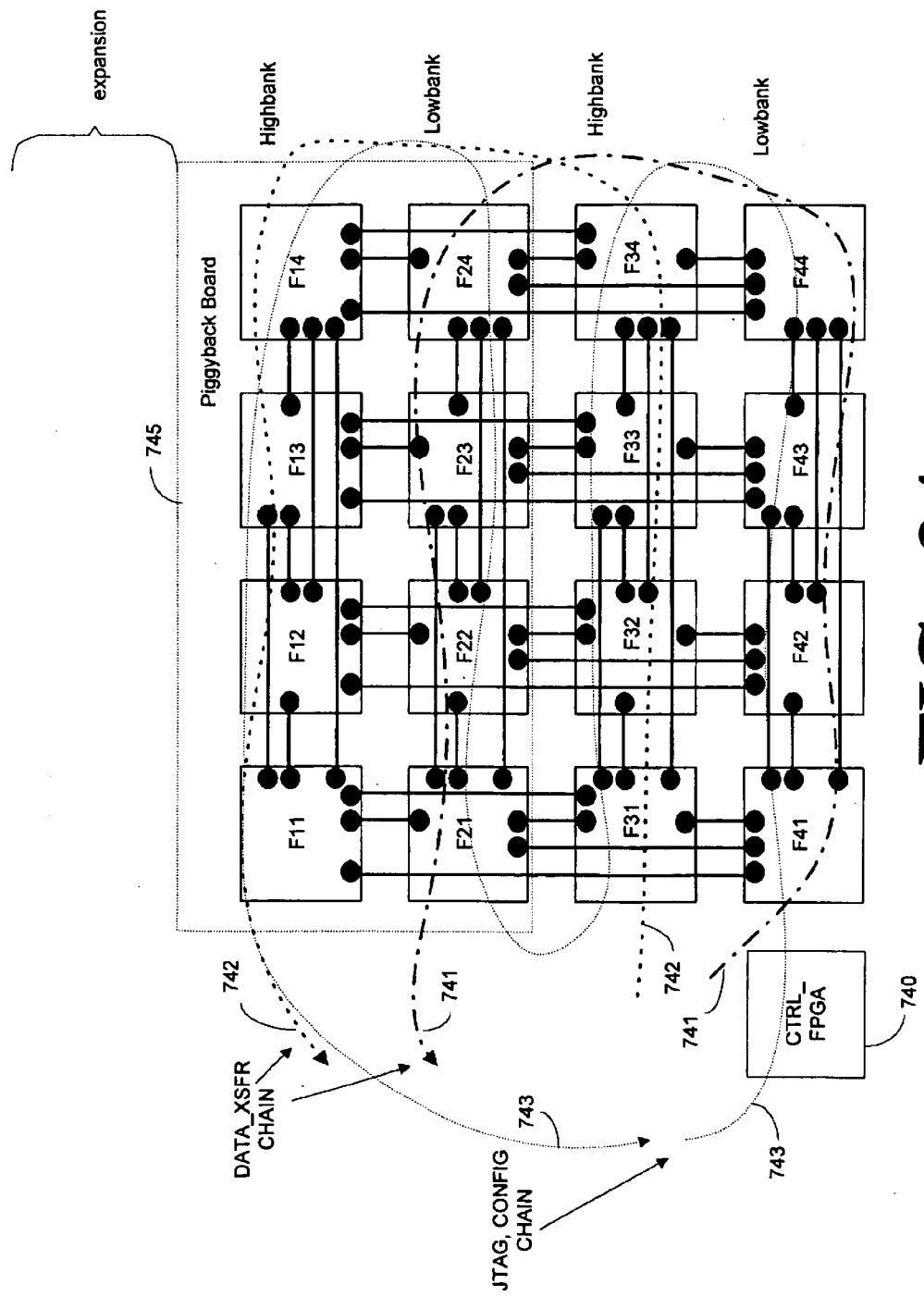
FIG. 24 shows the 4×4 FPGA array, its relationship to the FPGA banks, and expansion capability.

FIG. 24 shows the 4×4 FPGA array, its relationship to the FPGA banks, and the expansion capability. Like FIG. 8, FIG. 24 shows the same 4×4 array. The CTRL_FPGA unit 740 is also shown. Low bank chips (chips F41–F44 and F21–F24) and high bank chips (chips F31–F34 and F11–F14) are arranged in an alternating manner. Thus, characterizing the row of FPGA chips from the bottom row to the top row: low bank-high bank-low bank-high bank. The data transfer chain follows the banks in a predetermined order. The data transfer chain for the low bank is shown by arrow 741. The data transfer chain for the high bank is shown by arrow 742. The JTAG configuration chain is shown by arrow 743, which runs through the entire array of 16 chips from F41 to F44, F34 to F31, F21 to F24, and F14 to F11, and back to the CTRL_FPGA unit 740.

Expansion can be accomplished with piggyback boards. Assuming in FIG. 24 that the original array of FPGA chips included F41–F44 and F31–F34, the addition of two more rows of chips F21–F24 and F11–F14 can be accomplished with piggyback board 745. The piggyback board 745 also includes the appropriate buses to extend the banks. Further expansion can be accomplished with more piggyback boards placed one on top of the other in the array.

Figure 25:
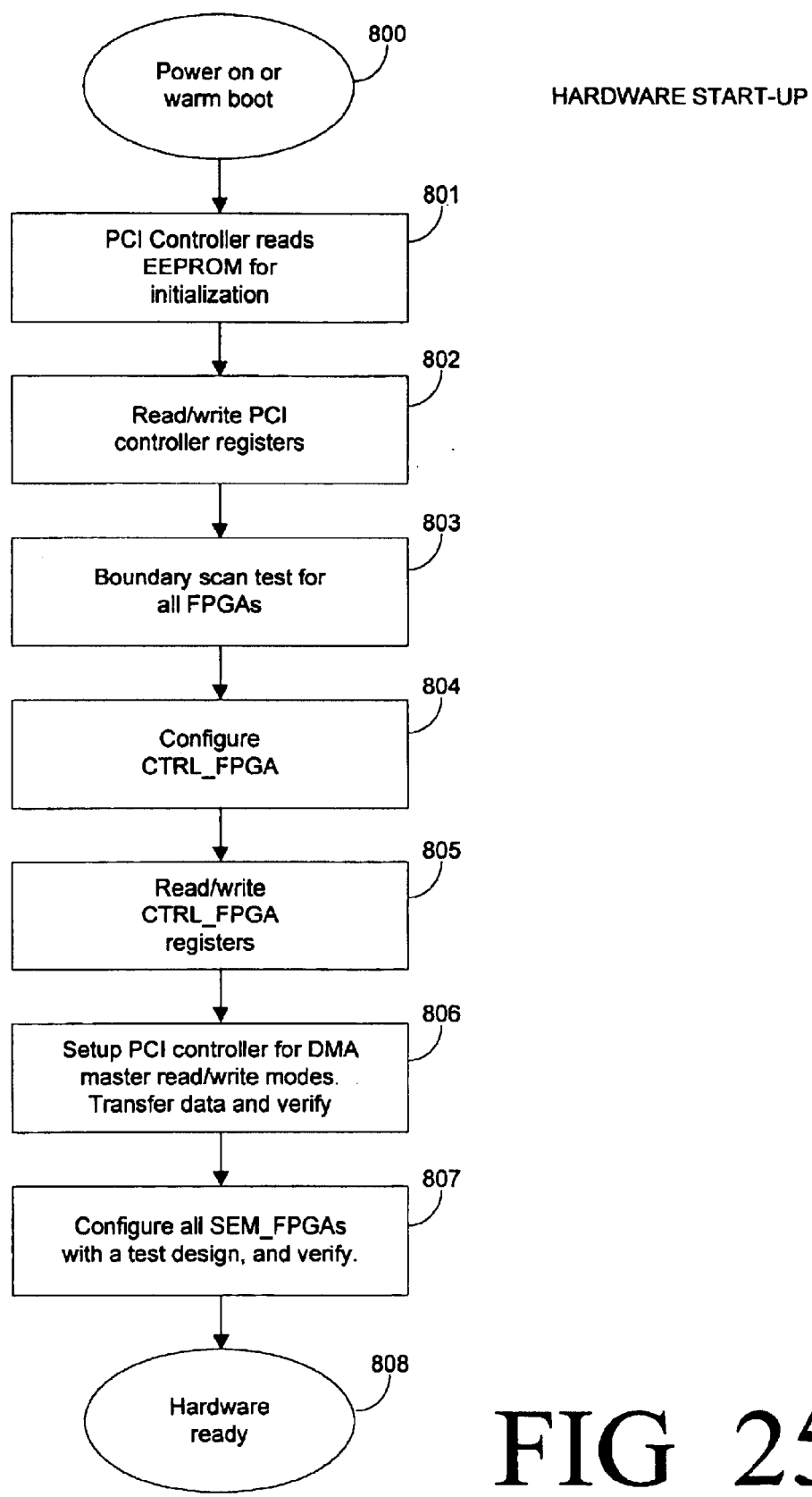
FIG. 25 shows one embodiment of the hardware start-up method.

FIG. 25 shows one embodiment of the hardware start-up method. Step 800 initiates the power on or warm boot sequence. In step 801, the PCI controller reads the EEPROM for initialization. Step 802 reads and writes PCI controller registers in light of the initialization sequence. Step 803 boundary scan tests for all the FPGA chips in the array. Step 804 configures the CTRL_FPGA unit in the FPGA I/O controller. Step 805 reads and writes the registers in the CTRL_FPGA unit. Step 806 sets up the PCI controller for DMA master read/write modes. Thereafter, the data is transferred and verified. Step 807 configures all the FPGA chips with a test design and verifies its correctness. At step 808, the hardware is ready for use. At this point, the system assumes all the steps resulted in a positive confirmation of the operability of the hardware, otherwise, the system would never reach step 808.

E. Alternate Embodiment Using Denser FPGA Chips

In one embodiment of the present invention, the FPGA logic devices are provided on individual boards. If more FPGA logic devices are required to model the user's circuit design than is provided in the board, multiple boards with more FPGA logic devices can be provided. The ability to add more boards into the Simulation system is a desirable feature of the present invention. In this embodiment, denser FPGA chips, such as Altera 10K130V and 10K250V, are used. Use of these chips alters the board design such that only four FPGA chips, instead of eight less dense FPGA chips (e.g., Altera 10K100), are used per board.

The coupling of these boards to the motherboard of the Simulation system presents a challenge. The interconnection and connection schemes must compensate for the lack of a backplane. The FPGA array in the Simulation system is provided on the motherboard through a particular board interconnect structure. Each chip may have up to eight sets of interconnections, where the interconnections are arranged according to adjacent direct-neighbor interconnects (i.e., N[73:0], S[73:0], W[73:0], E[73:0]), and one-hop neighbor interconnects (i.e., NH[27:0], SH[27:0], XH[36:0], XH[72:37]), excluding the local bus connections, within a single board and across different boards. Each chip is capable of being interconnected directly to adjacent neighbor chips, or in one hop to a non-adjacent chip located above, below, left, and right. In the X direction (east-west), the array is a torus. In the Y direction (north-south), the array is a mesh.

The interconnects alone can couple logic devices and other components within a single board. However, inter-board connectors are provided to couple these boards and interconnects together across different boards to carry signals between (1) the PCI bus via the motherboard and the array boards, and (2) any two array boards. Each board contains its own FPGA bus FD[63:0] that allows the FPGA logic devices to communicate with each other, the SRAM memory devices, and the CTRL_FPGA unit (FPGA I/O controller). The FPGA bus FD[63:0] is not provided across the multiple boards. The FPGA interconnects, however, provide connectivity among the FPGA logic devices across multiple boards although these interconnects are not related to the FPGA bus. On the other hand, the local bus is provided across all the boards.

A motherboard connector connects the board to the motherboard, and hence, to the PCI bus, power, and ground. For some boards, the motherboard connector is not used for direct connection to the motherboard. In a six-board configuration, only boards 1, 3, and 5 are directly connected to the motherboard while the remaining boards 2, 4, and 6 rely on their neighbor boards for motherboard connectivity. Thus, every other board is directly connected to the motherboard, and interconnects and local buses of these boards are coupled together via inter-board connectors arranged solder-side to component-side. PCI signals are routed through one of the boards (typically the first board) only. Power and ground are applied to the other motherboard connectors for those boards. Placed solder-side to component-side, the various inter-board connectors allow communication among the PCI bus components, the FPGA logic devices, memory devices, and various Simulation system control circuits.

Figure 56:
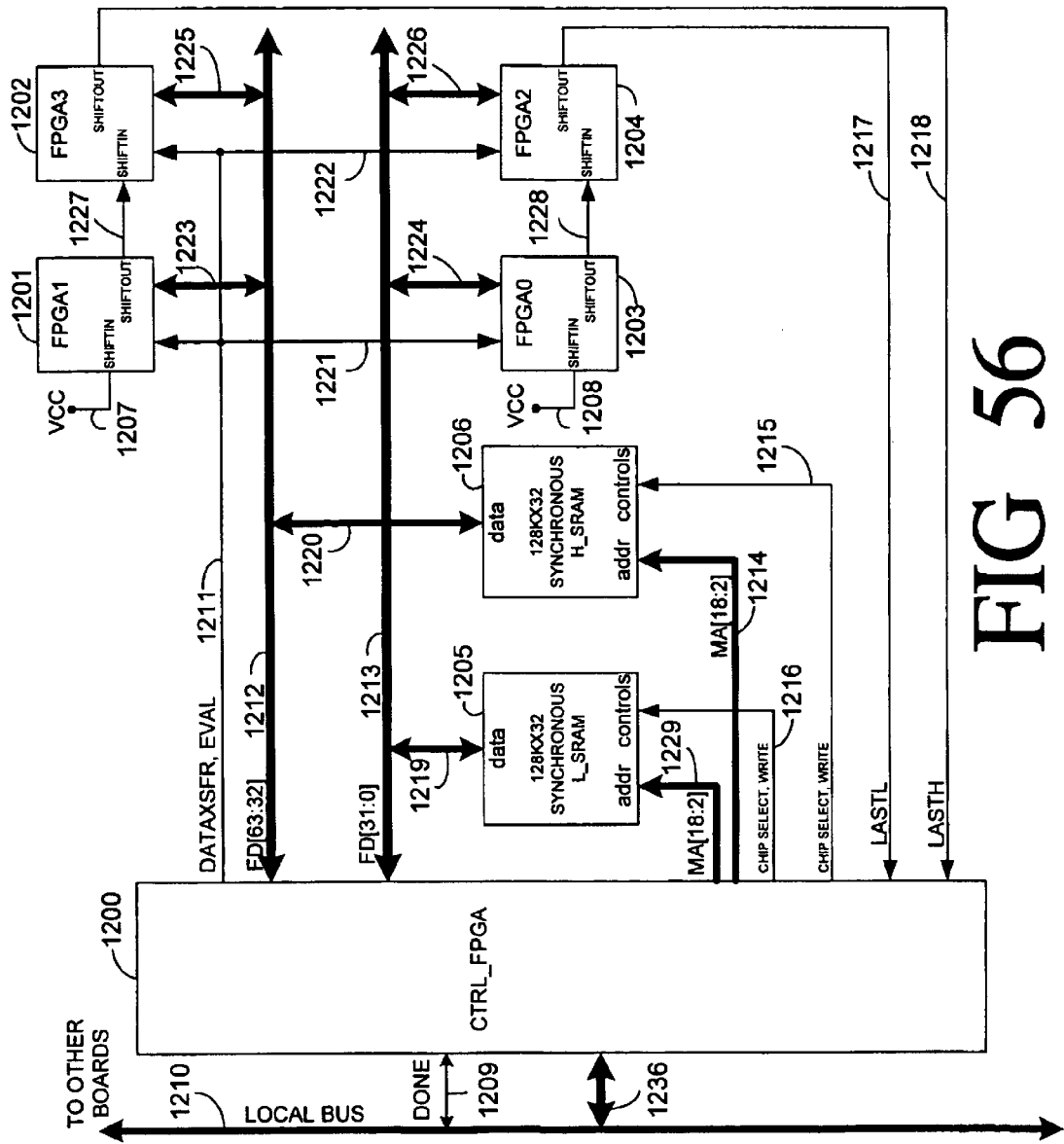
FIG. 56 shows a high level block diagram of the Simulation system for implementing memory mapping in accordance with one embodiment of the present invention.

FIG. 56 shows a high level block diagram of the array of FPGA chip configuration in accordance with one embodiment of the present invention. A CTRL_FPGA unit 1200, described above, is coupled to bus 1210 via lines 1209 and 1236. In one embodiment, the CTRL_FPGA unit 1200 is a programmable logic device (PLD) in the form of an FPGA chip, such as an Altera 10K50 chip. Bus 1210 allows the CTRL_FPGA unit 1200 to be coupled to other Simulation array boards (if any) and other chips (e.g., PCI controller, EEPROM, clock buffer). FIG. 56 shows other major functional blocks in the form of logic devices and memory devices. In one embodiment, the logic device is a programmable logic device (PLD) in the form of an FPGA chip, such as an Altera 10K130V or 10K250V chip. The 10K130V and 10K250V are pin compatible and each is a 599-pin PGA package. Thus, instead of the embodiment shown above with the eight Altera FLEX 10K100 chips in the array, this embodiment uses only four chips of Altera's FLEX 10K130. One embodiment of the present invention describes the board containing these four logic devices and their inter-connections.

Because the user's design is modeled and configured in any number of these logic devices in the array, inter-FPGA logic device communication is necessary to connect one part of the user's circuit design to another part. Furthermore, initial configuration information and boundary scan tests are also supported by the inter-FPGA interconnects. Finally, the necessary Simulation system control signals must be accessible between the Simulation system and the FPGA logic devices.

Figure 36:
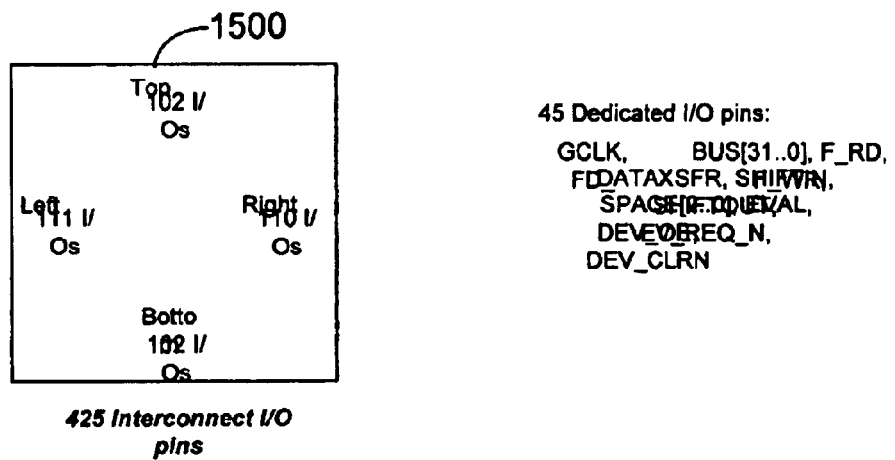
FIG. 36 shows an overview of the FPGA chip used in the present invention.

FIG. 36 shows the hardware architecture an FPGA logic device used in the present invention. The FPGA logic device 1500 includes 102 top I/O pins, 102 bottom I/O pins, 111 left I/O pins, and 110 right I/O pins. Thus, the total number of interconnect pins is 425. Furthermore, an additional 45 I/O pins are dedicated for GCLK, FPGA bus FD[31:0] (for the high bank, FD[63:32] is dedicated), F_RD, F_WR, DATAXSFR, SHIFTIN, SHIFTOUT, SPACE[2:0], ~EVAL, EVAL_REQ_N, DEVICE_OE (signal* CTRL_FPGA unit to turn on the output pins of FPGA logic devices), and DEV_CLRN (signal from CTRL_FPGA unit to clear all the internal flip-flops before starting the simulation). Thus, any data and control signals that cross between any two FPGA logic devices are carried by these interconnections. The remaining pins are dedicated for power and ground.

Figure 37:
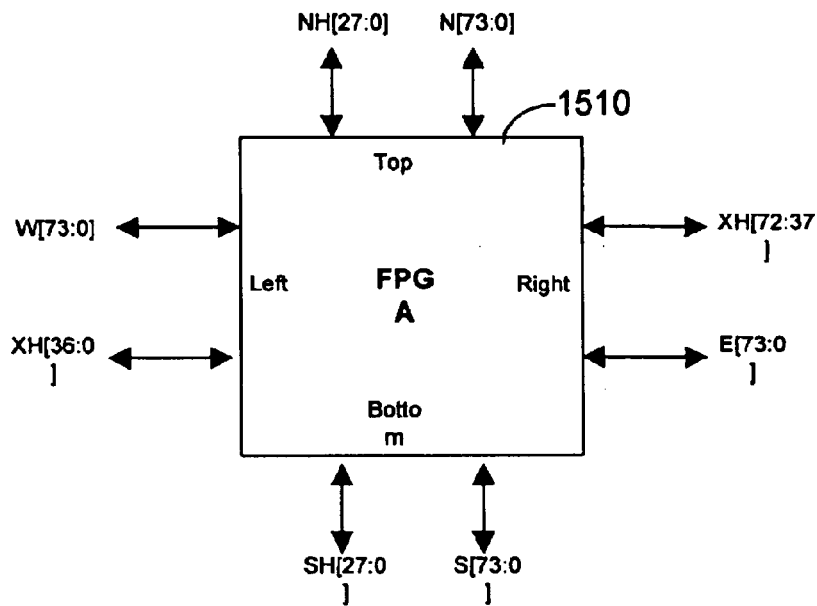
FIG. 37 shows the FPGA interconnection buses on the FPGA chip.

FIG. 37 shows the FPGA interconnect pin-outs for a single FPGA chip in accordance with one embodiment of the present invention. Each chip 1510 may have up to eight sets of interconnections, where each set comprises a particular number of pins. Some chips may have less than eight sets of interconnections depending on their respective positions on the board. In the preferred embodiment, all chips have seven sets of interconnections, although the specific sets of interconnections used may vary from chip to chip depending on their respective location on the board. The interconnections for each FPGA chip are oriented horizontally, (East-West) and vertically (North-South). The set of interconnections for the West direction is labeled as W[73:0]. The set of interconnections for the East direction is labeled as E[73:0]. The set of interconnections for the North direction is labeled as N[73:0]. The set of interconnections for the South direction is labeled as S[73:0]. These complete sets of interconnections are for the connections to adjacent chips; that is, these interconnections do not "hop" over any chip. For example, in FIG. 39, chip 1570 has interconnection 1540 for N[73:0], interconnection 1542 for W[73:0], interconnection 1543 for E[73:0], and interconnection 1545 for S[73:0]. Note that this FPGA chip 1570, which is also the FPGA2 chip, has all four sets of adjacent interconnections—N[73:0], S[73:0], W[73:0], and E[73:0]. The West interconnections of FPGA0 connects to the east interconnections of FPGA3 through wire 1539 via a torus-style interconnections. Thus, wire 1539 allows the chips 1569 (FPGA0) and 1572 (FPGA3) to be directly coupled to each other in a manner akin to wrapping the west-east ends of the board to be wrapped around to meet each other.

Figure 39:
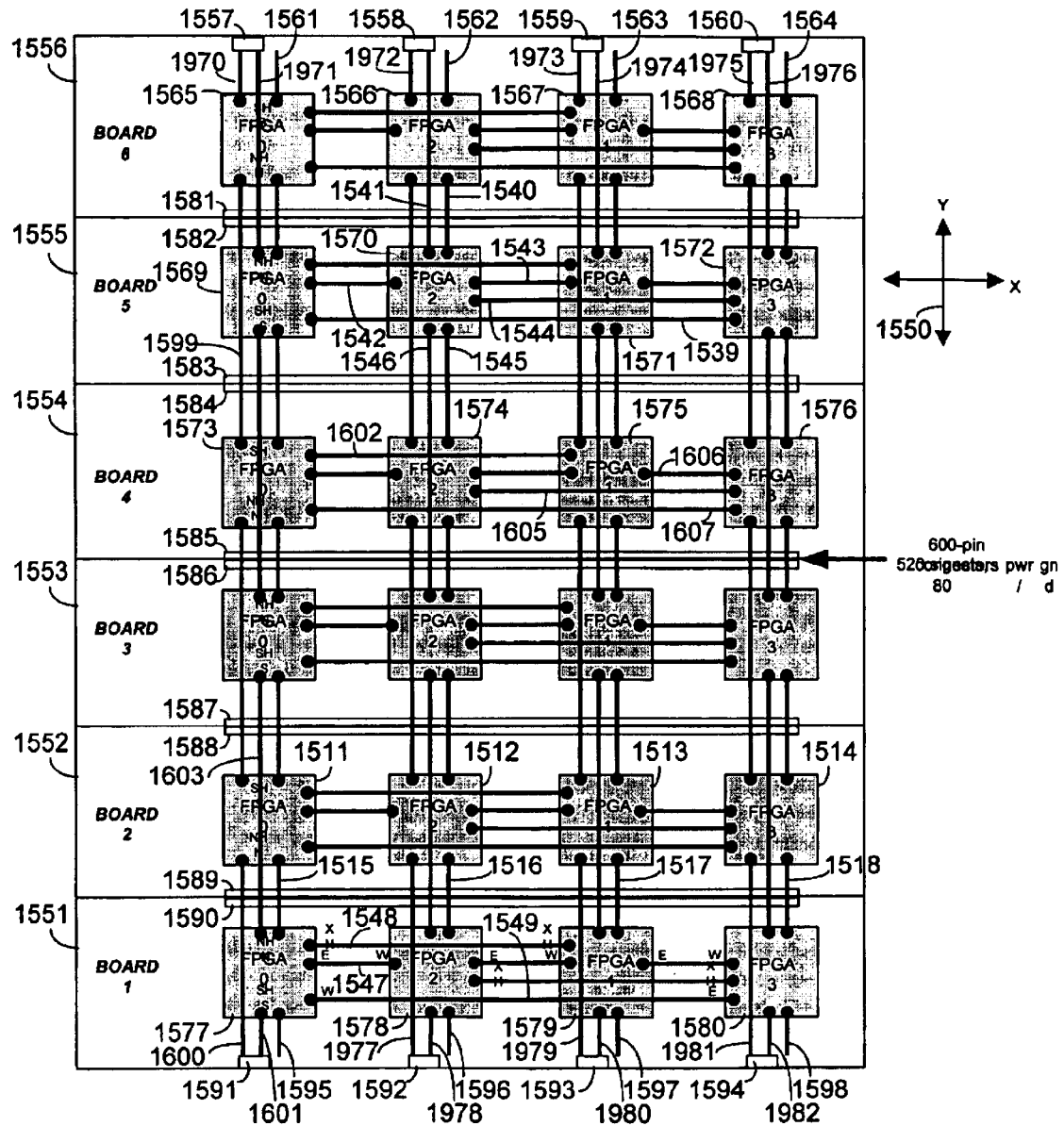
FIG. 39 shows a direct-neighbor and one-hop six-board interconnection layout of the FPGA array in accordance with one embodiment of the present invention.

Returning to FIG. 37, four sets of "hopping" interconnections are provided. Two sets of interconnections are for the non-adjacent interconnections running vertically—NH[27:0] and SH[27:0]. For example, FPGA2 chip 1570 in FIG. 39 shows NH interconnect 1541 and SH interconnect 1546. Returning to FIG. 37, the other two sets of interconnections are for the non-adjacent interconnections running horizontally—XH[36:0] and XH[72:37]. For example, FPGA2 chip 1570 in FIG. 39 shows XH interconnect 1544.

Returning to FIG. 37, the vertical hopping interconnections NH[27:0] and SH[27:0] have 28 pins each. The horizontal interconnections have 73 pins, XH[36:0] and XH[72:37]. The horizontal interconnection pins, XH[36:0] and XH[72:37], can be used on the west side.(e.g., for FPGA3 chip 1576, interconnect 1605 in FIG. 39) and/or the east side (e.g., for FPGA0 chip 1573, interconnect 1602 in FIG. 39). This configuration allows each chip to be manufactured identically. Thus, each chip is capable of being interconnected in one hop to a non-adjacent chip located above, below, left, and right.

FIG. 39 shows a direct-neighbor and one-hop neighbor FPGA array layout of the six boards on a single motherboard in accordance with one embodiment of the present invention. This figure will be used to illustrate two possible configurations—a six-board system and a dual-board system. Position indicator 1550 shows that the "Y" direction is north-south and the "X" direction is east-west. In the X direction, the array is a torus. In the Y direction, the array is a mesh. In FIG. 39, only the boards, FPGA logic devices, interconnects, and connectors at a high level are shown. The motherboard and other supporting components (e.g., SRAM memory devices) and wire lines (e.g., FPGA bus) are not shown.

Note that FIG. 39 provides an array view of the boards and their components, interconnects, and connectors. The actual physical configuration and installation involves placing these boards on their respective edges component-side to solder-side. Approximately half of the boards are directly connected to the motherboard while the other half of the boards are connected to their respective neighbor boards.

In the six-board embodiment of the present invention, six boards 1551 (board1), 1552 (board2), 1553 (board3), 1554 (board4), 1555 (board5), and 1556 (board6) are provided on the motherboard (not shown): as part of the reconfigurable hardware unit 20 in FIG. 1. Each board contains an almost identical set of components and connectors. Thus, for illustrative purposes, the sixth board 1556 contains FPGA logic devices 1565 to 1568, and connectors 1557 to 1560 and 1581; the fifth board 1555 contains FPGA logic devices 1569 to 1572 and connectors 1582 and 1583; and the fourth board 1554 contains FPGA logic devices 1573 to 1576, and connectors 1584 and 1585.

In this six-board configuration, board1 1551 and board6 1556 are provided as "bookend" boards that contain the Y-mesh terminations such as R-pack terminations 1557 to 1560 on board6 1556 and terminations 1591 to 1594 on board1 1551. Intermediately placed boards (i.e., boards 1552 (board2), 1553 (board3), 1554 (board4), and 1555 (board5)) are also provided to complete the array.

As explained above, the interconnects are arranged according to adjacent direct-neighbor interconnects (i.e., N[73:0], S[73:0], W[73:0], E[73:0]), and one-hop neighbor interconnects (i.e., NH[27:0], SH[27:0], XH[36:0], XH[72:37]), excluding the local bus connections, within a single board and across different boards. The interconnects alone can couple logic devices and other components within a single board. However, inter-board connectors 1581 to 1590 allow communication among the FPGA logic devices across different boards (i.e., board1 to board6). The FPGA bus is part of the inter-board connectors 1581 to 1590. These connectors 1581 to 1590 are 600-pin connectors carrying 520 signals and 80 power/ground connections between two adjacent array boards.

In FIG. 39, the various boards are arranged in a non-symmetrical manner with respect to the inter-board connectors 1581 to 1590. For example, between board 1551 and 1552, inter-board connectors 1589 and 1590 are provided. Interconnect 1515 connects FPGA logic devices 1511 and 1577 together and according to connectors 1589 and 1590, this connection is symmetrical. However, interconnect 1603 is not symmetrical; it connects an FPGA logic device in the third board 1553 to the FPGA logic device 1577 in board 1551. With respect to connectors 1589 and 1590, such an interconnect is not symmetrical. Similarly, interconnect 1600 is not symmetrical with respect to connectors 1589 and 1590 because it connects FPGA logic device 1577 to the termination 1591, which connects to FPGA logic device 1577 via interconnect 1601. Other similar interconnects exist which further shows the non-symmetry.

Figure 40A:
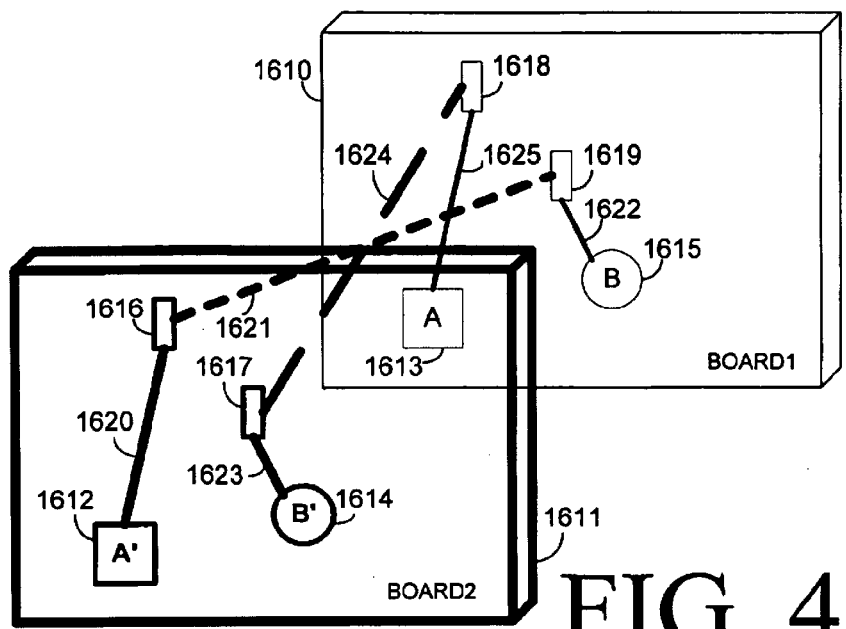
FIGS. 40(A) and 40(B) show FPGA inter-board interconnection scheme.
Figure 40B:
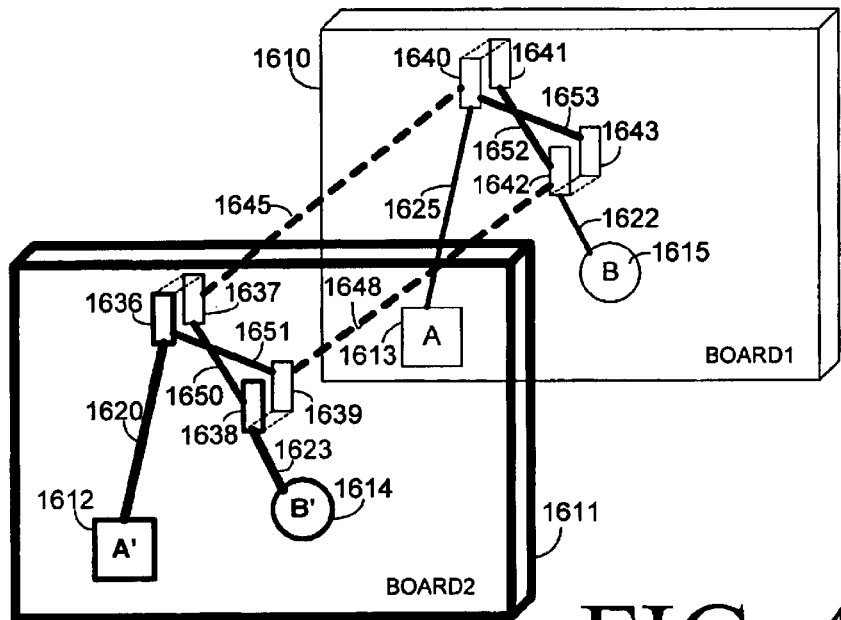

As a result of this non-symmetry, the interconnects are routed through the inter-board connectors in two different ways—one for symmetric interconnects like interconnect 1515 and another for non-symmetric interconnects like interconnects 1603 and 1600. The interconnection routing scheme is shown in FIGS. 40(A) and 40(B).

In FIG. 39, an example of a direct-neighbor connection within a single board is interconnect 1543 which couples logic device 1570 to logic device 1571 along the east-west direction in board 1555. Another example of a direct-neighbor connection within a single board is interconnect 1607 which couples logic device 1573 to logic device 1576 in board 1554. An example of a direct-neighbor connection between two different boards is interconnect 1545 which couples logic device 1570 in board 1555 to logic device 1574 in board 1554 via connectors 1583 and 1584 along the north-south direction. Here, two inter-board connectors 1583 and 1584 are used to transport signals across.

An example of a one-hop interconnect within a single board is interconnect 1544 which couples logic device 1570 to logic device 1572 in board 1555 along the east-west direction. An example of a one-hop interconnect between two different boards is interconnect 1599 which couples logic device 1565 in board 1556 to logic device 1573 in board 1554 via connectors 1581 to 1584. Here, four inter-board connectors 1581 to 1584 are used to transport signals across.

Some boards, especially those positioned at the north-south ends on the motherboard, also contain 10-ohm R-packs to terminate some connections. Thus, the sixth board 1556 includes the 10-ohm R-pack connectors 1557 to 1560, and the first board 1551 includes the 10-ohm R-pack connectors 1591 to 1594. The sixth board 1556 contains R-pack connector 1557 for interconnects 1970 and 1971, R-pack connector 1558 for interconnects 1972 and 1541, R-pack connector 1559 for interconnects 1973 and 1974, and R-pack connector 1560 for interconnects 1975 and 1976. Moreover, interconnects 1561 to 1564 are not connected to anything. These north-south interconnections, unlike the east-west torus-type interconnections, are arranged in mesh-type fashion.

These mesh terminations increase the number of north-south direct interconnections. Otherwise, the interconnections at north and south edges of the FPGA mesh will be all wasted. For example, FPGA logic devices 1511 and 1577 already have one set of direct interconnection 1515. Additional interconnections are also provided for these two FPGA logic devices via R-pack 1591 and interconnects 1600 and 1601; that is, R-pack 1591 connects interconnects 1600 and 1601 together. This increases the number of direct connections between FPGA logic devices 1511 and 1577.

Inter-board connections are also provided. Logic devices 1577, 1578, 1579, and 1580 on board 1551 are coupled to logic devices 1511, 1512, 1513, and 1514 on board 1552 via interconnects 1515, 1516, 1517, and 1518 and inter-board connectors 1589 and 1590. Thus, interconnect 1515 couples the logic device 1511 on board 1552 to logic device 1577 on board 1551 via connectors 1589 and 1590; interconnect 1516 couples the logic device 1512 on board 1552 to logic device 1578 on board 1551 via connectors 1589 and 1590; interconnect 1517 couples the logic device 1513 on board 1552 to logic device 1579 on board 1551 via connectors 1589 and 1590; and interconnect 1518 couples the logic device 1514 on board 1552 to logic device 1580 on board 1551 via connectors 1589 and 1590.

Some interconnects such as interconnects 1595, 1596, 1597, and 1598 are not coupled to anything because they are not used. However, as mentioned above with respect to logic devices 1511 and 1577, R-pack 1591 connects interconnects 1600 and 1601 to increase the number of north-south interconnects.

Figure 44:
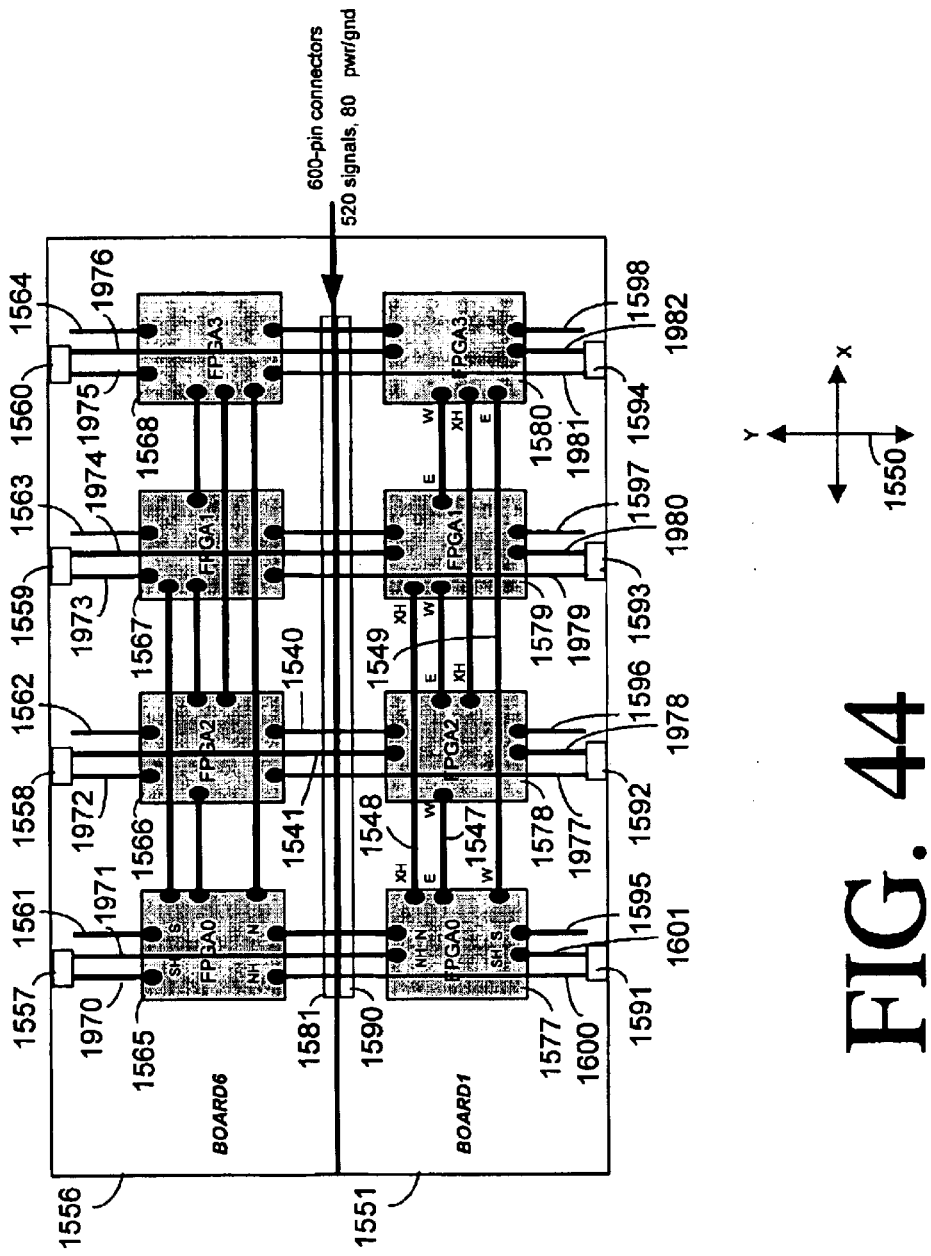
FIG. 44 shows a direct-neighbor and one-hop dual-board interconnection layout of the FPGA array in accordance with another embodiment of the present invention.

A dual-board embodiment of the present invention is illustrated in FIG. 44. In the dual-board embodiment of the present invention, only two boards are necessary to model the user's design in the Simulation system. Like the six-board configuration of FIG. 39, the dual-board configuration of FIG. 44 uses the same two boards for "bookends"—board1 1551 and board6 1556, which are provided on a motherboard as part of the reconfigurable hardware unit 20 in FIG. 1. In FIG. 44, one bookend board is board1 and the second bookend board is board6. Board6 is used in FIG. 44 to show its similarity to board6 in FIG. 39; that is, the bookend boards like board1 and board6 should have the requisite terminations for the north-south mesh connections.

This dual-board configuration contains four FPGA logic devices 1577 (FPGA0), 1578 (FPGA1), 1579 (FPGA2), and 1580 (FPGA3) on board 1551, and four FPGA logic devices 1565 (FPGA0), 1566 (FPGA1), 1567 (FPGA2), and 1568 (FPGA3) on board6 1556. These two boards are connected by inter-board connectors 1581 and 1590.

These boards contain 10-ohm R-packs to terminate some connections. For the dual-board embodiment, both boards are the "bookend" boards. Board 1551 contains 10-ohm R-pack connectors 1591, 1592, 1593, and 1594 as resistive terminations. The second board 1556 also contains the 10-ohm R-pack connectors 1557 to 1560.

Board 1551 has connector 1590 and board 1556 has connector 1581 for inter-board communication. The interconnects that cross from one board to another, such as interconnects 1600, 1971, 1977, 1541, and 1540, go through these connectors 1590 and 1581; in other words, the inter-board connectors 1590 and 1581 enable the interconnects 1600, 1971, 1977, 1541, and 1540 to make the connection between one component on one board and another component on another board. The inter-board connectors 1590 and 1581 carry control data and control signals on the FPGA buses.

For four-board configurations, board1 and board6 provide the bookend boards, while board2 1552 and board3 1553 (see FIG. 39) are the intermediate boards. When coupled to the motherboard in accordance with the present invention (to be discussed with respect to FIGS. 38(A) and 38(B)), board1 and board2 are paired and board3 and board6 are paired.

For six-board configurations, board1 and board6 provide the bookend boards as discussed above, while board2 1552, board3 1553, board4 1554, and board5 1555 (see. FIG. 39) are the intermediate boards. When coupled to the motherboard in accordance with the present invention (to be discussed with respect to FIGS. 38(A) and 38(B)), board1 and board2 are paired, board3 and board4 are paired, and board5 and board6 are paired.

More boards can be provided as necessary. However, regardless of the number of boards that will be added to the system, the bookend boards (such board1 and board6 of FIG. 39) should have the requisite terminations that complete the mesh array connections. In one embodiment, the minimum configuration is the dual-board configuration of FIG. 44. More boards can be added by two-board increments. If the initial configuration had board1 and board6, a future modification to a four-board configuration involves moving the board6 further out and pairing board1 and board2 together, and then pairing board3 and board6 together, as mentioned above.

As described above, each logic device is coupled to its adjacent neighbor logic device and its non-adjacent neighbor logic device within one hop. Thus, in FIGS. 39 and 44, logic device 1577 is coupled to adjacent neighbor logic device 1578 via interconnect 1547. Logic device 1577 is also coupled to non-adjacent logic device 1579 via one-hop interconnect 1548. However, logic device 1580 is considered to be adjacent to logic device 1577 due to the wrap-around torus configuration with interconnect 1549 providing the coupling.

Various board layouts are possible with the present invention. Each board may hold any number of rows of FPGA chips, limited only by the physical dimensions of the system hardware. Interconnects between adjacent boards extend the FPGA array uniformly in one dimension. Thus, a single board with one row of four FPGA chips provides a 1×4 array. By adding a second board with one row of four FPGA chips and the proper interconnects, the array has been extended to 2×4. If the extension is due to the addition of more rows, the extension is vertical. In order to achieve this expandability, the I/O signals of the FPGA array in each board are grouped into two categories—Group C and Group S.

Group C signals are connected to the next board by using connectors on the component side of the PCB. These connectors are at one edge of the FPGA array to facilitate short trace lengths and provide a lower number of signal layers for this PCB design. Group S signals are connected to the previous board by using connectors on the solder side of the PCB. These connectors are at the other edge of the FPGA array to facilitate short trace lengths and provide a lower number of signal layers for this PCB design. For example, referring now to FIG. 85, board 3 includes a single with exemplary FPGA chip FPGA0. The Group C component side signals are represented by C1, C2, and C3 on one edge, while the Group S solder side, signals are represented by S4, S5, and S6 on the other edge.

As a general rule, two adjacent boards are interconnected by mating connectors of Group C and Group S of these two boards at the same edge. In other words, these two boards are interconnected to each other at the top edge or the bottom edge. However, the interconnect must not pass through the motherboard or other backplane to achieve high packaging density, short trace lengths, and better performance. In contrast, the motherboard or backplane methods require all the connectors to be placed at only one edge of the board, thus forcing all I/O signals from the other edge of the FPGA array to be routed across the board. Today's FPGA chip has over 500 I/O pins and the number of interconnect signals reaches thousands. It may not be feasible to design a compact interconnect system by using out-of-shelf connectors. The array layout design of the present invention of placing two-group connectors at both edges of the FPGA board doubles the maximum possible number of interconnect signals per board. Furthermore, the design of the present invention reduces the complexity of the PCB design.

For those FPGA arrays with direct and one-hop connections, odd and even boards utilize different connections between the I/O signals and the connectors. FIGS. 85–88 show the various inter-board connection schemes for those FPGA boards with single-, dual-, triple-, and quadruple-rows. For simplicity, only one column is shown for each board layout. The mating connectors at the interconnects are pairs of Group C and Group S connectors with the same pin position (X, Y coordinates on the board), such as C1 and S1, C2 and S2, etc.

In the single row configuration, FIG. 85 shows eight boards and as mentioned above, one column. Because only one column is shown, only the first FPGA chip FPGA0 of each board is shown. To illustrate the interconnect scheme, the first three boards will be examined. The north edge of board 1 is aligned with the north edge of board 2 and board 3. However, the north edges of board 1 and board 2 are interconnected, while the north edges of board 2 and 3 are not interconnected. Also, the south edges of board 1, board 2, and board 3 are aligned. However, only the south edges of boards 2 and 3 are interconnected. Between board 1 and board 2, direct neighbor north connection C1, C2, and C3 in board 1 are coupled to north connection S1, S2, and S3 of board 2, respectively. However, only the C1-S1 connection is direct. The connection C2-S2 is one-hop (between board 1 and board 3 via connectors C5 and S5) and C3-S3 is another one-hop (between board 2 and termination via connector S6). Similarly, between board2 and board 3, direct neighbor south connection C4, C5, and C6 in board 2 are coupled to south connection S4, S5, and S6 of board 3, respectively. However, only the C4-S4 connection is direct. The connection C5-S5 is one-hop (between board 1 and board 3 via connectors C2 and S2) and C6-S6 is another one-hop (between board 2 and board 4 via connectors C3 and S3). Because only one row is provided in each board, the one-hop appears to be skipping boards. However, as more rows of chips are added, the one-hop concept refers to the skipping of a chip. Thus, even in one board, the one-shop connection is between two chips that are not adjacent to each other; that is, the connection has to skip over one chip between the two connecting chips.

In the dual row configuration, FIG. 86 shows four boards and as mentioned above, one column. Because only one column is shown, only the first two FPGA chips FPGA0 and FPGA1 of each board are shown. To illustrate the interconnect scheme, the first three boards will be examined. The north edge of board 1 is aligned with the north edge of board 2 and board 3. However, the north edges of board 1 and board 2 are interconnected, while the north edges of board 2 and 3 are not interconnected. Also, the south edges of board 1, board 2, and board 3 are aligned. However, only the south edges of boards 2 and 3 are interconnected. Between board 1 and board 2, direct neighbor north connection C1, C2, and C3 in board 1 are coupled to north connection S1, S2, and S3 of board 2, respectively. However, only the C1-S1 connection is direct. The connection C2-S2 is one-hop (between chip FPGA1 in board 1 and chip FPA0 in board 2 via connectors C5 and S5) and C3-S3 is another one-hop (between chip FPGA1 in board 2 and chip FPGA0 in board 1). Similarly, between board 2 and board 3, direct neighbor south connection C4, C5, and C6 in board 2 are coupled to south connection S4, S5, and S6 of board 3, respectively. However, only the C4-S4 connection is direct. The connections C5-S5 and C6-S6 are one-hop connections (one chip between the connecting chips is skipped).

Note that the inter-board interconnects are provided by the FPGA chips at the edges of each board. Also, the interconnects at the north edges are coupled together, while the interconnects at the south edges are coupled together.

A similar concept is utilized for the triple-row configuration shown in FIG. 87 and the quadruple-row layout of FIG. 88. The interconnect scheme for the triple-row layout is summarized in the table provided in FIG. 89. Generally, as odd-numbered boards are installed, only connectors C1, C2, C3, S4, S5, and S6 are loaded. For even-numbered boards, only connectors S1, S2, S3, C4, C5, and C6 are loaded. Some pin positions (e g., 1 and 4) of both component-side and solder-side are connected to the same direct-connect signals (N, S). For example, C1 and S1 are connected to FPGA2 (N), while C4 and S4 are connected to FPGA0 (S). Other pins positions (e.g., 2, 3, 5, 6) of component-side and solder-side are connected to different one-hop I/O signals (SH, NH). For example, C2 connects to FPGA2 (NH) and S2 connects to FPGA1 (NH). In these cases, the inter-board connectors are surface-mount type instead of through-hole type.

Figure 42:
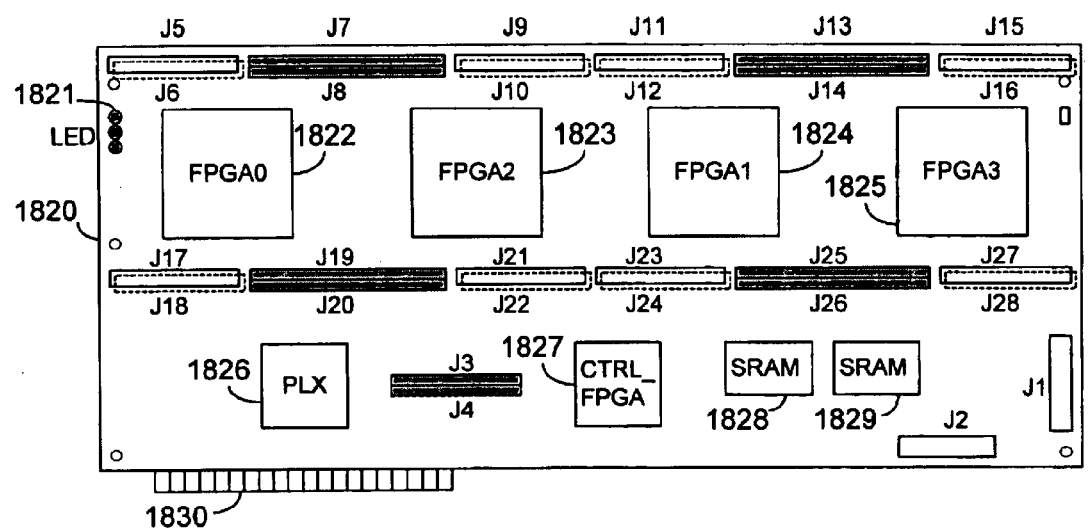
FIG. 42 shows on-board connectors and some components in a representative FPGA board.

FIG. 42 shows a top view (component side) of the on-board components and connectors for a single board. In one embodiment of the present invention, only one board is necessary to model the user's design in the Simulation system. In other embodiments, multiple boards (i.e., at least 2 boards) are necessary. Thus, for example, FIG. 39 shows six boards 1551 to 1556 coupled together through various 600-pin connectors 1581 to 1590. At the top and bottom ends, board 1551 is terminated by one set of 10-ohm R-packs and board 1556 is terminated by another set of 10-ohm R-packs.

Returning to FIG. 42, board 1820 contains four FPGA logic devices 1822 (FPGA0), 1823 (FPGA1), 1824 (FPGA2), and 1825 (FPGA3). Two SRAM memory devices 1828 and 1829 are also provided. These SRAM memory devices 1828 and 1829 will be used to map the memory blocks from the logic devices on this board; in other words, the memory Simulation aspect of the present invention maps memory blocks from the logic devices on this board to the SRAM memory devices on this board. Other boards will contain other logic devices and memory devices to accomplish a similar mapping operation. In one embodiment, the memory mapping is dependent on the boards; that is, memory mapping for board1 is limited to logic devices and memory devices on board1 while disregarding other boards.

In other embodiments, the memory mapping is independent of the boards. Thus, a few large memory devices will be used to map memory blocks from logic devices on one board to memory devices located on another board.

Light-emitting diodes (LEDs) 1821 are also provided to visually indicate some select activities. The LED display is as follows in Table A in accordance with one embodiment of the present invention:

TABLE A

LED DISPLAY

| LED | Color | State | Description |
|---|---|---|---|
| LED1 | Green | On | +5V and +3.3V are normal. |
| | | Off | +5V or +3.3V are abnormal. |
| LED2 | Amber | Off | All on-board FPGA configuration is done. |
| | | Blink | On-board FPGAs are not configured or configuration failed. |
| | | On | FPGA configuration is in process |
| LED3 | Red | On | Data transfer is in process. |
| | | Off | No data transfer |
| | | Blink | Diagnostic tests fail |

Various other control chips such as the PLX PCI controller 1826 and CTRL_FPGA unit 1827 control inter-FPGA and PCI communications. One example of a PLX PCI controller 1826 that may be used in the system is PLX Technology's PCI9080 or 9060. The PCI 9080 has the appropriate local bus interface, control registers, FIFOs, and PCI interface to the PCI bus. The data book PLX Technology, PCI 9080 Data Sheet (ver. 0.93, Feb. 28, 1997) is incorporated herein by reference. One example of the CTRL_FPGA unit 1827 is a programmable logic device (PLD) in the form of an FPGA chip, such as an Altera 10K50 chip. In multiple board configurations, only the first board coupled to the PCI bus contains the PCI controller.

Connector 1830 connects the board 1820 to the motherboard (not shown), and hence, the PCI bus, power, and ground. For some boards, the connector 1830 is not used for direct connection to the motherboard. Thus, in a dual-board configuration, only the first board is directly coupled to the motherboard. In a six-board configuration, only boards 1, 3, and 5 are directly connected to the motherboard while the remaining boards 2, 4, and 6 rely on their neighbor boards for motherboard connectivity. Inter-board connectors J1 to J28 are also provided. As the name implies, these connectors J1 to J28 allow connections across different boards.

Connector J1 is for external power and ground connections. The following Table B shows the pins and corresponding description for the external power connector J1 in accordance with one embodiment of the present invention:

TABLE B

EXTERNAL POWER - J1

| Pin number | Description |
|---|---|
| 1 | VCC5V |
| 2 | GND |
| 3 | GND |
| 4 | VCC3V |

Connector J2 is for the parallel port connection. Connectors 31 and J2 are used for stand-alone single-board boundary scan test during production. The following Table C shows the pins and corresponding description for the parallel JTAG port connector J2 in accordance with one embodiment of the present invention:

TABLE C

PARALLEL JTAG PORT - J2

| J2 Pin Number | J2 Signal | I/O from Board | DB25 Pin Number | DB25 Signal |
|---|---|---|---|---|
| 3 | PARA_TCK | I | 2 | D0 |
| 5 | PARA_TMS | I | 3 | D1 |
| 7 | PARA_TDI | I | 4 | D2 |
| 9 | PARA_NR | I | 5 | D3 |
| 19 | PARA_TDO | O | 10 | NACK |
| 10, 12, 14, 16, 18, 20, 22, 24 | GND | | 18–25 | GND |

Connectors J3 and J4 are for the local bus connections across boards. Connectors J5 to J16 are one set of FPGA interconnect connections. Connectors J17 to J28 are a second set of FPGA interconnect connections. When placed component-side to solder-side, these connectors provide effective connections between one component in one board with another component in another board. The following Tables D and E provide a complete list and description of the connectors J1 to J28 in accordance with one embodiment of the present invention:

TABLE D

CONNECTORS J1–J28

| Conn | Description | Type |
|---|---|---|
| J1 | +5V/+3V external power | 4-pin power RA header, comp side |
| J2 | Parallel Port | 0.1" pitch, 2-row thru-hole RA header, comp side |
| J3 | Local Bus | 0.05" pitch, 2 × 30 thru-hole header, SAMTEC, comp side |
| J4 | Local Bus | 0.05" pitch, 2 × 30 thru-hole receptacle; SAMTEC, solder side |
| J5 | Row A: NH[0], VCC3V, GND<br>Row B: J17 Row B, VCC3V, GND | 0.05" pitch 2 × 30 SMD header, SAMTEC, comp side |
| J6 | Row A: J5 Row B, VCC3V, GND<br>Row B: J5 Row A, VCC3V, GND | 0.05" pitch 2 × 30 SMD receptacle, SAMTEC, solder side |
| J7 | Row A: N[0], 4× VCC3V, 4× GND, N[2]<br>Row B: N[0], 4× VCC3V, 4× GND, N[2] | 0.05" pitch, 2 × 45 thru-hole header, SAMTEC, comp/solder side |
| J8 | Row A: N[0], 4× VCC3V, 4× GND, N[2]<br>Row B: N[0], 4× VCC3V, 4× GND, N[2] | 0.05" pitch, 2 × 45 thru-hole receptacle, SAMTEC, comp/solder side |
| J9 | Row A: NH[2], LASTL, GND<br>Row B: J21 Row B, GND | 0.05" pitch, 2 × 30 SMD header, SAMTEC, comp side |
| J10 | Row A: J9 Row B, FIRSTL, GND<br>Row B: J9 Row A, GND | 0.05" pitch, 2 × 30 SMD receptacle, SAMTEC, solder side |
| J11 | Row A: NH[1], VCC3V, GND<br>Row B: J23 Row B, VCC3V, GND | 0.05" pitch, 2 × 30 SMD header, SAMTEC, comp side |
| J12 | Row A: J11 Row B, VCC3V, GND<br>Row B: J11 Row A, VCC3V, GND | 0.05" pitch, 2 × 30 SMD receptacle, SAMTEC, solder side |
| J13 | Row A: N[1], 4× VCC3V, 4× GND, N[3]<br>Row B: N[1], 4× VCC3V, 4× GND, N[3] | 0.05" pitch, 2 × 45 thru-hole header, SAMTEC, comp/solder side |

TABLE D-continued

CONNECTORS J1–J28

| Conn | Description | Type |
|---|---|---|
| J14 | Row A: N[1], 4× VCC3V, 4× GND, N[3]<br>Row B: N[1], 4× VCC3V, 4× GND, N[3] | 0.05" pitch, 2 × 45 thru-hole receptacle, SAMTEC, comp/solder side |
| J15 | Row A: NH[3], LASTH, GND<br>Row B: J27 Row B, GND | 0.05" pitch, 2 × 30 SMD header, SAMTEC, comp side |
| J16 | Row A: J15 Row B, FIRSTH, GND<br>Row B: J15 Row A, GND | 0.05" pitch, 2 × 30 SMD receptacle, SAMTEC, solder side |
| J17 | Row A: SH[0], VCC3V, GND<br>Row B: J5 Row B, VCC3V, GND | 0.05" pitch, 2 × 30 SMD header, SAMTEC, comp side |
| J18 | Row A: J17 Row B, VCC3V, GND<br>Row B: J17 Row A, VCC3V, GND | 0.05" pitch, 2 × 30 SMD receptacle, SAMTEC, solder side |
| J19 | Row A: S[0], 4× VCC3V, 4× GND, S[2]<br>Row B: S[0], 4× VCC3V, 4× GND, S[2] | 0.05" pitch, 2 × 45 thru-hole header, SAMTEC, comp/solder side |
| J20 | Row A: S[0], 4× VCC3V, 4× GND, S[2]<br>Row B: S[0], 4× VCC3V, 4× GND, S[2] | 0.05" pitch, 2 × 45 thru-hole receptacle, SAMTEC, comp/solder side |
| J21 | Row A: SH[2], LASTL, GND<br>Row B: J9 Row B, GND | 0.05" pitch, 2 × 30 SMD header, SAMTEC, comp side |
| J22 | Row A: J21 Row B, FIRSTL, GND<br>Row B: J21 Row A, GND | 0.05" pitch, 2 × 30 SMD receptacle, SAMTEC, solder side |
| J23 | Row A: SH[1], VCC3V, GND<br>Row B: J11 Row B, VCC3V, GND | 0.05" pitch, 2 × 30 SMD header, SAMTEC, comp side |
| J24 | Row A: J23 Row B, VCC3V, GND<br>Row B: J23 Row A, VCC3V, GND | 0.05" pitch, 2 × 30 SMD receptacle, SAMTEC, solder side |
| J25 | Row A: S[1], 4× VCC3V, 4× GND, S[3]<br>Row B: S[1], 4× VCC3V, 4× GND, S[3] | 0.05" pitch, 2 × 45 thru-hole header, SAMTEC, comp/solder side |
| J26 | Row A: S[1], 4× VCC3V, 4× GND, S[3]<br>Row B: S[1], 4× VCC3V, 4× GND, S[3] | 0.05" pitch, 2 × 45 thru-hole receptacle, SAMTEC, comp/solder side |
| J27 | Row A: SH[3], LASTH, GND<br>Row B: J15 Row B, GND | 0.05" pitch, 2 × 30 SMD header, SAMTEC, comp side |
| J28 | Row A: J27 Row B, FIRSTH, GND<br>Row B: J27 Row A, GND | 0.05" pitch, 2 × 30 SMD receptacle, SAMTEC, solder side |

Shaded connectors are through-hole type. Note that in Table D, the number in the brackets [ ] represents the FPGA logic device number 0 to 3. Thus, S[0] indicates the south interconnection (i.e., S[73:0] in FIG. 37) and its 74 bits of FPGA0.

TABLE E

LOCAL BUS CONNECTORS - J3, J4

| Pin Number | Signal Name | I/O |
|---|---|---|
| A1 | GND | PWR |
| A2 | J3_CLK for J3, J4_CLK for J4 | I/O |
| A3 | GND | PWR |
| A4 | LD1 | I/O |
| A5 | LD3 | I/O |
| A6 | LD5 | I/O |
| A7 | LD7 | I/O |
| A8 | LD9 | I/O |
| A9 | LD11 | I/O |
| A10 | VCC3V | PWR |
| A11 | LD13 | I/O |
| A12 | LD15 | I/O |
| A13 | LD17 | I/O |
| A14 | LD19 | I/O |
| A15 | LD21 | I/O |
| A16 | LD22 | I/O |
| A17 | LD24 | I/O |
| A18 | LD26 | I/O |
| A19 | LD28 | I/O |
| A20 | LD30 | I/O |
| A21 | VCC3V | PWR |
| A22 | ADS_N | I/O |
| A23 | DEN_N | OT |
| A24 | LA31 | O |
| A25 | LA29 | O |
| A26 | LA10 | O |
| A28 | LA6 | O |
| A28 | LA4 | O |
| A29 | LA2 | O |
| A30 | VCC5V | PWR |
| B1 | LRESET_N | I/O |
| B2 | VCC5V | PWR |
| B3 | LD0 | I/O |
| B4 | LD2 | I/O |
| B5 | LD4 | I/O |
| B6 | LD6 | I/O |
| B7 | LD8 | I/O |
| B8 | LD10 | I/O |
| B9 | GND | PWR |
| B10 | LD12 | I/O |
| B11 | LD14 | I/O |
| B12 | LD16 | I/O |
| B13 | LD18 | I/O |
| B14 | LD20 | I/O |
| B15 | VCC3V | PWR |
| B16 | LD23 | I/O |
| B17 | LD25 | I/O |
| B18 | LD27 | I/O |
| B19 | LD29 | I/O |
| B20 | LD31 | I/O |
| B21 | LHOLD | OT |
| B22 | GND | PWR |
| B23 | DTR_N | O |
| B24 | LA30 | O |
| B25 | LA28 | O |
| B26 | LA7 | O |
| B28 | LA5 | O |
| B28 | LA3 | O |
| B29 | DONE | OD |
| B30 | VCC5V | PWR |

I/O direction is for Board1.

FIG. 43 shows a legend of the connectors J1 to J28 in FIGS. 41(A) to 41(F) and 42. In general, the clear filled blocks indicate surface mount, whereas the gray filled blocks represent the through hole types. Also, the solid outline block represents the connectors located on the component side. The dotted outline block represents the connectors located on the solder side. Thus, the block 1840 with the clear fill and the solid outline represents a 2×30 header, surface mount and located on the component side. Block 1841 with the clear fill and the dotted outline represents a 2×30 receptacle, surface mount and located on the solder side of the board. Block 1842 with the gray fill and solid outline represents a 2×30 or 2×45 header, through hole and located on the component side. Block 1843 with the gray fill and the dotted outline represents a 2×45 or 2×30 receptacle, through hole and located on the solder side. In one embodiment, the Simulation system uses Samtec's SFM and TFM series of 2×30 or 2×45 micro strip connectors for both surface mount and through hole types. Block 1844 with the cross-hatched fill and the solid outline is an R-pack, surface mount and located on the component side of the board. Block 1845 with the cross-hatched fill and the dotted outline is an R-pack, surface mount and located on the solder side. The Samtec specification from Samtec's catalog on their website is incorporated by reference herein. Returning to FIG. 42, connectors J3 to J28 are the type as indicated in the legend of FIG. 43.

Figure 41A:
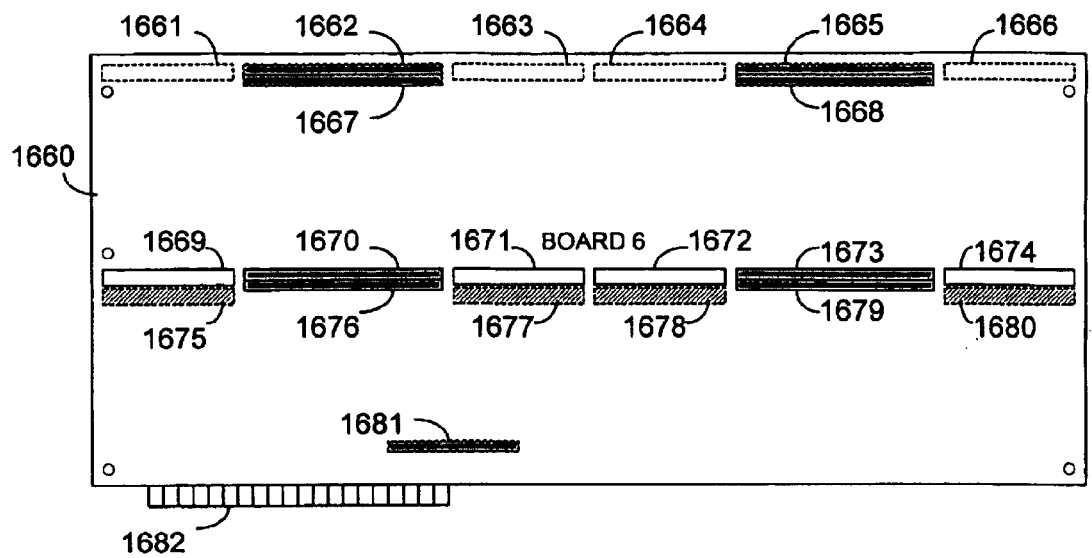
FIGS. 41(A) to 41(F) show top views of the board interconnection connectors.
Figure 41B:
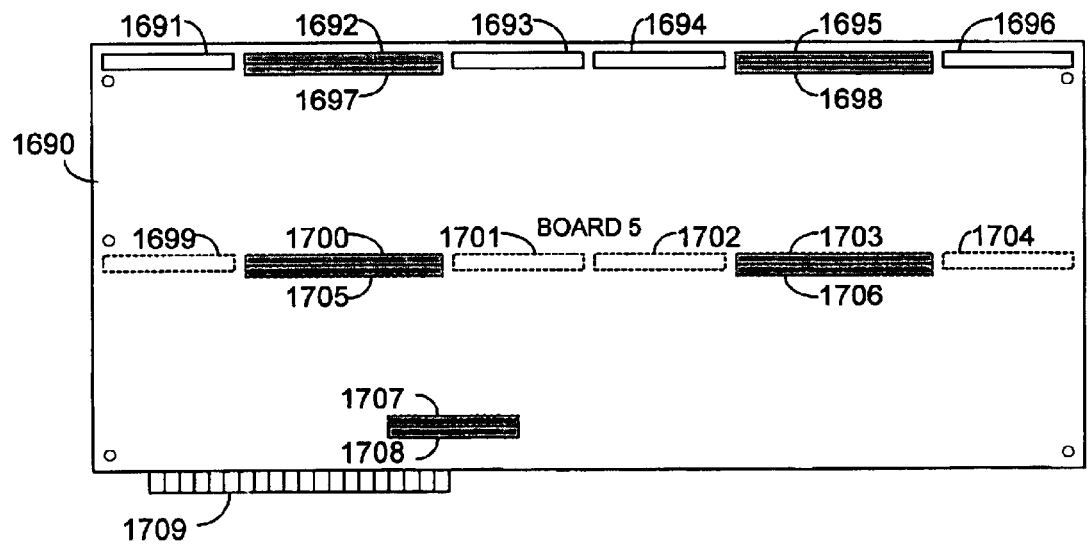
Figure 41C:
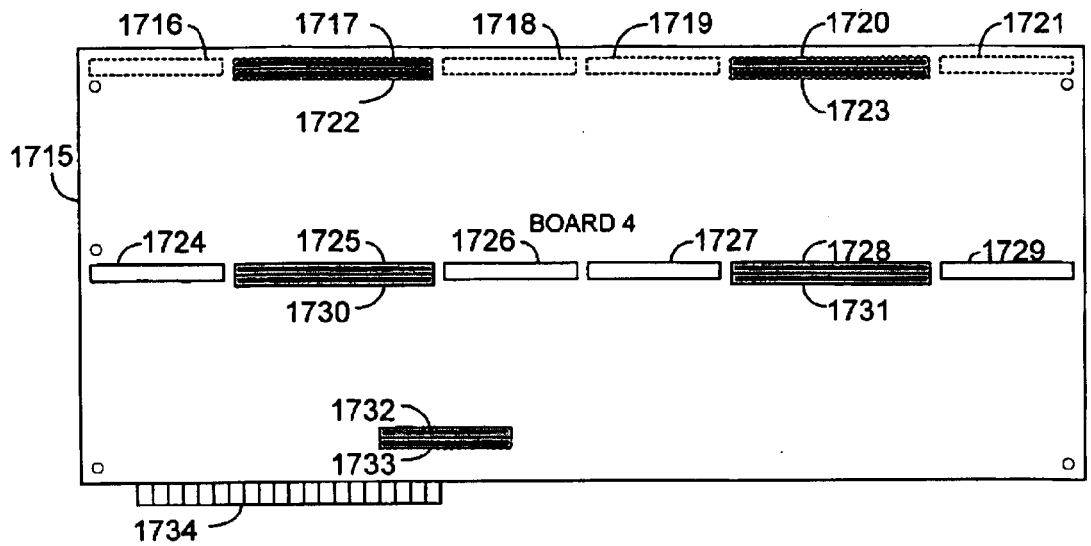
Figure 41D:
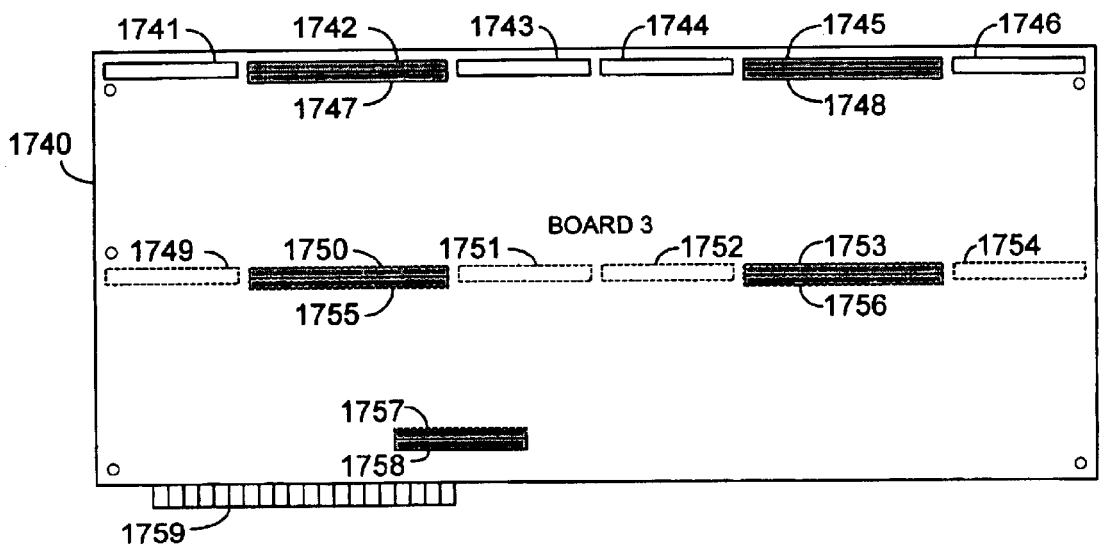
Figure 41E:
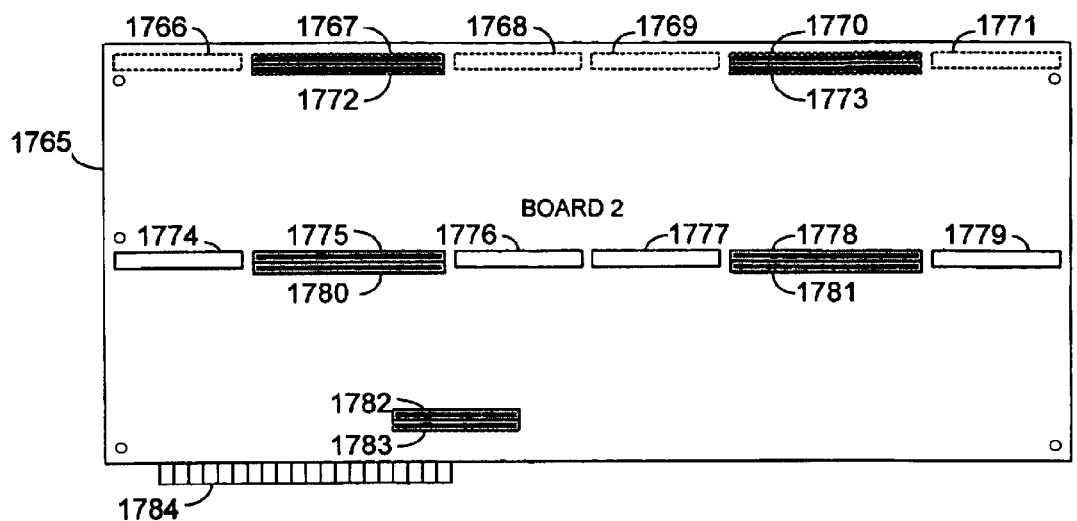
Figure 41F:
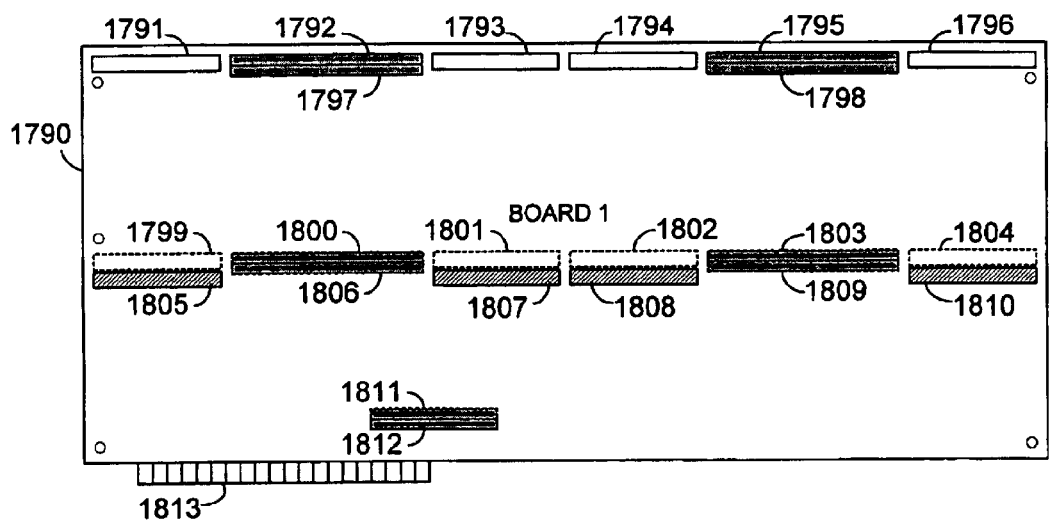

FIGS. 41(A) to 41(F) show top views of each board and their respective connectors. FIG. 41(A) shows the connectors for board6. Thus, board 1660 contains connectors 1661 to 1681 along with motherboard connector 1682. FIG. 41(B) shows the connectors for board5. Thus, board 1690 contains connectors 1691 to 1708 along with motherboard connector 1709. FIG. 41(C) shows the connectors for board4. Thus, board 1715 contains connectors 1716 to 1733 along with motherboard connector 1734. FIG. 41(D) shows the connectors for board3. Thus, board 1740 contains connectors 1741 to 1758 along with motherboard connector 1759. FIG. 41(E) shows the connectors for board2. Thus, board 1765 contains connectors 1766 to 1783 along with motherboard connector 1784. FIG. 41(F) shows the connectors for board1. Thus, board 1790 contains connectors 1791 to 1812 along with motherboard connector 1813. As indicated on the legend on FIG. 43, these connectors for the six boards are various combinations of (1) surface mount or through hole, (2) component side or solder side, and (3) header or receptacle or R-pack.

Figure 38A:
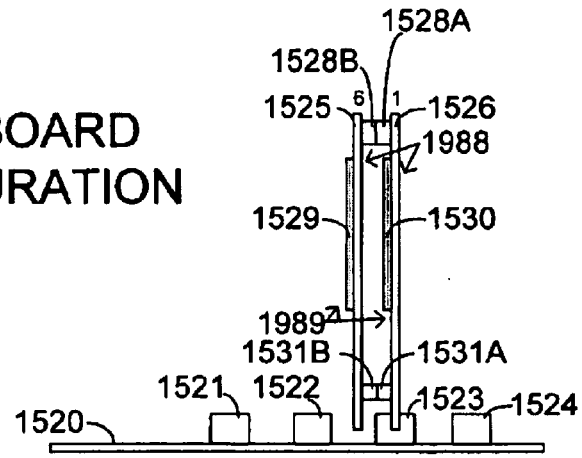
FIGS. 38(A) and 38(B) show side views of the FPGA board connection scheme in accordance with one embodiment of the present invention.
Figure 38B:
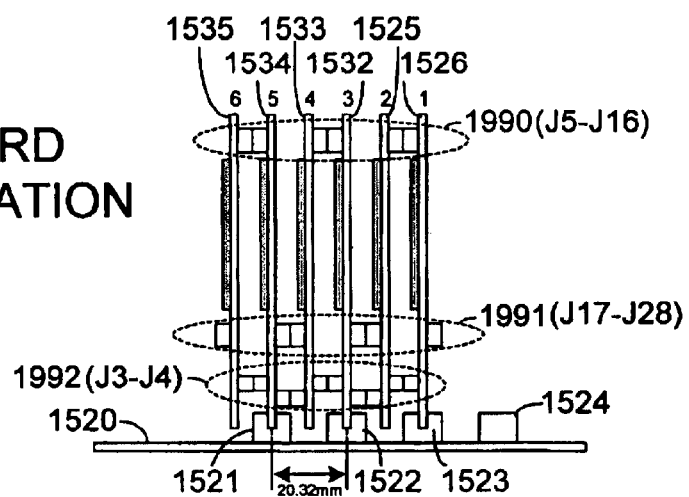

In one embodiment, these connectors are used for inter-board communications. Related buses and signals are grouped together and supported by these inter-board connectors for routing signals between any two boards. Also, only half of the boards are directly coupled to the motherboard. In FIG. 41(A), board6 1660 contains connectors 1661 to 1668 designated for one set of the FPGA interconnects, connectors 1669 to 1674, 1676, and 1679 designated for another set of FPGA interconnects, and connector 1681 designated for the local bus. Because board6 1660 is positioned as one of the boards at the end of the motherboard (along, with board1 1790 in FIG. 41(F) at the other end), connectors 1675, 1677, 1678, and 1680 are designated for the 10-ohm R-pack connections for certain north-south interconnects. Also, the motherboard connector 1682 is not used for board6 1660, as shown in FIG. 38(B) where the sixth board 1535 is coupled to the fifth board 1534 but not directly coupled to the motherboard 1520.

In FIG. 41(B), board5 1690 contains connectors 1691 to 1698 designated for one set of the FPGA interconnects, connectors 1699 to 1706 designated for another set of FPGA interconnects, and connectors 1707 and 1708 designated for the local bus. Connector 1709 is used to couple board5 1690 to the motherboard.

In FIG. 41(C), board4 1715 contains connectors 1716 to 1723 designated for one set of the FPGA interconnects, connectors 1724 to 1731 designated for another set of FPGA interconnects, and connectors 1732 and 1733 designated for the local bus. Connector 1709 is not used to couple board4 1715 directly to the motherboard. This configuration is also shown in FIG. 38(B) where the fourth board 1533 is coupled to the third board 1532 and the fifth board 1534 but not directly coupled to the motherboard 1520.

In FIG. 41(D), board3 1740 contains connectors 1741 to 1748 designated for one set of the FPGA interconnects, connectors 1749 to 1756 designated for another set of FPGA interconnects, and connectors 1757 and 1758 designated for the local bus. Connector 1759 is used to couple board3 1740 to the motherboard.

In FIG. 41(E), board2 1765 contains connectors 1766 to 1773 designated for one set of the FPGA interconnects, connectors 1774 to 1781 designated for another set of FPGA interconnects, and connectors 1782 and 1783 designated for the local bus. Connector 1784 is not used to couple board2 1765 directly to the motherboard. This configuration is also shown in FIG. 38(B) where the second board 1525 is coupled to the third board 1532 and the first board 1526 but not directly coupled to the motherboard 1520.

In FIG. 41(F), board1 1790 contains connectors 1791 to 1798 designated for one set of the FPGA interconnects, connectors 1799 to 1804, 1806, and 1809 designated for another set of FPGA interconnects, and connectors 1811 and 1812 designated for the local bus. Connector 1813 is used to couple board1 1790 to the motherboard. Because board1 1790 is positioned as one of the boards at the end of the motherboard (along with board6 1660 in FIG. 41(A) at the other end), connectors 1805, 1807, 1808, and 1810 are designated for the 10-ohm R-pack connections for certain north-south interconnects.

In one embodiment of the present invention, multiple boards are coupled to the motherboard and to each other in a unique manner. Multiple boards are coupled together component-side to solder-side. One of the boards, say the first board, is coupled to the motherboard and hence, the PCI bus, via a motherboard connector. Also, the FPGA interconnect bus on the first board is coupled to the FPGA interconnect bus of the other board, say the second board, via a pair of FPGA interconnect connectors. The FPGA interconnect connector on the first board is on the component side and the FPGA interconnect connector on the second board is on the solder side. The component-side and solder-side connectors on the first board and second board, respectively, allow the FPGA interconnect buses to be coupled together.

Similarly, the local buses on the two boards are coupled together via local bus connectors. The local bus connector on the first board is on the component side and the local bus connector on the second board is on the solder side. Thus, the component-side and solder-side connectors on the first board and second board, respectively, allow the local buses to be coupled together.

More boards can be added. A third board can be added with its solder-side to the component-side of the second board. Similar FPGA interconnects and local bus inter-board connections are also made. The third board is also coupled to the motherboard via another connector but this connector merely provides power and ground to the third board, to be discussed further below.

The component-side to solder-side connectors in the dual board configuration will be discussed with reference to FIG. 38(A). This figure shows side views of the FPGA board connection on the motherboard in accordance with one embodiment of the present invention. FIG. 38(A) shows the dual-board configuration where, as the name implies, only two boards are utilized. These two boards 1525 (board2) and 1526 (board1) in FIG. 38(A) coincide with the two boards 1552 and 1551 in FIG. 39. The component sides of the boards 1525 and 1526 are represented by reference numeral 1989. The solder side of the two boards 1525 and 1526 are represented by reference numeral 1988. As shown in FIG. 38(A), these two boards 1525 and 1526 are coupled to the motherboard 1520 via motherboard connector 1523. Other motherboard connectors 1521, 1522, and 1524 can also be provided for expansion purposes. Signals between the PCI bus and the boards 1525 and 1526 are routed via the motherboard connector 1523. PCI signals are routed between the dual-board structure and the PCI bus via the first board 1526 first. Thus, signals from the PCI bus encounter the first board 1526 first before they travel to the second board 1525. Analogously, signals to the PCI bus from the dual-board structure are sent from the first board 1526. Power is also applied to the boards 1525 and 1526 via motherboard connector 1523 from a power supply (not shown).

As shown in FIG. 38(A), board 1526 contains several components and connectors. One such component is an FPGA logic device 1530. Connectors 1528A and 1531A are also provided. Similarly, board 1525 contains several components and connectors. One such component is an FPGA logic device 1529. Connectors 1528B and 1531B are also provided.

In one embodiment, connectors 1528A and 1528B are the inter-board connectors for the FPGA bus such as 1590 and 1581 (FIG. 44). These inter-board connectors provide the inter-board connectivity for the various FPGA interconnects, such as N[73:0], S[73:0], W[73:0], E[73:0], NH[27:0], SH[27:0], XH[36:0] and XH[72:37], excluding the local bus connections.

Furthermore, connectors 1531A and 1531B are the inter-board connectors for the local bus. The local bus handles the signals between the PCI bus (via the PCI controller) and the FPGA bus (via the FPGA I/O controller (CTRL_FPGA) unit)). The local bus also handles configuration and boundary scan test information between the PCI controller and the FPGA logic devices and the FPGA I/O controller (CTRL_FPGA) unit.

In sum, the motherboard connector couples one board in a pair of boards to the PCI bus and power. One set of connectors couples the FPGA interconnects via the component side of one board to the solder side of the other board. Another set of connectors couples the local buses via the component side of one board to the solder side of the other board.

In another embodiment of the present invention, more than two boards are used. Indeed, FIG. 38(B) shows a six-board configuration. The configuration is analogous to that of FIG. 38(A), in which every other board is directly connected to the motherboard, and interconnects and local buses of these boards are coupled together via inter-board connectors arranged solder-side to component-side.

FIG. 38(B) shows six boards 1526 (first board), 1525 (second board), 1532 (third board), 1533 (fourth board), 1534 (fifth board), and 1535 (sixth board). These six boards are coupled to the motherboard 1520 via the connectors on boards 1526 (first board), 1532 (third board), and 1534 (fifth board). The other boards 1525 (second board), 1533 (fourth board), and 1535 (sixth board) are not directly coupled to the motherboard 1520; rather, they are indirectly coupled to the motherboard through their respective connections to their respective neighbor boards.

Placed solder-side to component-side, the various inter-board connectors allow communication among the PCI bus components, the FPGA logic devices, memory devices, and various Simulation system control circuits. The first set of inter-board connectors 1990 correspond to connectors J5 to J16 in FIG. 42. The second set of inter-board connectors 1991 correspond to connectors J17 to J28 in FIG. 42. The third set of inter-board connectors 1992 correspond to connectors J3 and J4 in FIG. 42.

Motherboard connectors 1521 to 1524 are provided on the motherboard 1520 to couple the motherboard (and hence the PCI bus) to the six boards. As mentioned above, boards 1526 (first board), 1532 (third board), and 1534 (fifth board) are directly coupled to the connectors 1523, 1522, and 1521, respectively. The other boards 1525 (second board), 1533 (fourth board), and 1535 (sixth board) are not directly coupled to the motherboard 1520. Because only one PCI controller is needed for all six boards, only the first board 1526 contains a PCI controller. Also, the motherboard connector 1523 which is coupled to the first board 1526 provides access to/from the PCI bus. Connectors 1522 and 1521 are only coupled to power and ground. The center-to-center spacing between adjacent motherboard connectors is approximately 20.32 mm in one embodiment.

For the boards 1526 (first board), 1532 (third board), and 1534 (fifth board) that are directly coupled to the motherboard connectors 1523, 1522, and 1521, respectively, the J5 to J16 connectors are located on the component side, the J17 to J28 connectors are located on the solder side, and the J3 to J4 local bus connectors are located on the component side. For the other boards 1525 (second board), 1533 (fourth board), and 1535 (sixth board) that are not directly coupled to the motherboard connectors 1523, 1522, and 1521, the J5 to J16 connectors are located on the solder side, the J17 to J28 connectors are located on the component side, and the J3 to J4 local bus connectors are located on the solder side. For the end boards 1526 (first board) and 1535 (sixth board), parts of the J17 to J28 connectors are 10-ohm R-pack terminations.

FIGS. 40(A) and 40(B) show array connection across different boards. To facilitate the manufacturing process, a single layout design is used for all the boards. As explained above, boards connect to other boards through connectors without a backplane. FIG. 40(A) shows two exemplary boards 1611 (board2) and 1610 (board1). The component side of board 1610 is facing the solder side of board 1611. Board 1611 contains numerous FPGA logic devices, other components, and wire lines. Particular nodes of these logic devices and other components on board 1611 are represented by nodes A' (reference numeral 1612) and B' (reference numeral 1614). Node A' is coupled to connector pad 1616 via PCB trace 1620. Similarly, node B' is connected to connector pad 1617 via PCB trace 1623.

Analogously, board 1610 also contains numerous FPGA logic devices, other components, and wire lines. Particular nodes of these logic devices and other components on board 1610 are represented by nodes A (reference numeral 1613) and B (reference numeral 1615). Node A is coupled to connector pad 1618 via PCB trace 1625. Similarly, node B is connected to connector pad 1619 via PCB trace 1622.

The routing of signals between nodes located in different boards using surface mount connectors will now be discussed. In FIG. 40(A), the desired connections are between: (1) node A and node B' as indicated by imaginary path 1623, 1624, and 1625, and (2) node B and node A' as indicated by imaginary path 1620, 1621, and 1622. These connections are for paths such as the asymmetric interconnect 1600 between board 1551 and board 1552 in FIG. 39. Other asymmetric interconnects include the NH to SH interconnects 1977, 1979, and 1981 on both sides of connectors 1589 and 1590.

A–A' and B–B' correspond to symmetrical interconnections like interconnect 1515 (N, S). N and S interconnections use-through hole connectors, whereas NH and SH asymmetric interconnections use SMD connectors. Refer to Table D.

The actual implementation using surface mount connectors will now be discussed with reference to FIG. 40(B) using like numbers for like items. In FIG. 40(B), board 1611 shows node A' on the component side coupled to component-side connector pad 1636 via PCB trace 1620. The component-side connector pad 1636 is coupled to the solder-side connector pad 1639 via conductive path 1651. Solder-side connector pad 1639 is coupled to the component-side connector pad 1642 on board 1610 via conductive path 1648. Finally, component-side connector pad 1642 is coupled to node B via PCB trace 1622. Thus, node A' on board 1611 can be coupled to node B on board 1610.

Likewise, in FIG. 40(B), board 1611 shows node B' on the component side-coupled to component-side connector pad 1638 via PCB trace 1623. The component-side connector pad 1638 is coupled to the solder-side connector pad 1637 via conductive path 1650. Solder-side connector pad 1637 is coupled to the component-side connector pad 1640 via conductive path 1645. Finally, component-side connector-pad 1640 is coupled to node A via PCB trace 1625. Thus, node B' on board 1611 can be coupled to node A on board 1610. Because these boards share the same layout, conductive paths 1652 and 1653 could be used in the same manner as conductive paths 1650 and 1651 for other boards placed adjacent to board 1610. Thus, a unique inter-board connectivity scheme is provided using surface mount and through hole connectors without using switching components.

F. Timing-Insensitive Glitch-Free Logic Devices

One embodiment of the present invention solves both the hold time and clock glitch problems. During configuration of the user designs into the hardware model of the reconfigurable computing system, standard logic devices (e.g., latches, flip-flops) found in the user designs are replaced with emulation logic devices, or timing-insensitive glitch-free (TIGF) logic devices, in accordance with one embodiment of the present invention. In one embodiment, a trigger signal that has been incorporated into the ~EVAL signal is used to update the values stored in these TIGF logic devices. After waiting for the various input and other signals to propagate through the hardware model of the user design and reach steady-state during the evaluation period, the trigger signal is provided to update the values stored or latched by the TIGF logic devices. Thereafter, a new evaluation period begins. This evaluation period-trigger period is cyclical, in one embodiment.

The hold time problem mentioned above will now be briefly discussed. As known to those ordinarily skilled in the art, a common and pervasive problem in logic circuit design is hold time violation. Hold time is defined as the minimum amount of time that the data input(s) of a logic element must be held stable after the control input (e.g., clock input) changes to latch, capture or store the value indicated by the data input(s); otherwise, the logic element will fail to work properly.

Figure 75A:
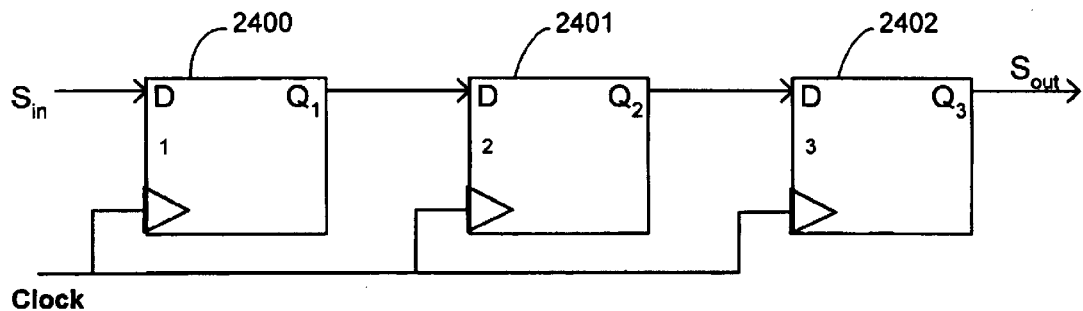
FIG. 75(A) shows an exemplary shift register circuit which will be used to explain the hold time and clock glitch problems.

A shift register example will now be discussed to illustrate the hold time requirement. FIG. 75(A) shows an exemplary shift register in which three D-type flip-flops are connected serially; that is, the output of flip-flop 2400 is coupled to the input of flip-flop 2401, whose output is in turn coupled to the input of flip-flop 2402. The overall input signal $S_{in}$ is coupled to the input of flip-flop 2400 and the overall output signal $S_{out}$ is generated from the output of flip-flop 2402. All three flip-flops receive a common clock signal at their respective clock inputs. This shift register design is based on the assumption that (1) the clock signal will reach all the flip-flops at the same time, and (2) after detecting the edge of the clock signal, the input of the flip-flop will not change for the duration of the hold time.

Figure 75B:
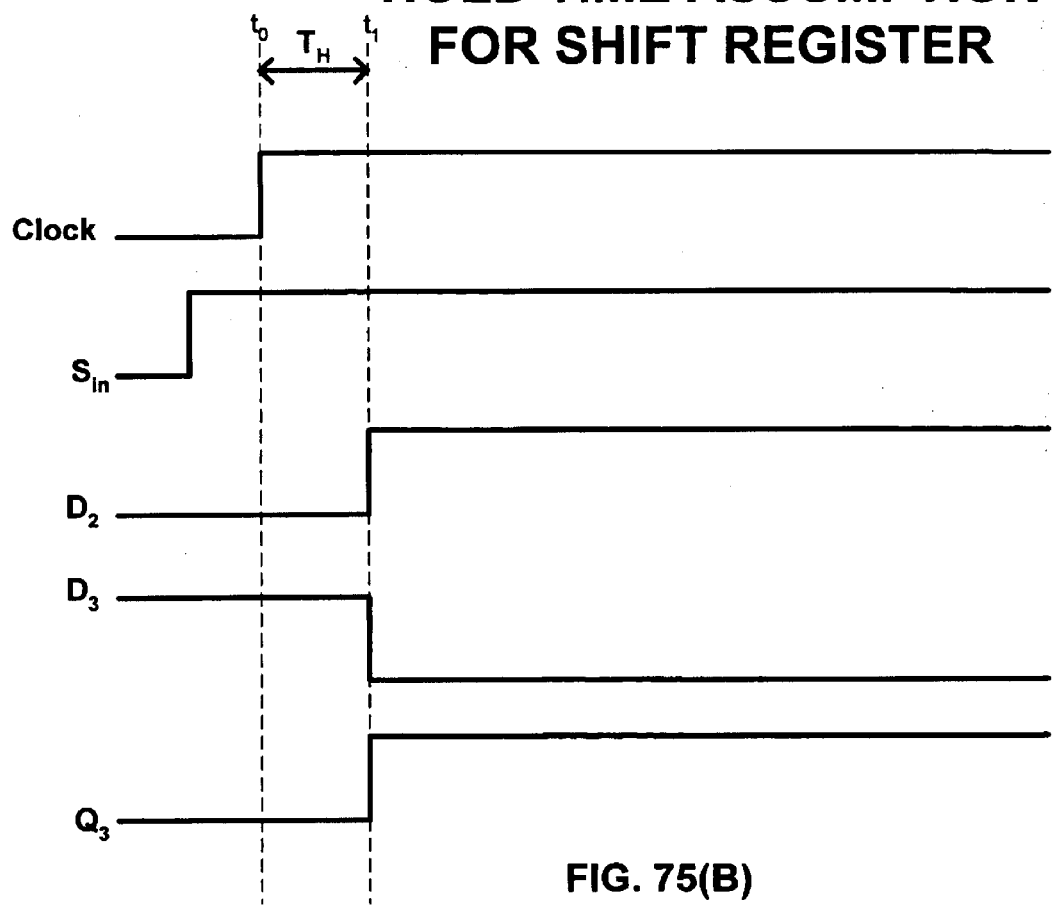
FIG. 75(B) shows a timing diagram of the shift register circuit shown in FIG. 75(A) to illustrate hold time.

Referring to the timing diagram of FIG. 75(B), the hold time assumption is illustrated where the system does not violate hold time requirements. The hold time varies from one logic element to the next but is always specified in the specification sheets. The clock input changes from logic 0 to logic 1 at time $t_0$. As shown in FIG. 75(A), the clock input is provided to each flip-flop 2400–2402. From this clock edge at $t_0$, the input $S_{in}$ must be stable for the duration of the hold time $T_H$, which lasts from time $t_0$ to time $t_1$. Similarly, the inputs to flip-flops 2401 (i.e., $D_2$) and 2402 (i.e., $D_3$) must also be stable for the duration of the hold time from the trigger edge of the clock signal. Since this requirement is satisfied in FIGS. 75(A) and 75(B), input Sin is shifted into flip-flop 2400, input at $D_2$ (logic 0) is shifted into flip-flop 2401, and input at $D_3$ (logic 1) is shifted into flip-flop 2402. As known to those ordinarily skilled in the art, after the clock edge has been triggered, the new values at the input of flip-flop 2401 (logic 1 at input $D_2$) and flip-flop 2402 (logic 0 at input $D_3$) will be shifted into or stored in the next flip-flop at the next clock cycle assuming hold time requirements are satisfied. The table below summarizes the operation of the shift register for these exemplary values:

|  | $D_1$ | $D_2$ | $D_3$ | $Q_3$ |
| --- | --- | --- | --- | --- |
| Before clock edge | 1 | 0 | 1 | 0 |
| After clock edge | 1 | 1 | 0 | 1 |

In an actual implementation, the clock signal will not reach all the logic elements at the on same time; rather, the circuit is designed such that the clock signal will reach all the logic elements in almost the same time or substantially the same time. The circuit must be designed such that the clock skew, or the timing difference between the clock signals reaching each flip-flop, is much smaller than the hold time requirement. Accordingly, all the logic elements will capture the appropriate input values. In the example above illustrated in FIGS. 75(A) and 75(B), hold time violation due to clock signals arriving at different times at the flip-flops 2400–2402 may result in some flip-flops capturing the old input values while another flip-flop capturing a new input value. As a result, the shift register will not operate properly.

In a reconfigurable logic (e.g., FPGA) implementation of the same shift register design, if the clock is directly generated from a primary input, the circuit can be designed so that the low skew network can distribute the clock signal to all the logic elements such that the logic elements will detect the clock edge at substantially the same time. Primary clocks are generated from self-timed test-bench processes. Usually, the primary clock signals are generated in software and only a few (i.e., 1–10) primary clocks are found in a typical user circuit design.

However, if the clock signal is generated from internal logic instead of the primary input, hold time becomes more of an issue. Derived or gated clocks are generated from a network of combinational logic and registers that are in turn driven by the primary clocks. Many (i.e., 1,000 or more) derived clocks are found in a typical user circuit design. Without extra precautions or additional controls, these clock signals may reach each logic element at different times and the clock skew may be longer than the hold time. This may result in the failure of a circuit design, such as the shift register circuit illustrated in FIGS. 75(A) and 75(B).

Figure 76A:
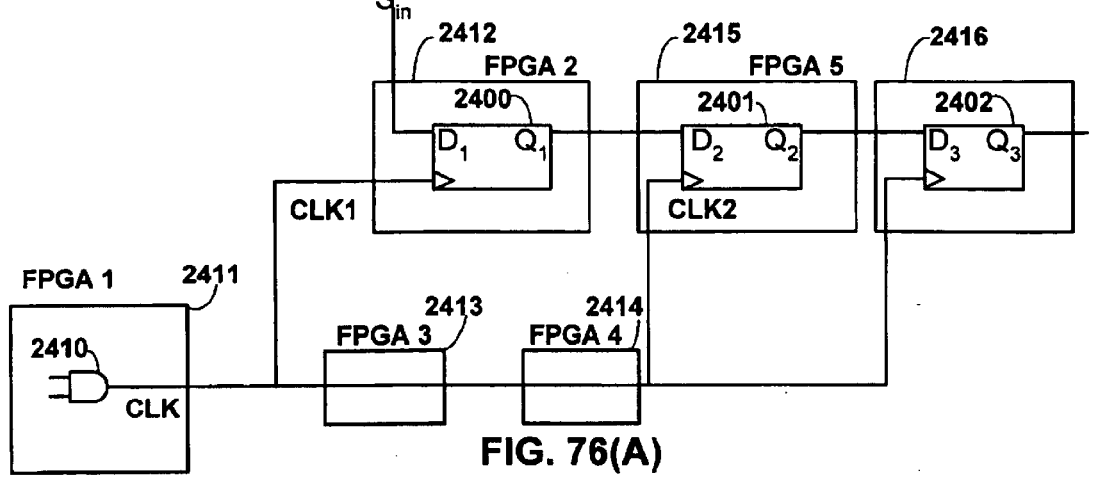
FIG. 76(A) shows the same shift register circuit of FIG. 75(A) placed across multiple FPGA chips.

Using the same shift register circuit illustrated in FIG. 75(A), hold time violation will now be discussed. This time, however, the individual flip-flops of the shift register circuit are spread out across multiple reconfigurable logic chips (e.g., multiple FPGA chips) as shown in FIG. 76(A). The first FPGA chip 2411 contains the internally derived clock logic 2410 which will feed its clock signal CLK to some components of FPGA chips 2412–2416. In this example, the internally generated clock signal CLK will be provided to flip-flops 2400–2402 of the shift register circuit. Chip 2412 contains flip-flop 2400, chip 2415 contains flip-flop 2401, and chip 2416 contains flip-flop 2402. Two other chips 2413 and 2414 are provided to illustrate the hold time violation concept.

The clock logic 2410 in chip 2411 receives a primary clock input (or possibly another derived clock input) to generate an internal clock signal CLK. This internal clock signal CLK will travel to chip 2412 and is labeled CLK1. The internal clock signal CLK from clock logic 2410 will also travel to chip 2415 as CLK2 via chips 2413 and 2414. As shown, CLK1 is input to flip-flop 2400 and CLK2 is input to flip-flop 2401. Both CLK1 and CLK2 experience wire trace delays such that the edges of CLK1 and CLK2 will be delayed from the edge of the internal clock signal CLK. Furthermore, CLK2 will experience additional delays because it traveled through two other chips 2413 and 2414.

Figure 76B:
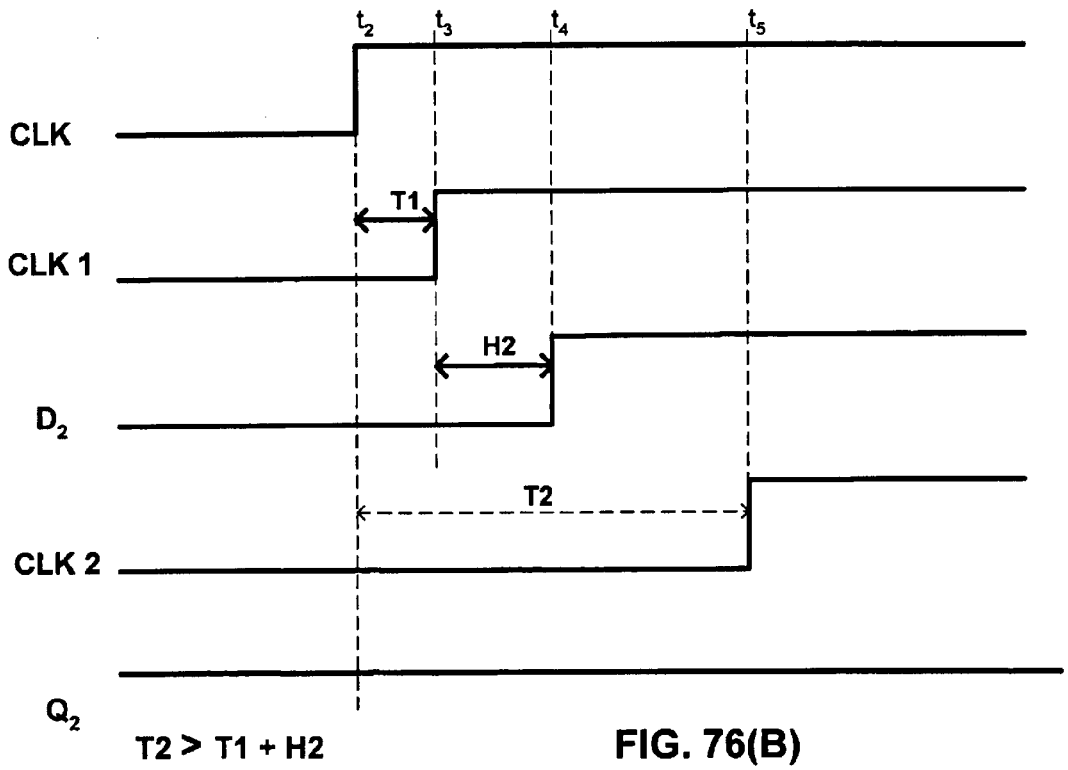
FIG. 76(B) shows a timing diagram of the shift register circuit shown in FIG. 76(A) to illustrate hold time violation.

Referring to the timing diagram of FIG. 76(B), the internal clock signal CLK is generated and triggered at time $t_2$. Because of wire trace delays, CLK1 does not arrive at flip-flop 2400 in chip 2412 until time $t_3$, which is a delay of time T1. As shown in the table above, the output at $Q_1$ (or input $D_2$) is at logic 0 before the arrival of the clock edge of CLK1. After the edge of CLK1 is sensed at flip-flop 2400, the input at $D_1$ must remain stable for the requisite hold time H2 (i.e., until time $t_4$). At this point, flip-flop 2400 shifts in or stores the input logic 1 so that the output at $Q_1$ (or $D_2$) is at logic 1.

While this is taking place for flip-flop 2400, the clock signal CLK2 is making its way to flip-flop 2401 in chip 2415. The delay T2 caused by chips 2413 and 2414 were such that CLK2 arrived at flip-flop 2401 at time $t_5$. The input at $D_2$ is now at logic 1 and after the hold time has been satisfied for this flip-flop 2401, this logic value 1 will appear at the output $Q_2$ (or $D_3$). Thus, the output $Q_2$ was at logic 1 before the arrival of CLK2 and the output continues to be at logic 1 after the arrival of CLK2. This is an incorrect result. This shift register should have shifted in logic 0. While flip-flop 2400 correctly shifted in the old input value (logic 1), the flip-flop 2401 incorrectly shifted in the new input value (logic 1). This incorrect operation typically results when the clock skew (or timing delay) is greater than the hold time. In this example, T2>T1+H2. In sum, hold time violations are likely to occur where the clock signal is generated from one chip and distributes it to the other logic elements that reside in different chips, as shown in FIG. 76(A), unless some precautionary measures are taken.

The clock glitch problem mentioned above will now be discussed with reference to FIGS. 77(A) and 77(B). Generally, when the inputs of a circuit change, the outputs change to some random value for some very brief time before they settle down to the correct value. If another circuit inspects the output at just the wrong time and reads the random value, the results can be incorrect and difficult to debug. This random value that detrimentally affected another circuit is called a glitch. In typical logic circuits, one circuit may generate the clock signal for another circuit. If uncompensated timing delays exist in one or both circuits, a clock glitch (i.e., an unplanned occurrence of a clock edge) may be generated which may cause an incorrect result. Like hold time violation, clock glitches arise because certain logic elements in the circuit design change values at different times.

Figure 77A:
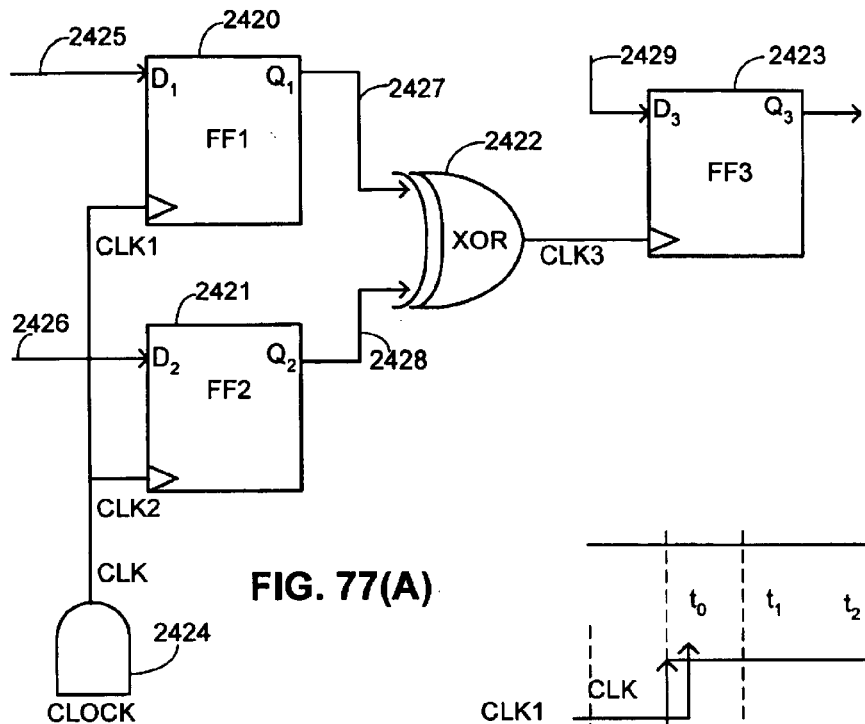
FIG. 77(A) shows an exemplary logic circuit which will be used to illustrate a clock glitch problem.
Figure 77B:
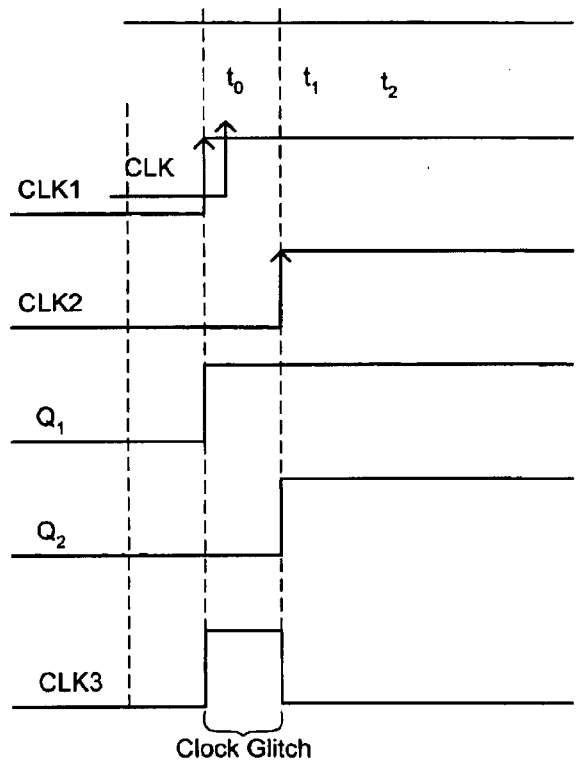
FIG. 77(B) shows a timing diagram of the logic circuit of FIG. 77(A) to illustrate the clock glitch problem.

FIG. 77(A) shows an exemplary logic circuit where some logic elements generate a clock signal for another set of logic elements; that is, D-type flip-flop 2420, D-type flip-flop 2421, and exclusive-or (XOR) gate 2422 generate a clock signal (CLK3) for D-type flip-flop 2423. Flip-flop 2420 receives its data input at $D_1$ on line 2425 and outputs data at $Q_1$ on line 2427. It receives its clock input (CLK1) from a clock logic 2424. CLK refers to the originally generated clock signal from the clock logic 2424 and CLK1 refers to the same signal that is delayed in time when it reaches flip-flop 2420.

Flip-flop 2421 receives its data input at $D_2$ on line 2426 and outputs data at $Q_2$ on line 2428. It receives its clock input (CLK2) from a clock logic 2424. As mentioned above, CLK refers to the originally generated clock signal from the clock logic 2424 and CLK2 refers to the same signal that is delayed in time when it reaches flip-flop 2421.

The outputs from flip-flops 2420 and 2421 on lines 2427 and 2428, respectively, are inputs to XOR gate 2422. XOR gate 2422 outputs data labeled as CLK3 to the clock input of flip-flop 2423. Flip-flop 2423 also inputs data at $D_3$ on line 2429 and outputs data at $Q_3$.

The clock glitch problem that may arise for this circuit will now be discussed with reference to the timing diagram illustrated in FIG. 77(B). The CLK signal is triggered at time $t_0$. By the time this clock signal (i.e., CLK1) reaches flip-flop 2420, it is already time $t_1$. CLK2 does not reach flip-flop 2421 until time $t_2$.

Assume that the inputs to $D_1$ and $D_2$ are both at logic 1. When CLK1 reaches flip-flop 2420 at time $t_1$, the output at $Q_1$ will be at logic 1 (as shown in FIG. 77(B)). CLK2 arrives at flip-flop 2421 a little late at time $t_2$ and thus, the output $Q_2$ on line 2428 remains at logic 0 from time $t_1$ to time $t_2$. The XOR gate 2422 generates a logic 1 as CLK3 for presentation to the clock input of flip-flop 2423 during the time period between time $t_1$ and time $t_2$, even though the desired signal is a logic 0 (1 XOR 1=0). This generation of CLK3 during this time period between time $t_1$ and time $t_2$ is a clock glitch. Accordingly, whatever logic value is present at $D_3$ on input line 2429 of flip-flop 2423 is stored whether this is desired or not, and this flip-flop 2423 is now ready for the next input on line 2429. If properly designed, the time delay of CLK1 and CLK2 would be minimized such that no clock glitch would be generated, or at the very least, the clock glitch would last for such a short duration that it would not impact the rest of the circuit. In the latter case, if the clock skew between CLK1 and CLK2 is short enough, the XOR gate delay will be long enough to filter out the glitch and would not impact the rest of the circuit.

Figure 78:
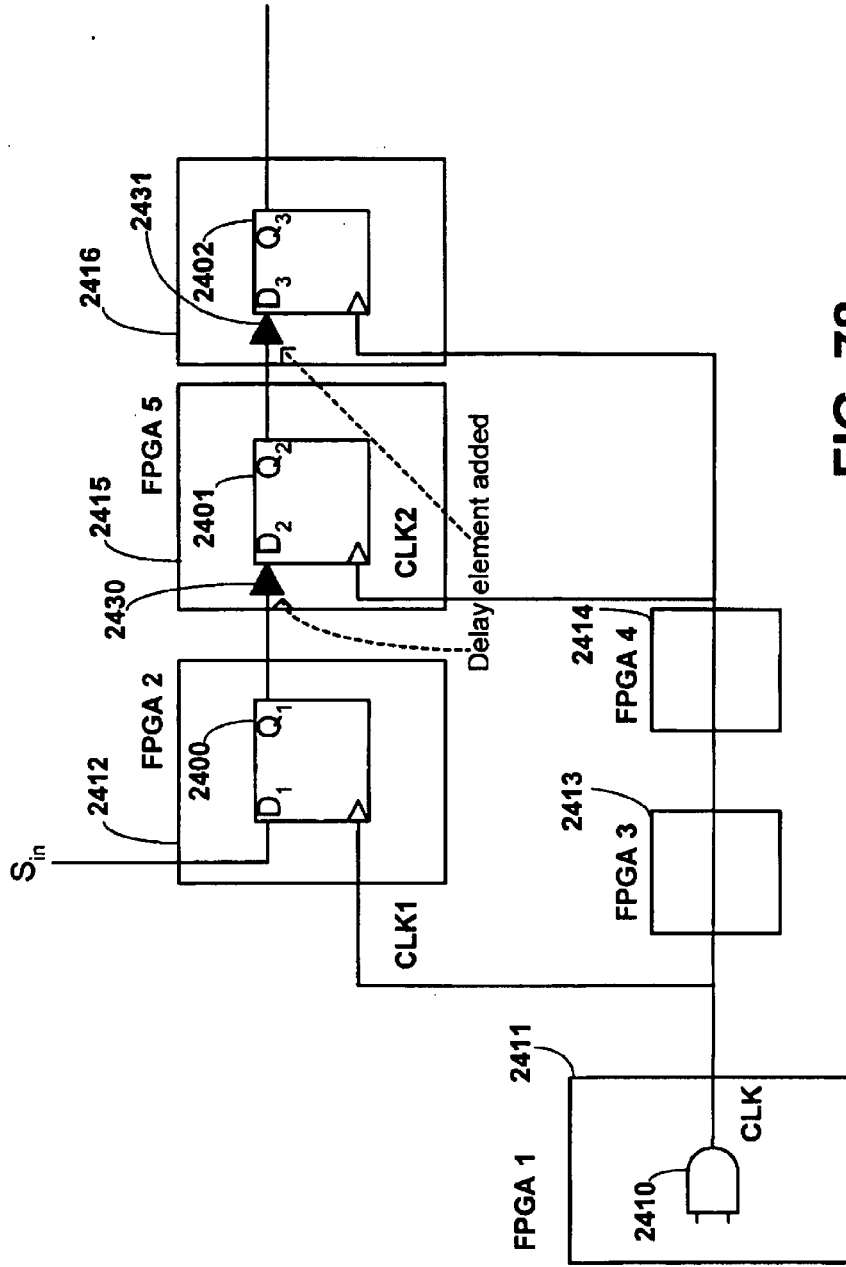
FIG. 78 shows a prior art timing adjustment technique for solving the hold time violation problem.
Figure 79:
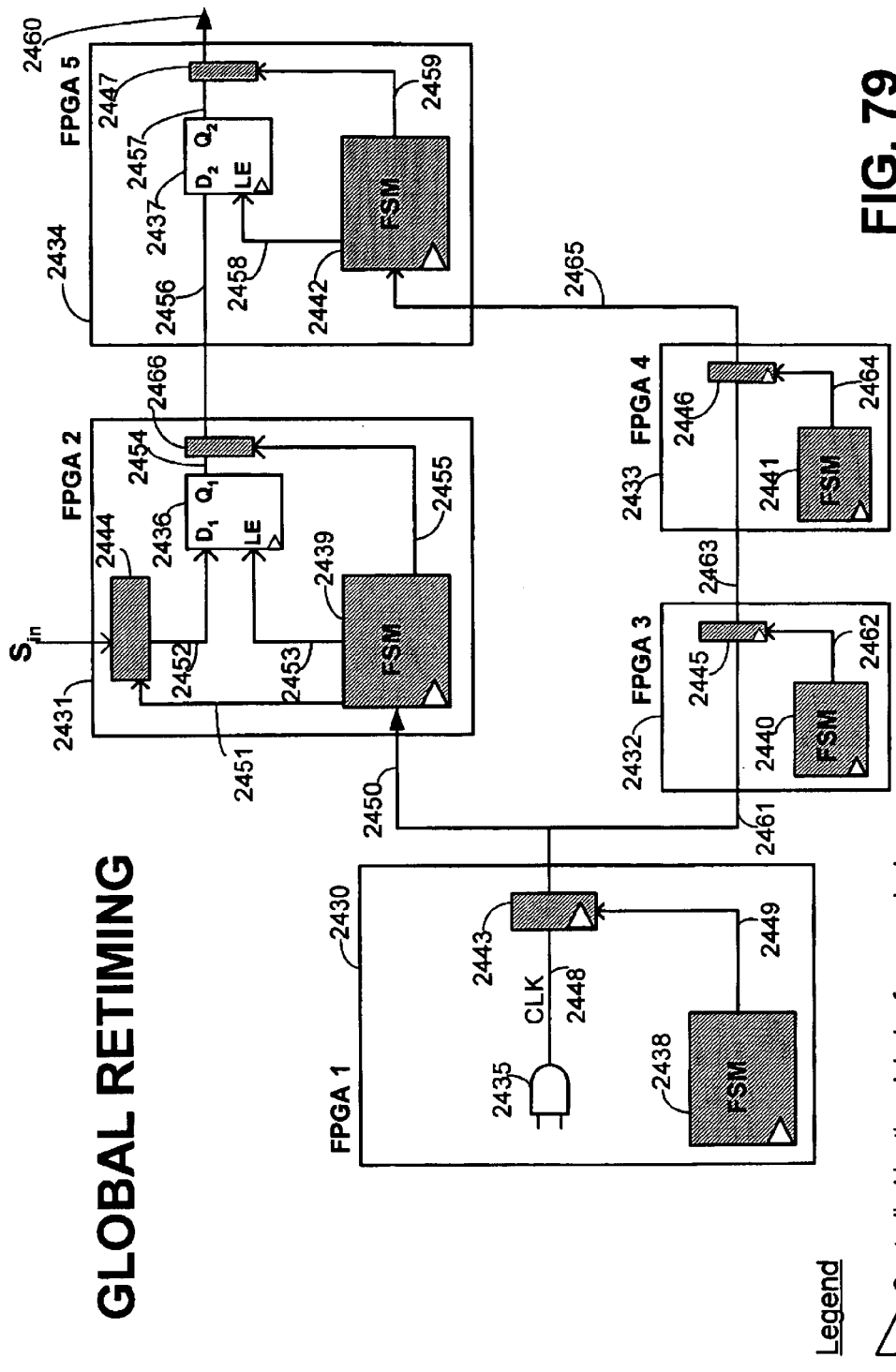
FIG. 79 shows a prior art timing resynthesis technique for solving the hold time violation problem.

Two known solutions to the hold time violation problem are (1) timing adjustment, and (2) timing resynthesis. Timing adjustment, discussed in U.S. Pat. No. 5,475,830, requires the insertion of sufficient delay elements (such as buffers) in certain signal paths to prolong the hold time of the logic elements. For example, adding sufficient delay on the inputs $D_2$ and $D_3$ in the shift register circuit above may avoid hold time violation. Thus, in FIG. 78, the same shift register circuit is shown with delay elements 2430 and 2431 added to the inputs $D_2$ and $D_3$, respectively. As a result, the delay element 2430 can be designed such that time $t_4$ occurs after time $t_5$ so that T2<T1+H2 (FIG. 76(B)), and hence, no hold time violation will occur.

A potential problem with the timing adjustment solution is that it relies on the specification sheet of the FPGA chips too heavily. As known to those skilled in the art, reconfigurable logic chips, like FPGA chips, implement logic elements with look-up tables. The delay of look-up tables in the chips is provided in the specification sheets and designers using the timing adjustment method of avoiding hold time violations rely on this specified time delay. However, this delay is just an estimate and varies from chip to chip. Another potential problem with the timing adjustment method is that designers must also compensate for the wiring delays present throughout the circuit design. Although this is not an impossible task, the estimation of wiring delay is time-consuming and prone to errors. Moreover, the timing adjustment method does not solve clock glitch problems.

Another solution is timing resynthesis, a technique introduced by IKOS's VirtualWires technology. The timing resynthesis concept involves transforming a user's circuit design into a functionally equivalent design while strictly controlling the timing of clock and pin-out signals via finite state machines and registers. Timing resynthesis retimes a user's circuit design by introducing a single high speed clock. It also converts latches, gated clocks, and multiple synchronous and asynchronous clocks into a flip-flop based single-clock synchronous design. Thus, timing resynthesis uses registers at the input and output pin-outs of each chip to control the precise inter-chip signal movement so that no inter-chip hold-time violation will occur. Timing resynthesis also uses a finite state machine in each chip to schedule inputs from other chips, schedule outputs to other chips, and schedule updates of internal flip-flops based on the reference clock.

Using the same shift register circuit introduced in the discussion above associated with FIGS. 75(A), 75(B), 76(A), and 76(B), FIG. 79 shows one example of the timing resynthesis circuit. The basic three flip-flop shift register design has been transformed into a functionally equivalent circuit. Chip 2430 includes the original internal clock generating logic 2435 coupled to a register 2443 via line 2448. The clock logic 2435 generates the CLK signal. A first finite state machine 2438 is also coupled to the register 2443 via line 2449. Both the register 2443 and the first finite state machine 2438 are controlled by a design-independent global reference clock.

The CLK signal is also delivered across chips 2432 and 2433 before it arrives at chip 2434. In chip 2432, a second finite state machine 2440 controls a register 2445 via line 2462. The CLK signal travels to register 2445 via line 2461 from register 2443. Register 2445 outputs the CLK signal to the next chip 2433 via line 2463. Chip 2433 includes a third finite state machine 2441 which controls a register 2446 via line 2464. The register 2446 outputs the CLK signal to chip 2434.

Chip 2431 includes the original flip-flop 2436. A register 2444 receives the input $S_{in}$ and outputs the input $S_{in}$ to the $D_1$ input of flip-flop 2436 via line 2452. The $Q_1$ output of the flip-flop 2436 is coupled to register 2466 via line 2454. A fourth finite state machine 2439 controls the register 2444 via line 2451, register 2466 via line 2455, and the flip-flop 2436 via the latch enable line 2453. The fourth finite state machine 2439 also receives the original clock signal CLK from chip 2430 via line 2450.

Chip 2434 includes the original flip-flop 2437, which receives the signal from register 2466 in the chip 2431 at its $D_2$ input via line 2456. The $Q_2$ output of the flip-flop 2437 is coupled to register 2447 via line 2457. A fifth finite state machine 2439 controls the register 2447 via line 2459, and the flip-flop 2437 via the latch enable line 2458. The fifth finite state machine 2442 also receives the original clock signal CLK from chip 2430 via chips 2432 and 2433.

With timing resynthesis, the finite state machines 2438–2442, registers 2443–2447 and 2466, and the single global reference clock are used to control signal flow across multiple chips and update internal flip-flops. Thus, in chip 2430, the distribution of the CLK signal to other chips is scheduled by the first finite state machine 2438 via the register 2443. Similarly, in chip 2431, the fourth finite state machine 2439 schedules the delivery of the input $S_{in}$ to the flip-flop 2436 via register 2444 as well as the $Q_1$ output via register 2466. The latching function of the flip-flop 2436 is also controlled by a latch enable signal from the fourth finite state machine 2439. The same principle holds for the logic in the other chips 2432–2434. With such tight control of inter-chip input delivery schedule, inter-chip output delivery schedule, and internal flip-flop state updating, inter-chip hold-time violations are eliminated.

However, the timing resynthesis technique requires the transformation of the user's circuit design into a much larger functionally equivalent circuit including the addition of finite state machines and registers. Typically, the additional logic necessary to implement this technique takes up to 20% of the useful logic in each chip. Furthermore, this technique is not immune to clock glitch problems. To avoid clock glitches, designers using the timing resynthesis technique must take additional precautionary steps. One conservative design approach is to design the circuit so that the inputs to a logic device utilizing gated clocks are not changed at the same time. An aggressive approach uses e gate delays to filter the glitches so that they do not impact the rest of the circuit. However, as stated above, timing resynthesis requires some additional non-trivial measures to avoid clock glitches.

The various embodiments of the present invention, which solve both the hold time and clock glitch problems, will now be discussed. During configuration mapping of the user design into the software model of the RCC computing system and the hardware model of the RCC array, latches shown in FIG. 18(A) are emulated with a timing insensitive glitch-free (TIGF) latch in accordance with one embodiment of the present invention. Similarly, design flip-flops shown in FIG. 18(B) are emulated with a TIGF flip-flop in accordance with one embodiment of the present invention. These TIGF logic devices, whether in the form of a latch or flip-flop, can also be called emulation logic devices. The updates of the TIGF latches and flip-flops are controlled with a global trigger signal.

In one embodiment of the present invention, not all of the logic devices found in the user design circuit are replaced with the TIGF logic devices. A user design circuit includes those portions that are enabled or clocked by the primary clocks and other portions that are controlled by gated or derived clocks. Because hold time violations and clock glitches are issues for the latter-case where logic devices are controlled by gated or derived clocks, only these particular logic devices that are controlled by gated or derived clocks are replaced with the TIGF logic devices in accordance with the present invention. In other embodiments, all logic devices found in the user design circuit are replaced with the TIGF logic devices.

Figure 82:
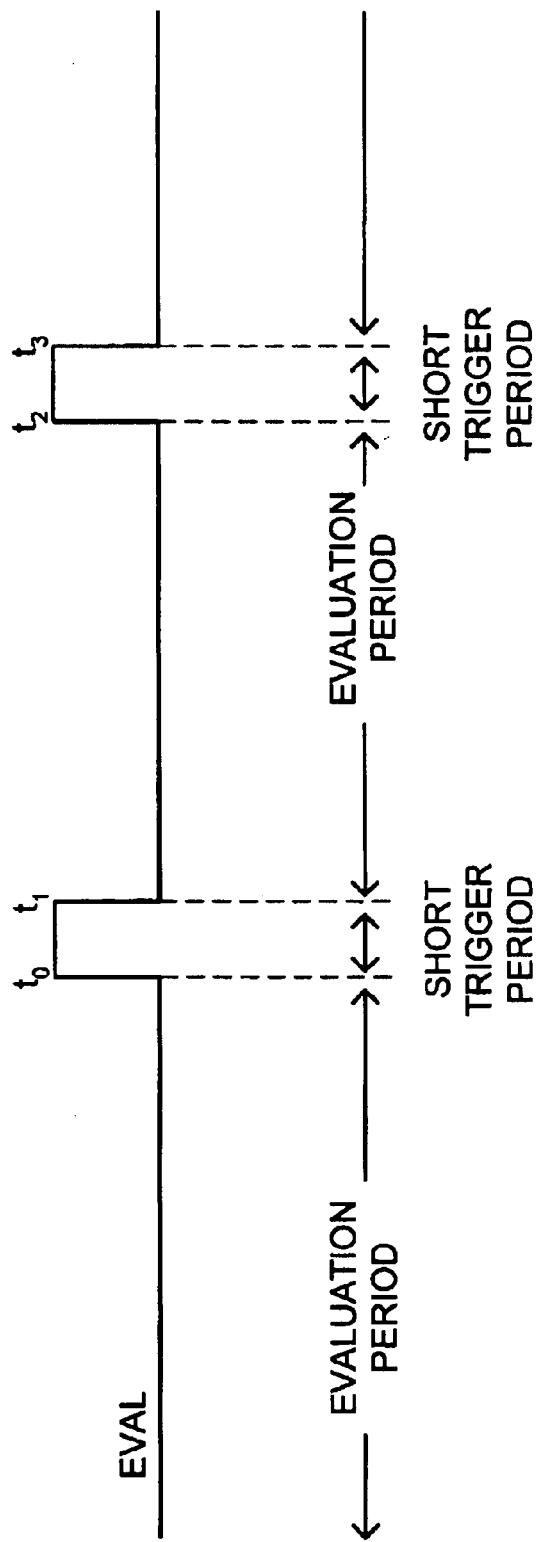
FIG. 82 shows a timing diagram of the trigger mechanism of the timing insensitive and glitch-free latch and flip-flop in accordance with one embodiment of the present invention.

Before discussing the TIGF latch and flip-flop embodiments of the present invention, the global trigger signal will be discussed. Generally, the global trigger signal is used to allow the TIGF latches and flip-flops to keep its state (i.e., keep the old input value) during the evaluation period and update its state (i.e., store the new input value) during a short trigger period. In one embodiment, the global trigger signal, shown in FIG. 82, is separate from and derived from the ~EVAL signal discussed above. In this embodiment, the global trigger signal has a long evaluation period followed by a short trigger period. The global trigger signal tracks the ~EVAL signal during the evaluation period and at the conclusion of the EVAL cycle, a short trigger signal is generated to update the TIGF latches and flip-flops. In another embodiment, the ~EVAL signal is the global trigger signal, where the ~EVAL signal is at one logic state (e.g., logic 0) during the evaluation period and at another logic state (e.g., logic 1) during non-evaluation or TIGF latch/flip-flop update periods.

The evaluation period, as discussed above with respect to the RCC computing system and RCC hardware array, is used to propagate all the primary inputs and flip-flop/latch device changes into the entire user design, one simulation cycle at a time. During the propagation, the RCC system waits until all the signals in the system achieve steady-state. The evaluation period is calculated after the user design has been mapped and placed into the appropriate reconfigurable logic devices (e.g., FPGA chips) of the RCC array. Accordingly, the evaluation period is design-specific; that is, the evaluation period for one user design may be different from the evaluation period for another user design. This evaluation period must be long enough to assure that all the signals in the system are propagated through the entire system and reach steady-state before the next short trigger period.

The short trigger period occurs adjacent in time to the evaluation period, as shown in FIG. 82. In one embodiment, the short trigger period occurs after the evaluation period. Prior to this short trigger period, the input signals are propagated throughout the hardware model-configured portion of the user design circuit during the evaluation period. The short trigger period, marked by a change in the logic state of the ~EVAL signal in accordance with one embodiment of the present invention, controls all the TIGF latches and flip-flops in the user design so that they can be updated with the new values that have been propagated from the evaluation period after steady-state has been achieved. This short trigger period is globally distributed with a low skew network and can be as short (i.e., duration from $t_0$ to $t_1$, as well as duration $t_2$ to $t_3$, as shown in FIG. 82) as the reconfigurable logic devices will allow for proper operation. During this short trigger period, the new primary inputs are sampled at every input stage of the TIGF latches and flip-flops and the old stored values at the same TIGF latches and flip-flops are exported out to the next stage in the RCC hardware model of the user design. In the discussion below, the portion of the global trigger signal that occurs during the short trigger period will be referred to as the TIGF trigger, TIGF trigger signal, trigger signal, or simply the trigger.

Figure 80A:
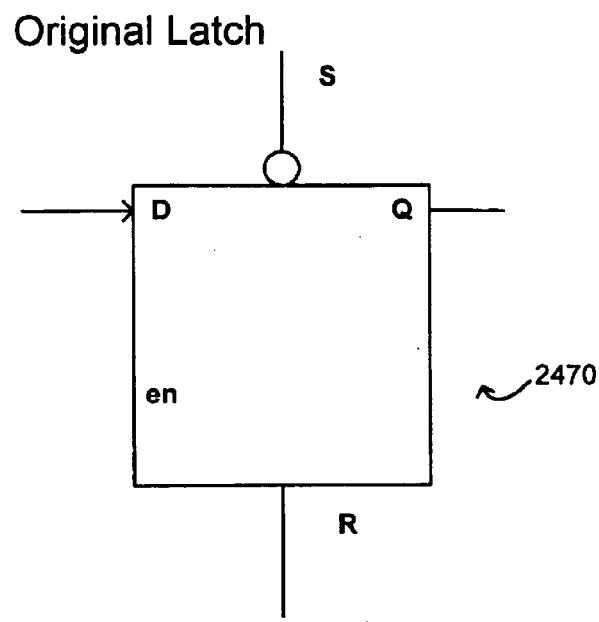
FIG. 80(A) shows the original latch and FIG. 80(B) shows a timing insensitive and glitch-free latch in accordance with one embodiment of the present invention.

FIG. 80(A) shows the latch 2470 originally shown in FIG. 18(A). This latch operates as follows:

| if (#S), | Q ← 1 |
| else if (#R), | Q ← 0 |
| else if (en), | Q ← D |
| else Q keeps the old value. | |

Because this latch is level-sensitive and asynchronous, so long as the clock input is enabled and the latch enable input is enabled, the output Q tracks the input D.

Figure 80B:
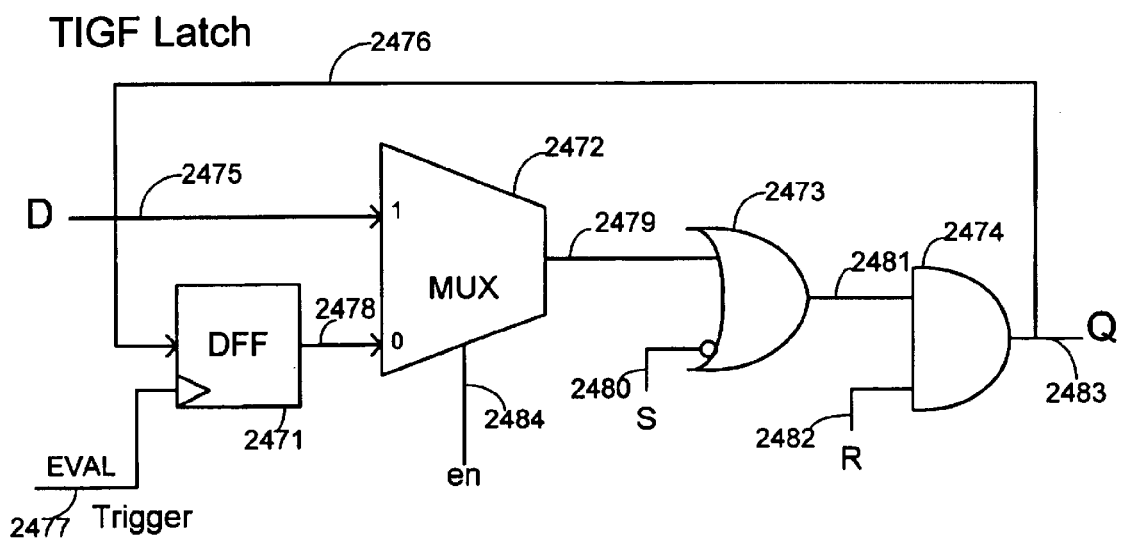

FIG. 80(B) shows the TIGF latch in accordance with one embodiment of the present invention. Like the latch of FIG. 80(A), the TIGF latch has a D input, amenable input, a set (S), a reset (R), and an output Q. Additionally, it has a trigger input. The TIGF latch includes a D flip-flop 2471, a multiplexer 2472, an OR gate 2473, an AND gate 2474, and various interconnections.

D flip-flop 2471 receives its input from the output of AND gate 2474 via line 2476. The D flip-flop is also triggered at its clock input by a trigger signal on line 2477, which is globally distributed by the RCC system in accordance with a strict schedule dependent on the evaluation cycle. The output of D flip-flop 2471 is coupled to one input of multiplexer 2472 via line 2478. The other input of multiplexer 2472 is coupled to the TIGF latch D input on line 2475. The multiplexer is controlled by an enable signal on line 2484. The output of the multiplexer 2472 is coupled to one input of OR gate 2473 via line 2479. The other input of OR gate 2473 is coupled to the set (S) input on line 2480. The output of the OR gate 2473 is coupled to one input of AND gate 2474 via line 2481. The other input of AND gate 2474 is coupled to the reset (R) signal on line 2482. The output of AND gate 2474 is fed back to the input of the D flip-flop 2471 via line 2476, as mentioned above.

The operation of this TIGF latch embodiment of the present invention will now be discussed. In this embodiment of the TIGF latch, the D flip-flop 2471 holds the current state (i.e., old value) of the TIGF latch. Line 2476 at the input of D flip-flop 2471 presents the new input value that has yet to be latched into the TIGF latch. Line 2476 presents the new value because the main input (D input) of the TIGF latch on line 2475 ultimately makes its way from the input of the multiplexer 2472 (with the proper enable signal on line 2484, which will ultimately be presented) through the OR gate 2473, and finally through the AND gate 2474 onto line 2483, which feeds back the new input signal of the TIGF latch to the D flip-flop 2471 on line 2476. A trigger signal on line 2477 updates the TIGF latch, by clocking the new input value on line 2476 into the D flip-flop 2471. Thus, the output on line 2478 of the D flip-flop 2471 indicates the current state (i.e., old value) of the TIGF latch, while the input on line 2476 indicates the new input value that has yet to be latched by the TIGF latch.

The multiplexer 2472 receives the current state from D flip-flop 2471 as well as the new input value on line 2475. The enable line 2484 functions as the selector signal for the multiplexer 2472. Because the TIGF latch will not update (i.e., store new input value) until the trigger signal is provided on line 2477, the D input of the TIGF latch on line 2475 and the enable input on line 2484 can arrive at the TIGF latch in any order. If this TIGF latch (and other TIGF latches in the hardware model of the user design) encounters a situation that would normally cause hold time violation in a circuit that used a conventional latch, such as in the discussion above with respect to FIGS. 76(A) and 76(B) where one clock signal arrived much later than another clock signal, this TIGF latch will function properly by keeping the proper old value until the trigger signal is provided on line 2477.

The trigger signal is distributed through the low-skew global clock network.

This TIGF latch also solves the clock glitch problem. Note that the clock signal is replaced by the enable signal in the TIGF latch. The enable signal on line 2484 can glitch often during the evaluation period but the TIGF latch will continue to hold the current state without fail. The only mechanism by which the TIGF latch can be updated is through the trigger signal, which is provided after the evaluation period, in one embodiment, when the signals have attained steady-state.

FIG. 81(A) shows a flip-flop 2490 originally shown in FIG. 18(B). This flip-flop operates as follows:

| | |
|---|---|
| if (#S), | Q ← 1 |
| else if (#R), | Q ← 0 |
| else if (positive edge of CLK), | Q ← D |
| else Q keeps the old value. | |

Because this latch is edge-triggered, so long as flip-flop enable input is enabled, the output Q tracks the input D at the positive edge of the clock signal.

FIG. 81(B) shows the TIGF D-type flip-flop in accordance with one embodiment of the present invention. Like the flip-flop of FIG. 81(A), the TIGF flip-flop has a D input, a clock input, a set (S), a reset (R), and an output Q. Additionally, it has a trigger input. The TIGF flip-flop includes three D flip-flops 2491, 2492, and 2496, a multiplexer 2493, an OR gate 2494, two AND gates 2495 and 2497, and various interconnections.

Flip-flop 2491 receives the TIGF D input on line 2498, the trigger input on line 2499, and provides a Q output on line 2500. This output line 2500 also serves as one of the inputs to multiplexer 2493. The other input to the multiplexer 2493 comes from the Q output of flip-flop 2492 via line 2503. The output of multiplexer 2493 is coupled to one of the inputs of OR gate 2494 via line 2505. The other input of OR gate 2492 is the set (S) signal on line 2506. The output of OR gate 2494 is coupled to one of the inputs of AND gate 2495 via line 2507. The other input of AND gate 2495 is the reset (R) signal on line 2508. The output of AND gate 2495 (which is also the overall TIGF output Q) is coupled to the input of flip-flop 2492 via line 2501. Flip-flop 2492 also has a trigger input on line 2502.

Returning to the multiplexer 2493, its selector, input is coupled to the output of AND gate 2497 via line 2509. AND gate 2497 receives one of its inputs from the CLK signal on line 2510 and the other input from the output of flip-flop 2496 via line 2512. Flip-flop 2496 also receives its input from the CLK signal on line 2511 and its trigger input on line 2513.

The operation of the TIGF flip-flop embodiment of the present invention will now be discussed. In this embodiment, the TIGF flip-flop receives the trigger signal at three different points—the D flip-flop 2491 via line 2499, the D flip-flop 2492 via line 2502, and the D flip-flop 2496 via line 2513.

The TIGF flip-flop stores the input value only when an edge of the clock signal has been detected. In accordance with one embodiment of the present invention, the required edge is the positive edge of the clock signal. To detect this positive edge of the clock signal, an edge detector 2515 has been provided. The edge detector 2515 includes a D flip-flop 2496 and an AND gate 2497. The edge detector 2515 is also updated via the trigger signal on line 2513 of the D flip-flop 2496.

The D flip-flop 2491 holds the new input value of the TIGF flip-flop and resists any changes to the D input on line 2498 until the trigger signal is provided on line 2499. Thus, before each evaluation period of the TIGF flip-flop, the new value is stored in the D flip-flop 2491. Accordingly, the TIGF flip-flop avoids hold time violations by pre-storing the new value until the TIGF flip-flop is updated by the trigger signal.

D flip-flop 2492 holds the current value (or old value) of the TIGF flip-flop until the trigger signal is provided on line 2502. This value is the state of the emulated TIGF flip-flop after it has been updated and before the next evaluation period. The input to the D flip-flop 2492 on line 2501 holds the new value (which is the same value on line 2500, for a significant duration of the evaluation period).

The multiplexer 2493 receives the new input value on line 2500 and the old value that is currently stored in the TIGF flip-flop on line 2503. Based on the selector signal on line 2504, the multiplexer outputs either the new value (line 2500) or the old value (line 2503) as the output of the emulated TIGF flip-flop. This output changes with any clock glitches before all of the propagated signals in the user design's hardware model approach steady-state. Thus, the input on line 2501 will present the new value that is stored in flip-flop 2491 by the end of the evaluation period. When the trigger signal is received by the TIGF flip-flop, flip-flop 2492 now stores the new value that was present in line 2501 and the flip-flop 2491 stores the next new value on line 2498. Thus, the TIGF flip-flop in accordance with one embodiment of the present invention is not negatively affected by clock glitches.

To further elaborate, this TIGF flip-flop also provides some immunity against clock glitches. One ordinarily skilled in the art will realize that by replacing the flip-flops 2420, 2421, and 2423 in FIG. 77(A) with the TIGF flip-flop embodiment of FIG. 81(B), clock glitches will not impact any circuit utilizing this TIGF flip-flop. Referring to FIGS. 77(A) and 77(B) for a moment, a clock glitch negatively impacted the circuit of FIG. 77(A) because for the time between time $t_1$ and $t_2$, the flip-flop 2423 clocked in a new value when it should not have clocked in a new value. The skewed nature of the CLK1 and CLK2 signals forced XOR gate 2422 to generate a logic 1 state during the time period between time $t_1$ and $t_2$, which drove the clock line of the next flip-flop 2423. With the TIGF flip-flop in accordance with one embodiment of the present invention, the clock glitches will not affect its clocking in of the new value. Substituting the flip-flop 2423 with TIGF flip-flop, once the signals have achieved steady-state during the evaluation period, the trigger signal during the short trigger period will enable the TIGF flip-flop to store the new value in flip-flop 2491 (FIG. 81(B). Thereafter, any clock glitches, like the clock glitch of FIG. 77(B) during the time interval from time $t_1$ and $t_2$, will not clock in a new value. The TIGF flip-flop updates only with the trigger signal and this trigger signal will not be presented to the TIGF flip-flop until after the evaluation period when the signals propagating through the circuit have achieved steady-state.

Although this particular embodiment of the TIGF flip-flop is a D-type flip-flop, other flip-flops (e.g., T, JK, SR) are within the scope of the present invention. Other types of edge-triggered flip-flops can be derived from the D flip-flop by adding some AND/OR logic before the D input.

G. Dynamic Logic Evaluation

One embodiment of the present invention provides a dynamic logic evaluation system and method which dynamically calculates the evaluation time necessary for each input. In contrast, the prior art systems provide for a fixed and statically calculated evaluation time that is primarily based on the worst possible evaluation time caused by the worst possible circuit/trace length path. Thus, this embodiment of the preset invention will remove the performance burden that a fixed and statically calculated evaluation time would introduce. This dynamic logic evaluation system and method will not penalize 99% of the inputs for the sake of the 1% of the inputs that need the worst possible evaluation time. By dynamically calculating different evaluation times based on the input, the overall evaluation time is shortened by 10 to 100 times compared to the current statically calculated constant evaluation time techniques. In addition, the static loop problem will be a non-issue.

A system diagram is provided on FIG. 90. In this exemplary diagram, four FPGA chips 2710–2713 are shown. However, any number of FPGA chips and boards can be provided while still incorporating the dynamic logic evaluation system in accordance with one embodiment of the present invention. As discussed throughout this patent specification, the FPGA chips collectively contain the hardware model of the user's circuit design. Because the hardware model of the user's circuit design is spread across multiple FPGA chips, the input can propagate from one FPGA chip to another. For example, FPGA chip 2710 accepts some input and the resulting process of that input becomes a2 and d1, as illustrated in FIG. 90. Data a2 makes its way to FPGA chip 2711, while data d1 is delivered to FPGA chip 2713. Similarly, data d2 in FPGA chip 2713 is delivered to FPGA chip 2710 and data c1 is delivered to FPGA chip 2712. The dynamic logic evaluation system keeps track of these propagating data in dynamically determining the evaluation time.

The evaluation time must be designed to be long enough to allow any given input to be evaluated properly until the corresponding output stabilizes. So, if the input is processed and the changing data (if any) propagates through the FPGA chips, the dynamic logic evaluation system recognizes that the output has not stabilized yet. Accordingly, no new input must be processed at this point. In time though, the output will stabilize for a given input. Once the output has an stabilized, the dynamic logic evaluation system will then instruct the next input to be processed.

In accordance with one embodiment of the present invention, the dynamic logic evaluation system and method comprises a global control unit 2700 which is controlled by a master clock. This global control unit 2700 is coupled to several FPGA chips 2710–2713 in general and propagation detectors 2704–2707 in particular. In each FPGA chip, a propagation detector is provided. So, FPGA chip 2710 contains propagation detector 2704, FPGA chip 2711 contains propagation detector 2705, FPGA chip 2712 contains propagation detector 2706, and FPGA chip 2713 contains propagation detector 2707.

The propagation detector in each FPGA chip alerts the global control unit 2700 of any input data that is currently propagating within the FPGA chips, which implies that the output has not stabilized yet. Specifically, the propagation detector in each FPGA chip detects inter-chip propagation of data; that is, the propagation detector detects those data that is in the process of moving from one chip to another. The propagation detector does not care about those data that is propagating or otherwise changing within a chip if these same data are not moving across chips. Thus, data a1 in chip 2711 needs to propagate to chip 2710, so the propagation detector 2705 will detect this propagation. Similarly, data b2 in chip 2711 is planning on propagating to chip 2712 so the propagation detector 2705 will detect this propagation. Other data that is changing in chip 2711 will not be monitored if these changing data are not moving to another chip.

As long as the relevant input data is propagating, the global control unit 2700 will prevent the next input from being provided to the FPGA chips for evaluation. The global control unit 2700 uses the next input signal on line 2703 for this purpose. In effect, so long as the output has not stabilized with the given input, the next set of inputs will not be processed. Once the output has stabilized, the global control unit 2700 will then instruct the system to accept and process the next set of input data with the next input signal on line 2703.

Thus, the global control unit 2700 in conjunction with the propagation detectors can dynamically provide varying evaluation time periods based on the needs of the input data. Whether the system needs longer or shorter evaluation times, the system will dynamically adjust the amount of evaluation time necessary to properly process that input and then move onto the next evaluation time for the next set of inputs. As signals stabilize sooner, the faster the logic evaluation process. For the 1% case where the input requires the worst possible evaluation time, the global control unit 2700 will delay the expiration of the evaluation time until the output has stabilized.

How does the global control unit 2700 know how long to extend the evaluation time? The global control unit 2700 uses a global propagation delay register (PDR) 2701 and a global propagation delay counter (PDC) 2702. The PDR 2701 contains the value of a particular number of cycles. In one embodiment, this value is 10 cycles. However, this value can range anywhere from 1 to 10, however, other values beyond 10 are also possible. The value in the PDR 2701 is the maximum delay in sending data from one FPGA chip to another. It is not necessarily, the worst possible evaluation time.

The PDC 2702 is a down counter. The PDC 2702 counts down at every master clock cycle from whatever value is in the counter. The PDC 2702 normally gets the counter value from the PDR 2701. When the down counter PDC 2702 reaches 0, the next input signal online 2703 is triggered. So, if the PDR 2701 contained the value 5 and the PDC 2702 is instructed to load the PDR value, then the down counter PDC 2702 counts down from 5 cycles at every master cycle. In 5 cycles, the down counter PDC 2702 reaches 0 and the global control unit 2700 sends the next input signal on line 2703 to instruct the system to process the next input. Note that the value in the PDR 2701 does not determine the length of the evaluation time; rather, the propagation detection logic determines the evaluation time. PDR 2701 provides the extra delay control needed after detecting the last propagation activity from any given FPGA chip and ensures that the propagation activity reaches its connected FPGAs.

The PDR 2701 hods a value that represents the maximum delay (in number of master clock cycles) that is needed for a signal to propagate between two FPGA chips. Usually, these chips are neighboring chips and are directly connected to each other. Depending on the interconnect technology, this PDR value can be as small as 1 and as large as 10. Typically, this number is less than 10 for most systems. The PDC down counter 2702 is loaded with the value of the PDR at the start of each evaluation cycle or when the global propagation signal on line 2714 asserts (as described further below).

In one embodiment, the interconnect technology uses multiplexers at the boundaries of each chip to save pin-outs. Thus, each FPGA chip uses an N-to-1 mux to transport the data from that chip to another chip. Time-division multiplexing techniques are used to ensure that all the relevant data makes its way to the other chips via this mux. This multiplexing technique is described elsewhere in this patent specification. Thus, if a 5-to-1 mux is used to deliver the data from chip 2713 to chip 2712, the PDR 2701 holds a value of 5 so that each of the five inputs to the 5-to-1 mux is transported to the other chip at each cycle. Until all of the data at the input of this 5-to-1 mux has been transported to the next chip, the dynamic logic evaluation system will prevent the next input from being processed.

In this embodiment, a master clock controls the operation of these components. Thus, the PDC 2702 relies on the master clock input to count down. The propagation detectors 2704–2707 rely on the master clock to determine whether any data in their respective chips are propagating.

How do the propagation detectors alert the global control unit 2700 via the PDC 2702 that data is still propagating in the FPGA chips? All of the outputs of the propagation detectors are coupled to each other in a wired-OR configuration. In other words, the outputs of propagation detector 2704–2707 are coupled to line 2714, which is coupled to the LD input of the down counter PDC 2702 in the global control unit 2700. Because the outputs of the propagation detectors are connected in a wired-OR configuration to line 2714, whenever any of these outputs is a logic "1," the LD input of PDC 2702 will receive a logic "1," signal to trigger the loading process. This signal on line 2714 is called the global propagation signal or the propagation detect (PD) signal. When the LD input is enabled by the logic "1," the PDC 2702 will load the PDR value in PDR 2701 and the PDC 2702 will count down at every master clock cycle. As mentioned above, the PDC down counter 2702 is loaded with the value of the PDR at the start of each evaluation cycle or when the global propagation signal on line 2714 asserts.

In this manner, the longest trace length or the worst possible circuit path need not be used to statically determine a fixed worst possible evaluation time. So long as the propagation detector in each FPGA detects inter-chip propagation of data, the dynamic logic evaluation system will not process the next input. Accordingly, 99% of the input need not be unnecessarily delayed for the sake of the 1% of the input that need the worst possible evaluation time. In one embodiment, since a time division mux technique is used, the evaluation time in the PDR is proportional to the number of cycles needed to transport data across neighboring chips. To determine stability of the output given a particular input, the only data that are monitored are the ones that are involved in inter-chip propagation.

A more detailed view of the propagation detector will now be provided. The propagation detector generally receives signals that need inter-chip transport to generate a propagation detect (PD) signal. The signals that need to be transported to neighboring or otherwise connected chips, are divided into groups of fixed-size signals. With respect to a particular chip, these signals are considered to be essentially output signals since these signals are being output from that chip to another chip. FIG. 91 shows an exemplary implementation of a particular propagation detector in a chip. In FIG. 91, the output signals in this chip are divided into three groups, where each group includes a group propagation detecting (GPD) logic that receives eight (8) signals. One GPD logic includes XOR 2720, XOR 2726, and D register 2723. This GPD logic receives eight signals at XOR 2720; another group receives eight signals at XOR 2721; and a third group receives eight signals at XOR 2722.

Each GPD logic provides a signal at its respective outputs, called the "GPD signal," in response the inputs to the GPD logic. The output of each GPD logic will become logic "0" immediately after the master clock. Within a clock cycle, however, the GPD signal will remain logic "0" if no input signal to the GPD logic changes value. The GPD signal will become logic "1," if one of the inputs to the GPD logic changes value. The GPD signal will toggle between logic "1" and logic "0" if more than one of the inputs to the GPD logic change values.

When the inputs to the XOR gate 2720, for example, do not change, the GPD signal is at logic "0" since the two inputs to the XOR gate 2726 are logic "0." When one of the inputs to the XOR gate 2720 changes, the XOR gate 2726 generates a logic "1" (since one of the inputs to the XOR gate 2726 is logic "1" and the other input is logic "0"). At the leading edge of the master clock, however, the D register 2723 provides logic "1" to one of the inputs to XOR gate 2726 so that the output of XOR gate 2726 is logic "0." Thus, a GPD signal at logic "1" indicates that an input signal to XOR gate 2720 has changed.

The GPD signals from the GPD logic are provided to OR gate 2729. The OR gate generates a combined propagation detection signal, called the "CPD signal." When any of the GPD signals is a logic "1" which indicates a changing signal at the inputs to this propagation detector, the output of OR gate 2729 is a logic "1." Thus, a CPD signal of logic "1" indicates a changing signal at the input to the propagation detector.

The final stage includes a CPD edge detection logic and a CPD level detection logic. The CPD signal from the OR gate 2729 is provided to both the CPD edge detection logic and the CPD level detection logic. The CPD edge detection logic includes two D registers 2730 and 2731 in a feedback configuration. The CPD level detection logic includes a D register 2732.

The CPD edge detection logic detects changes in the edge of the CPD signal. Normally, the output of this CPD edge detection logic is a logic "0." The first D register 2730 receives as its input a logic "1" (via-Vcc). If a logic "1" is generated at the output of OR gate 2729 (CPD signal), this logic "1" is used as the clock signal to D register 2730. This causes the logic "1" to be provided to D register 2731 at a master clock cycle. At this master clock, the D register 2731 outputs a logic "1" which is provided to OR gate 2733 as well as to the reset input of D register 2730 in a feedback configuration. At the next master clock, D register 2730 is reset and the output of D register 2731 eventually returns to logic "0."

The CPD level detection logic includes a single D register 2732 to detect the change in the level of the CPD signal. So long as the input to the D register 2732 is at logic "1" at the assertion of the master clock, the output of the D register 2732 is at logic "1." This output is provided to OR gate 2733.

The outputs from the CPD edge detection logic and the CPD level detection logic are provided to OR gate 2733 to generate the propagation detect (PD) signal. When any of the inputs to the OR gate 2733 is logic "1," the PD signal will be logic "1." This PD signal is, of course, provided to the wired-OR line 2714 as the global propagation signal in FIG. 90. Thus, whenever the PD signal is logic "1," the dynamic evaluation logic system will prevent the next input in the FPGA chip (e.g., next test bench input) from being processed. When no signal at the input to the propagation detection logic changes, the PD signal will be logic "0."

In sum, the dynamic evaluation logic includes a global control unit and a plurality of propagation detectors in the FPGA chips. One propagation detector is provided in each FPGA chip to detect signals that want to propagate from one chip to another. If these propagating signals are detected, the applicable propagation detector alerts the global control unit by sending a propagation detect (PD) or global propagation signal. The global control unit loads a delay value from a propagation delay register (PDR) into a propagation delay counter (PDC). At each master clock, the PDC counts down. When the PDC finally counts down to 0, the dynamic evaluation logic sends a Next Input signal so that the next set of inputs can be processed. However, until the Next Input signal is asserted, the dynamic evaluation logic continues to evaluate the current set of inputs until the outputs have stabilized.

H. Emulation System with Multiple Asynchronous Clocks

Current logic emulators use external clock sources to drive logic emulators. One drawback with the use of such external clock sources is that an external clock source has no knowledge of the emulator and cannot adapt itself based on the internal state of the logic emulator. As a result, both the logic emulator system and the external hardware test bench have to run the clock at the speed of the worst possible evaluation time of the logic emulator. This is known as the "slow down" process in logic emulation. This problem was discussed above with respect to the dynamic evaluation logic system.

In accordance with one embodiment of the present invention, the logic emulation system which uses the dynamic evaluation technology described herein adjusts itself to the shortest evaluation time based on the input stimulus. This emulation system does not use an external clock source as its input clock because the external clock source cannot adjust itself based on the emulation state (i.e., input stimulus). Instead, this emulation system generates clocks in the logic emulator to control both the logic emulator execution and the external test bench.

Referring to FIG. 92, the emulation system includes the emulator 2870, the clock generator clkgen 2871, and the hardware model of user's circuit design configured in the reconfigurable logic elements (shown here collectively as 2876). The emulator is discussed in greater detail elsewhere in this patent specification. The clock generator 2871 generates clock signals in hardware and provides them to various points in the emulated model via lines 2873–2875. This clock generator 2871 will be discussed further below.

The emulation system may also include a test bench board 2872 which generates test bench data in hardware. Typically this test bench board would be a target system (e.g., user's microprocessor design within the motherboard target system). The test bench board 2872 provides its output on representative lines 2881 and 2882, receives its input from the emulator on representative lines 2883 and 2884, and receives its clock from representative clock lines 2885 and 2886. These lines are merely representative. More or less lines may be used than are shown in the figure.

As shown in FIG. 92, the emulator generates the clock signals with the clock generator 2871. These clocks are provided to the test bench board 2872 via lines 2885 and 2886. Thus, the test bench board 2872 does not use its own generated clock or a static external clock generator; rather, the test bench board uses the emulator's clock. As described herein, the clock generation logic generates the multiple asynchronous clocks while strictly controlling their relative phase relationships. Accordingly, the logic evaluation in the emulator can increase in speed.

The emulator 2870 generates multiple asynchronous clocks via clock generator 2871 where the each generated clock's relative phase relationship with respect to all other generated clocks is strictly controlled to speed up the emulation logic evaluation. Unlike statically designed emulator systems known in the prior art, the speed of the logic evaluation in the emulator need not be slowed down to the worst possible evaluation time since the clocking is generated internally in the emulator and carefully controlled. The emulation system does not concern itself with the absolute time duration of each clock, because only the phase relationship among the multiple asynchronous clocks is important. By retaining the phase relationship (and the initial values) among the multiple asynchronous clocks, the speed of the logic evaluation in the emulator can be increased.

By coupling the selected emulator-generated clocks to the emulated design 2876, the logic evaluation is driven by these emulator-generated and -controlled clocks. Similarly, by coupling selected emulator-generated clocks to the test bench board 2872, the evaluation of data in the test bench board components are also driven by these emulator-generated clocks.

An RCC computer system which controls the emulation system, generates the software clock, provides software test bench data, and contains a software model of the user's design can also be coupled to the emulation system. However, this RCC computer system is not shown in FIG. 92. Other sections and figures in this patent specification describe and illustrate the RCC computer system, the target system, and the hardware accelerator (emulator) in greater detail.

Clock Specification

For the single clock dynamic evaluation logic, refer to the previous section. Described therein is the emulation system's ability to dynamically adjust its clocking based on the input stimulus. By doing so, the clock need not be statically slowed down to the worst possible evaluation time. Instead, the clock adjusts itself based on the nature of the input stimulus.

In this section, the emulation system generates multiple asynchronous clocks whose phase relationship is strictly controlled to speed up the emulation logic evaluation. Once again, the speed of the logic evaluation in the emulator need not be slowed down to the worst possible evaluation time since the clocking is generated internally in the emulator and carefully controlled. The emulation system does not concern itself with the absolute time duration of each clock, because only the phase relationship among the multiple asynchronous clocks is important. By retaining the phase relationship (and the initial values) among the multiple asynchronous clocks, the speed of the logic evaluation in the emulator can be increased.

One embodiment of the present invention is an emulation system that generates any predetermined or arbitrary number of asynchronous clocks. Each clock has the general waveform specification as follows:

Clkgen(clksig, $v0$, $t1$, $t2$, $tc$);

where,

"clksig" is the clock signal;

"$v0$" is the forced current clock value (e.g., 1 or 0);

"$t1$" represents the time duration from the current time to the first clksig toggle point;

"$t2$" represents the time duration from the current time to the second clksig toggle point;

"$tc$" represents the clock period.

Referring now to FIG. 93, three asynchronous clocks are shown. These clocks are merely exemplary for the purposes of teaching the invention. More (or less) than three clocks may be used in an actual implementation and the clock waveforms can be of any design. Conforming to the clkgen specification convention above, the first two clocks in FIG. 93 are defined as follows:

Clkgen(CLK1, 0, $t1$, $t2$, $tc$)

Clkgen(CLK2, 1, $t3$, $t4$, $td$)

For the purpose of this discussion, the third clock is ignored. All three clocks will be discussed together in the discussion below on the operation of the clock generation scheduler. However, in the actual emulation system in accordance with one embodiment of the present invention, all the asynchronous clocks are strictly controlled to behave in a certain way.

Focusing on the first two clocks of FIG. 93, assume that the current time is time 2800. Per the clock definition, CLK1 starts off at logic "0" at time 2800 and toggles to logic "1" at time 2801. The time duration from time 2800 (the current time) to time 2801 is t1. CLK1 then toggles to logic "0" at time 2802. The time duration from time 2800 to time 2802 is t2. The period of this clock is tc, represented here as the time duration from time 2801 to time 2805 (or the time duration from time 2802 to time 2806).

Similarly, per the clock definition, CLK2 starts off at logic "1" at time 2800 and toggles to logic "0" at time 2802. The time duration from time 2800 (the current time) to time 2802 is t3. CLK2 then toggles to logic "1" at time 2803. The time duration from time 2800 to time 2803 is t4. The period of this clock is td, represented here as the time duration from time 2803 to time 2805 (or the time duration from time 2805 to time 2808).

The clock definition is a simulation domain concept. Realization of the clock definition in the emulator system itself is different from the specification.

For these asynchronous clocks (and all other asynchronous clocks generated by the emulator system), the phase relationships between the clocks are important. The phase relationship within a single clock is not relevant. What this implies is that the absolute time durations of t1, t2, t3, t4, tc, and td are not important; what is important are the phase relationships between these two clocks.

Two properties make the dynamic clock generation possible: (1) starting values of the clocks; and (2) phase relationship between/among the clocks. So, for the two clocks of FIG. 93, CLK1 must start at logic "0" and CLK2 must start at logic "1" per the clock definition. Thereafter, the sequence of events is as follows:

CLK1 toggles to logic "1"
CLK1 toggles to logic "0"
CLK2 toggles to logic "0"
CLK2 toggles to logic "1"
CLK2 toggles to logic "0"
CLK1 toggles to logic "1"
CLK2 toggles to logic "1"
. . . and so forth as shown in FIG. 93.

As discussed above, these two properties (i.e., the initial value of the clocks and the phase relationship between the clocks) make the dynamic clock generation possible. The absolute time duration and phase relationship of each clock in isolation are not relevant.

Clock Generation Scheduler

If only one clock generator is used in the entire design, then only a loadable T flip-flop is needed to realize the clock generator in the RCC system. The T flip-flop must be loadable so that when swapping occurs, the current clock value can be programmed. When the RCC system's EvalStart signal is provided, the emulator reads the next set of input data and evaluates the data. The EvalStart signal represents the start of this cycle. In one embodiment, the RCC system would control the toggling of the T flip-flop with the EvalStart signal.

If more than one clock is generated, a clock generation logic is implemented in the RCC System. The RCC clock generation logic comprises a clock generation scheduler and a set of clock generation slices. The clock generation scheduler schedules the execution of the clock generation slices. Each clock generation slice represents one clock in the clkgen specification.

The clock generation scheduler schedules the execution of the clock generation slices, where each slice represents one clock in the clkgen specification. FIG. 94 shows a clock generation scheduler in accordance with one embodiment of the present invention. The clock generation scheduler includes a subtractor 2820, a Min register 2821, a finite state machine 2822, and a multiplexer 2823 which interact with a set of clock generation slices 2824–2826. Each clock generation slice such as clock generation slice 2825 includes a Z register (e.g., Z register 2852) and an R0 register (e.g., R0 register 2853). These and other components in the clock generation slice contains other components which will be discussed further below. In FIG. 94, only three clock generation slices are shown because only three asynchronous clocks are generated in this example.

The clock generation scheduler performs the following algorithm:
(1) find the minimum value from the R0 registers of all the clock generation slices; and
(2) subtract the minimum value from the R0 registers of all the clock generation slices and set the Z register to logic "1" if the result of the subtraction is "0."

The structure of the clock generation scheduler is as follows. In this example, three clock generation slices 2824–2826 are shown. The clock generation slices are coupled together through their respective Z and R0 registers.

Clock generation slice 2824 generates CLK1. It is coupled to clock generation slice 2825 via line 2839 (which couples the Z registers in both slices together) and line 2842 (which couples the R0 registers in both slices together). The R0 register of slice 2824 is coupled via line 2831a to the Min register 2821 via line 2831c, the subtractor 2820 via line 2831b, and the mux 2823 via line 2831d. The slice 2824 also receives control signals from finite state machine 2822 via line 2836 (Next signal) and the RCC System via line 2835 (EvalStart signal).

Clock generation slice 2825 generates CLK2. It is coupled to clock generation slice 2824 via line 2839 (which couples the Z registers in both slices together) and line 2842 (which couples the R0 registers in both slices together). In addition, slice 2825 is coupled to slice 2826 via line 2838 (which couples the Z registers in both slices together) and line 2841 (which couples the R0 registers in both slices together). The slice 2825 also receives control signals from finite state machine 2822 via line 2836 (Next signal) and the RCC System via line 2835 (EvalStart signal).

Clock generation slice 2826 generates CLK3. Slice 2826 is coupled to slice 2825 via line 2838 (which couples the Z registers in both slices together) and line 2841 (which couples the R0 registers in both slices together). Slice 2826 also receives the output of mux 2823 in its R0 register via line 2840, and a control signal from the subtractor 2820 into its Z register via line 2837. Slice 2826 also receives control signals from finite state machine 2822 via line 2836 (Next signal) and the RCC System via line 2835 (EvalStart signal).

The subtractor 2820 receives as its inputs the value of the R0 register in slice 2824 via line 2831b and the current minimum value in the Min register 2821 via line 2832. Incidentally, the value of the R0 register in slice 2824 is also provided to mux 2823 via line 2831d as one of the inputs to the mux. These two input values in the subtractor 2820 are subtracted and the result ("SUB RESULT") provided on line 2830 as one of the inputs to mux 2823.

As described further below, the subtractor compares the R0 values in all the slices and performs the subtraction. If the result of the subtraction is "0," the subtractor provides a logic "1" to the Z register in slice 2826 via line 2837, otherwise the subtractor provides a logic "0" on line 2837. During the stage when the minimum value among the R0 registers is being determined, the mux outputs the R0 value, not the SUB RESULT in subtractor 2820.

The Min register 2821 holds the minimum R0 value and provides this minimums value to the subtractor 2820 via line 2832. At the start of each EvalStart cycle, as indicated by the EvalStart signal on line 2835, the Min register 2821 is loaded with the maximum possible value based on the number of digits in the register. This is done by setting all the digits to logic "1." Thereafter, the next R0 that is received by the Min register 2821 via line 2831c will be the new minimum value. A new R0 value is provided from the R0 register in slice 2824 to the Min register via line 2831c. If this new R0 value is less than the current minimum, this new R0 value displaces the current minimum value as the new minimum value. A load signal on line 2834 from the finite state machine 2822 loads this R0 value as the new minimum value.

The mux 2823 receives as its inputs the current R0 value from the R0 register in slice 2824 via line 2831d and the current subtraction result from the subtractor 2820 via line 2830. The output of the mux 2823 is provided on line 2840 to the R0 register in slice 2826. A control signal is provided by the finite state machine 2822 via line 2845.

As discussed further below, the clock scheduler performs its operations through two stages—(1) determine the minimum value among the R0 register values, and (2) subtract this minimum value from the R0 register values. The control signal selects the R0 register value on line 2831d during the minimum R0 value seek stage. However, during the subtraction stage, the control signal selects the subtraction result from the subtractor 2820 on line 2830. Whatever value is output from the mux 2823 writes over the R0 register of slice 2826.

The finite state machine 2822 schedules the execution of the above two-step algorithm by providing control signals to the various components of this clock generation scheduler. If the current R0 value in the R0 register of slice 2824 is less than the current minimum value in the Min register 2821, then a logic "1" signal is provided to the finite state machine 2822 via line 2833. In addition, the load signal on line 2834 loads the current R0 value as the new minimum value in the Min register 2821 if this new R0 value is less than the minimum value in the Min register 2821. The finite state machine 2822 is also made aware of the EvalStart signal on line 2835 and also provides the Next signal on line 2836. The Next signal is analogous to a next instruction command. For the clock scheduler, the EvalStart signal is used to rotate register values among the R0, R1, and R2 registers within a winning clock generation slice. However, the Next signal is used to globally rotate register values across multiple clock generation slices.

Clock Generation Slice

In FIG. 94, three exemplary clock generation slices are shown. To examine the clock generation slices in more detail, refer now to FIG. 95. Here clock generation slice 2825, which generates CLK2, is illustrated in greater detail. Clock generation slice 2825 contains five loadable registers—a T flip-flop 2851, a Z register 2852, an R0 register 2853, an R1 register 2854, and an R2 register 2855. A control logic 2850 is provided to control the operation of these five registers.

The T flip-flop 2851 holds the clock value (i.e., logic "1" or "0") on line 2860 and thus represents CLK2 for this slice 2825. This T flip-flop register is initialized to "vo" per the clkgen clock definition and toggles when both the Z register 2852 and the EvalStart signal on line 2835 are at logic "1." The T flip-flop 2851 also receives a control signal from the control logic 2850 via line 2861 to control when the T flip-flop 2851 should toggle.

The R0 register 2853 keeps the time duration from the current time to the next trigger point. The RCC software will initialize the R0 register 2853 to t1 per the clkgen clock definition. The R0 register 2853 in this slice 2825 links to other clock generation slices in a rotation ring for the clock scheduling. The previous R0 from a neighboring slice is provided on line 2841, while the current R0 value in the R0 register 2853 of this slice 2825 is provided on line 2842 to the next R0 register in the next neighboring slice. The R1 register 2854 outputs its value to the R0 register 2853 via line 2865 at the assertion of the Next signal from the clock generation scheduler. The Next signal from the scheduler will rotate R1 with its neighboring slices.

The R1 register 2854 keeps the time duration from the first toggle point to the second toggle point. The RCC system software will initialize R1 to (t2−t1). The R1 register 2854 receives some value from the R2 register 2855 via line 2863, provides its value to the R2 register 2855 via line 2864, and provides its value to the R0 register 2853 via line 2865 at the assertion of the EvalStart signal. The control logic 2850 receives this EvalStart signal and translates it to a control signal on line 2867 to the R1 and R2 registers to rotate their respective values accordingly.

The R2 register 2855 keeps the time duration from the second toggle point to the next first toggle point. The RCC system software will initialize R2 to (tc−t2+t1). The R2 register 2855 receives some value from the R1 register 2854 via line 2864, and provides its value to the R1 register 2854 via line 2863 at the assertion of the EvalStart signal. The control logic 2850 receives this EvalStart signal (and Z register value) and translates it to a control signal on line 2867 to the R1 and R2 registers to rotate their respective values accordingly.

With respect to the relationship of the R0, R1, and R2 registers, R1 transfers its value to R0, while R1 and R2 rotates when both the Z register 2852 and the EvalStart signal on line 2835 are at logic "1." The rotation occurs whenever the clock slice associated with these registers wins the comparison of the lowest R0 value (i.e., closest next toggle point from the current time). All other R0, R1, and R2 registers in the losing clock slices do not rotate. However, the values in the R0 registers for these losing clock slices are adjusted for the current time.

The Z register 2852 partially controls the toggling of the clock value and the rotation of the R0, R1, and R2 register values. If the value of the R0 register becomes logic "0," then the value of the Z register becomes logic "1." The Z register 2852 is linked to its neighboring slices in a shift pipe for clock scheduling via lines 2838 and 2839. The Next signal from the clock generation scheduler will rotate the value in the Z register 2852 with its neighboring slices. The control logic 2850 receives this Next signal and translates it to a control signal on line 2862 to the Z register to shift its value down the pipe. Also, the value of the Z register is provided to the control logic 2850 on line 2866 so that the control logic can determine whether to toggle the T flip-flop 2851 for the clock signal. If both the Z register value and the EvalStart signal are at logic "1," then the control logic. 2850 will toggle the T flip-flop 2851.

The control logic 2850 controls the operation of the five registers in this slice 2825. Also, the value of the Z register 2852 is provided to the control logic 2850 on line 2866 so that the control logic can determine whether to toggle the T flip-flop 2851 for the clock signal. If both the Z register value and the EvalStart signal are at logic "1," then the control logic 2850 will toggle the T flip-flop 2851. The control logic 2850 delivers a control signal via line 2861 to control when the T flip-flop 2851 should toggle. The control logic 2850 receives an EvalStart signal on line 2836 and translates it to a control signal on line 2867 to the R1 and R2 registers to rotate their respective values accordingly. The control logic 2850 also receives this same Next signal and translates it to a control signal on line 2862 to the Z register to shift its value down the pipe with its neighboring slices.

Operation of the Clock Generation Logic

The operation of the clock generation logic will now be described with respect to FIGS. 96 and 93. FIG. 96 shows not only the clock generation scheduler but also the internal components of the clock generation slices. FIG. 93 shows three clocks.

At a high level, the clock generation scheduler performs the following algorithm for each evaluation cycle, as indicated by EvalStart signal:

(1) set initial values for all registers;
(2) from the current time, find the next toggle point for all the clocks;
(3) toggle the clock associated with this next toggle point;
(4) adjust the current time to be the time associated with this toggle point;
(5) adjust the next toggle point for the winning clock slice, while keeping all other clock slices' respective next toggle points (the toggle points will be the same for the losing slices but the time durations will be adjusted based on the new current time).

Stated differently and using clock scheduler component terminology, the clock generation scheduler performs the following two-step algorithm:

(1) find the minimum value from the R0 registers of all the clock generation slices; and
(2) subtract the minimum value from the R0 registers of all the clock generation slices and set the Z register to logic "1" if the result of the subtraction is "0."

When the EvalStart signal is provided, each clock generation slice will update its clock value and the finite state machine starts execution of the above two step algorithm to determine the next clock toggle event while the RCC system performs logic evaluation with the current set of input stimulus. The finite state machine rotates the R0 ring twice—the first time to find the minimum value of all the R0s, and the second time to subtract the minimum value from the current R0s. An inner rotation of the R0, R1, and R2 registers within each clock generation slice updates the register values so that the winning clock generation slice contains the proper next toggle point information for future toggle point comparisons among all the clock slices. In essence, for each next toggle point comparison, the winning clock generation slice rotates the R0, R1, and R2 registers, while the losing clock generation slices updates their respective R0 register values based on the current time.

These inner rotation operations are triggered by the EvalStart signal. After receiving the EvalStart signal, this algorithm completes its task in 2*(number of slices) cycles, which is fast enough for all practical designs.

Each clock generation slice generates a single clock per the clkgen clock specification. If N asynchronous clocks are needed for the design, N clock generation slices will be provided. In FIG. 96, three clock slices are shown for the three clocks, CLK1, CLK2, and CLK3. The timing diagram of these three clocks are shown in FIG. 93.

With respect to FIG. 93, the operation of the clock generation logic will be described for the initial time 2800 and four exemplary toggle points—times 2801, 2802, 2803, and 2804.

Current Time 2800

Initially, the clock generation logic sets the initial values in the various registers. The clock generation logic compares all the time durations from the current time to the next toggle point for all three clocks. These time duration values are held in the R0 registers in the clock slices. Initially, these time durations are the t1 values for each clock, or essentially the time duration from the current time to the first toggle point. So, register R0 for CLK1 clock slice 2824 holds the time duration from time 2800 to time 2801, register R0 for CLK2 clock slice 2825 holds the time duration from time 2800 to time 2802, and register R0 for CLK3 clock slice 2826 holds the time duration from time 2800 to time 2804.

Based on the comparison, the clock generation logic selects the lowest time duration because this time duration represents the next closest toggle point. The clock associated with this lowest time duration toggles. In FIG. 93, this next toggle point is represented by CLK1, which toggles at time 2801. This clock slice represents the winning clock slice since it is associated with the next toggle point, or the lowest R0 value among all the R0 registers. Note that at this point, the comparisons have been done with first toggle points for each of the three clocks.

The clock generation logic then subtracts this time duration (time 2800 to time 2801) from the other time durations in the R0 registers of their respective clock slices. The emulation system (and the RCC system) now views time 2801 as the current time. After this subtraction, the clock generation logic is now ready to look for the next toggle point. These comparison and subtraction steps are accomplished with the Next signal for globally rotating the R0 values across multiple clock generation slices.

Prior to looking for the next toggle point, the clock generation logic rotates the value of the R0, R1, and R2 registers of the winning slice, in this case slice 2824, with the assertion of the EvalStart signal. Register R0 would now contain the time duration from the prior first toggle point to a second toggle point. Here, this is represented by the time duration from time 2801 to time 2802. Register R1 would now contain the time duration from this second toggle point to the next first toggle point (time 2802 to time 2805), while register R2 would hold the time duration from the first toggle point to the second toggle point (time 2801 to time 2802). Although the winning slice (slice 2824 in this example) would hold this new time duration in the R0 register, all the other slices would retain their original time duration to the first toggle point with some adjustment for the new current time (now time 2801). After all, the valid comparisons should be the updated next toggle point of the winning slice and the next toggle point of all the losing slices.

Current Time 2801

With the current time at time 2801 (based on the subtraction), the clock generation logic then compares the time duration to the next toggle point for each of the clocks. Once again, these time durations are held in the R0 registers in the clock slices. For CLK1, this is the time duration from time 2801 to time 2802. For CLK2, its register R0 holds the time duration from time 2801 to time 2802. For CLK3, its register R0 holds the time duration from time 2801 to time 2804. For CLK2 and CLK3, the values are adjusted from the previous evaluation cycle based on the new current time (now time 2801).

The clock generation logic compares all the time durations from the current time (now time 2801) to the next toggle point for all three clocks. These time duration values are held in the R0 registers in the clock slices as described above. Based on the comparison, the clock generation logic selects the lowest time duration because this time duration represents the next closest toggle point. The clock associated with this lowest time duration toggles. In FIG. 93, this next toggle point is represented by CLK1 again, which toggles at time 2802. This clock slice represents the winning clock slice since it is associated with the next toggle point, or the lowest R0 value among all the R0 registers.

The clock generation logic then subtracts this time duration (time 2801 to time 2801) from the other time durations in the R0 registers of their respective clock slices. The emulation system (and the RCC system) now views time 2802 as the current time. After this subtraction, the clock generation logic is now ready to look for the next toggle point.

Prior to looking for the next toggle point, the clock generation logic rotates the value of the R0, R1, and R2 registers of the winning slice, in this case slice 2824. Register R0 would now contain the time duration from the prior second toggle point to the next first toggle point. Here, this is represented by the time duration from time 2802 to time 2805. Register R1 would now contain the time duration from this next first toggle point to the second toggle point (time 2805 to time 2806), while register R2 would hold the time duration from this second toggle point to the next first toggle point (time 2806 to time 2811). Although the winning slice (slice 2824 in this example) would hold this new time duration in the R0 register, all the other slices would retain their original time duration to their respective first toggle point with some adjustment for the new current time (now time 2802). After all, the valid comparisons should be the updated next toggle point of the winning slice and the next toggle point of all the losing slices.

Current Time 2802

With the current time at time 2802 (based on the subtraction), the clock generation logic then compares the time duration to the next toggle point for each of the clocks. Once again, these time durations are held in the R0 registers in the clock slices. For CLK1, this is the time duration from time 2802 to time 2805. For CLK2, its register R0 holds the time duration from time 2802 to time 2802. For CLK3, its register R0 holds the time duration from time 2802 to time 2804. For CLK2 and CLK3, the values are adjusted from the previous evaluation cycle based on the new current time (now time 2802).

The clock generation logic compares all the time durations from the current time (now time 2802) to the next toggle point for all three clocks. These time duration values are held in the R0 registers in the clock slices as described above. Based on the comparison, the clock generation logic selects the lowest time duration because this time duration represents the next closest toggle point. The clock associated with this lowest time duration toggles. In FIG. 93, this next toggle point is represented by CLK2, which toggles at time 2802. This clock slice represents the winning clock slice since it is associated with the next toggle point, or the lowest R0 value among all the R0 registers.

The clock generation logic then subtracts this time duration (time 2802 to time 2802) from the other time durations in the R0 registers of their respective clock slices. The emulation system (and the RCC system) now views time 2802 as the current time, even though this is the same current time as the last evaluation cycle. This is because two clocks toggled at this same time. After this subtraction, the clock generation logic is now ready to look for the next toggle point.

Prior to looking for the next toggle point, the clock generation logic rotates the value of the R0, R1, and R2 registers of the winning slice, in this case slice 2825. Register R0 would now contain the time duration from the prior first toggle point to the second toggle point. Here, this is represented by the time duration from time 2802 to time 2803. Register R1 would now contain the time duration from this second toggle point to the next first toggle point (time 2803 to time 2810), while register R2 would hold the time duration from the first toggle point to the second toggle point (time 2810 to time 2805). Although the winning slice (slice 2825 in this example) would hold this new time duration in the R0 register, all the other slices would retain their original time duration to their respective next toggle points with some adjustment for the new current time (now time 2802). After all, the valid comparisons should be the updated next toggle point of the winning slice and the next toggle point of all the losing slices.

Current Time 2802 (Again)

With the current time at time 2802 (based on the subtraction), the clock generation logic then compares the time duration to the next toggle point for each of the clocks. Once again, these time durations are held in the R0 registers in the clock slices. For CLK1, this is the time duration from time 2802 to time 2805. For CLK2, its register R0 holds the time duration from time 2802 to time 2803. For CLK3, its register R0 holds the time duration from time 2802 to time 2804. For CLK1 and CLK3, the values are adjusted from the previous evaluation cycle based on the new current time (now time 2802).

The clock generation logic compares all the time durations from the current time (now time 2802) to the next toggle point for all three clocks. These time duration values are held in the R0 registers in the clock slices as described above. Based on the comparison, the clock generation logic selects the lowest time duration because this time duration represents the next closest toggle point. The clock associated with this lowest time duration toggles. In FIG. 93, this next toggle point is represented by CLK2 again, which toggles at time 2803. This clock slice represents the winning clock slice since it is associated with the next toggle point, or the lowest R0 value among all the R0 registers.

The clock generation logic then subtracts this time duration (time 2802 to time 2803) from the other time durations in the R0 registers of their respective clock slices. The emulation system (and the RCC system) now views time 2803 as the current time. After this subtraction, the clock generation logic is now ready to look for the next toggle point.

Prior to looking for the next toggle point, the clock generation logic rotates the value of the R0, R1, and R2 registers of the winning slice, in this case slice 2825. Register R0 would now contain the time duration from the second toggle point to the next first toggle point. Here, this is represented by the time duration from time 2803 to time 2810. Register R1 would now contain the time duration from the first toggle point to the second toggle point (time 2810 to time 2805), while register R2 would hold the time duration from the second toggle point to the next first toggle point (time 2805 to time 2812). Although the winning slice (slice 2825 in this example) would hold this new time duration in the R0 register, all the other slices would retain their original time duration to their respective next toggle points with some adjustment for the new current time (now time 2803). After all, the valid comparisons should be the updated next toggle point of the winning slice and the next toggle point of all the losing slices.

Current Time 2803

With the current time at time 2803 (based on the subtraction), the clock generation logic then compares the time duration to the next toggle point for each of the clocks. Once again, these time durations are held in the R0 registers in the clock slices. For CLK1, this is the time duration from time 2803 to time 2805. For CLK2, its register R0 holds the time duration from time 2803 to time 2810. For CLK3, its register R0 holds the time duration from time 2803 to time 2804. For CLK1 and CLK3, the values are adjusted from the previous evaluation cycle based on the new current time (now time 2803).

The clock generation logic compares all the time durations from the current time (now time 2803) to the next toggle point for all three clocks. These time duration values are held in the R0 registers in the clock slices as described above. Based on the comparison, the clock generation logic selects the lowest time duration because this time duration represents the next closest toggle point. The clock associated with this lowest time duration toggles. In FIG. 93, this next toggle point is represented by CLK3, which toggles at time 2804. This clock slice 2826 represents the winning clock slice since it is associated with the next toggle point, or the lowest R0 value among all the R0 registers.

The clock generation logic then subtracts this time duration (time 2803 to time 2804) from the other time durations in the R0 registers of their respective clock slices. The emulation system (and the RCC system) now views time 2804 as the current time. After this subtraction, the clock generation logic is now ready to look for the next toggle point.

Prior to looking for the next toggle point, the clock generation logic rotates the value of the R0, R1, and R2 registers of the winning slice, in this case slice 2826, in the manner described above. Register R0 would now contain the value from the R1 register, while register R1 and R2 swap values. Although the winning slice (slice 2826 in this example) would hold this new time duration in the R0 register, all the other slices would retain their original time duration to their respective next toggle points with some adjustment for the new current time (now time 2804). After all, the valid comparisons should be the updated next toggle point of the winning slice and the next toggle point of all the losing slices.

In sum, the emulator generates multiple asynchronous clocks via a clock generation logic where each generated clock's relative phase relationship with respect to all other generated clocks is strictly controlled to speed up the emulation logic evaluation. Unlike statically designed emulator systems known in the prior art, the speed of the logic evaluation in the emulator need not be slowed down to the worst possible evaluation time since the clocking is generated internally in the emulator and carefully controlled. The emulation system does not concern itself with the absolute time duration of each clock, because only the phase relationship among the multiple asynchronous clocks is important. By retaining the phase relationship (and the initial values) among the multiple asynchronous clocks, the speed of the logic evaluation in the emulator can be increased. This is accomplished with a clock generation logic that comprises a clock generation scheduler and a set of clock generation slices, where each clock generation slice generates a clock. The clock generation scheduler compares each clock's next toggle point from the current time, toggles the clock associated with the winning next toggle point, determines the new current time, updates the next toggle point information for all of the clock generation slices, and performs the comparison again in the next evaluation cycle. In the update phase, the winning slice updates its register with a new next toggle point, while the losing slices merely updates their respective registers by adjusting for the new current time.

VII. Simulation Server

A Simulation server in accordance with another embodiment of the present invention is provided to allow multiple users to access the same reconfigurable hardware unit to effectively simulate and accelerate the same or different user designs in a time-shared manner. A high speed simulation scheduler and state swapping mechanisms are employed to feed the Simulation server with active simulation processes which results in a high throughput. The server provides the multiple users or processes to access the reconfigurable hardware unit for acceleration and hardware state swapping purposes. Once the acceleration has been accomplished or the hardware state has been accessed, each user or process can then simulate in software only, thus releasing control of the reconfigurable hardware unit to other users or processes.

In the Simulation server portion of this specification, terms such as "job" and "process" are used. In this specification, the terms "job" and "process" are generally used interchangeably. In the past, batch systems executed "jobs" and time-shared systems stored and executed "processes" or programs. In today's systems, these jobs and processes are similar. Thus, in this specification, the term "job" is not limited to batch-type systems and "process" is not limited to time-shared systems; rather, at one extreme, a "job" is equivalent to a "process" if the "process" can be executed within a time slice or without interruption by any other time-shared intervenor, and at the other extreme, a "job" is a subset of a "process" if the "job" requires multiple time slices to complete. So, if a "process" requires multiple time slices to execute to completion due to the presence of other equal priority users/processes, the "process" is divided up into "jobs." Moreover, if the "process" does not require multiple time slices to execute to completion because it is the sole high priority user or the process is short enough to complete within a time slice, the "process" is equivalent to a "job." Thus, a user can interact with one or more "processes" or programs that have been loaded and executed in the Simulation system, and each "process" may require one or more "jobs" to complete in a time-shared system.

In one system configuration, multiple users via remote terminals can utilize the same multiprocessor workstation in a non-network environment to access the same reconfigurable hardware unit to review/debug the same or different user circuit design. In a non-network environment, remote terminals are connected to a main computing system for access to its processing functions. This non-network configuration allows multiple users to share access to the same user design for parallel debugging purposes. The access is accomplished via a time-shared process in which a scheduler determines access priorities for the multiple users, swaps jobs, and selectively locks hardware unit access among the scheduled users. In other instances, multiple users may access the same reconfigurable hardware unit via the server for his/her own separate and different user design for debugging purposes. In this configuration, the multiple users or processes are sharing the multiple microprocessors in the workstation with the operating system.

In another configuration, multiple users or processes in separate microprocessor-based workstations can access the same reconfigurable hardware unit to review/debug the same or different user circuit design across a network. Similarly, the access is accomplished via a time-shared process in which a scheduler determines access priorities for the multiple users, swaps jobs, and selectively locks hardware unit access among the scheduled users. In a network environment, the scheduler listens for network requests through UNIX socket system calls. The operating system uses sockets to send commands to the scheduler.

As stated earlier, the Simulation scheduler uses a preemptive multiple priority round robin algorithm. In other words, higher priority users or processes are served first until the user or process completes the job and ends the session. Among equal priority users or processes, a preemptive round robin algorithm is used in which each user or process is assigned an equal time slice to execute its operations until completed. The time slice is short enough such that multiple users or process will not have to wait a long time before being served. The time slice is also long enough such that sufficient operations are executed before the Simulation server's scheduler interrupts one user or process to swap in and execute the new user's job. In one embodiment, the default time slice is 5 seconds and is user settable. In one embodiment, the scheduler makes specific calls to the operating system's built-in scheduler.

Figure 45:
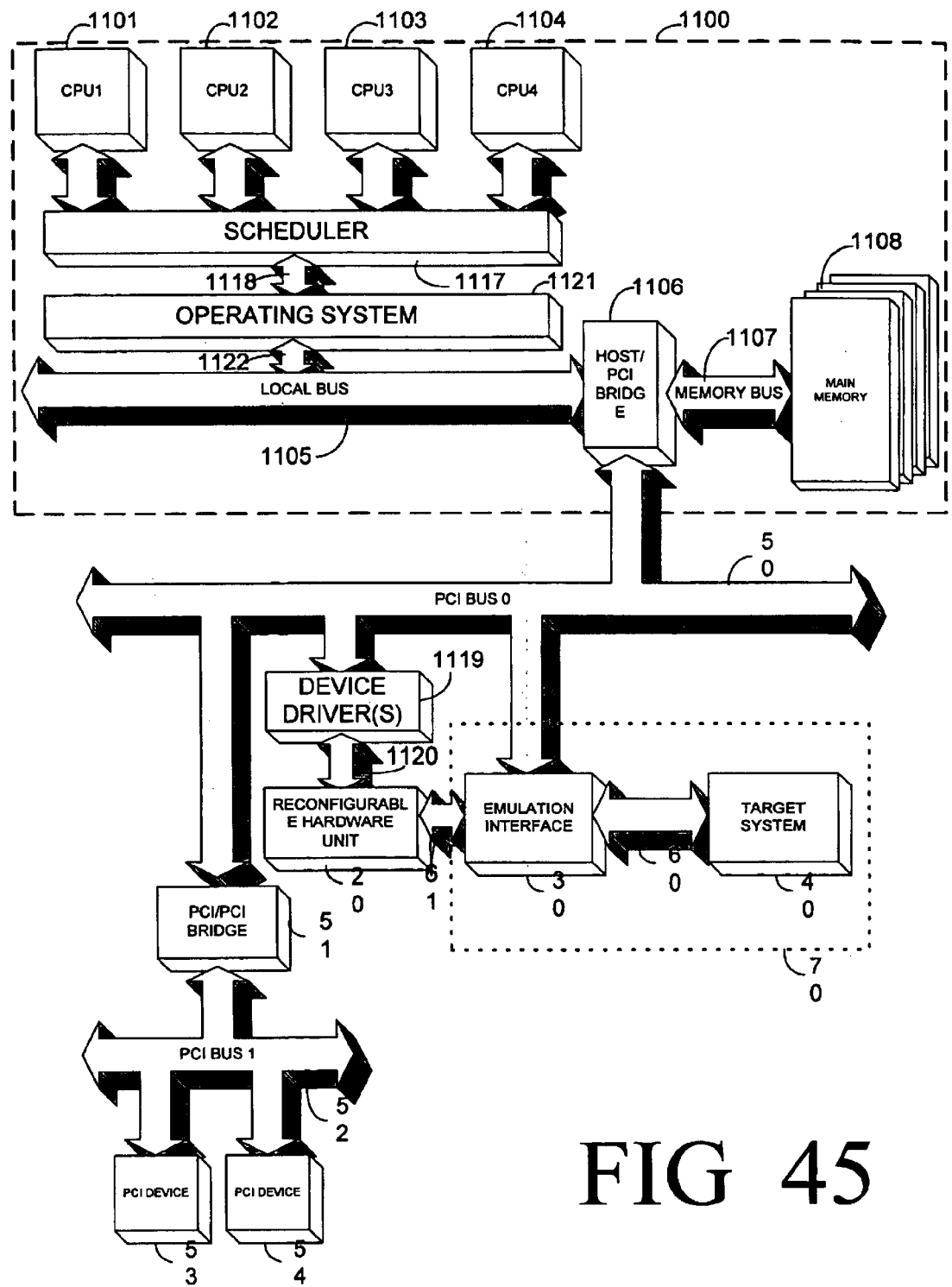
FIG. 45 shows a workstation with multiprocessors in accordance with another embodiment of the present invention.

FIG. 45 shows a non-network environment with a multiprocessor workstation in accordance with one embodiment of the present invention. FIG. 45 is a variation of FIG. 1, and accordingly, like reference numerals will be used for like components/units. Workstation 1100 includes local bus 1105, a host/PCI bridge 1106, memory bus 1107, and main memory 1108. A cache memory subsystem (not shown) may also be provided. Other user interface units (e.g., monitor, keyboard) are also provided but not shown in FIG. 45. Workstation 1100 also includes multiple microprocessors 1101, 1102, 1103, and 1104 coupled to the local bus 1105 via a scheduler 1117 and connections/path 1118. As known to those skilled in the art, an operating system 1121 provides the user-hardware interface foundation for the entire computing environment for managing files and allocating resources for the various users, processes, and devices in the computing environment. For conceptual purposes the operating system 1121 along with a bus 1122 are shown. References to operating systems can be made in Abraham Silberschatz and James L. Peterson, OPERATING SYSTEM CONCEPTS (1988) and William Stallings, MODERN OPERATING SYSTEMS (1996), which are incorporated herein by reference.

In one embodiment, the workstation 1100 is a Sun Microsystems Enterprise 450 system which employs UltraSPARC II processors. Instead of the memory access via the local bus, the Sun 450 system allows the multiprocessors to access the memory via dedicated buses to the memory through a crossbar switch. Thus, multiple processes can be running with multiple microprocessors executing their respective instructions and accessing the memory without going through the local bus. The Sun 450 system along with the Sun UltraSPARC multiprocessor specifications are incorporated herein by reference. The Sun Ultra 60 system is another example of a microprocessor system although it allows only two processors.

The scheduler 1117 provides the time-shared access to the reconfigurable hardware unit 20 via the device driver 1119 and connections/path 1120. Scheduler 1117 is implemented mostly in software to interact with the operating system of the host computing system and partially in hardware to interact with the Simulation server by supporting the simulation job interruption and swapping in/out the simulation sessions. The scheduler 1117 and device driver 1119 will be discussed in more detail below.

Each microprocessor 1101–1104 is capable of processing independently of the other microprocessors in the workstation 1101. In one embodiment of the present invention, the workstation 1100 is operating under a UNIX-based operating system, although in other embodiments, the workstation 1100 can operate under a Windows-based or Macintosh-based operating system. For UNIX-based systems, the user is equipped with X-Windows for the user interface to manage programs, tasks, and files as necessary. For details on the UNIX operating system, reference is made to Maurice J. Bach, THE DESIGN OF THE UNIX OPERATING SYSTEM (1986).

In FIG. 45, multiple users can access workstation 1100 via remote terminals. At times, each user may be using a particular CPU to run its processes. At other times, each user uses different CPUs depending on the resource limitations. Usually, the operating system 1121 determines such accesses and indeed, the operating system itself may jump from one CPU to another to accomplish its tasks. To handle the time-sharing process, the scheduler listens for network requests through socket system calls makes system calls to the operating system 1121, which in turn handles preemption by initiating the generation of interrupt signals by the device driver 1119 to the reconfigurable hardware unit 20. Such interrupt signal generation is one of many steps in the scheduling algorithm which includes stopping the current job, saving state information for the currently interrupted job, swapping jobs, and executing the new job. The server scheduling algorithm will be discussed below.

Sockets and socket system calls will now be discussed briefly. The UNIX operating system, in one embodiment, can operate on a time-sharing mode. The UNIX kernel allocates the CPU to a process for a period of time (e.g., time slice) and at the end of the time slice, preempts the process and schedules another one for the next time slice. The preempted process from the previous time slice is rescheduled for execution at a later time slice.

One scheme for enabling and facilitating interprocess communication and allowing use of sophisticated network protocols is sockets. The kernel has three layers that function in the context of a client-server model. These three layers include the socket layer, the protocol layer, and the device layer. The top layer, the socket layer, provides the interface between the system calls and the lower layers (protocol layer and device layer). Typically, the socket has end points that couple client processes with server processes. The socket end points can be on different machines. The middle layer, the protocol layer, provides the protocol modules for communication, such as TCP and IP. The bottom layer, the device layer, contains the device drivers that control the network devices. One example of a device driver is an Ethernet driver over an Ethernet-based network.

Processes communicate using the client-server model where the server process listens to a socket at one end point and a client process to the server process over another socket at the other end point of the two-way communication path. The kernel maintains internal connections among the three layers of each client and server and routes data from client to the server as needed.

The socket contains several system calls including a socket system call which establishes the end points of a communication path. Many processes use the socket descriptor sd in many system calls. The bind system call associates a name with a socket descriptor. Some other exemplary system calls include the connect system call requests that the kernel make a connection to a socket, the close system call closes sockets, the shutdown system call closes a socket connection, and the send and recv system calls transmit data over a connected socket.

Figure 46:
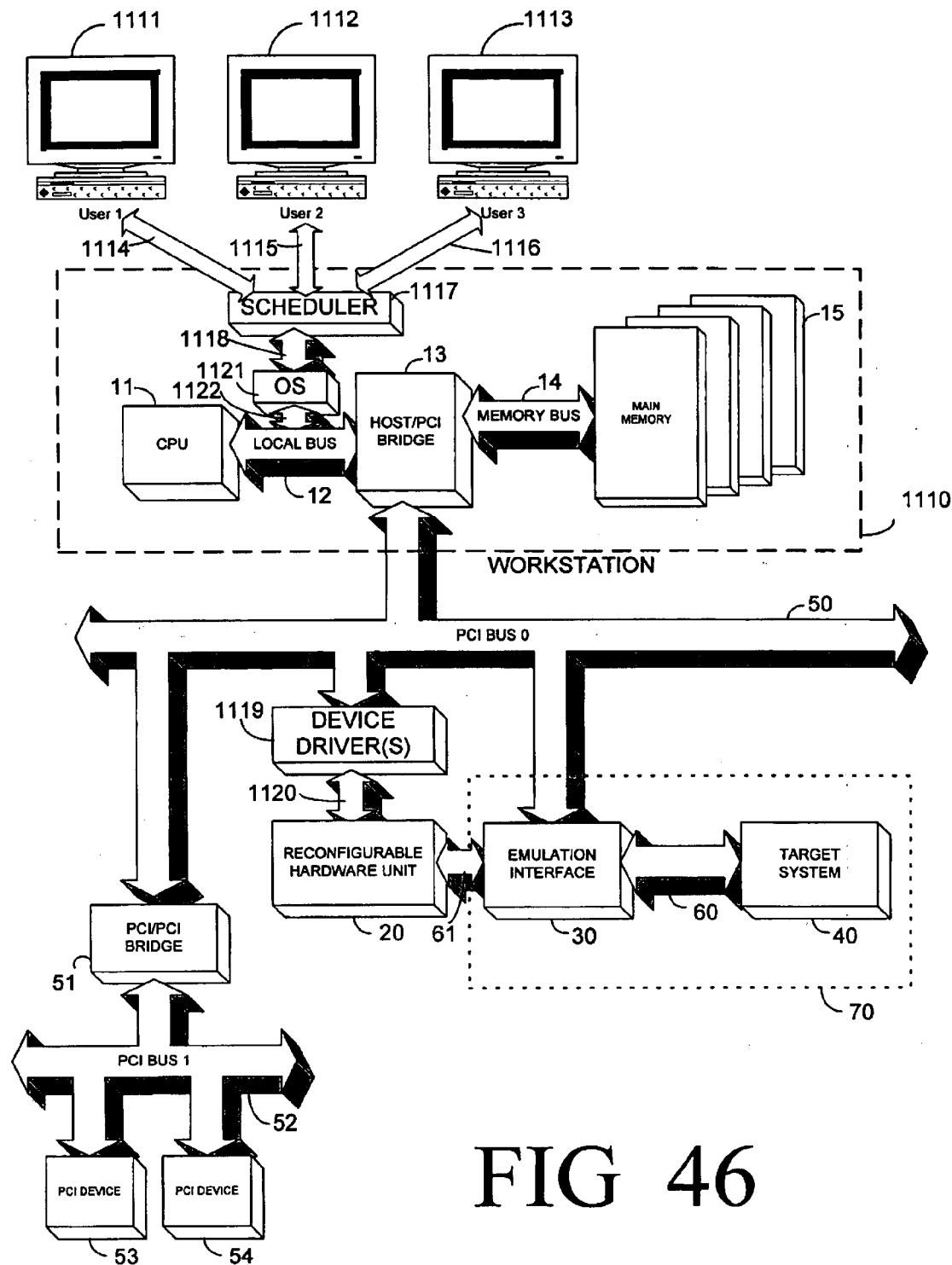
FIG. 46 shows an environment in accordance with another embodiment of the present invention in which multiple users share a single simulation/emulation system on a time-shared basis.

FIG. 46 shows another embodiment in accordance with the present invention in which multiple workstations share a single Simulation system on a time-shared basis across a network. The multiple workstations are coupled to the Simulation system via a scheduler 1117. Within the computing environment of the Simulation system, a single CPU 11 is coupled to the local bus 12 in station 1110. Multiple CPUs may also be provided in this system. As known to those skilled in the art, an operating system 1118 is also provided and nearly all processes and applications reside on top of the operating system. For conceptual purposes the operating system 1121 along with a bus 1122 are shown.

In FIG. 46, workstation 1110 includes those components/units found in FIG. 1 along with scheduler 1117 and scheduler bus 1118 coupled to the local bus 12 via the operating system 1121. Scheduler 1117 controls the time-shared access for the user stations 1111, 1112, and 1113 by making socket calls to the operating system 1121. Scheduler 1117 is implemented mostly in software and partially in hardware.

In this figure, only three users are shown and capable of accessing the Simulation system across the network. Of course, other system configurations provide for more than three users or less than three users. Each user accesses the system via remote stations 1111, 1112, or 1113. Remote user stations 1111, 1112, and 1113 are coupled to the scheduler 1117 via network connections 1114, 1115, and 1116, respectively.

As known to those skilled in the art, device driver 1119 is coupled between the PCI bus 50 and the reconfigurable hardware unit 20. Connection or electrically conductive path 1120 are provided between the device driver 1119 and the reconfigurable hardware unit 20. In this network multi-user embodiment of the present invention, the scheduler 1117 interfaces with the device driver 1119 via the operating system 1121 to communicate and control the reconfigurable hardware unit 20 for hardware acceleration and simulation after hardware state restoration purposes.

Again, in one embodiment, the Simulation workstation 1100 is a Sun Microsystems Enterprise 450 system which employs UltraSPARC II multiprocessors. Instead of the memory access via the local bus, the Sun 450 system allows the multiprocessors to access the memory via dedicated buses to the memory through a crossbar switch instead of tying up the local bus.

Figure 47:
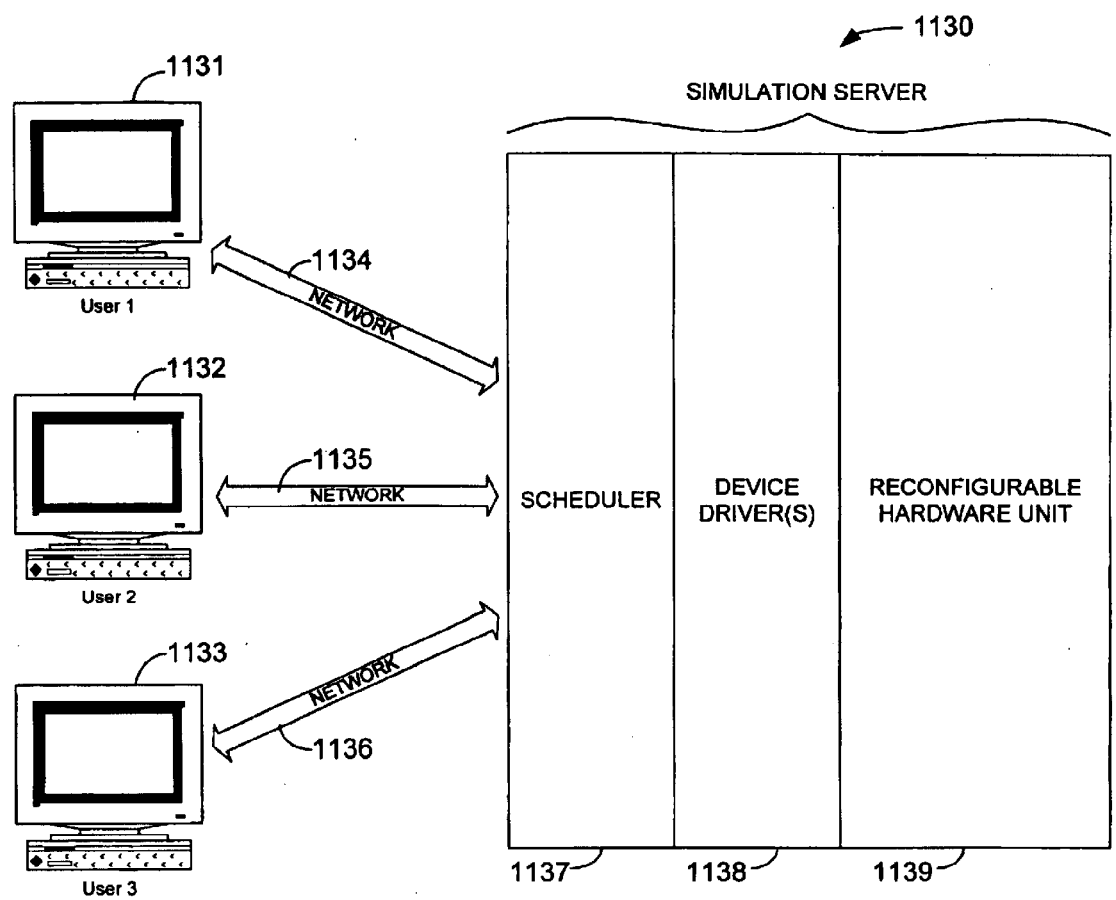
FIG. 47 shows a high level structure of the Simulation server in accordance with one embodiment of the present invention.

FIG. 47 shows a high level structure of the Simulation server in accordance with the network embodiment of the present invention. Here, the operating system is not explicitly shown but, as known to those skilled in the art, it is always present for file management and resource allocation purposes to serve the various users, processes, and devices in the Simulation computing environment. Simulation server 1130 includes the scheduler 1137, one or more device drivers 1138, and the reconfigurable hardware unit 1139. Although not expressly shown as a single integral unit in FIGS. 45 and 46, the Simulation server comprises the scheduler 1117, device driver 1119, and the reconfigurable hardware unit 20. Returning to FIG. 47, the Simulation server 1130 is coupled to three workstations (or users) 1131, 1132, and 1133 via network connections/paths 1134, 1135, and 1136, respectively. As stated above, more than three or less than three workstations may be coupled to the Simulation server 1130.

The scheduler in the Simulation server is based on a preemptive round robin algorithm. In essence, the round robin scheme allows several users or processes to execute sequentially to completion with a cyclic executive. Thus, each simulation job (which is associated with a workstation in a network environment or a user/process in a multiprocessing non-network environment) is assigned a priority level and a fixed time slice in which to execute.

Generally, the higher priority jobs execute first to completion. At one extreme, if different users each have different priorities, the user with the highest priority is served first until this user's job(s) is/are completed and the user with the lowest priority is served last. Here, no time slice is used because each user has a different priority and the scheduler merely serves users according to priority. This scenario is analogous to having only one user accessing the Simulation system until completion.

At the other extreme, the different users have equal priority. Thus, the time slice concept with a first-in first-out (FIFO) queue are employed. Among equal priority jobs, each job executes until it completes or the fixed time slice expires, whichever comes first. If the job does not execute to completion during its time slice, the simulation image associated with whatever tasks it has completed must be saved for later restoration and execution. This job is then placed at the end of the queue. The saved simulation image, if any, for the next job is then restored and executed in the next time slice.

A higher priority job can preempt a lower priority job. In other words, jobs of equal priority run in round robin fashion until they execute through the time slices to completion. Thereafter, jobs of lower priority run in round robin fashion. If a job of higher priority is inserted in the queue while a lower priority job is running, the higher priority job will preempt the lower priority job until the higher priority job executes to completion. Thus, jobs of higher priority run to completion before jobs of lower priority begin execution. If the lower priority job has already begun execution, the lower priority job will not be further executed to completion until the higher priority job executes to completion.

In one embodiment, the UNIX operating system provides the basic and foundational preemptive round robin scheduling algorithm. The Simulation server's scheduling algorithm in accordance with one embodiment of the present invention works in conjunction with the operating system's scheduling algorithm. In UNIX-based systems, the preemptive nature of the scheduling algorithm provides the operating system to preempt user-defined schedules. To enable the time-sharing scheme, the Simulation scheduler uses a preemptive multiple priority round robin algorithm on top of the operating system's own scheduling algorithm.

Figure 55:
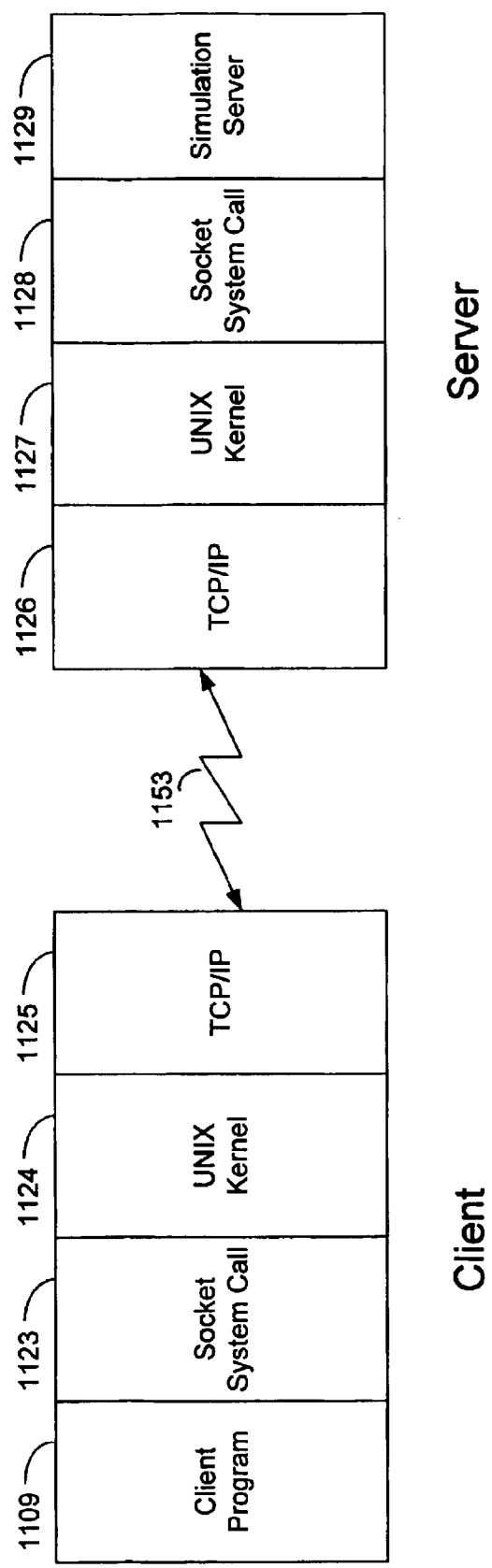
FIG. 55 shows an overview of the client-server model of the Simulation server in accordance with one embodiment of the present invention.

The relationship between the multiple users and the Simulation server in accordance with one embodiment of the present invention follows a client-server model, where the multiple users are clients and the Simulation server is the server. Communication between the user clients and the server occurs via socket calls. Referring briefly to FIG. 55, the client includes client program 1109, a socket system call component 1123, UNIX kernel 1124, and a TCP/IP protocol component 1125. The server includes a TCP/IP protocol component 1126, a UNIX kernel 1127, socket system call component 1128, and the Simulation server 1129. Multiple clients may request simulation jobs to be simulated in the server through UNIX socket calls from the client application program.

In one embodiment, a typical sequence of events includes multiple clients sending requests to the server via the UNIX socket protocol. For each request, the server acknowledges the requests as to whether the command was successfully executed. For the request of server queue status, however, the server replies with the current queue state so that it can be properly displayed to the user. Table F below lists the relevant socket commands from the client:

TABLE F

Client Socket Commands

| Commands | Description |
|---|---|
| 0 | Start simulation < design > |
| 1 | Pause simulation < design > |
| 2 | Exit simulation < design > |
| 3 | Re-assign priority to simulation session |
| 4 | Save design simulation state |
| 5 | Queue status |

For each socket call, each command encoded in integers may be followed with additional parameters such as <design> which represents the design name. Response from the Simulation server will be "0" if the command is executed successfully or a "1" if the command failed. For command "5" which requests queue status, one embodiment of the command's return response is ASCII text terminated by a "\0" character for display onto the user's screen. With these system socket calls, the appropriate communication protocol signals are transmitted to and received from the reconfigurable hardware unit via device drivers.

Figure 48:
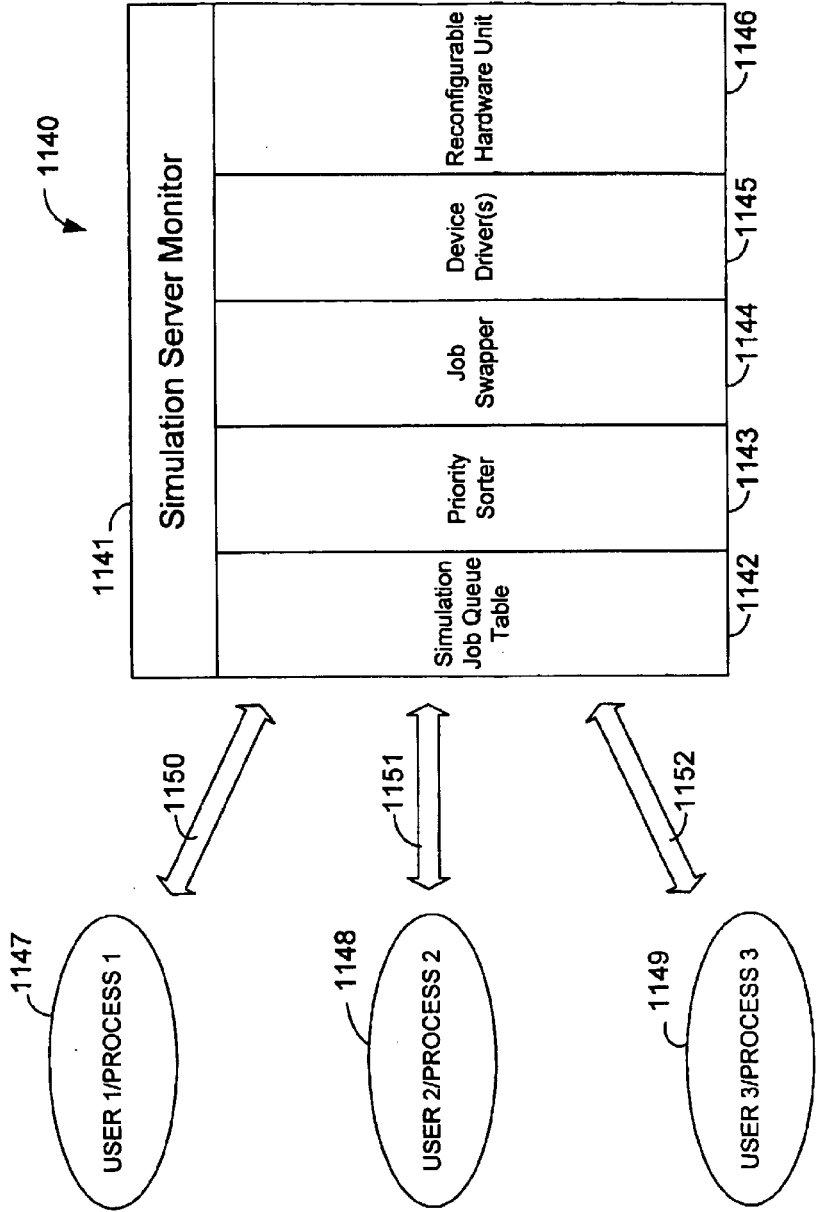
FIG. 48 shows the architecture of the Simulation server in accordance with one embodiment of the present invention.

FIG. 48 shows one embodiment of the architecture of the Simulation server in accordance with the present invention. As explained above, multiple users or multiple processes may be served by the single Simulation server for simulation and hardware acceleration of the users' designs in a time-shared manner. Thus, user/process 1147, 1148, and 1149 are coupled to the Simulation server 1140 via inter-process communication paths 1150, 1151, and 1152, respectively. The inter-process communication paths 1150, 1151, and 1152 may reside in the same workstation for multiprocessor configuration and operation, or in the network for multiple workstations. Each simulation session contains software simulation states along with hardware states for communication with the reconfigurable hardware unit. Inter-process communication among the software sessions is performed using UNIX socket or system calls which provide the capability to have the simulation session reside on the same workstation where the Simulator plug-in card is installed or on a separate workstation connected via a TCP/IP network. Communication with the Simulation server will be initiated automatically.

In FIG. 48, Simulation server 1140 includes the server monitor 1141, a simulation job queue table 1142, a priority sorter 1143, a job swapper 1144, device driver(s) 1145, and the reconfigurable hardware unit 1146. The simulation job queue table 1142, priority sorter 1143, and job swapper 1144 make up the scheduler 1137 shown in FIG. 47.

The server monitor 1141 provides user interface functions for the administrator of the system. The user can monitor the status of the Simulation server state by commanding the system to display simulation jobs in the queue, scheduling priority, usage history, and simulation job swapping efficiency. Other utility functions include editing job priority, deleting simulation jobs, and resetting the simulation server state.

The simulation job queue table 1142 keeps a list of all outstanding simulation requests in the queue which was inserted by the scheduler. The table entries include job number, software simulation process number, software simulation image, hardware simulation image file, design configuration file, priority number, hardware size, software size, cumulative time of the simulation run, and owner identification. The job queue is implemented using a first-in first-out (FIFO) queue. Thus, when a new job is requested, it is placed at the end of the queue.

The priority sorter 1143 decides which simulation job in the queue to execute. In one embodiment, the simulation job priority scheme is user definable (i.e., controllable and definable by the system administrator) to control which simulation process has priority for current execution. In one embodiment, the priority levels are fixed based on the urgency of specific processes or importance of specific users. In another embodiment, the priority levels are dynamic and can change during the course of the simulation. In the preferred embodiment, priority is based on the user ID. Typically, one user will have a high priority and all other users will have lower but equal priority.

Priority levels are settable by the system administrator. Simulator server obtains all user information from the UNIX facility, typically found in the UNIX user file called "/etc/passwd". Adding new users is consistent with the process of adding new users within the UNIX system. After all users are defined, the Simulator server monitor can be used to adjust priority levels for the users.

The job swapper 1144 temporarily replaces one simulation job associated with one process or one workstation for another simulation job associated with another process or workstation based on the priority determination-programmed for the scheduler. If multiple users are simulating the same design, the job swapper swaps in only the stored simulation state for the simulation session. However, if multiple users are simulating multiple designs, the job swapper loads in the design for hardware configuration before swapping in the simulation state. In one embodiment, the job swapping mechanism enhances the performance of the time-sharing embodiment of the present invention because the job swapping need only be done for reconfigurable hardware unit access. So, if one user needs software simulation for some time period, the server swaps in another job for another user so that this other user can access the reconfigurable hardware unit for hardware acceleration. The frequency of the job swapping can be user adjustable and programmable. The device driver also communicates with the reconfigurable hardware unit to swap jobs.

Figure 49:
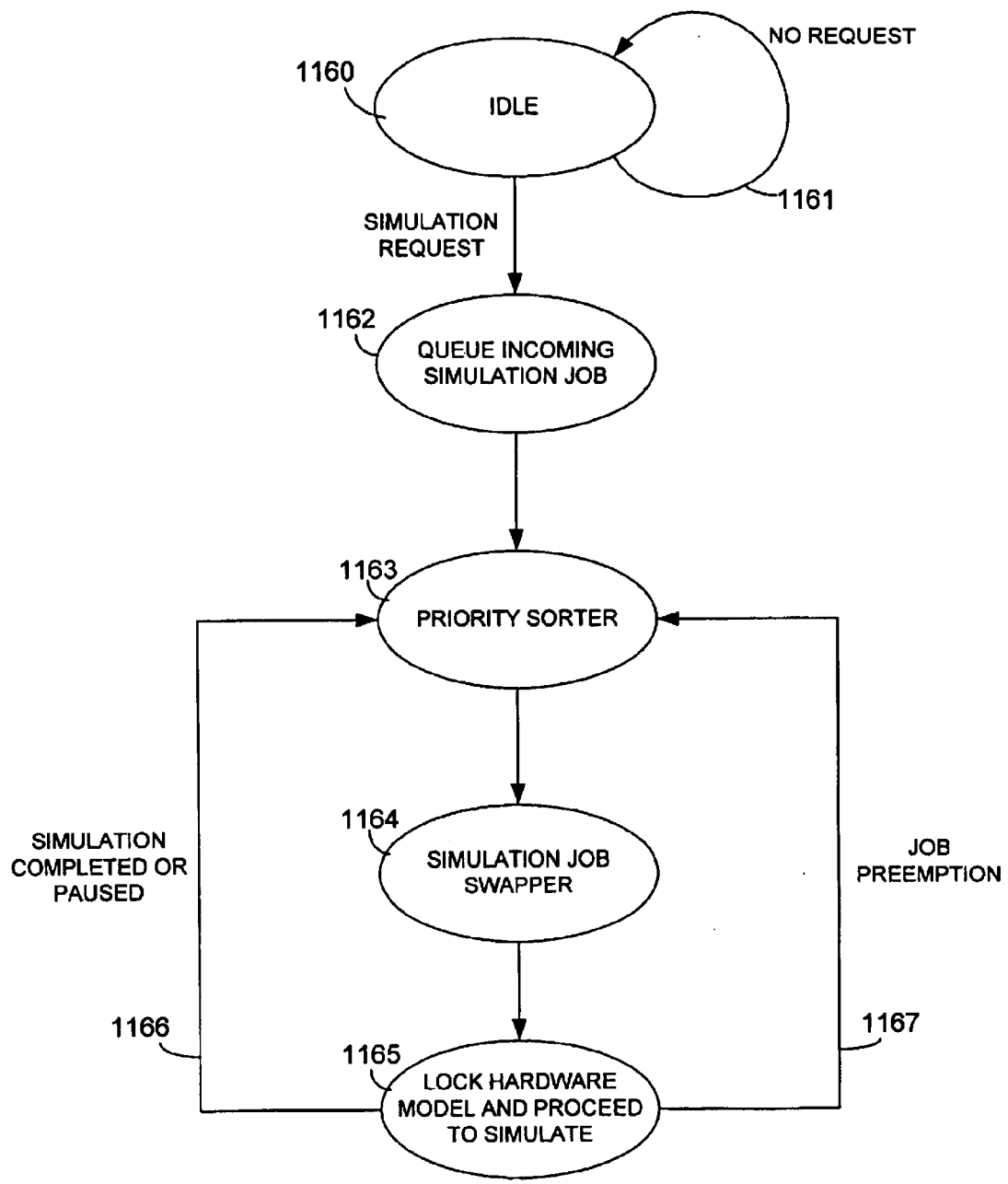
FIG. 49 shows a flow diagram of the Simulation server.

The operation of the Simulation server will now be discussed. FIG. 49 shows a flow diagram of the Simulation server during its operation. Initially, at step 1160, the system is idle. When the system is idle in step 1160, the Simulation server is not necessarily inactive or that a simulation task is not running. Indeed, idleness may mean one of several things: (1) no simulation is running; (2) only one user/workstation is active in a single processor environment so that time-sharing is not required; or (3) only one user/workstation in a multiprocessing environment is active but only one process is running. Thus, conditions 2 and 3 above indicate that the Simulation server has only one job to process so that queuing jobs, determining priorities, and swapping jobs are not necessary and essentially, the Simulation server is idle because it receives no requests (event 1161) from other workstations or processes.

When a simulation request occurs due to one or more request signals from a workstation in a multi-user environment or from a microprocessor in a multiprocessor environment, the Simulation server queues the incoming simulation job or jobs at step 1162. The scheduler keeps a simulation job queue table to insert all outstanding simulation requests onto its queue and list all outstanding simulation requests. For batch simulation jobs, the scheduler in the server queues all the incoming simulation requests and automatically processes the tasks without human intervention.

The Simulation server then sorts the queued jobs to determine priority at step 1163. This step is particularly important for multiple jobs where the server has to prioritize among them to provide access to the reconfigurable hardware unit. The priority sorter decides which simulation job in the queue to execute. In one embodiment, the simulation job priority scheme is user definable (i.e., controllable and definable by the system administrator) to control which simulation process has priority for current execution if a resource contention exists.

After priority sorting at step 1163, the server then swaps simulation jobs, if necessary, at step 1164. This step temporarily replaces one simulation job associated with one process or one workstation for another simulation job associated with another process or workstation based on the priority determination programmed for the scheduler in the server. If multiple users are simulating the same design, the job swapper swaps in only the stored simulation state for the simulation session. However, if multiple users are simulating multiple designs, the job swapper loads in the design first before swapping in the simulation state. Here, the device driver also communicates with the reconfigurable hardware unit to swap jobs.

In one embodiment, the job swapping mechanism enhances the performance of the time-sharing embodiment of the present invention because the job swapping need only be done for reconfigurable hardware unit access. So, if one user needs software simulation for some time period, the server swaps in another job for another user so that this other user can access the reconfigurable hardware unit for hardware acceleration. For example, assume that two users, user 1 and user 2, are coupled to the Simulation server for access to the reconfigurable hardware unit. At one time, user 1 has access to the system so that debugging can be performed for his/her user design. If user 1 is debugging in software mode only, the server can release the reconfigurable hardware unit so that user 2 can access it. The server swaps in the job for user 2 and user 2 can then either software simulate or hardware accelerate the model. Depending on the priorities between user 1 and user 2, user 2 can continue accessing the reconfigurable hardware unit for some predetermined time or, if user 1 needs the reconfigurable hardware unit for acceleration, the server can preempt the job for user 2 so that the job for user 1 can be swapped in for hardware acceleration using the reconfigurable hardware unit. The predetermined time refers to the preemption of simulator jobs based on multiple requests of the same priority. In one embodiment, the default time is 5 minutes although this time is user settable. This 5 minute setting represents one form of a time-out timer. The Simulation system of the present invention uses the time-out timer to stop the execution of the current simulation job because it is excessively time consuming and the system decides that other pending jobs of equal priority should gain access to the reconfigurable hardware model.

Upon the completion of the job swapping step in step 1164, the device driver in the server locks the reconfigurable hardware unit so that only, the currently scheduled user or process can simulate and use the hardware model. The locking and simulation step occurs at step 1165.

At the occurrence of either the completion of simulation or a pause in the currently simulating session at event 1166, the server returns to the priority sorter step 1163 to determine priority of pending simulation jobs and later swap simulation jobs if necessary. Similarly, the server may preempt the running of the currently active simulation job at event 1167 to return the server to the priority sorter state 1163. The preemption occurs only under certain conditions. One such condition is when a higher priority task or job is pending. Another such condition is when the system is currently running a computationally intensive simulation task, in which case the scheduler can be programmed to preempt the currently running job to schedule a task or job with equal priority by utilizing a time-out timer. In one embodiment, the time-out timer is set at 5 minutes and if the current job executes for 5 minutes, the system preempts the current job and swaps in the pending job even though it is at the same priority level.

Figure 50:
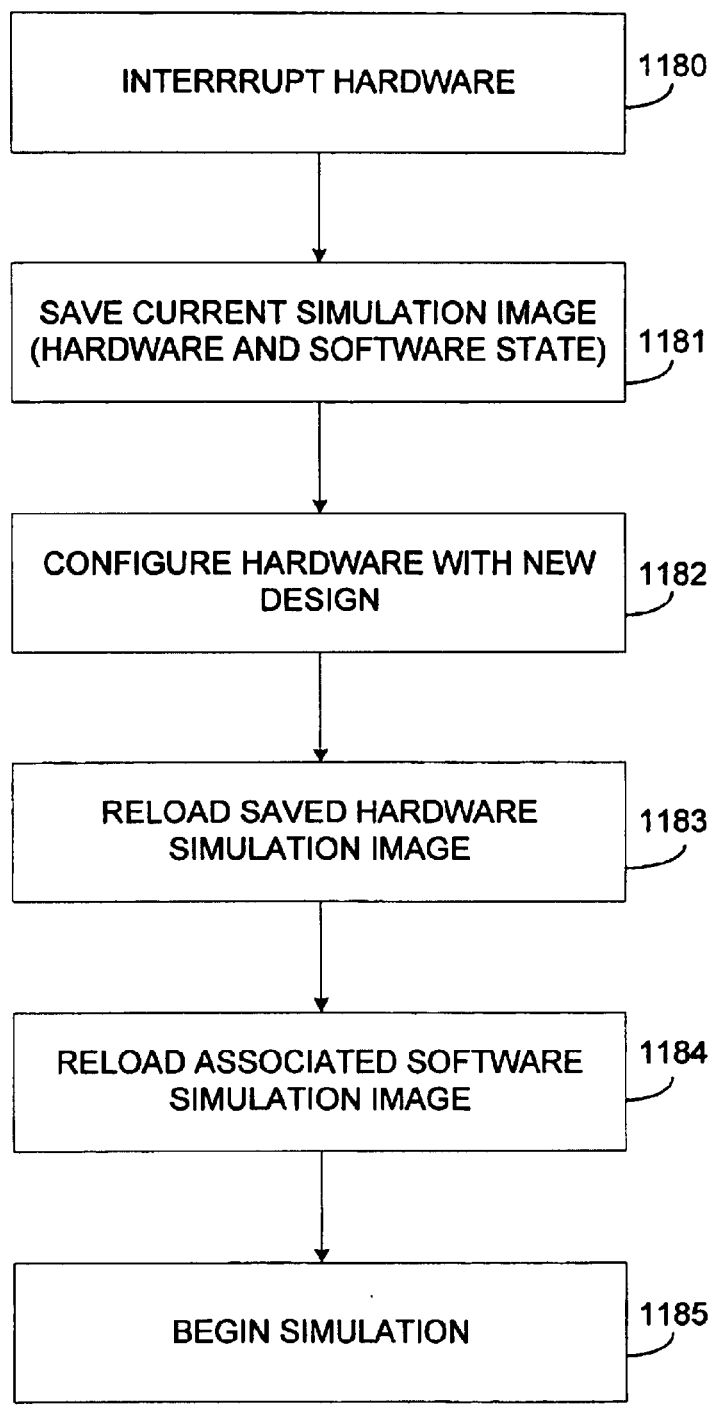
FIG. 50 shows a flow diagram of the job swapping process.

FIG. 50 shows a flow diagram of the job swapping process. The job swapping function is performed in step 1164 of FIG. 49 and is shown in the Simulation server hardware as job swapper 1144 in FIG. 48. In FIG. 50, when a simulation job needs to be swapped with another simulation job, the job swapper sends an interrupt to the reconfigurable hardware unit at step 1180. If the reconfigurable hardware unit is not currently running any jobs (i.e., the system is idle or the user is operating in software simulation mode only without any hardware acceleration intervention), the interrupt immediately prepares the reconfigurable hardware unit for job swapping. However, if the reconfigurable hardware unit is currently running a job and in the midst of executing an instruction or processing data, the interrupt signal is recognized but the reconfigurable unit continues to execute the currently pending instruction and process the data for the current job. If the reconfigurable hardware unit receives the interrupt signal while the current simulation job is not in the middle of executing an instruction or processing data, then the interrupt signal essentially terminates the operation of the reconfigurable hardware unit immediately.

At step 1181, the Simulation system saves the current simulation image (i.e., hardware and software states). By saving this image, users can later restore the simulation run without re-running the whole simulation up to that saved point.

At step 1182, the Simulation system configures the reconfigurable hardware unit with the new user design. This configuration step is only necessary if the new job is associated with a different user design than the one already configured and loaded in the reconfigurable hardware unit and whose execution has just been interrupted. After configuration, the saved hardware simulation image is reloaded at step 1183 and the saved software simulation image is reloaded at step 1184. If the new simulation job is associated with the same design, then no additional configuration is needed. For the same design, the Simulation system loads the desired hardware simulation image associated with the new simulation job for that same design at step 1183 because the simulation image for the new job is probably different from the simulation image for the just interrupted job. The details of the configuration step are provided herein in this patent specification. Thereafter, the associated software simulation image is reloaded at step 1184. After reloading of the hardware and software simulation images, the simulation can begin at step 1185 for this new job, while the previous interrupted job can only proceed in software simulation mode only because it has no access to the reconfigurable hardware unit for the moment.

Figure 51:
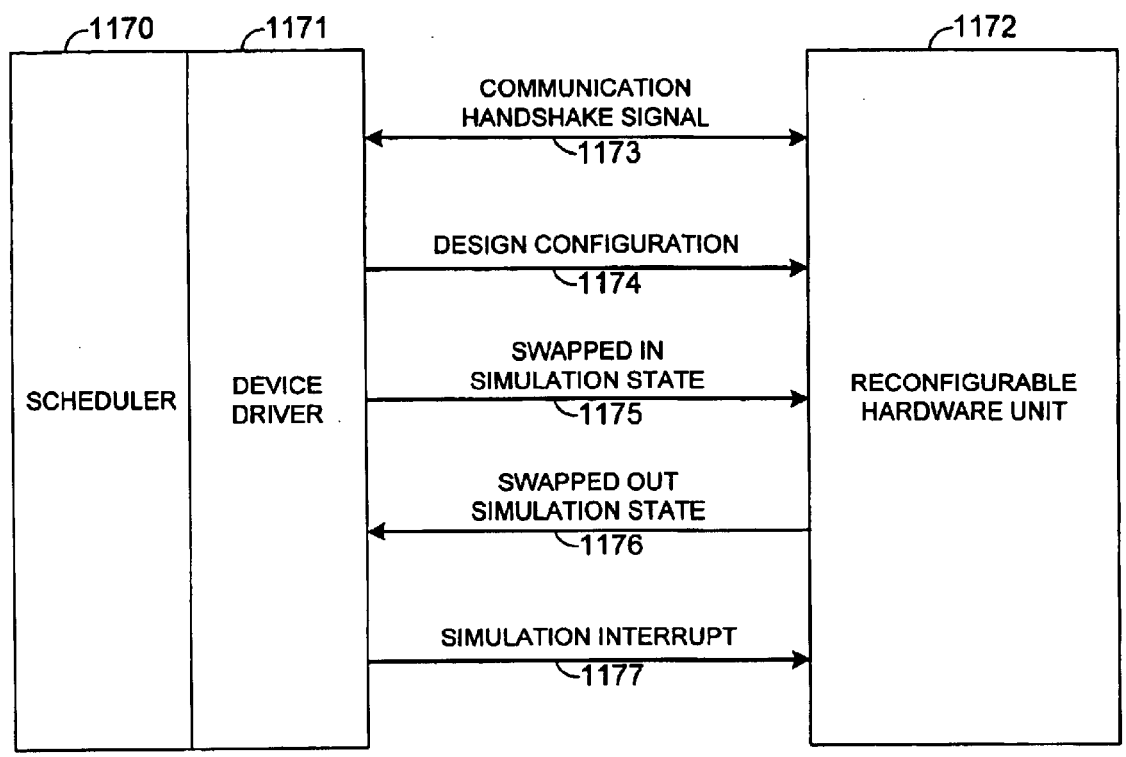
FIG. 51 shows the signals between the device driver and the reconfigurable hardware unit.

FIG. 51 shows the signals between the device driver and the reconfigurable hardware unit. The device driver 1171 provides the interface between the scheduler 1170 and the reconfigurable hardware unit 1172. The device driver 1171 also provides the interface between the entire computing environment (i.e., workstation(s), PCI bus, PCI devices) and the reconfigurable hardware unit 1172 as shown in FIGS. 45 and 46, but FIG. 51 shows the Simulation server portion only. The signals between the device driver and the reconfigurable hardware unit includes the bi-directional communication handshake signals, the unidirectional design configuration information from the computing environment via the scheduler to the reconfigurable hardware unit, the swapped in simulation state information, the swapped out simulation state information, and the interrupt signal from the device driver to the reconfigurable hardware unit so that the simulation jobs can be swapped.

Line 1173 carries the bi-directional communication handshake signals. These signals and the handshake protocol will be discussed further with respect to FIGS. 53 and 54.

Line 1174 carries the unidirectional design configuration information from the computing environment via the scheduler 1170 to the reconfigurable hardware unit 1172. Initial configuration information can be transmitted to the reconfigurable hardware unit 1172 for modeling purposes on this line 1170. Additionally, when users are modeling and simulating different user designs, the configuration information must be sent to the reconfigurable hardware unit 1172 during a time slice. When different users are modeling the same user design, no new design configuration is necessary; rather, different simulation hardware states associated with the same design may need to be transmitted to the reconfigurable hardware unit 1172 for different simulation runs.

Line 1175 carries the swapped in simulation state information to the reconfigurable hardware unit 1172. Line 1176 carries the swapped out simulation state information from the reconfigurable hardware unit to the computing environment (i.e., usually memory). The swapped in simulation state information includes previously saved hardware model state information and the hardware memory state that the reconfigurable hardware unit 1172 needs to accelerate. The swapped in state information is sent at the beginning of a time slice so that the scheduled current user can access the reconfigurable hardware unit 1172 for acceleration. The swapped out state information includes hardware model and memory state information that must be saved in memory at the end of a time slice upon the reconfigurable hardware unit 1172 receiving an interrupt signal to move on to the next time slice associated with a different user/process. The saving of the state information allows the current user/process to restore this state at a later time, such as at the next time slice that is assigned to this current user/process.

Line 1177 sends the interrupt signal from the device driver 1171 to the reconfigurable hardware unit so that the simulation jobs can be swapped. This interrupt signal is sent between time slices to swap out the current simulation job in the current time slice and swap in the new simulation job for the next time slice.

Figure 53:
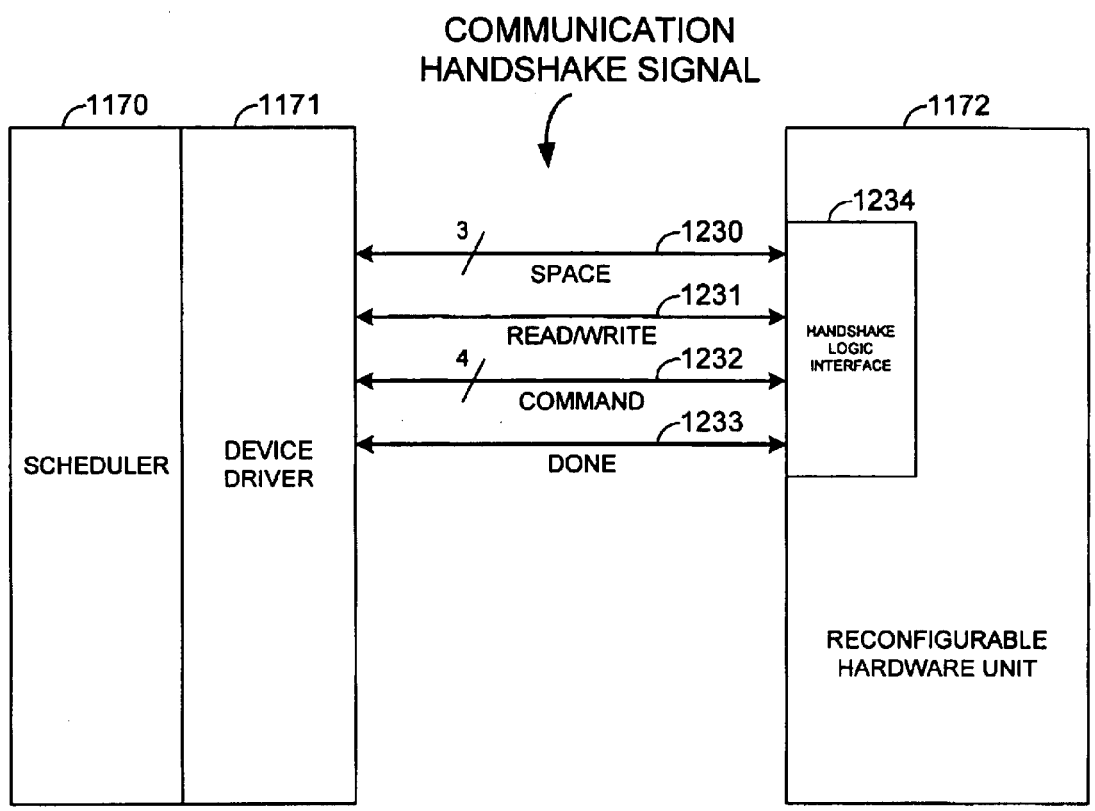
FIG. 53 shows the communication handshake signals between the device driver and the reconfigurable hardware unit.
Figure 54:
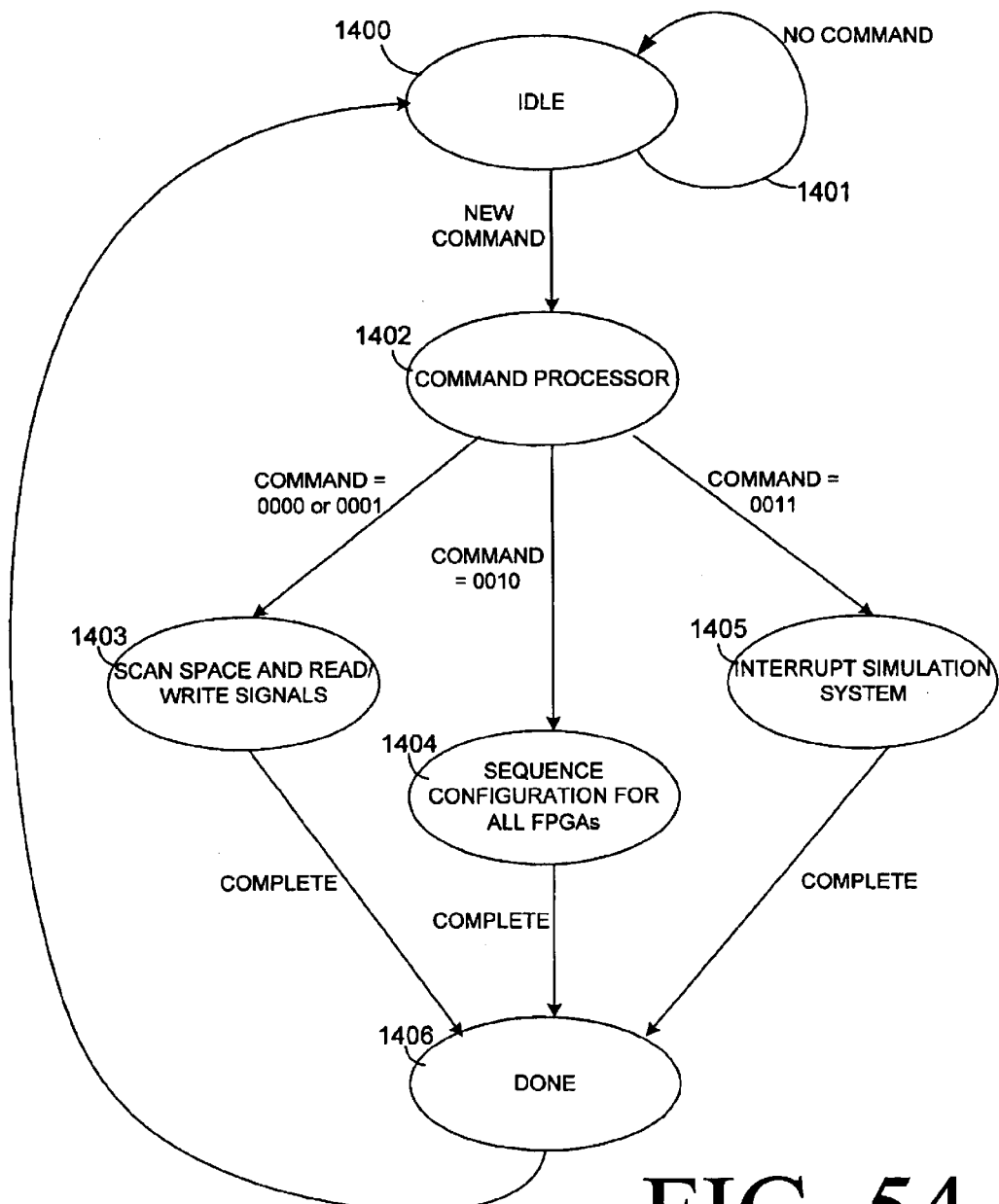
FIG. 54 shows the state diagram of the communication handshake protocol.

The communication handshake protocol in accordance with one embodiment of the present invention will now be discussed with reference to FIGS. 53 and 54. FIG. 53 shows the communication handshake signals between the device driver and the reconfigurable hardware unit via a handshake logic interface. FIG. 54 shows a state diagram of the communication protocol. FIG. 51 shows the communication handshake signals on line 1173. FIG. 53 shows a detailed view of the communication handshake signals between the device driver 1171 and the reconfigurable hardware unit 1172.

In FIG. 53, a handshake logic interface 1234 is provided in the reconfigurable hardware unit 1172. Alternatively, the handshake logic interface 1234 can be installed external to the reconfigurable hardware unit 1172. Four sets of signals are provided between the device driver 1171 and the handshake logic interface 1234. These signals are the 3-bit SPACE signal on line 1230, a single-bit read/write signal on line 1231, a 4-bit COMMAND signal on line 1232, and a single bit DONE signal on line 1233. The handshake logic interface includes logic circuitry that processes these signals to place the reconfigurable hardware unit in the proper mode for the various operations that need to be performed. The interface is coupled to the CTRL_FPGA unit (or FPGA I/O controller).

For the 3-bit SPACE signal, the data transfers between the Simulation system's computing environment over the PCI bus and the reconfigurable hardware unit are designated for certain I/O address spaces in the software/hardware boundary—REG (register), CLK (software clock), S2H (software to hardware), and H2S (hardware to software). As explained above, the Simulation system maps the hardware model into four address spaces in main memory according to different component types and control functions: REG space is designated for the register components; CLK space is designated for the software clocks; S2H space is designated for the output of the software test-bench components to the hardware model; and H2S space is designated for the output of the hardware model to the software test-bench components. These dedicated I/O buffer spaces are mapped to the kernel's main memory space during system initialization time.

The following Table G provides a description of each of the SPACE signals

TABLE G

SPACE Signal

| SPACE | DESCRIPTION |
|---|---|
| 000 | Global (or CLK) space and software to hardware (DMA wr) |
| 001 | Register write (DMA wr) |
| 010 | Hardware to software (DMA rd) |
| 011 | Register Read (DMA rd) |
| 100 | SRAM Write (DMA wr) |
| 101 | SRAM Read (DMA rd) |
| 110 | Unused |
| 111 | Unused |

The read/write signal on line 1231 indicates whether the data transfer is a read or a write. The DONE signal on line 1233 indicates the completion of a DMA data transfer period.

The 4-bit COMMAND indicates whether the data transfer operation should be a write, read, configure new user design into the reconfigurable hardware unit, or interrupt the simulation. As shown in Table H below, the COMMAND protocol is as follows:

TABLE H

COMMAND Signal

| COMMAND | DESCRIPTION |
|---|---|
| 0000 | Write into designated space |
| 0001 | Read from designated space |
| 0010 | Configure FPGA design |

TABLE H-continued

COMMAND Signal

| COMMAND | DESCRIPTION |
|---|---|
| 0011 | Interrupt simulation |
| 0100 | Unused |

The communication handshake protocol will now be discussed with reference to the state diagram on FIG. 54. At state 1400, the Simulation system at the device driver is idle. As long as no new command is presented, the system remains idle as indicated by path 1401. When a new command is presented, the command processor processes the new command at state 1402. In one embodiment, the command processor is the FPGA I/O controller.

If COMMAND=0000 OR COMMAND=0001, the system reads from or writes to the designated space as indicated by the SPACE index at state 1403. If COMMAND=0010, the system to initially configures the FPGAs in the reconfigurable hardware unit with a user design or configures the FPGAs with a new user design at state 1404. The system sequences configuration information for all the FPGAs to model the portion of the user design that can be modeled into hardware. If, however, COMMAND=0011, the system interrupts the reconfigurable hardware unit at state 1405 to interrupt the Simulation system because the time slice has timed out for a new user/process to swap in a new simulation state. At the completion of these states 1403, 1404, or 1405, the Simulation system proceeds to the DONE state 1406 to generate the DONE signal, and then returns to state 1400 where it is idle until a new command is presented.

Figure 52:
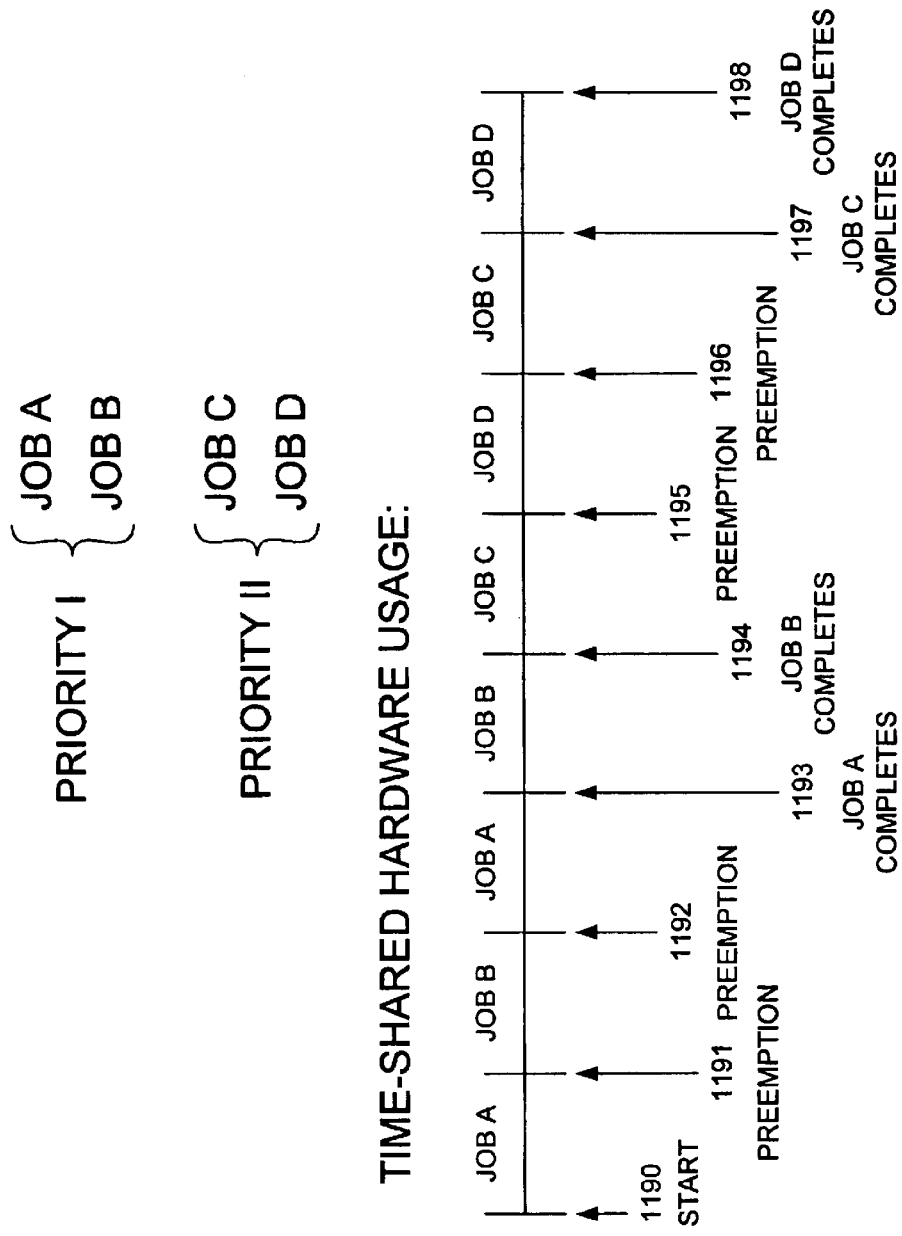
FIG. 52 illustrates the time-sharing feature of the Simulation server for handling multiple jobs with different levels of priorities.

The time-sharing feature of the Simulation server for handling multiple jobs with different levels of priorities will now be discussed. FIG. 52 illustrates one example. Four jobs (job A, job B, job C, job D) are the incoming jobs in the simulation job queue. However, the priority levels for these four jobs are different; that is, jobs A and B are assigned high priority I, whereas jobs C and D are assigned lower priority II. As shown in the time line chart of FIG. 52, the time-shared reconfigurable hardware unit usage depends on the priority levels of the queued incoming jobs. At time 1190, the simulation starts with job A given access to the reconfigurable hardware unit. At time 1191, job A is preempted by job B because job B has the same priority as job A and the scheduler provides equal time-shared access to the two jobs. Job B now has access to the reconfigurable hardware unit. At time 1192, job A preempts job B and job A executes to completion at time 1193. At time 1193, job B takes over and it executes to completion to time 1194. At time 1194, job C, which is next in the queue but with a lower priority level than jobs A and B, now has access to the reconfigurable hardware unit for execution. At time 1195, job D preempts job C for time-shared access because it has the same priority level as job C. Job D now has access until time 1196 where it is preempted by job C. Job C executes to completion at time 1197. Job D then takes over at time 1197 and executes to completion until time 1198.

VIII. Memory Simulation

The Memory Simulation or memory mapping aspect of the present invention provides an effective way for the Simulation system to manage the various memory blocks associated with the configured hardware model of the user's design, which was programmed into the array of FPGA chips in the reconfigurable hardware unit. By implementing the embodiments of the present invention, the memory Simulation scheme does not require any dedicated pins in the FPGA chips to handle the memory access.

As used herein, the phrase "memory access" refers to either a write access or a read access between the FPGA logic devices where the user's design is configured and the SRAM memory devices which stores all the memory blocks associated with the user's design. Thus, a write operation involves data transfer from the FPGA logic devices to the SRAM memory devices, while a read operation involves data transfer from the SRAM memory devices to the FPGA logic devices. Referring to FIG. 56, the FPGA logic devices include 1201 (FPGA1), 1202 (FPGA3), 1203 (FPGA0), and 1204 (FPGA2). The SRAM memory devices include memory devices 1205 and 1206.

Also, the phrase "DMA data transfer" refers to data transfer between the computing system and the Simulation system, in addition to its common usage among those ordinarily skilled in the art. The computing system is shown in FIGS. 1, 45, and 46 as the entire PCI-based system with memory that supports the Simulation system, which resides in software as well as the reconfigurable hardware unit. Selected device drivers, socket/system calls to/from the operating system are also part of the Simulation system that allow the proper interface with the operating system and the reconfigurable hardware unit. In one embodiment of the present invention, a DMA read transfer involves the transfer of data from the FPGA logic devices (and FPGA SRAM memory devices for initialization and memory content dump) to the host computing system. A DMA write transfer involves the transfer of data from the host computing system to the FPGA logic devices (and FPGA SRAM memory devices for initialization and memory content dump).

The terms "FPGA data bus," "FPGA bus," "FD bus," and variations thereof refer to the high bank bus FD[63:32] and low bank bus FD[31:0] coupling the FPGA logic devices which contain the configured and programmed user design to be debugged and the SRAM memory devices.

The memory Simulation system includes a memory state machine, an evaluation state machine, and their associated logic to control and interface with: (1) the main computing system and its associated memory system, (2) the SRAM memory devices coupled to the FPGA buses in the Simulation system, and (3) the FPGA logic devices which contain the configured and programmed user design that is being debugged.

The FPGA logic device side of the memory Simulation system includes an evaluation state machine, an FPGA bus driver, and a logic interface for each memory block N to interface with the user's own memory interface in the user design to handle: (1) data evaluations among the FPGA logic devices, and (2) write/read memory access between the FPGA logic devices and the SRAM memory devices. In conjunction with the FPGA logic device side, the FPGA I/O controller side includes a memory state machine and interface logic to handle DMA, write, and read operations between: (1) main computing system and SRAM memory devices, and (2) FPGA logic devices and the SRAM memory devices.

The operation of the memory Simulation system in accordance with one embodiment of the present invention is generally as follows. The Simulation write/read cycle is divided into three periods—DMA data transfer, evaluation, and memory access. The DATAXSFR signal indicates the occurrence of the DMA data transfer period where the computing system and the SRAM memory units are transferring data to each other via the FPGA data bus—high bank bus (FD[63:32]) 1212 and low bank bus (FD[31:0]) 1213.

During the evaluation period, logic circuitry in each FPGA logic device generates the proper software clock, input enable, and mux enable signals to the user's design logic for data evaluation. Inter-FPGA logic device communication occurs in this period.

During the memory access period, the memory Simulation system waits for the high and low bank FPGA logic devices to put their respective address and control signals onto their respective FPGA data buses. These address and control signals are latched in by the CTRL_FPGA unit. If the operation is a write, then address, control, and data signals are transported from the FPGA logic devices to their respective SRAM memory devices. If the operation is a read, then address and control signals are provided to the designated SRAM memory devices, and data signals are transported from the SRAM memory devices to their respective FPGA logic devices. After all desired memory blocks in all FPGA logic devices have been accessed, the memory Simulation write/read cycle is complete and the memory Simulation system is idle until the onset of the next memory Simulation write/read cycle.

FIG. 56 shows a high level block diagram of the memory Simulation configuration in accordance with one embodiment of the present invention. Signals, connections, and buses that are not relevant to the memory Simulation aspect of the present invention are not shown. A CTRL_FPGA unit 1200, described above, is coupled to bus 1210 via line 1209. In one embodiment, the CTRL_FPGA unit 1200 is a programmable logic device (PLD) in the form of an FPGA chip, such as an Altera 10K50 chip. Local bus 1210 allows the CTRL_FPGA unit 1200 to be coupled to other Simulation array boards (if any) and other chips (e.g., PCI controller, EEPROM, clock buffer). Line 1209 carries the DONE signal which indicates the completion of a Simulation DMA data transfer period.

FIG. 56 shows other major functional blocks in the form of logic devices and memory devices. In one embodiment, the logic device is a programmable logic device (PLD) in the form of an FPGA chip, such as an Altera 10K130 or 10K250 chip. Thus, instead of the embodiment shown above with the eight Altera FLEX 10K100 chips in the array, this embodiment uses only four chips of Altera's FLEX 10K130. The memory device is a synchronous-pipelined cache SRAM, such as a Cypress 128Kx32 CY7C1335 or CY7C1336 chip. The logic devices include 1201 (FPGA1), 1202 (FPGA3), 1203 (FPGA0), and 1204 (FPGA2). The SRAM chips include low bank memory device 1205 (L_SRAM) and high bank memory device 1206 (H_SRAM).

These logic devices and memory devices are coupled to the CTRL_FPGA unit 1200 via a high bank bus 1212 (FD[63:32]) and a low bank bus 1213 (FD[31:0]). Logic devices 1201 (FPGA1) and 1202 (FPGA3) are coupled to the high bank bus 1212 via bus 1223 and bus 1225, respectively, while logic devices 1203 (FPGA0) and 1204 (FPGA2) are coupled to the low bank data bus 1213 via bus 1224 and bus 1226, respectively. High bank memory device 1206 is coupled to the high bank bus 1212 via bus 1220, while low bank memory device 1205 is coupled to the low bank bus 1213 via bus 1219. The dual bank bus structure allows the Simulation system to access the devices on the high bank and the devices on the low bank in parallel at improved throughput rates. The dual bank data bus structure supports other signals, such as control and address signals, so that the Simulation write/read cycles can be controlled.

Figure 61:
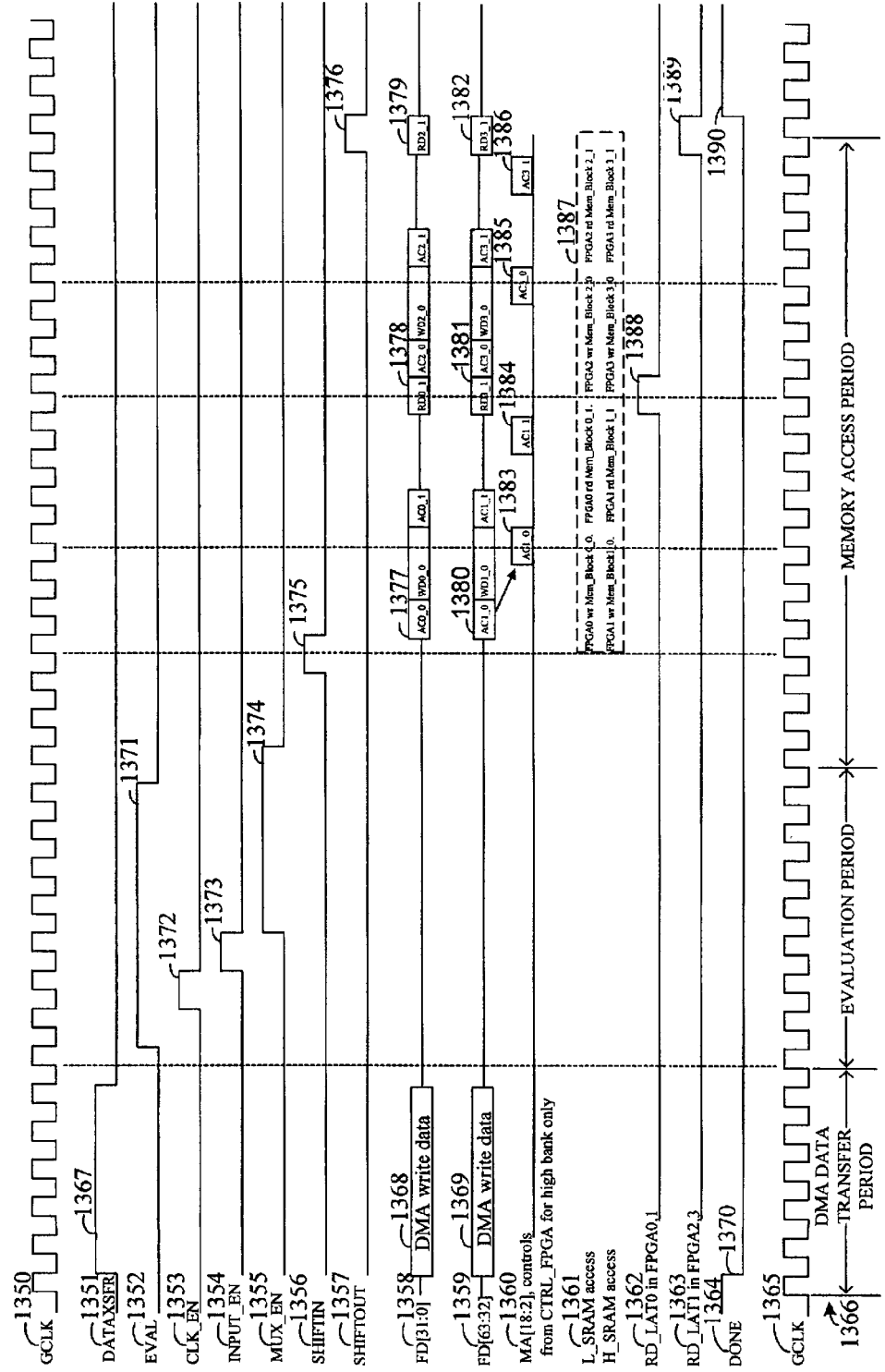
FIG. 61 shows the Simulation write/read cycle in accordance with one embodiment of the present invention.

Turning briefly to FIG. 61, each Simulation write/read cycle includes a DMA data transfer period, an evaluation period, and a memory access period. The combination of the various control signals control and indicate whether the Simulation system is in one period as opposed to another. DMA data transfer between the host computer system and the logic devices 1201 to 1204 in the reconfigurable hardware unit occurs across the PCI bus (e.g., bus 50 in FIG. 46), the local bus 1210 and 1236, and the FPGA bus 1212 (FD[63:32]) and 1213 (FD[31:0]). The memory devices 1205 and 1206 are involved in DMA data transfer for initialization and memory content dumps. Evaluation data transfer among the logic devices 1201–1204 in the reconfigurable hardware unit occurs across the interconnects (as described above) and the FPGA bus 1212 (FD[63:32]) and 1213 (FD[31:0]). Memory access between the logic devices 1201 to 1204 and the memory devices 1205 and 1206 occurs across the FPGA bus 1212 (FD[63:32]) and 1213 (FD [31:0]).

Returning to FIG. 56, the CTRL_FPGA unit 1200 provides and receives many control and address signals to control the Simulation write/read cycles. The CTRL_FPGA unit 1200 provides DATAXSFR and ~EVAL signals on line 1211 to logic devices 1201 and 1203 via line 1221, respectively, and logic devices 1202 and 1204 via line 1222, respectively. The CTRL_FPGA unit 1200 also provides memory address signals MA[18:2] to the low bank memory device 1205 and the high bank memory device 1206 via buses 1229 and 1214, respectively. To control the mode of these memory devices, the CTRL_FPGA unit 1200 provides chip select write (and read) signals to the low bank memory device 1205 and the high bank memory device 1206 via lines 1216 and 1215, respectively. To indicate the completion of a DMA data transfer, the memory Simulation system can send and receive the DONE signal on line 1209 to the CTRL_FPGA unit, 1200 and the computing system.

As discussed previously with respect to FIGS. 9, 11, 12, 14, and 15, the logic devices 1201–1204 are connected together by, among other things, the multiplexed cross chip address pointer chain represented here in FIG. 56 by the two sets of SHIFTIN/SHIFTOUT lines—lines 1207, 1227, and 1218, and lines 1208, 1228, and 1217. These sets are initialized at the beginning of the chain by Vcc at lines 1207 and 1208. The SHIFTIN signal is sent from the preceding FPGA logic device in the bank to start the memory access for the current FPGA logic device. At the completion of the shifts through a given set of chain, the last logic device generates a LAST signal (i.e., LASTL or LASTH) to the CTRL_FPGA unit 1200. For the high bank, logic device 1202 generates a LASTH shiftout signal on line 1218 to the CTRL_FPGA unit 1200, and for the low bank, logic device 1204 generates a LASTL signal on line 1217 to the CTRL_FPGA unit 1200.

With respect to board implementation and FIG. 56, one embodiment of the present invention incorporates the components (e.g., logic devices 1201–1204, memory devices 1205–1206, and CTRL_FPGA unit 1200) and buses (e.g., FPGA buses 1212–1213 and local bus 1210) in one board. This one board is coupled to the motherboard via motherboard connectors. Thus, in one board, four logic devices (two on each bank), two memory devices (one on each bank), and buses are provided. A second board would contain its own complement of logic devices (typically four), memory devices (typically two), FPGA I/O controller (CTRL_FPGA unit) and buses. The PCI controller, however, would be installed on the first board only. Inter-board connectors, as discussed above, are provided between the boards so that the logic devices in all the boards can be connected together and communicate with each other during the evaluation period, and the local bus is provided across all the boards. The FPGA buses FD[63:0] are provided only in each board but not across multiple boards.

In this board configuration, the Simulation system performs memory mapping between logic devices and memory devices in each board. Memory mapping across different boards is not provided. Thus, logic devices in board5 map memory blocks to memory devices in board5 only, not to memory devices on other boards. In other embodiments, however, the Simulation system maps memory blocks from logic devices on one board to memory devices on another board.

The operation of the memory Simulation system in accordance with one embodiment of the present invention is generally as follows. The Simulation write/read cycle is divided into three periods—DMA data transfer, evaluation, and memory access. To indicate the completion of a Simulation write/read cycle, the memory Simulation system can send and receive the DONE signal on line 1209 to the CTRL_FPGA unit 1200 and the computing system. The DATAXSFR signal on bus 1211 indicates the occurrence of the DMA data transfer period where the computing system and the FPGA logic devices 1201–1204 are transferring data to each other via the FPGA data bus, high bank bus (FD[63:32]) 1212 and low bank bus (FD[31:0]) 1213. In general, DMA transfer occurs between the host computing system and the FPGA logic devices. For initialization and memory content dump, the DMA transfer is between the host computing system and the SRAM memory devices 1205 and 1206.

During the evaluation period, logic circuitry in each FPGA logic device 1201–1204 generates the proper software clock, input enable, and mux enable signals to the user's design logic for data evaluation. Inter-FPGA logic device communication occurs in this period. The CTRL_FPGA unit 1200 also begins an evaluation counter to control the duration of the evaluation period. The number of counts, and hence the duration of the evaluation period, is set by the system by determining the longest path of the signals. The path length is associated with a specific number of steps. The system uses the step information and calculates the number of counts necessary to enable the evaluation cycle to run to its completion.

During the memory access period, the memory Simulation system waits for the high and low bank FPGA logic devices 1201–1204 to put their respective address and control signals onto their respective FPGA data buses. These address and control signals are latched in by the CTRL_FPGA unit 1200. If the operation is a write, address, control, and data signals are transported from the FPGA logic devices 1201–1204 to their respective SRAM memory devices 1205 and 1206. If the operation is a read, address and control signals are transported from the FPGA logic devices 1201–1204 to their respective SRAM memory devices 1205 and 1206, and data signals are transported from the SRAM memory devices 1205, 1205 to their respective FPGA logic devices 1201–1204. At the FPGA logic device side, the FD bus driver places the address and control signals of a memory block onto the FPGA data bus (FD bus). If the operation is a write, the write data is placed on the FD bus for that memory block. If the operation is a read, the double buffer latches in the data for the memory block on the FD bus from the SRAM memory device. This operation continues for each memory block in each FPGA logic device in sequential order one memory block at a time. When all the desired memory blocks in an FPGA logic device has been accessed, the memory Simulation system proceeds to the next FPGA logic device in each bank and begins accessing the memory blocks in that FPGA logic device. After all desired memory blocks in all FPGA logic devices 1201–1204 have been accessed, the memory Simulation write/read cycle is complete and the memory Simulation system is idle until the onset of the next memory Simulation write/read cycle.

Figure 57:
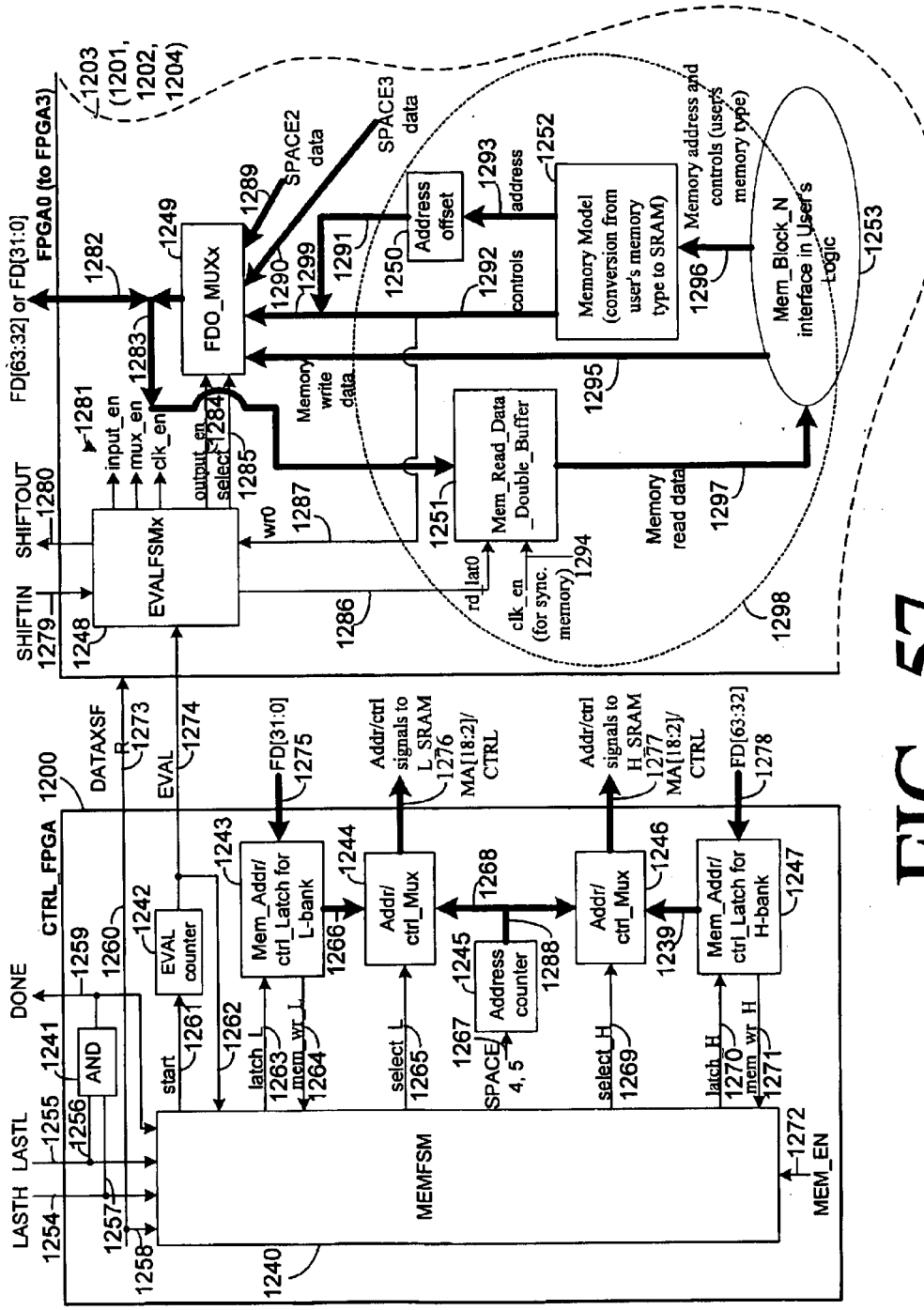
FIG. 57 shows a more detailed block diagram of the memory mapping aspect of the Simulation system with supporting components for the memory finite state machine (MEMFSM) and the evaluation finite state machine for each FPGA logic device (EVALFSMx).

FIG. 57 shows a more detailed block diagram of the memory Simulation aspect of the present invention, including a more detailed structural diagram of the CTRL_FPGA 1200 and each logic device that are relevant to memory Simulation. FIG. 57 shows the CTRL_FPGA 1200 and a portion of the logic device 1203 (which is structurally similar to that of the other logic devices 1201, 1202, and 1204). The CTRL_FPGA 1200 includes the memory finite state machine (MEMFSM) 1240, AND gate 1241, evaluation (EVAL) counter 1242, a low bank memory address/control latch 1243, a low bank address/control multiplexer 1244, address counter 1245, a high bank memory address/control latch 1247, and a high bank address/control multiplexer 1246. Each logic device, such as logic device 1203 shown here in FIG. 57, includes an evaluation finite state machine (EVALFSMx) 1248, data bus multiplexer (FDO_MUXx for the FPGA0 logic device 1203) 1249. The "x" designation appended to the end of EVALFSM identifies the particular logic device (FPGA0, FPGA1, FPGA2, FPGA3) with which it is associated, where "x" is a number from 0 to 3 in this example. Thus, EVALFSM0 is associated with the FPGA0 logic device 1203. In general, each logic device is associated with some number x and as N logic devices are used, the "x" represents a number from 0 to N–1.

In each logic device 1201–1204, numerous memory blocks are associated with the configured and mapped user design. Thus, memory block interface 1253 in the user's logic provides a means for the computing system to access the desired memory block in the array of FPGA logic devices. The memory block interface 1253 also provides memory write data on bus 1295 to the FPGA data bus multiplexer (FDO_MUXx) 1249 and receives memory read data on bus 1297 from the memory read data double buffer 1251.

A memory block data/logic interface 1298 is provided in each FPGA logic device. Each of these memory block data/logic interface 1298 is coupled to the FPGA data bus multiplexer (FDO_MUXx) 1249, the evaluation finite state machine (EVALFSMx) 1248, and the FPGA bus FD[63:0]. The memory block data/logic interface 1298 includes a memory read data double buffer 1251, the address offset unit 1250, the memory model 1252, and the memory block interface for each memory block N (mem_block_N) 1253 which are all repeated in any given FPGA logic device 1201–1204 for each memory block N. Thus, for five memory blocks, five sets of the memory block data/logic interface 1298 are provided; that is, five sets of the memory read data double buffer 1251, the address offset unit 1250, the memory model 1252, and the memory block interface for each memory block N (mem_block_N) 1253 are provided.

Like EVALFSMx, the "x" in FDO_MUXx identifies the particular logic device (FPGA0, FPGA1, FPGA2, FPGA3) with which it is associated, where "x" is a number from 0 to 3. The output of FDO_MUXx 1249 is provided on bus 1282 which is coupled to the high bank bus FD[63:32] or the low bank bus FD[31:0] depending on which chip (FPGA0, FPGA1, FPGA2, FPGA3) is associated with the FDO_MUXx 1249. In FIG. 57, FDO_MUXx is FDO_MUX0, which is associated with low bank logic device FPGA0 1203. Hence, the output on bus 1282 is provided to low bank bus FD[31:0]. Portions of the bus 1283 are used for transporting read data from the high bank FD[63:32] or low bank FD[31:0] bus to the read bus 1283 for input to the memory read data double buffer 1251. Hence, write data is transported out via FDO_MUX0 1249 from the memory block in each logic device 1201–1204 to the high bank FD[63:32] or low bank FD[31:0] bus, and read data is transported in to the memory read data double buffer 1251 from the high bank FD[63:32] or low bank FD[31:0] bus via read bus 1283. The memory read data double buffer provides a double buffered mechanism to latch data in the first buffer and then buffered again to get the latched data out at the same time to minimize skew. This memory read data double buffer 1251 will be discussed in more detail below.

Returning to the memory model 1252, it converts the user's memory type to the memory Simulation system's SRAM type. Because the memory type in the user's design can vary from one type to another, this memory block interface 1253 can also be unique to the user's design. For example, the user's memory type may be DRAM, flash memory, or EEPROM. However, in all variations of the memory block interface 1253, memory addresses and control signals (e.g., read, write, chip select, mem_clk) are provided. One embodiment of the memory Simulation aspect of the present invention converts the user's memory type to the SRAM type used in the memory Simulation system. If the user's memory type is SRAM, the conversion to an SRAM type memory model is quite simple. Thus, memory addresses and control signals are provided on bus 1296 to the memory model 1252, which performs the conversion.

The memory model 1252 provides memory block address information on bus 1293 and control information on bus 1292. Address offset unit 1250 receives address information for the various memory blocks and provides a modified offset address on bus 1291 from the original address on bus 1293. The offset is necessary because certain memory blocks' addresses may overlap each other. For example, one memory block may use and reside in space 0-2K, whereas another memory block may use and reside in space 0-3K. Because both memory blocks overlap in space 0-2K, individual addressing may be difficult without some sort of address offsetting mechanism. Thus, the first memory block may use and reside in space 0-2K, while the second memory block may use and reside in the space above 2K and up to 5K. The offset addresses from address offset unit 1250 and the control signals on bus 1292 are combined and provided on bus 1299 to the FPGA bus multiplexer (FDO_MUXx) 1249.

The FPGA data bus multiplexer FDO_MUXx receives SPACE2 data on bus 1289, SPACE3 data on bus 1290, address/control signals on bus 1299, and memory write data on bus 1295. As described previously, SPACE2 and SPACE3 are specific space indices. The SPACE index, which is generated by the FPGA I/O controller (item 327 in FIG. 10; FIG. 22), selects the particular address space (i.e., REG read, REG write, S2H read, H2S write, and CLK write). Within this address space, the system of the present invention sequentially selects the particular word to be accessed. SPACE2 refers to the memory space dedicated for the DMA read transfer for the hardware-to-software H2S data. SPACE3 refers to the memory space dedicated for the DMA read transfer for REGISTER_READ data. Refer to Table G above.

As its output, FDO_MUXx 1249 provides data on bus 1282 to either the low bank or high bank bus. The selector signals are the output enable (output_en) signal on line 1284 and the select signal on line 1285 from the EVALFSMx unit 1248. The output enable signal on line 1284 enables (or disables) the operation of the FDO_MUXx 1249. For data accesses across the FPGA bus, the output enable signal is enabled to allow the FDO_MUXx to function. The select signal on line 1285 is generated by the EVALFSMx unit 1248 to select among the plurality of inputs from the SPACE2 data on bus 1289, SPACE3 data on bus 1290, address/control signals on bus 1299, and memory write data on bus 1295. The generation of the select signal by the EVALFSMx unit 1248 will be discussed further below.

The EVALFSMx unit 1248 is at the operational core of each logic device 1201–1204 with respect to the memory Simulation system. The EVALFSMx unit 1248 receives as its inputs the SHIFTIN signal on line 1279, the EVAL signal from the CTRL_FPGA unit 1200 on line 1274, and a write signal wrx on line 1287. The EVALFSMx unit 1248 outputs the SHIFTOUT signal on line 1280, the read latch signal rd_latx on line 1286 to the memory read data double buffer 1251, the output enable signal on line 1284 to the FDO_MUXx 1249, the select signal on line 1285 to the FDO_MUXx 1249, and three signals to the user's logic (input-en, mux_en, and clk_en) on lines 1281.

The operation of the FPGA logic devices 1201–1204 for the memory Simulation system in accordance with one embodiment of the present invention is generally as follows. When the EVAL signal is at logic 1, data evaluation within the FPGA logic devices 1201–1204 takes place; otherwise, the Simulation system is performing either DMA data transfer or memory access. At EVAL=1, the EVALFSMx unit 1248 generates the clk_en signal, the input_en signal, and the mux_en signal to allow the user's logic to evaluate the data, latch relevant data, and multiplex signals across logic devices, respectively. The EVALFSMx unit 1248 generates the clk_en signal to enable the second flip-flop of all the clock edge register flip-flops in the user's design logic (see FIG. 19). The clk_en signal is otherwise known as the software clock. If the user's memory type is synchronous, clk_en also enables the second clock of the memory read data double buffer 1251 in each memory block. The EVALFSMx unit 1248 generates the input_en signal to the user's design logic to latch the input signals sent from the CPU by DMA transfer to the user's logic. The input_en signal provides the enable input to the second flip-flop in the primary clock register (see FIG. 19). Finally, the EVALFSMx unit 1248 generates the mux_en signal to turn on the multiplexing circuit in each FPGA logic device to start the communication with other FPGA logic devices in the array.

Thereafter, if the FPGA logic devices 1201–1204 contain at least one memory block, the memory Simulation system waits for the selected data to be shifted in to the selected FPGA logic device and then generates the output_en and select signals for the FPGA data bus driver to put the address and control signals of the memory block interface 1253 (mem_block_N) on the FD bus.

If the write signal wrx on line 1287 is enabled (i.e., logic 1), then the select and output_en signals are enabled to place the write data onto either the low or high bank bus, depending on which bank the FPGA chip is coupled. In FIG. 57, logic device 1203 is FPGA0 and is coupled to the low bank bus FD[31:0]. If the write signal wrx on line 1287 is disabled (i.e., logic 0), then the select and output_en signals are disabled and the read latch signal rd_latx on line 1286 to let the memory read data double buffer 1251 latch and double buffer the selected data from the SRAM via either the low or high bank bus, depending on which bank the FPGA chip is coupled. The wrx signal is the memory write signal which is derived from the memory interface of the of the user's design logic. Indeed, the wrx signal on line 1287 comes from memory model 1252 via control bus 1292.

This process of reading or writing data occurs for each FPGA logic device. After all memory blocks have been processed via SRAM access, the EVALFSMx unit 1248 generates the SHIFTOUT signal to allow SRAM access by the next FPGA logic device in the chain. Note that the memory access for the devices on the high and low banks occur in parallel. At times, the memory access for one bank may complete before the memory access for the other bank. For all of these accesses, appropriate wait cycles are inserted so that logic processes data only when it is ready and data is available.

On the CTRL_FPGA unit 1200 side, the MEMFSM 1240 is at the core of the memory Simulation aspect of the present invention. It sends and receives many control signals to control the activation of the memory Simulation write/read cycles and the control of the various operations supported by the cycles. The MEMFSM 1240 receives the DATAXSFR signal on line 1260 via line 1258. This signal is also provided to each logic device on line 1273. When DATAXSFR goes low (i.e., logic low), the DMA data transfer period ends and the evaluation and memory access periods begin.

The MEMFSM 1240 also receives a LASTH signal on line 1254 and a LASTL signal on line 1255 to indicate that the selected word associated with the selected address space has been accessed between the computing system and the Simulation system via the PCI bus and the FPGA bus. The MOVE signal associated with this shift out process is propagated through each logic device (e.g., logic device 1201–1204) until the desired word has been accessed and the MOVE signal ultimately becomes the LAST signal (i.e., LASTH for the high bank and LASTL for the low bank) at the end of the chain. In the EVALFSM 1248 (i.e., FIG. 57 shows the EVALFSM0 for the FPGA0 logic device 1203), the corresponding LAST signal is the SHIFTOUT signal on line 1280. Because the particular logic device 1203 is not the last logic device in the low bank chain as shown in FIG. 56 where logic device 1204 is the last logic device in the low bank chain, the SHIFTOUT signal for EVALFSM0 is not the LAST signal. If the EVALFSM 1248 corresponds to EVALFSM2 in FIG. 56, then the SHIFTOUT signal on line 1280 is the LASTL signal provided to line 1255 to the MEMFSM. Otherwise, the SHIFTOUT signal online 1280 is provided to logic device 1204 (see FIG. 56). Similarly, the SHIFTIN signal on line 1279 represents Vcc for the FPGA0 logic device (see FIG. 56) 1203.

The LASTL and LASTH signals are input to AND gate 1241 via lines 1256 and 1257, respectively. AND gate 1241 provides an open drain. The output of the AND gate 1241 generates the DONE signal on line 1259, which is provided to the computing system and the MEMFSM 1240. Thus, only when both the LASTL and LASTH signals are logic high to indicate the end of the shifted out chain process will the AND gate output a logic high.

The MEMFSM 1240 generates a start signal on line 1261 to the EVAL counter 1242. As the name implies, the start signal triggers the start of the EVAL counter 1242 and is sent after the completion of the DMA data transfer period. The start signal is generated upon the detection of a high to low (1 to 0) transition of the DATAXSFR signal. The EVAL counter 1242 is a programmable counter that counts a predetermined number of clock cycles. The duration of the programmed counts in the EVAL counter 1242 determines the duration of the evaluation period. The output of the EVAL counter 1242 on line 1274 on line 1274 is either a logic level 1 or 0 depending on whether the counter is counting or not. When the EVAL counter 1242 is counting, the output on line 1274 is at logic 1, which is provided to each FPGA logic device 1201–1204 via EVALFSMx 1248. When EVAL=1, the FPGA logic devices 1201–1204 perform inter FPGA communication to evaluate data in the user's design. The output of the EVAL counter 1242 is also fed back on line 1262 to the MEMFSM unit 1240 for its own tracking purposes. At the end of the programmed counts, the EVAL counter 1242 generates a logic 0 signal on lines 1274 and 1262 to indicate the end of the evaluation period.

If memory access is not desired, the MEM_EN signal on line 1272 is asserted at logic 0 and provided to the MEMFSM unit 1240, in which case the memory Simulation system waits for another DMA data transfer period. If memory access is desired, the MEM_EN signal on line 1272 is asserted at logic 1. In essence, the MEM_EN signal is a control signal from the CPU to enable the on-board SRAM memory device for accessing the FPGA logic devices. Here, the MEMFSM unit 1240 waits for the FPGA logic devices 1201–1204 to place the address and control signals on the FPGA bus, FD[63:32] and FD[31:0].

The remainder of the functional units and their associated control signals and lines are for providing address/control information to the SRAM memory devices for writing and reading data. These units include the memory address/control latch 1243 for the low bank, the address control mux 1244 for the low bank, the memory address/control latch 1247 for the high bank, the address control mux 1246 for the high bank, and the address counter 1245.

The memory address/control latch 1243 for the low bank receives address and control signals from the FPGA bus FD[31:0] 1275, which coincides with bus 1213, and a latch signal on line 1263. The latch 1243 generates mem_wr_L signal on line 1264 and provides the incoming address/control signals from FPGA bus FD[31:0] to the address/control mux 1244 via bus 1266. This mem_wr signal is the same as the chip select write signal.

The address/control mux 1244 receives as inputs the address and control information on bus 1266 and the address information from address counter 1245 via bus 1268. As output, it sends address/control information on bus 1276 to the low bank SRAM memory device 1205. The select signal on line 1265 provides the proper selection signal from the MEMFSM unit 1240. The address/control information on bus 1276 corresponds to the MA[18:2] and chip select read/write signals on buses 1229 and 1216 in FIG. 56.

The address counter 1245 receives information from SPACE4 and SPACE5 via bus 1267. SPACE4 includes the DMA write transfer information. SPACE5 includes the DMA read transfer information. Thus, these DMA transfers occur between the computing system (cache/main memory via the workstation CPU) and the Simulation system (SRAM memory devices 1205, 1206) across the PCI bus. The address counter 1245 provides its output to bus 1288 and 1268 to address/control muxes 1244 and 1246. With the appropriate select signal on line 1265 for the low bank, the address/control mux 1244 places on bus 1276 either the address/control information on bus 1266 for write/read memory access between the SRAM devices 1205 and the FPGA logic devices 1203, 1204, or alternatively, the DMA write/read transfer data from SPACE4 or SPACE5 on bus 1267.

During the memory access period, the MEMFSM unit 1240 provides the latch signal on line 1263 to the memory address/control latch 1243 to fetch the inputs from the FPGA bus FD[31:0]. The MEMFSM unit 1240 extracts the mem__wr__L control information from the address/control signals on FD[31:0] for further control. If the mem__wr__L signal on line 1264 is a logic 1, a write operation is desired and the appropriate select signal on line 1265 is generated by the MEMFSM unit 1240 to the address/control mux 1244 so that the address and control signals on bus 1266 are sent to the low bank SRAM on bus 1276. Thereafter, a write data transfer occurs from the FPGA logic devices to the SRAM memory devices. If the mem__wr__L signal on line 1264 is a logic 0, a read operation is desired so the Simulation system waits for data on the FPGA bus FD[31:0] placed there by the SRAM memory device. As soon as data is ready, the read data transfer occurs from the SRAM memory devices to the FPGA logic devices.

A similar configuration and operation for the high bank are provided. The memory address/control latch 1247 for the high bank receives address and control signals from the FPGA bus FD[63:32] 1278, which coincides with bus 1212, and a latch signal on line 1270. The latch 1270 generates mem__wr__H signal on line 1271 and provides the incoming address/control signals from FPGA bus FD[63:32] to the address/control mux 1246 via bus 1239.

The address/control mux 1246 receives as inputs the address and control information on bus 1239 and the address information from address counter 1245 via bus 1268. As output, it sends address/control information on bus 1277 to the high bank SRAM memory device 1206. The select signal on line 1269 provides the proper selection signal from the MEMFSM unit 1240. The address/control information on bus 1277 corresponds to the MA[18:2] and chip select read/write signals on buses 1214 and 1215 in FIG. 56.

The address counter.1245 receives information from SPACE4 and SPACE5 via bus 1267 as mentioned above for DMA write and read transfers. The address counter 1245 provides its output to bus 1288 and 1268 to address/control muxes 1244 and 1246. With the appropriate select signal on line 1269 for the high bank, the address/control mux 1246 places on bus 1277 either the address/control information on bus 1239 for write/read memory access between the SRAM devices 1206 and the FPGA logic devices 1201, 1202, or alternatively, the DMA write/read transfer data from SPACE4 or SPACE5 on bus 1267.

During the memory access period, the MEMFSM unit 1240 provides the latch signal on line 1270 to the memory address/control latch 1247 to fetch the inputs from the FPGA bus FD[63:32]. The MEMFSM unit 1240 extracts the mem__wr__H control information from the address/control signals on FD[63:32] for further control. If the mem__wr__H signal on line 1271 is a logic 1, a write operation is desired and the appropriate select signal on line 1269 is generated by the MEMFSM unit 1240 to the address/control mux 1246 so that the address and control signals on bus 1239 are sent to the high bank SRAM on bus 1277. Thereafter, a write data transfer occurs from the FPGA logic devices to the SRAM memory devices. If the mem__wr__H signal on line 1271 is a logic 0, a read operation is desired so the Simulation system waits for data on the FPGA bus FD[63:32] placed there by the SRAM memory device. As soon as data is ready, the read data transfer occurs from the SRAM memory devices to the FPGA logic devices.

As shown in FIG. 57, address and control signals are provided to low bank SRAM memory device and the high bank memory device via bus 1276 and 1277, respectively. The bus 1276 for the low bank corresponds to the combination of the buses 1229 and 1216 in FIG. 56. Similarly, the bus 1277 for the high bank corresponds to the combination of the buses 1214 and 1215 in FIG. 56.

The operation of the CTRL__FPGA unit 1200 for the memory Simulation system in accordance with one embodiment of the present invention is generally as follows. The DONE signal on line 1259, which is provided to the computing system and the MEMFSM unit 1240 in the CTRL__FPGA unit 1200 indicates the completion of a Simulation write/read cycle. The DATAXSFR signal on line 1260 indicates the occurrence of the DMA data transfer period of the Simulation write/read cycle. Memory address/control signals on both of the FPGA bus FD[31:0] and FD[63:32] are provided to the memory address/control latch 1243 and 1247 for the high and low banks, respectively. For either bank, MEMFSM unit 1240 generates the latch signal (1263 or 1269) to latch the address and control information. This information is then provided to the SRAM memory devices. The mem__wr signal is used to determine if a write or a read operation is desired. If a write is desired, data is transferred from the FPGA logic devices 1201–1204 to the SRAM memory devices via the FPGA bus. If a read is desired, the Simulation system waits for the SRAM memory device to put the requested data onto the FPGA bus for transfer between the SRAM memory device to the FPGA logic devices. For DMA data transfers of SPACE4 and SPACE5, the select signal on lines 1265, 1269 can select the output of the address counter 1245 as the data to be transferred between the main computing system and the SRAM memory devices in the Simulation system. For all of these accesses, appropriate wait cycles are inserted so that logic processes data only when it is ready and data is available.

Figure 60:
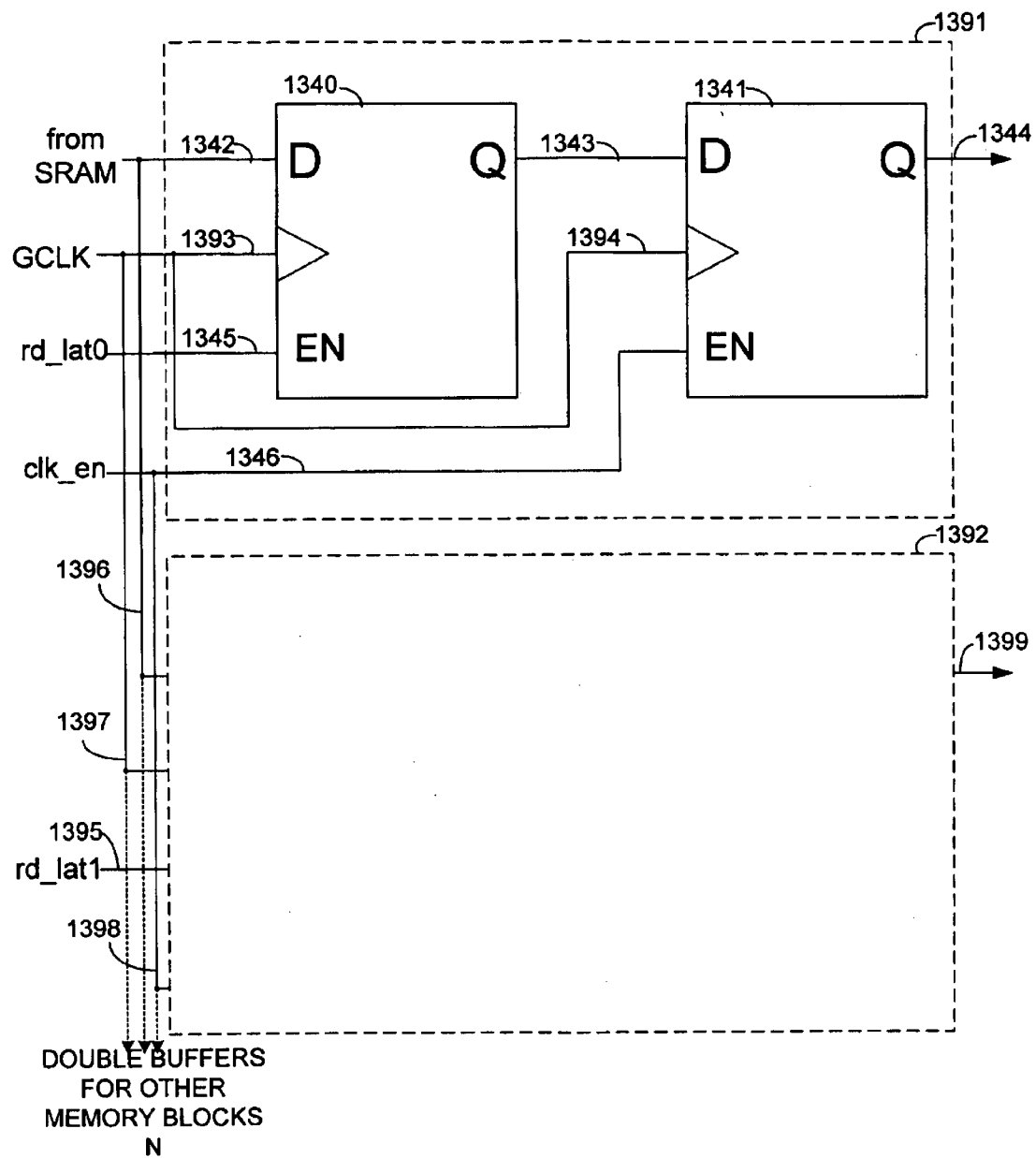
FIG. 60 shows the memory read data double buffer.

FIG. 60 shows a more detailed view of the memory read data double buffer 1251 (FIG. 57). Each memory block N in each FPGA logic device has a double buffer to latch in the relevant data which may be coming in at different times, and then finally buffering out this relevant latched data at the same time. In FIG. 60, double buffer 1391 for memory block 0 includes two D-type flip-flops 1340 and 1341. The output 1343 of the first D flip-flop 1340 is coupled to the input of the second D flip-flop 1341. The output 1344 of the second D flip-flop 1341 is the output of the double buffer, which is provided to the memory block N interface in the user's design logic. The global clock input is provided to the first flip-flop 1340 on line 1393 and the second flip-flop 1341 on line 1394.

The first D flip-flop 1340 receives on line 1342 its data input from the SRAM memory devices via bus 1283 and the FPGA bus FD[63:32] for the high bank and FD[31:0] for the low bank. The enable input is coupled to line 1345 which receives the rd__latx (e.g., rd__lat0) signal from the EVALF-SMx unit for each FPGA logic device. Thus, for read operations (i.e., wrx=0), the EVALFSMx unit generates the rd__latx signal to latch in the data on line 1342 to line 1343. The input data for all the double buffers of all memory blocks may come in at different times, the double buffer ensures that all of the data is latched in first. Once all the data is latched in to D flip-flop 1340, the clk__en signal (i.e., the software clock) is provided on line 1346 as the clock input to the second D flip-flop 1341. When the clk__en signal is asserted, the latched data on line 1343 is buffered into D flip-flop 1341 to line 1344.

For the next memory block 1, another double buffer 1392 substantially equivalent to double buffer 1391 is provided. The data from the SRAM memory devices are input on line

1396. The global clock signal is input on line 1397. The clk_en (software clock) signal is input to the second flip-flop (not shown) in the double buffer 1392 on line 1398. These lines are coupled to analogous signal lines for the first double buffer 1391 for memory block 0 and all other double buffers for other memory blocks N. The output double buffered data is provided on line 1399.

The rd_latx signal (e.g., rd_lat1) for the second double buffer 1392 is provided on line 1395 separately from other rd_latx signals for other double buffers. More double buffers are provided for other memory blocks N.

Figure 58:
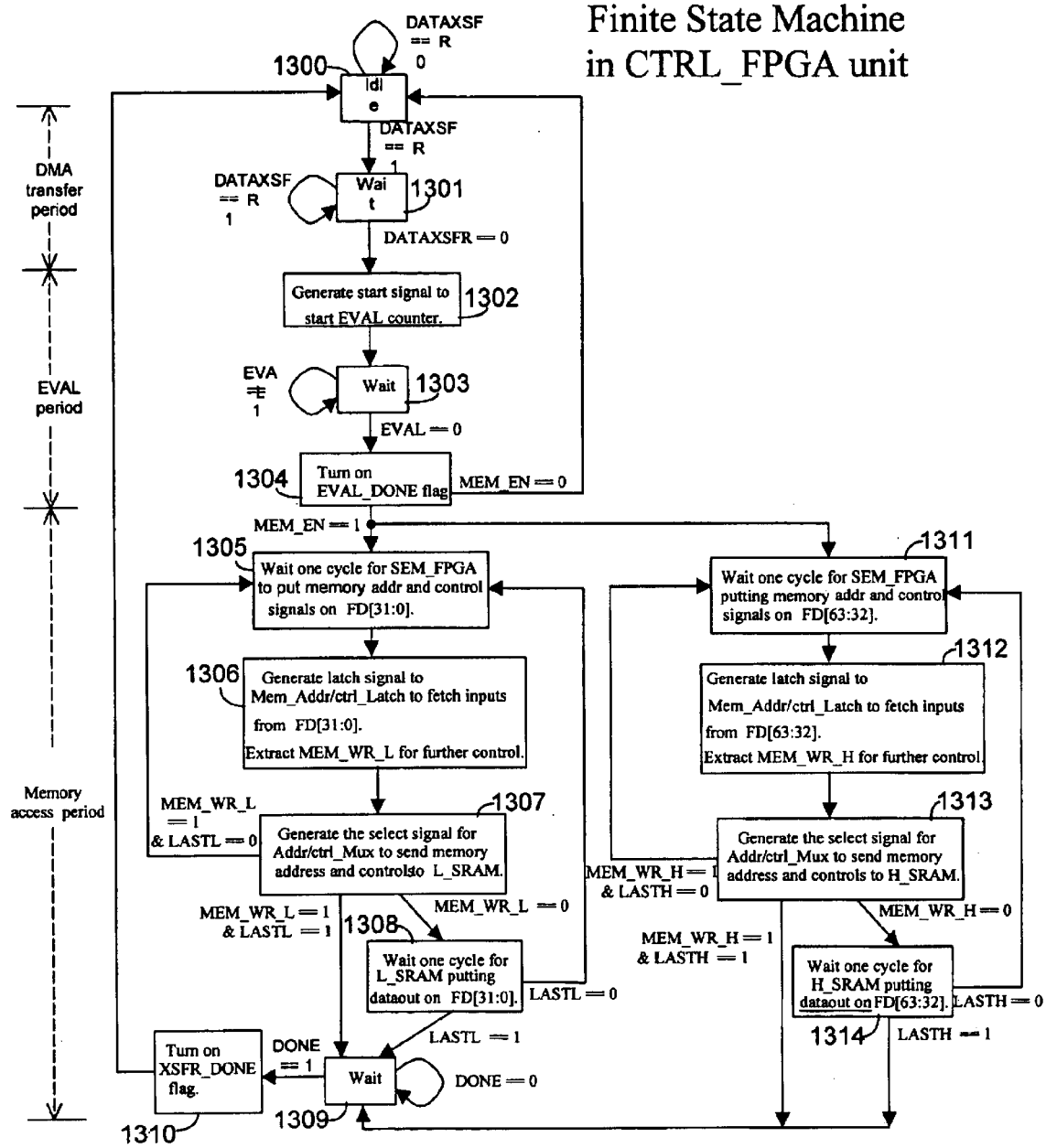
FIG. 58 shows a state diagram of a finite state machine of the MEMFSM unit in the CTRL_FPGA unit in accordance with one embodiment of the present invention.

The state diagram of the MEMFSM unit 1240 will now be discussed in accordance with one embodiment of the present invention. FIG. 58 shows such a state diagram of the finite state machine of the MEMFSM unit in the CTRL_FPGA unit. The state diagram in FIG. 58 has been structured so that the three periods within the Simulation write/read cycle are also shown with their corresponding states. Thus, states 1300–1301 correspond to the DMA data transfer period; states 1302–1304 correspond to the evaluation period; and states 1305–1314 correspond to the memory access period. Refer to FIG. 57 in conjunction with FIG. 58 in the discussion below.

Generally, the sequence of signals for the DMA transfer, evaluation, and memory access is set. In one embodiment, the sequence is as follows: DATA_XSFR triggers the DMA data transfer, if any. The LAST signals for both high and low banks are generated at the completion of the DMA data transfer and trigger the DONE signal to indicate the completion of the completion of the DMA data transfer period. The XSFR_DONE signal is then generated and the EVAL cycle then begins. At the conclusion of EVAL, memory read/write can begin.

Turning to the top of FIG. 58, state 1300 is idle whenever the DATAXSFR signal is at logic 0. This indicates that no DMA data transfers are occurring at the moment. When the DATAXSFR signal is at logic 1, the MEMFSM unit 1240 proceeds to state 1301. Here, the computing system requires DMA data transfer between the computing system (main memory in FIGS. 1, 45, and 46) and the Simulation system (FPGA logic devices 1201–1204 or SRAM memory device 1205, 1206 in FIG. 56). Appropriate wait cycles are inserted until the DMA data transfer is complete. When the DMA transfer has completed, the DATAXSFR signal returns to logic 0.

When the DATAXSFR signal returns to logic 0, the generation of the start signal is triggered in the MEMFSM unit 1240 at state 1302. The start signal starts the EVAL counter 1242, which is a programmable counter. The duration of the programmed counts in the EVAL counter is equivalent to the duration of the evaluation period. So long as the EVAL counter is counting at state 1303, the EVAL signal is asserted at logic 1 and provided to the EVALFSMx in each FPGA logic device as well as the MEMFSM unit 1240. At the end of the count, the EVAL counter presents the EVAL signal at logic 0 to the EVALFSMx in each FPGA logic device and the MEMFSM unit 1240. When the MEMFSM unit 1240 receives the logic 0 EVAL signal, it turns on the EVAL_DONE flag at state 1304. The EVAL_DONE flag is used by MEMFSM to indicate that the evaluation period has ended and the memory access period, if desired, can now proceed. The CPU will check the EVAL_DONE and XSFR_DONE by reading the XSFR_EVAL register (see Table K below) to confirm that DMA transfer and EVAL has completed successfully before starting the next DMA transfer.

However, in some cases, the Simulation system may not want to perform memory access at the moment. Here, the Simulation system keeps the memory enable signal MEM_EN at logic 0. This disabled (logic 0) MEM_EN signal keeps the MEMFSM unit at idle state 1300, where it is waiting for DMA data transfer or evaluation of data by the FPGA logic devices. On the other hand, if the memory enable signal MEM_EN is at logic 1, the Simulation system is indicating the desire to conduct memory access.

Below state 1304 in FIG. 58, the state diagram is divided into two sections which proceed in parallel. One section contains states 1305, 1306, 1307, 1308, and 1309 for the low bank memory access. The other section contains states 1311, 1312, 1313, 1314, and 1309 for the high bank memory access.

At state 1305, the Simulation system waits one cycle for the currently selected FPGA logic device to place the address and control signals on the FPGA bus FD[31:0]. At state 1306, the MEMFSM generates the latch signal on line 1263 to the memory address/control latch 1243 to fetch inputs from the FD[31:0]. The data corresponding to this particular fetched address and control signal will either be read from the SRAM memory device or written to the SRAM memory device. To determine if the Simulation system requires a read operation or a write operation, the memory write signal mem_wr_L for the low bank will be extracted from the address and control signals. If mem_wr_L=0, a read operation is requested. If mem_wr_L=1, then a write operation is requested. As stated previously, this mem_wr signal is equivalent to the chip select write signal.

At state 1307, the proper select signal for the address/control mux 1244 is generated to send address and control signals to the low bank SRAM. The MEMFSM unit checks the mem_wr signal and the LASTL signal. If mem_wr_L=1 and LASTL=0, a write operation is requested but the last data in the chain of FPGA logic devices has not been shifted out yet. Thus, the Simulation system returns to state 1305 where it waits one cycle for the FPGA logic device to put more address and control signals on FD[31:0]. This process continues until the last data has been shifted out of the FPGA logic devices. If, however, mem_wr_L=1 and LASTL=1, the last data has been shifted out of the FPGA logic devices.

Similarly, if mem_wr_L=0 indicating a read operation, the MEMFSM proceeds to state 1308. At state 1308, the Simulation system waits one cycle for the SRAM memory device to put the data onto the FPGA bus FD[31:0]. If LASTL=0, the last data in the chain of FPGA logic devices has not been shifted out yet. Thus, the Simulation system returns to state 1305 where it waits one cycle for the FPGA logic device to put more address and control signals on FD[31:0]. This process continues until the last data has been shifted out of the FPGA logic devices. Note that write operations (mem_wr_L=1) and read operations (mem_wr_L=0) can be interleaved or otherwise alternate until LASTL=1.

When LASTL=1, the MEMFSM proceeds to state 1309 where it waits while DONE=0. When DONE=1, both LASTL and LASTH are at logic 1 and thus, the Simulation write/read cycle has completed. The Simulation system then proceeds to state 1300 where it remains idle whenever DATAXSFR=0.

The same process is applicable for the high bank. At state 1311, the Simulation system waits one cycle for the currently selected FPGA logic device to place the address and control signals on the FPGA bus FD[63:32]. At state 1312, the MEMFSM generates the latch signal on line 1270 to the memory address/control latch 1247 to fetch inputs from the FD[63:32]. The data corresponding to this particular fetched address and control signal will either be read from the SRAM memory device or written to the SRAM memory device. To determine if the Simulation system requires a read operation or a write operation, the memory write signal mem_wr_H for the high bank will be extracted from the address and control signals. If mem_wr_H=0, a read operation is requested. If mem_wr_H=1, then a write operation is requested.

At state 1313, the proper select signal for the address/control mux 1246 is generated to send address and control signals to the high bank SRAM. The MEMFSM unit checks the mem_wr signal and the LASTH signal. If mem_wr_H=1 and LASTH=0, a write operation is requested but the last data in the chain of FPGA logic devices has not been shifted out yet. Thus, the Simulation system returns to state 1311 where it waits one cycle for the FPGA logic device to put more address and control signals on FD[63:32]. This process continues until the last data has been shifted out of the FPGA logic devices. If, however, mem_wr_H=1 and LASTH=1, the last data has been shifted out of the FPGA logic devices.

Similarly, if mem_wr_H=0 indicating a read operation, the MEMFSM proceeds to state 1314. At state 1314, the Simulation system waits one cycle for the SRAM memory device to put the data onto the FPGA bus FD[63:32]. If LASTH=0, the last data in the chain of FPGA logic devices has not been shifted out yet. Thus, the Simulation system returns to state 1311 where it waits one cycle for the FPGA logic device to put more address and control signals on FD[63:32]. This process continues until the last data has been shifted out of the FPGA logic devices. Note that write operations (mem_wr_H=1) and read operations (men_wr_H=0) can be interleaved or otherwise alternate until LASTH=1.

When LASTH=1, the MEMFSM proceeds to state 1309 where it waits while DONE=0. When DONE=1, both LASTL and LASTH are at logic 1 and thus, the Simulation write/read cycle has completed. The Simulation system then proceeds to state 1300 where it remains idle whenever DATAXSFR=0.

Alternatively, for both the high bank and the low bank, states 1309 and 1310 are not implemented in accordance with another embodiment of the present invention. Thus, in the low bank, the MEMFSM will proceed directly to state 1300 after passing states 1308 (LASTL=1) or 1307 (MEM_WR_L=1 and LASTL=1). In the high bank, the MEMFSM will proceed directly to state 1300 after passing states 1314 (LASTH=1) or 1313 (MEM_WR_H=1 and LASTH=1).

Figure 59:
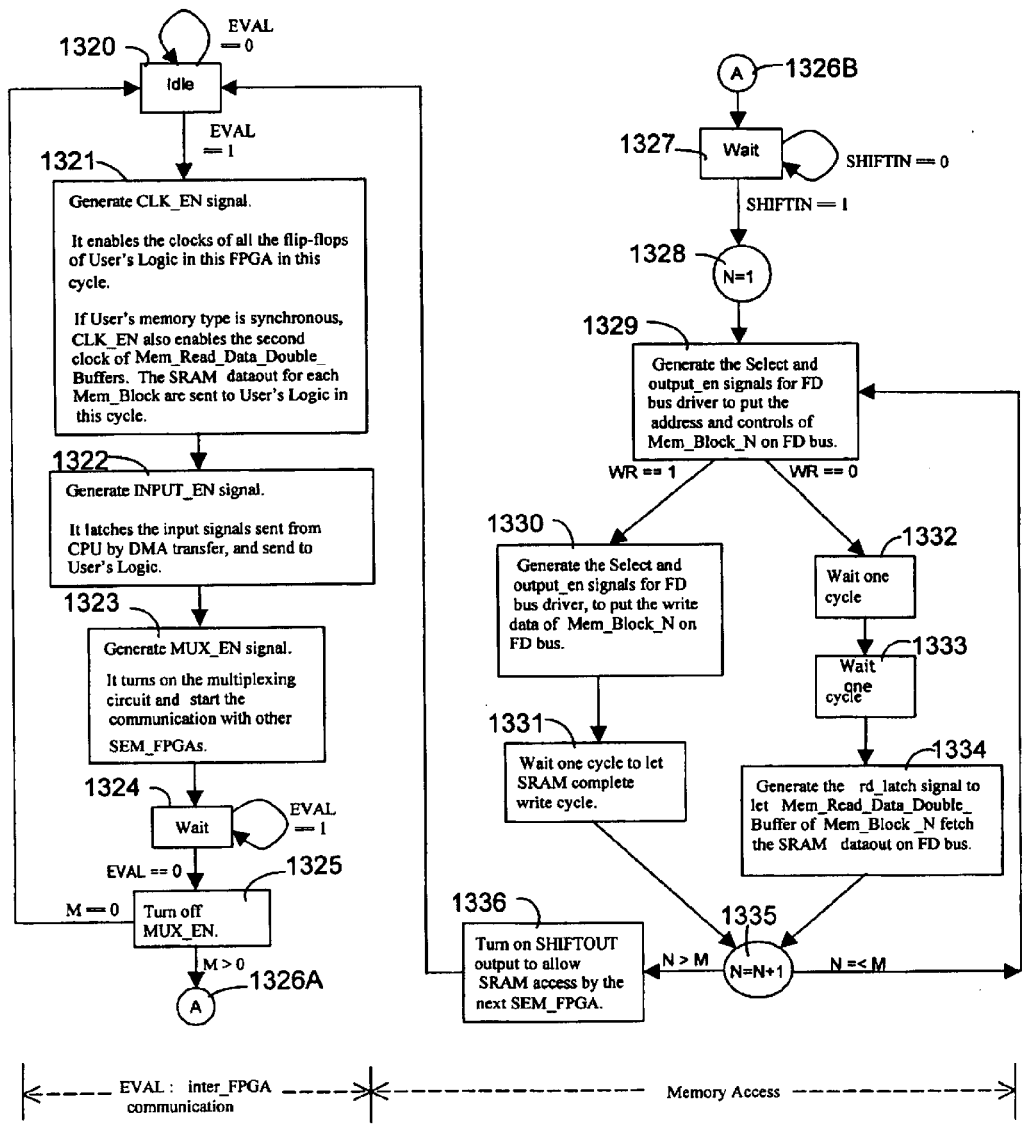
FIG. 59 shows a state diagram of a finite state machine in each FPGA chip in accordance with one embodiment of the present invention.

The state diagram of the EVALFSM unit 1248 will now be discussed in accordance with one embodiment of the present invention. FIG. 59 shows such a state diagram of the EVALFSMx finite state machine in each FPGA chip. Like FIG. 58, the state diagram in FIG. 59 has been structured so that two periods within the Simulation write/read cycle are also shown with their corresponding states. Thus, states 1320–1326A correspond to the evaluation period, and states 1326B–1336 correspond to the memory access period. Refer to FIG. 57 in conjunction with FIG. 59 in the discussion below.

The EVALFSMx unit 1248 receives the EVAL signal on line 1274 from the CTRL_FPGA unit 1200 (see FIG. 57). While EVAL=0, no evaluation of data by the FPGA logic devices is occurring. Thus, at state 1320, the EVALFSMx is idle while EVAL=0. When EVAL=1, EVALFSMx proceeds to state 1321.

States 1321, 1322, and 1323 relate to inter-FPGA communication where data is evaluated by the user's design via the FPGA logic devices. Here, EVALFSMx generates the signals input_en, mux_en, and clk_en (item 1281 in FIG. 57) to the user's logic. At state 1321, EVALFSMx generates the clk_en signal, which enables the second flip-flop of all the clock edge register flip-flops in the user's design logic in this cycle (see FIG. 19). The clk_en signal is otherwise known as the software clock. If the user's memory type is synchronous, clk_en also enables the second clock of the memory read data double buffer 1251 in each memory block. The SRAM data output for each memory block are sent to the user'design logic in this cycle.

At state 1322, the EVALFSMx generates the input_en signal to the user's design logic to latch the input signals sent from the CPU by DMA transfer to the user's logic. The input_en signal provides the enable input to the second flip-flop in the primary clock register (see FIG. 19).

At state 1323, EVALFSMx generates the mux_en signal to turn on the multiplexing circuit in each FPGA logic device to start the communication with other FPGA logic devices in the array. As explained earlier, inter-FPGA wire lines are often multiplexed to efficiently utilize the limited pin resources in each FPGA logic device chip.

At state 1324, EVALFSM waits for as long as EVAL=1. When EVAL=0, the evaluation period has completed and so, state 1325 requires that EVALFSMx turn off the mux_en signal.

If the number of memory blocks M (where M is an integer, including 0) is zero, the EVALFSMx returns to state 1320, where it remains idle if EVAL=0. In most cases, M>0 and thus, EVALFSMx proceeds to state 1326A/1326B. "M" is the number of memory blocks in the FPGA logic device. It is a constant from the user's design mapped and configured in the FPGA logic device; it does not count down. If M>0, the right portion (memory access period) of FIG. 59 will be configured in the FPGA logic devices. If M=0, only the left portion (EVAL period) of FIG. 59 will be configured.

State 1327 keeps the EVALFSMx in a wait state as long as SHIFTIN=0. When SHIFTIN=1, the previous FPGA logic device has completed its memory access and the current FPGA logic device is now ready to perform its memory access tasks. Alternatively, when SHIFTIN=1, the current FPGA logic device is the first logic device in the bank and the SHIFTIN input line is coupled to Vcc. Regardless, the receipt of the SHIFTIN=1 signal indicates that the current FPGA logic device is ready to perform memory access. At state 1328, the memory block number N is set at N=1. This number N will be incremented at the occurrence of each loop so that memory access for that particular memory block N can be accomplished. Initially, N=1 and so, EVALFSMx will proceed to access memory for memory block 1.

At state 1329, EVALFSMx generates the select signal on line 1285 and the output_en signal on line 1284 to the FPGA bus driver FDO_MUXx 1249 to put the address and control signals of the Mem_Block_N interface 1253 onto the FPGA bus FD[63:32] or FD[31:0]. If a write operation is required, wr=1; otherwise, a read operation is required so wr=0. The EVALFSMx receives as one of its inputs the wr signal on line 1287. Based on this wr signal, the proper select signal on line 1285 will be asserted.

When wr=1, the EVALFSMx proceeds to state 1330. EVALFSMx generates the select and output_en signals for the FD bus driver to put the write data of the Mem_Block_N 1253 on the FPGA bus FD[63:32] or FD[31:0].

Thereafter, EVALFSMx waits one cycle to let the SRAM memory device to complete the write cycle. EVALFSMx then goes to state 1335 where the memory block number N is incremented by one; that is, N=N+1.

However, if wr=0 at state 1329, a read operation is requested and EVALFSMx goes to state 1332 where it waits one cycle and then to state 1333 where it waits another cycle. At state 1334, EVALFSMx generates the rd__latch signal on line 1286 to let the memory read data double a buffer 1251 of memory block N fetch the SRAM data out onto the FD bus. EVALFSMx then proceeds to state 1335, where the memory block number N is incremented by one; that is, N=N+1. Thus, if N=1 prior to the incrementing state 1335, N is now 2 so that subsequent memory accesses will be applicable for memory block 2.

If the number of the current memory block N is less than or equal to the total number of memory blocks M in the user's design (i.e., N≦M), the EVALFSMx proceeds to state 1329, where it generates the particular select and output_en signals for the FD bus driver based on whether the operation is a write or a read. Then, the write or read operation for this next memory block N will take place.

If, however, the number of the current memory block N is greater than the total number of memory blocks M in the user's design (i.e., N>M), the EVALFSMx proceeds to state 1336, where it turns on the SHIFTOUT output signal to allow the next FPGA logic device in the bank to access the SRAM memory devices. Thereafter, EVALFSMx proceeds to state 1320 where it is idle until the Simulation system requires data evaluation among the FPGA logic devices (i.e., EVAL=1).

FIG. 61 shows the Simulation write/read cycle in accordance with one embodiment of the present invention. FIG. 61 shows at reference numeral 1366 the three periods in the Simulation write/read cycle—DMA data transfer period, evaluation period, and memory access period. Although not shown, it is implicit that a prior DMA transfer, evaluation, and memory access may have taken place. Furthermore, the timing for data transfers to/from the low bank SRAM may differ from that of the high bank SRAM. For simplicity, FIG. 61 shows one example where the access times for the low and high banks are identical. A global clock GCLK 1350 provides the clocking signal for all components in the system.

The DATAXSFR signal 1351 indicates the occurrence of the DMA data transfer period. When DATAXSFR=1 at trace 1367, DMA data transfer is taking place between the main computing system and the FPGA logic devices or SRAM memory devices. Thus, data is provided on the FPGA high bank bus FD[63:32] 1359 and trace 1369, as well as the FPGA low bank bus FD[31:0] 1358 and trace 1368. The DONE signal 1364 indicates the completion of the memory access period by a logic 0 to 1 signal (e.g., trace 1390) or otherwise indicates the duration of the Simulation write/read cycle with a logic 0 (e.g., combination of edge of trace 1370 and edge of trace 1390). During the DMA transfer period, the DONE signal is at logic 0.

At the end of the DMA transfer period, the DATAXSFR signal goes from logic 1 to 0, which triggers the onset of the evaluation period. Thus, EVAL 1352 is at logic 1 as indicated by trace 1371. The duration of the EVAL signal at logic 1 is predetermined and can be programmable. During this evaluation period, the data in the user's design logic is evaluated with the clk_en signal 1353 which is at logic 1 as indicated by trace 1372, the input_en signal 1354 which is also at logic 1 as indicated by trace 1373, and the mux_en signal 1355 which is also at logic 1 for a longer duration than clk_en and input_en as indicated by trace 1374. Data is being evaluated within this particular FPGA logic device. When the mux_en signal 1355 goes from logic 1 to 0 at trace 1374 and at least one memory block is present in the FPGA logic devices, then the evaluation period ends and the memory access period begins.

The SHIFTIN signal 1356 is asserted with a logic 1 at trace 1375. This indicates that the preceding FPGA has completed its evaluations and all desired data have been accessed to/from this preceding FPGA logic device. Now, the next FPGA logic device in the bank is ready to begin memory accesses.

In traces 1377 to 1386, the following nomenclature will be used. ACj_k indicates that the address and control signal is associated with FPGAj and memory block k, where j and k are integers including 0. WDj_k indicates write data for FPGAj and memory block k. RDj_k indicates read data for FPGAj and memory block k. Thus, AC3_1 indicates the address and control signals associated with FPGA3 and memory block 1. The low bank SRAM accesses and the high bank SRAM accesses 1361 are shown as trace 1387.

The next few traces 1377 to 1387 will show how memory access is accomplished. Based on the logic level of wrx signal to the EVALFSMx and consequently, the mem_wr signal to the MEMFSM, either a write or read operation is performed. If a write operation is desired, the memory model interfaces with the user's memory block N interface (Mem_Block_N interface 1253 in FIG. 57) to provide wrx as one of its control signals. This control signal wrx is provided to the FD bus driver as well as the EVALFSMx unit. If wrx is at logic 1, the proper select signal and output_en signal are provided to the FD bus driver to place the memory write data on the FD bus. This same control signal which is now on the FD bus can be latched by the memory address/control latch in the CTRL_FPGA unit. The memory address/control latch sends the address and control signals to the SRAM via a MA[18:2]/control bus. The wrx control signal, which is at logic 1, is extracted from the FD bus and because a write operation is requested, the data associated with the address and control signals on the FD bus is sent to the SRAM memory device.

Thus, as shown on FIG. 61, this next FPGA logic device, which is logic device FPGA0 in the low bank, places AC0_0 on FD[31:0] as indicated by trace 1377. The Simulation system performs a write operation for WD0_0. Then, AC0_1 is placed on the FD[31:0] bus. If, however, a read operation was requested, the placement of the AC0_1 on the FD bus FD[31:0] would be followed by some time delay before RD0_0 instead of WD0_0 corresponding to AC0_0 is placed on the FD bus by the SRAM memory device.

Note that placement of the AC0_0 on the MA[18:2]/control bus as indicated by trace 1383 are slightly delayed than the placement of the address, control, and data on the FD bus. This is because the MEMFSM unit requires time to latch the address/control signals in from the FD bus, extract the mem_wr signal, and generate the proper select signal to the address/control mux so that address/control signals can be placed on the MA[18:2]/control bus. Furthermore, after placement of the address/control signals on the MA[18:2]/control bus to the SRAM memory device, the Simulation system must wait for the corresponding data from the SRAM memory device to be placed on the FD bus. One example is the time offset between trace 1384 and trace 1381, where the RD1_1 is placed on the FD bus after the AC1_1 is placed on the MA[18:2]/control bus.

On the high bank, FPGA1 is placing AC1_0 on the bus FD[63:32], which is then followed by WD1_0. Thereafter, AC1_1 is placed on the bus FD[63:32]. This is indicated by trace 1380. When AC1_1 is placed on the FD bus, the control signal indicates a read operation in this example. Thus, as described above, the proper wrx and mem_wr signals at logic 0 are presented in the address/control signals to the EVALFSMx and MEMFSM units as AC1_1 is placed on the MA[18:2]/control bus as indicated by trace 1384. Because the Simulation system knows that this is a read operation, write data will not be transported to the SRAM memory device; rather, read data associated with AC1_1 is placed on the FD bus by the SRAM memory device for subsequent reading by the user's design logic via the Simulation memory block interface. This is indicated by trace 1381 on the high bank. On the low bank, RD0_1 is placed on the FD bus as indicated by trace 1378, following the AC0_1 on the MA[18:2]/control bus (not shown).

The reading operation by the user's design logic via the Simulation memory block interface is accomplished when the EVALFSMx generates the rd_lat0 signal 1362 to the memory read data double buffer in the Simulation memory block interface as indicated by trace 1388. This rd_lat0 signal is provided to both the low bank FPGA0 and the high bank FPGA1.

Thereafter, the next memory block for each FPGA logic device is placed on the FD bus. AC2_0 is placed on the low bank FD bus, while AC3_0 is placed on the high bank FD bus. If a write operation is desired, WD2_0 is placed on the low bank PD bus and WD3_0 is placed on the high bank FD bus. AC3_0 is placed on the high bank MA[18:2]/control bus as indicated on trace 1385. This process continues for the next memory block for write and read operations. Note that the write and read operations for the low bank and the high bank can occur at differing times and speeds and FIG. 61 shows one particular example where the timing for the low and high banks are the same. Additionally, write operations for the low and high banks occur together, followed by read operations on both banks. This may not always be the case. The existence of low and high banks allows parallel operation of the devices coupled to these banks; that is, activity on the low bank is independent of activity on the high bank. Other scenarios can be envisioned where the low bank is performing a series of write operations while the high bank is performing a series of read operations in parallel.

When the last data in the last FPGA logic device for each bank is encountered, the SHIFTOUT signal 1357 is asserted as indicated by trace 1376. For read operations, a rd_lat1 signal 1363 corresponding to FPGA2 on the low bank and FPGA3 on the high bank is asserted as indicated by trace 1389 to read RD2_1 on trace 1379 and RD3_1 on trace 1382. Because the last data for the last FPGA units have been accessed, the completion of the Simulation write/read cycle is indicated by the DONE signal 1364 as indicated by trace 1390.

The following Table H lists and describes the various components on the Simulation system boards and their corresponding register/memory, PCI memory address, and local address.

TABLE H

MEMORY MAP

| Component | Register/memory | PCI Memory Address (Byte) | Local Address (Byte) | Description |
| --- | --- | --- | --- | --- |
| PLX9080 | PCI Configuration Registers | 00H to 3CH | — | |
| PLX9080 | Local Config./Run-time/DMA Registers | Offset from PCI base addr 0: 0–FFh | Offset from CS addr: 80h–180h | Accessible from PCI and Local buses |
| CTRL_FPGA[6:1] | XSFR_EVAL Register | Offset from PCI base addr 2: 0h | 0h | in Local Space 0 |
| CTRL_FPGA1 | CONFIG_JTAG1 Register | Offset from PCI base addr 2: 10h | 10h | in Local Space 0 |
| CTRL_FPGA2 | CONFIG_JTAG2 Register | Offset from PCI base addr 2: 14h | 14h | in Local Space 0 |
| CTRL_FPGA3 | CONFIG_JTAG3 Register | Offset from PCI base addr 2: 18h | 18h | in Local Space 0 |
| CTRL_FPGA4 | CONFIG_JTAG4 Register | Offset from PCI base addr 2: 1Ch | 1Ch | in Local Space 0 |
| CTRL_FPGA5 | CONFIG_JTAG5 Register | Offset from PCI base addr 2: 18h | 20h | in Local Space 0 |
| CTRL_FPGA6 | CONFIG_JTAG6 Register | Offset from PCI base addr 2: 1Ch | 24h | in Local Space 0 |
| CTRL_FPGA1 | Local RAM | Offset from PCI base addr 2: 400h–7FFh | 400h–7FFh | in Local Space 0 |
| FPGA[3:0] | SPACE0 | Offset from PCI base addr for ch0 DMA: 0–FFF FFFFh | 8000 0000h to 8FFF FFFFh | DMA write transfer for GLOBAL and S2H data |
| FPGA[3:0] | SPACE1 | Offset from PCI base addr for ch0 DMA: 0–FFF FFFFh | 9000 0000H to 9FFF FFFFh | DMA write transfer for REGISTER_WRITE data |
| FPGA[3:0] | SPACE2 | Offset from PCI base addr for ch1 DMA: 0–FFF FFFFh | A000 0000H to AFFF FFFFh | DMA read transfer for H2S data |
| FPGA[3:0] | SPACE3 | Offset from PCI base addr for ch1 DMA: 0–FFF FFFFh | B000 0000H to BFFF FFFFh | DMA read transfer for REGISTER_READ data |
| L_SRAM, H_SRAM | SPACE4 | Offset from PCI base addr for ch0 DMA: 0–FFF FFFFh | C000 0000H to CFFF FFFFh | DMA write transfer for SRAM |
| L_SRAM, H_SRAM | SPACE5 | Offset from PCI base addr for ch1 DMA: 0–FFF FFFFh | D000 0000H to DFFF FFFFh | DMA read transfer for SRAM |
| | SPACE6 | Offset from PCI base addr for ch1 DMA: 0–FFF FFFFh | E000 0000H to EFFF FFFFh | Reserved |
| | SPACE7 | Offset from PCI base addr for ch1 DMA: 0–FFF FFFFh | F000 0000H to FFFF FFFFh | Reserved |

The data format for the configuration file is shown below in Table J in accordance with one embodiment of the present invention. The CPU sends one word through the PCI bus each time to configure one bit for all on-board FPGAs in parallel.

TABLE J

CONFIGURATION DATA FORMAT

| | bit0 | bit1 | bit2 | bit3 | bit16–31 |
|---|---|---|---|---|---|
| word0 | D0(FPGA0) | D0(FPGA1) | D0(FPGA2) | D0(FPGA3) | control/status |
| word1 | D1(FPGA0) | D1(FPGA1) | D1(FPGA2) | D1(FPGA3) | control/status |
| word2 | D2(FPGA0) | D2(FPGA1) | D2(FPGA2) | D2(FPGA3) | control/status |
| word3 | D3(FPGA0) | D3(FPGA1) | D3(FPGA2) | D3(FPGA3) | control/status |
| word4 | D4(FPGA0) | D4(FPGA1) | D4(FPGA2) | D4(FPGA3) | control/status |
| word5 | D5(FPGA0) | D5(FPGA1) | D5(FPGA2) | D5(FPGA3) | control/status |

The following Table K lists the XSFR_EVAL register. It resides in all the boards. The XSFR_EVAL register is used by the host computing system to program the EVAL period, control DMA read/write, and read the status of the EVAL_DONE and XSFR_DONE fields. The host computing system also uses this register to enable memory access. The operation of the Simulation system with respect to this register is described below with in conjunction with FIGS. 62 and 63.

TABLE K

XSFR_EVAL REGISTER for all 6 boards (Local Addr: 0h)

| Field | Signal | Description | R/W | Value After Reset |
|---|---|---|---|---|
| 7:0 | EVALTIME[7:0] | Eval time in cycles of PCI clock | R/W | 0h |
| 8 | EVAL_DONE | Eval_done flag. Cleared by setting WR_XSFR bit. | R | 0 |
| 9 | XSFRDONE | Xsfr_done flag for both read and write. Cleared by writing XSFR_EVAL register. | R | 0 |
| 10 | RD_XSFR_EN | Enable DMA-read-transfer. Cleared by XSFR_DONE. | R/W | 0 |
| 11 | WR_XSFR_EN | Enable DNA-write-transfer. Cleared by XSFR_DONE. When both WR_XSFR and RD_XSFR are set, CTRL_FPGA executes DMA-write-transfer first, then DMA-read-transfer automatically. | R/W | 0 |
| 19:12 | | Reserved | R/W | 0h |
| 20 | F_CLRN | Resets all FPGA[3:0] when low. | R/W | 0 |
| 21 | WAIT_EVAL | This bit is effective if both RD_XSFR and WR_XSFR are set. When 1, DMA-read-transfer starts after EVAL_DONE. When 0, DMA-read-transfer starts after CLK_EN. | R/W | 0 |
| 22 | MEM_EN | Enable on-board SRAM | R/W | 0 |
| 31:23 | | Reserved | | |

The following Table L lists the contents of the CONFIG_JTAG [6:1] register. The CPU configures the FPGA logic devices and runs the boundary scan test for FPGA logic devices through this register. Each board has one dedicated register.

TABLE L

CONFIG_JTAG [6:1] REGISTER

| FIELD | SIGNAL | DESCRIPTION | R/W | VALUE AFTER RESET |
|---|---|---|---|---|
| 15:0 | CONF_D[15:0] | Config data for FPGA[15:0] | R/W | 0h |
| 16 | NCONFIG | Start configuration at low-to-high transition. | R/W | 0h |
| 17 | CONFDONE | Config done | R | — |
| 18 | CONF_CLK | Config clock | R/W | 0 |
| 19 | NSTATUS | Config status, error when low | R | — |
| 20 | F_OE | Output enable to all on-board Simulation FPGAs | R/W | 0h |
| 21 | JTAG_TCK | JTAG clock | R/W | 0 |
| 22 | JTAG_TMS | JTAG mode select | R/W | 0 |
| 23 | JTAG_TDI | JTAG data in - send to TDI of FPGA0 | R/W | 0 |
| 24 | JTAG_TDO | JTAG data out - from TDO of FPGA3 | R | — |
| 25 | JTAG_NR | Reset TJAG test when low. | R/W | 0 |
| 26 | LED2 | 1 = turn on LED2 for Config_status. 0 = turn off. | R/W | 0 |
| 27 | LED3 | 1 = turn on LED3 for DataXsfr/Diag. 0 = turn off. | R/W | 0 |
| 31:28 | | Reserved | | |

Figure 62:
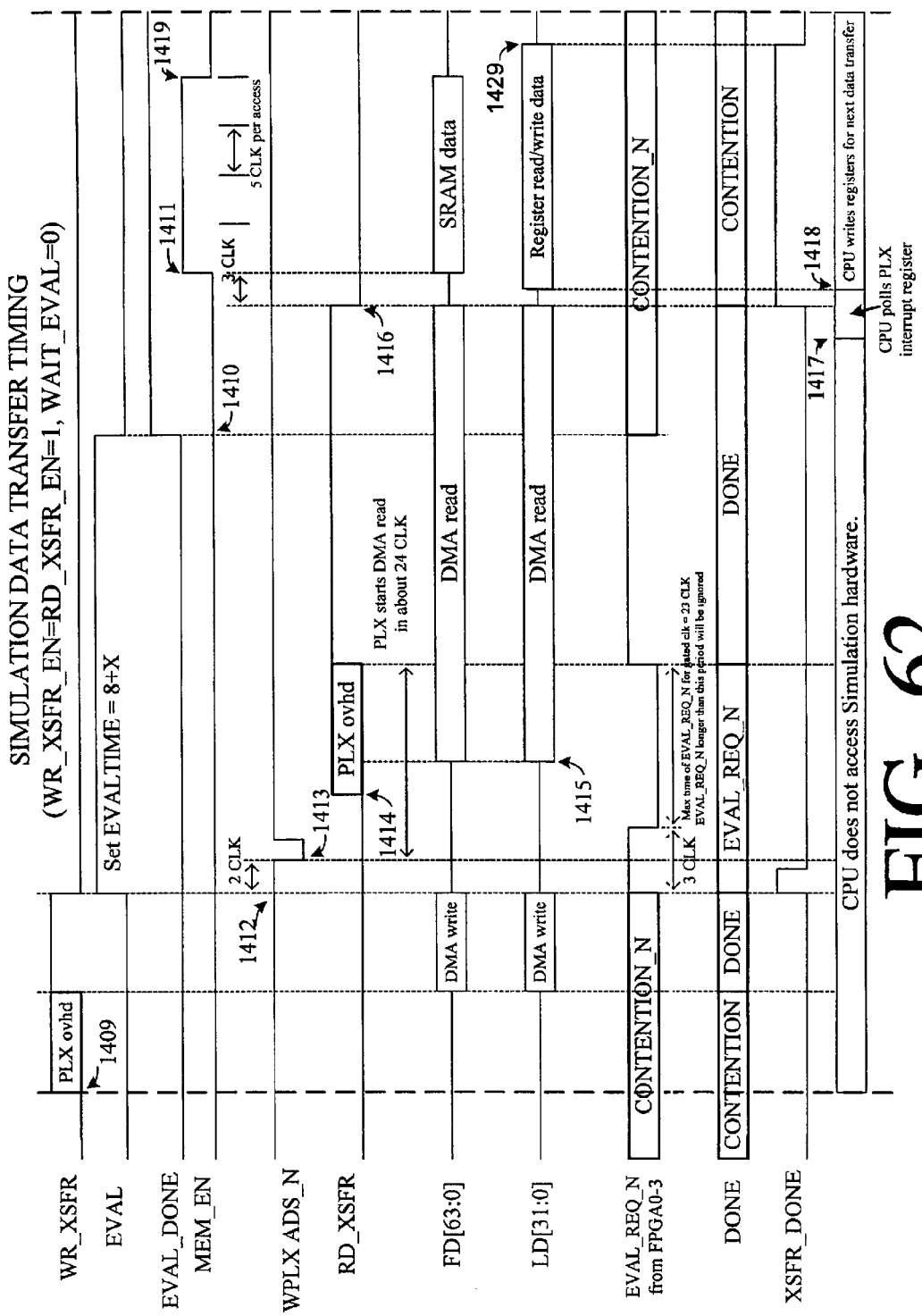
FIG. 62 shows a diagram of the Simulation data transfer operation when the DMA read operation occurs after the CLK_EN signal.
Figure 63:
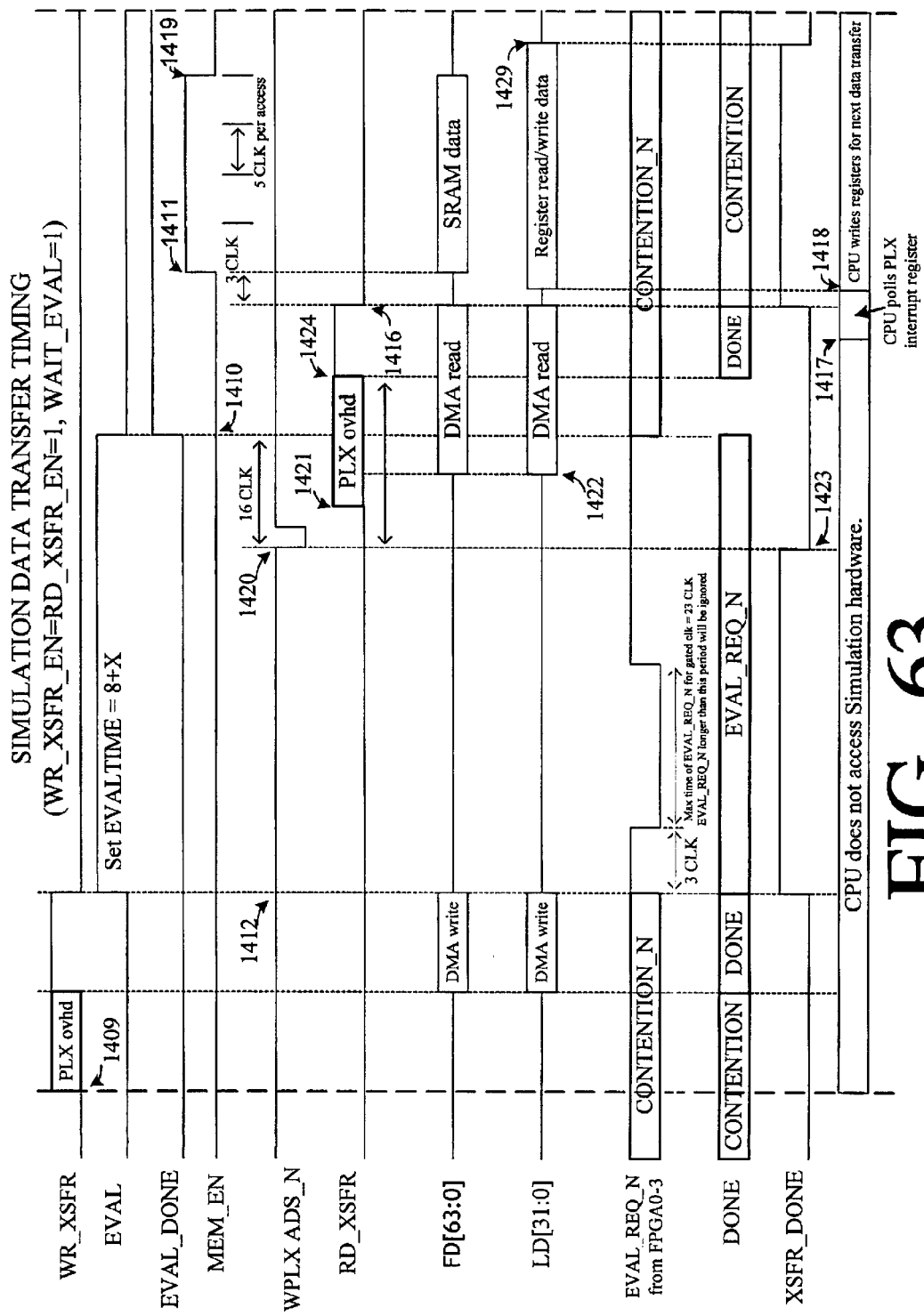
FIG. 63 shows a timing diagram of the Simulation data transfer operation when the DMA read operation occurs near the end of the EVAL period.

FIGS. 62 and 63 show timing diagrams of another embodiment of the present invention. These two figures show the operation of the Simulation system with respect to the XSFR_EVAL register. The XSFR_EVAL register is used by the host computing system to program the EVAL period, control DMA read/write, and read the status of the EVAL_DONE and XSFR_DONE fileds. The host computing system also uses this register to enable memory access. One of the main differences between these two figures is the state of the WAIT_EVAL field. When WAIT_EVAL field is set to "0," as is the case for FIG. 62, the DMA read transfer starts after CLK_EN. When WAIT_EVAL field is set to "1," as is the case for FIG. 63, the DMA read transfer starts after EVAL_DONE.

In FIG. 62, both WR_XSFR_EN and RD_XSFR_EN are set to "1." These two fields enable DMA write/read transfers and can be cleared by XSFR_DONE. Because both fields are set to "1," the CTRL_FPGA unit automatically executes DMA write transfer first and then DMA read transfer. The WAIT_EVAL field, however, is set to "0" indicating that the DMA read transfer starts after the assertion of CLK_EN (and after the completion of the DMA write operation). Thus, in FIG. 62, the DMA read operation occurs almost immediately after the completion of the DMA write operation as soon as the CLK_EN signal (software clock) is detected. The DMA read transfer operation does not wait for the completion of the EVAL period.

At the beginning of the timing diagram, EVAL_REQ_N signals experience contention as multiple FPGA logic devices vie for attention. As explained previously, the EVAL_REQ_N (or EVAL_REQ#) signal is used to start the evaluation cycle if any of the FPGA logic devices asserts this signal. At the end of the data transfer, the evaluation cycle begins including address pointer initialization and the operation of the software clocks to facilitate the evaluation process.

The DONE signal, which is generated at the conclusion of a DMA data transfer period, also experiences contention as multiple LAST signals (from the shiftin and shiftout signals at the output of each FPGA logic device) are generated and provided to the CTRL_FPGA unit. When all the LAST signals are received and processed, the DONE signal is generated and a new DMA data transfer operation can begin. The EVAL_REQ_N signal and the DONE signal use the same wire on a time-shared basis in a manner to be discussed below.

The system automatically initiates DMA write transfer first as is shown by the WR_XSFR signal at time 1409. The initial portion of the WR_XSFR signal includes some overhead associated with the PCI controller, the PCI9080 or 9060 in one embodiment. Thereafter, the host computing system performs a DMA write operation via the local bus LD[31:0] and the FPGA bus FD[63:0] to the FPGA logic devices coupled to the FPGA bus FD[63:0].

At time 1412, the WR_XSFR signal is deactivated indicating the completion of the DMA write operation. The EVAL signal is activated for a predetermined time from time 1412 to time 1410. The duration of the EVALTIME is programmable and initially set at 8+X, where X is derived from the longest signal trace path. The XSFR_DONE signal is also activated for a brief time to indicate the completion of this DMA transfer operation in which the present operation is a DMA write.

Also at time 1412, the contention among EVAL_REQ_N signals ceases but the wire that carries the DONE signal now delivers the EVAL_REQ_N signal to the CTRL_FPGA unit. For 3 clock cycles, the EVAL_REQ_N signals are processed via the wire that carries the DONE signal. After 3 clock cycles, the EVAL_REQ_N signals are no longer generated by the FPGA logic devices but the EVAL_REQ_N signals that have previously been delivered to the CTRL_FPGA unit will be processed. The maximum time that the EVAL_REQ_N signals are no longer generated by the FPGA logic devices for gated clocks is roughly 23 clock cycles. EVAL_REQ_N signals longer than this period will be ignored.

At time 1413, approximately 2 clock cycles after time 1412 (which is at the end of the DMA write operation), the CTRL_FPGA unit sends a write address strobe WPLX ADS_N signal to the PCI controller (e.g., PLX PCI9080) to initiate the DMA read transfer. In about 24 clock cycles from time 1413, the PCI controller will start the DMA read transfer process and the DONE signal is also generated. At time 1414, prior to the start of the DMA read process by the PCI controller, the RD_XSFR signal is activated to enable the DMA read transfer. Some PLX overhead data is transmitted and processed first. At time 1415, during the time that this overhead data is processed, the DMA read data is placed on the FPGA bus FD[63:0] and the local bus LD[31:0]. At the end of the 24 clock cycles from time 1413 and at the time of the activation of the DONE signal and the generation of the EVAL_REQ_N signals from the FPGA logic devices, the PCI controller processes the DMA read data by transporting the data from the FPGA bus FD[63:0] and the local bus LD[31:0] to the host computer system.

At time 1410, the DMA read data will continue to be processed while the EVAL signal will be deactivated and the EVAL_DONE signal will be activated to indicate the completion of the EVAL cycle. Contention among the FPGA logic devices also begins as they generate the EVAL_REQ_N signals.

At time 1417, just prior to the completion of the DMA read period at time 1416, the host computer system polls the PLX interrupt register to determine if the end of the DMA cycle is near. The PCI controller knows how many cycles are necessary to complete the DMA data transfer process. After a predetermined number of cycles, the PCI controller will set a particular bit in its interrupt register. The CPU in the host computer system polls this interrupt register in the PCI controller. If the bit is set, the CPU knows that the DMA period is almost done. The CPU in the host system does not poll the interrupt register all the time because then it will tie up the PCI bus with a read cycle. Thus, in one embodiment of the present invention, the CPU in the host computer system is programmed to wait a certain number of cycles before it polls the interrupt register.

After a brief time, the end of the DMA read period occurs at time 1416 as the RD_XSFR is deactivated and the DMA read data is no longer on the FPGA bus FD[63:0] or the local bus LD[31:0]. The XSFR_DONE signal is also activated at time 1416 and contention among the LAST signals for generation of the DONE signal begins.

During the entire DMA period from the generation of the WR_XSFR signal at time 1409 to time 1417, the CPU in the host computer system does not access the Simulation hardware system. In one embodiment, the duration of this period is the sum of (1) overhead time for the PCI controller times 2, (2) the number of words of WR_XSFR and RD_XSFR, and (3) the host computer system's (e.g., Sun ULTRASparc) PCI overhead. The first access after the DMA period occurs at time 1419 when the CPU polls the interrupt register in the PCI controller.

At time 1411, which is about 3 clock cycles after time 1416, the MEM_EN signal is activated to enable the on-board SRAM memory devices so that memory access between the FPGA logic devices and the SRAM memory devices can begin. Memory access continues until time 1419 and in one embodiment, 5 clock cycles are necessary per access. If no DMA read transfer is necessary, then the memory access can begin earlier at time 1410 instead of time 1411.

While the memory access takes place between the FPGA logic devices and the SRAM memory devices across the FPGA bus FD[63:0], the CPU in the host computer system can communicate with the PCT controller and the CTRL_FPGA unit via the local bus LD[31:0] from time 1418 to time 1429. This occurs after the CPU has completed polling the interrupt register of the PCI controller. The CPU writes data onto various registers in preparation for the next data transfer. The duration of this period is greater than 4 µsec. If the memory access is shorter than this period, the FPGA bus FD[63:0] will not experience any conflicts. At time 1429, the XSFR_DONE signal is deactivated.

In FIG. 63, the timing diagram is somewhat different from that of FIG. 62 because in FIG. 63 the WAIT_EVAL field is set to "1." In other words, the DMA read transfer period starts after the EVAL_DONE signal has been activated and is almost completed. It waits for the near completion of the EVAL period instead of starting immediately after the completion of the DMA write operation. The EVAL signal is activated for a predetermined time from time 1412 to time 1410. At time 1410, the EVAL_DONE signal is activated to indicate the completion of the EVAL period.

In FIG. 63, after the DMA write operation at time 1412, the CTRL_FPGA unit does not generate the write address strobe signal WPLX ADS_N to the PCI controller until time 1420, which is about 16 clock cycles before the end of the EVAL period. The XSFR_DONE signal is also extended to time 1423. At time 1423, the XSFR_DONE field is set and the WPLX ADS_N signal can then be generated to start the DMA read process.

At time 1420, approximately 16 clock cycles before the activation of the EVAL_DONE signal, the CTRL_FPGA unit sends a write address strobe WPLX ADS_N signal to the PCI controller (e.g., PLX PCI9080) to initiate the DMA read transfer. In about 24 clock cycles from time 1420, the PCI controller will start the DMA read transfer process and the DONE signal is also generated. At time 1421, prior to the start of the DMA read process by the PCI controller, the RD_XSFR signal is activated to enable the DMA read transfer. Some PLX overhead data is transmitted and processed first. At time 1422, during the time that this overhead data is processed, the DMA read data is placed on the FPGA bus FD[63:0] and the local bus LD[31:0]. At the end of the 24 clock cycles at time 1424, the PCI controller processes the DMA read data by transporting the data from the FPGA bus FD[63:0] and the local bus LD[31:0] to the host computer system. The remainder of the timing diagram is equivalent to that of FIG. 62. Thus, the RD_XSFR signal in FIG. 63 is activated later than in FIG. 62. The RD_XSFR signal in FIG. 63 follows the near completion of the EVAL period so that the DMA read operation is delayed. The RD_XSFR signal in FIG. 62 follows the detection of the CLK_EN signal after the completion of the DMA write transfer.

In the above embodiment, the verification system mapped memory blocks that were in the FPGA chips into the on-board SRAMs on the FD bus. Referring to FIG. 56, for example, memory block A in FPGA chip 1203 and memory block B in FPGA chip 1201 are mapped into SRAMs 1205 and 1206, respectively. In accordance with another embodiment of the present invention, the verification system can map memory blocks into any memory device or storage that the computer system can access. This includes main memory, PCI expansion memory, DRAM, SRAM, ROM, and the like. For example, referring now to FIGS. 46 and 56, assume that memory block A is in FPGA chip 1203, memory block B is in FPGA chip 1201, and memory blocks C and D are in FPGA chip 1202.

Accordingly, to use the above example, one embodiment of the present invention can map these memory blocks from the FPGA chips into the SRAMs, as well as RAM 15 and memory in PCI device 54 (see FIG. 46). Thus, memory block A is mapped into SRAM 1205, memory block B is mapped into SRAM 1206, memory block C is mapped into main memory 15 (see FIG. 46), and memory block D is mapped into memory in PCI device 54 (see FIG. 46). Usually, this scheme is employed when the capacities of the SRAMs 1205 and 1206 are too small. Alternatively, this scheme is employed when the memory block that needs to be mapped is larger than the on-board SRAM, or the memory block is shared by other software models and test benches. Mapping these memory blocks is important since the CPU needs to dump and manipulate memory data very often during simulation.

In order to accomplish this memory mapping into external memory, the CPU performs the equivalent memory access function of memory control blocks as CTRL_FPGA 1200 (see FIG. 56 and associated discussion) and the evaluation logic in the logic device which contains the memory blocks. The equivalent connection between memory blocks and the external memory devices are also provided.

Implementing this system is analogous to the embodiment above. For the bus driver of the external memory, the first mux input (see mux 1249 in FIG. 57) is connected to the user memory interface and memory write data (DMA RD space 2). In the SRAM memory mapping embodiment (see FIG. 57), the third mux input is connected to the user memory interface and the fourth mux input is connected to the memory write data.

For the memory block interface, the same memory converter from the previous embodiment (see memory model 1252 in FIG. 57) is used. The external memory read data are sent to hardware by DMA WR space 0. In the previous embodiment, the memory block interface includes the memory converter and-the double buffer (for the memory read data).

For the evaluation logic, the signals of shiftin and shiftout for on-board SRAM access are not used. In the previous on-board SRAM memory mapping embodiment, the signals of eval, shiftin, and shiftout are used.

For memory initialization and dumping, the previous on-board SRAM embodiment used DMA space 4 and 5 through the CTRL_FPGA 1200 unit. In the external memory embodiment, memory access is by the CPU.

For memory access during simulation, the previous on-board SRAM embodiment located memory blocks in the FPGA chips which sent address and read/write signals to the bus controller in the CTRL_FPGA unit through the FD bus. These signals are then converted and sent to the on-board SRAM. The memory write or read data are placed on the FD bus by a memory block interface or memory devices depending on the write or read operation. The read data are fetched by the memory block interface at the end of the evaluation sequence. In the external memory embodiment, the write data, address, and read/write signals from the memory blocks are sent to the computer system through DMA RD space 2. Then, the CPU performs memory access to the mapped memory location. The memory read data are sent to the driven logic located in the FPGA chips through DMA WR space 0. Essentially, space 2 is used to read the data, then evaluation occurs, and then the system uses space 0 to put the read data in the, appropriate logic.

IX. Coverification System

The coverification system of the present invention can accelerate the design/development cycle by providing designers with the flexibility of software simulation and the faster speed derived from using a hardware model. Both the hardware and software portions of a design can be verified prior to ASIC fabrication and without the limitations of an emulator-based coverification tool. The debugging feature is enhanced and overall debug time can be significantly reduced.

Conventional Coverification Tool with ASIC as the Device-under-test

Figure 64:
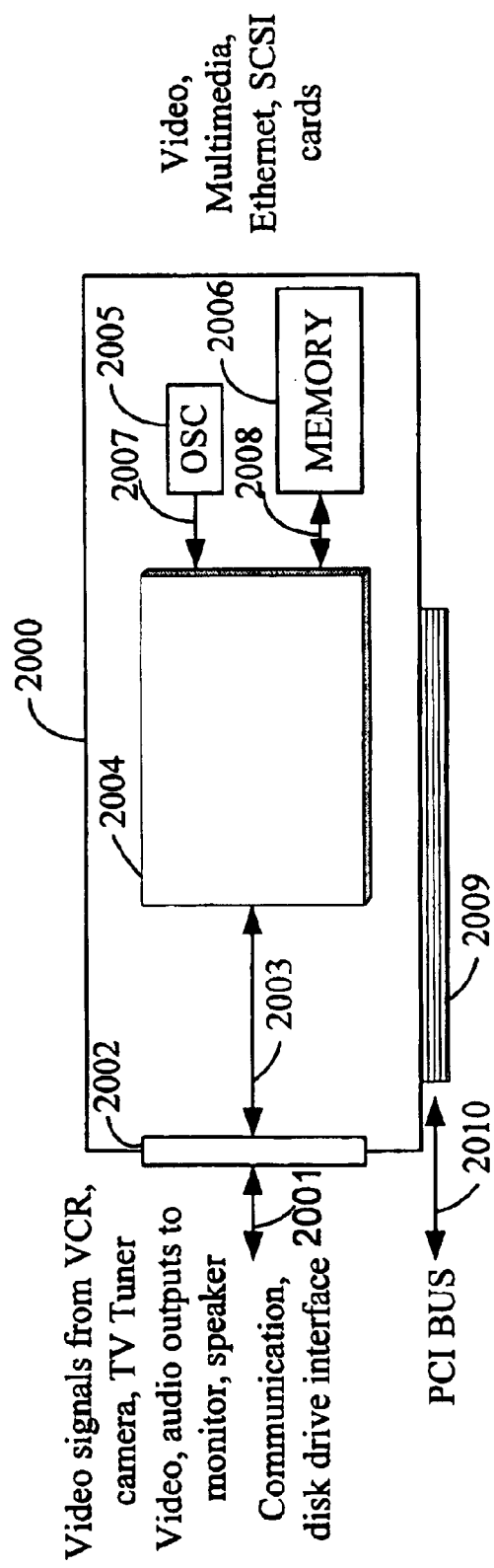
FIG. 64 shows a typical user design implemented as a PCI add-on card.

FIG. 64 shows a typical final design embodied as a PCI add-on card, such as a video, multimedia, Ethernet, or SCSI card. This card 2000 includes a direct interface connector 2002 that allows communication with other peripheral devices. The connector 2002 is coupled to bus 2001 to transport video signals from a VCR, camera, or television tuner; video and audio outputs to a monitor or speaker; and signals to communication or disk drive interface. Depending on the user's design, one ordinarily skilled in the art can anticipate other interface requirements. The bulk of the functionality of the design is in chip 2004 which is coupled to the interface connector 2002 via bus 2003, local oscillator 2005 via bus 2007 for generating a local clock signal, and memory 2006 via bus 2008. The add-on card 2000also includes a PCI connector 2009 for coupling with a PCI bus 2010.

Figure 65:
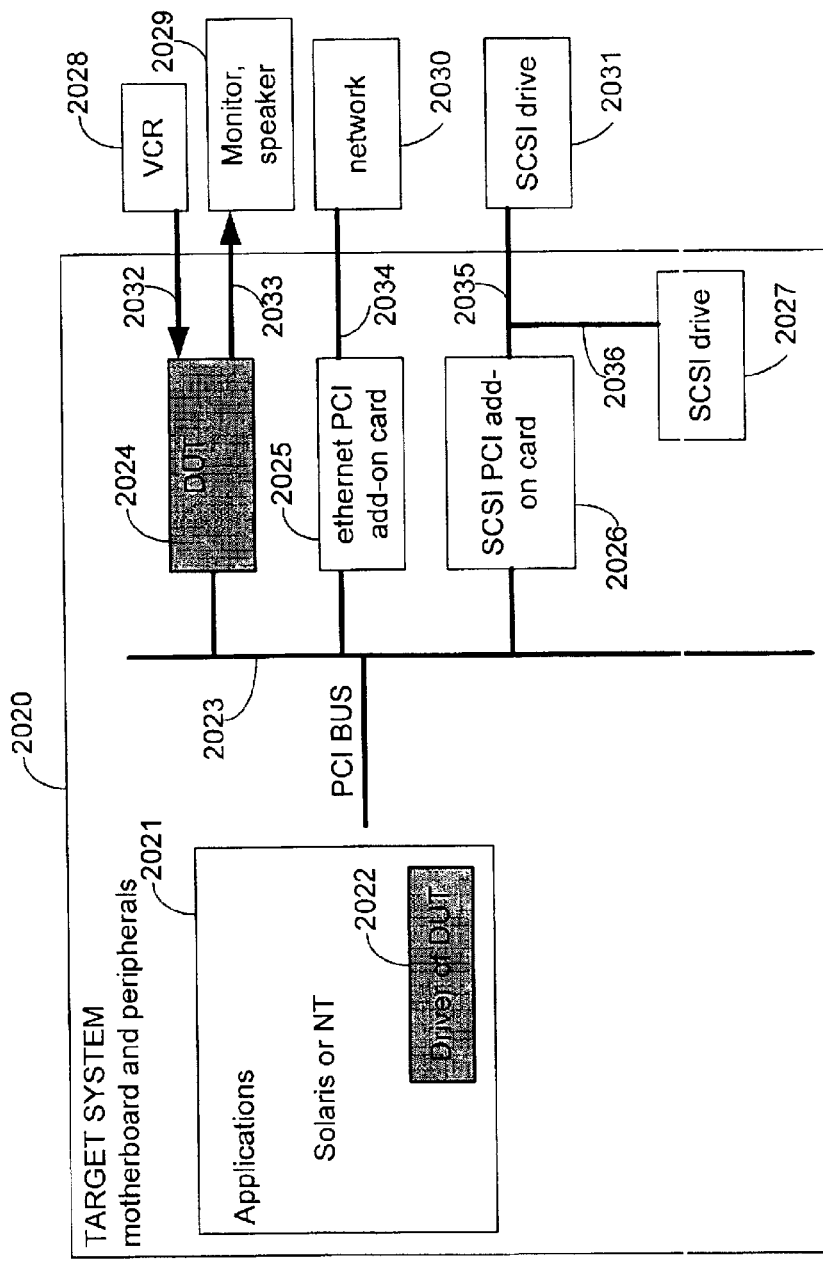
FIG. 65 shows a typical hardware/software coverification system using an ASIC as the device-under-test.

Prior to implementing the design as an add-on card as shown in FIG. 64, the design is reduced to ASIC form for testing purposes. A conventional hardware/software coverification tool is shown in FIG. 65. The user's design is embodied in the form of an ASIC labeled as the device-under-test (or "DUT") 2024 in FIG. 65. To obtain stimulus from a variety of sources with which it is designed to interface, the device-under-test 2024 is placed in the target system 2020, which is a combination of the central computing system 2021 on the motherboard and several peripherals. The target system 2020 includes a central computing system 2021 which includes a CPU and memory, and operates under some operating system such as Microsoft Windows or Sun MicroSystem's Solaris to run a number of applications. As known to those ordinarily skilled in the art, Sun MicroSystem's Solaris is an operating environment and set of software products which support Internet, Intranet and enterprise-wide computing. The Solaris operating environment is based on industry standard UNIX System V Release 4, and designed for client-server applications in a distributed networking environment, provide the appropriate resources for smaller workgroups, and provide the WebTone that is required for electronic commerce.

The device driver 2022 for the device-under-test 2024 is included in the central computing system 2021 to enable communication between the operating system (and any applications) and the device-under-test 2024. As known to those ordinarily skilled in the art, a device driver is a particular software to control a hardware component or peripheral device of a computer system. A device driver is responsible for accessing the hardware registers of the device and often includes an interrupt handler to service interrupts generated by the device. Device drivers often form part of the lowest level of the operating system kernel, with which they are linked when the kernel is built. Some more recent systems have loadable device drivers which can be installed from files after the operating system is running.

The device-under-test 2024 and the central computing system 2021 are coupled to a PCI bus 2023. Other peripherals in the target system 2020 include an Ethernet PCI add-on card 2025 used to couple the target system to a network 2030 via bus 2034, a SCSI PCI add-on card 2026 coupled to SCSI drives 2027 and 2031 via buses 2036 and 2035, a VCR 2028 coupled to the device-under-test 2024 via bus 2032 (if necessary for the design in the device-under-test 2024), and a monitor and/or speaker 2029 coupled to the device-under-test 2024 via bus 2033 (if necessary for the design in the device-under-test 2024). As known to those ordinarily skilled in the art, "SCSI" stands for "Small Computer Systems Interface," a processor-independent standard for system-level interfacing between a computer and intelligent devices such as hard disks, floppy disks, CD-ROM, printers, scanners and many more.

In this target system environment, the device-under-test 2024 can be examined with a variety of stimuli from the central computing system (i.e., operating system, applications) and the peripheral devices. If time is not a concern and the designers are only seeking a simple pass/fail test, this coverification tool should be adequate to fulfill their needs. However, in most situations, a design project is strictly budgeted and scheduled prior to release as a product. As explained above, this particular ASIC-based coverification tool is unsatisfactory because its debug feature is nonexistent (the designer cannot isolate the cause of a "failed" test without sophisticated techniques, and the number of "fixes" for every bug detected cannot be predicted at the outset of a project and thus makes scheduling and budgeting unpredictable.

Conventional Coverification Tool with an Emulator as the Device-under-test

Figure 66:
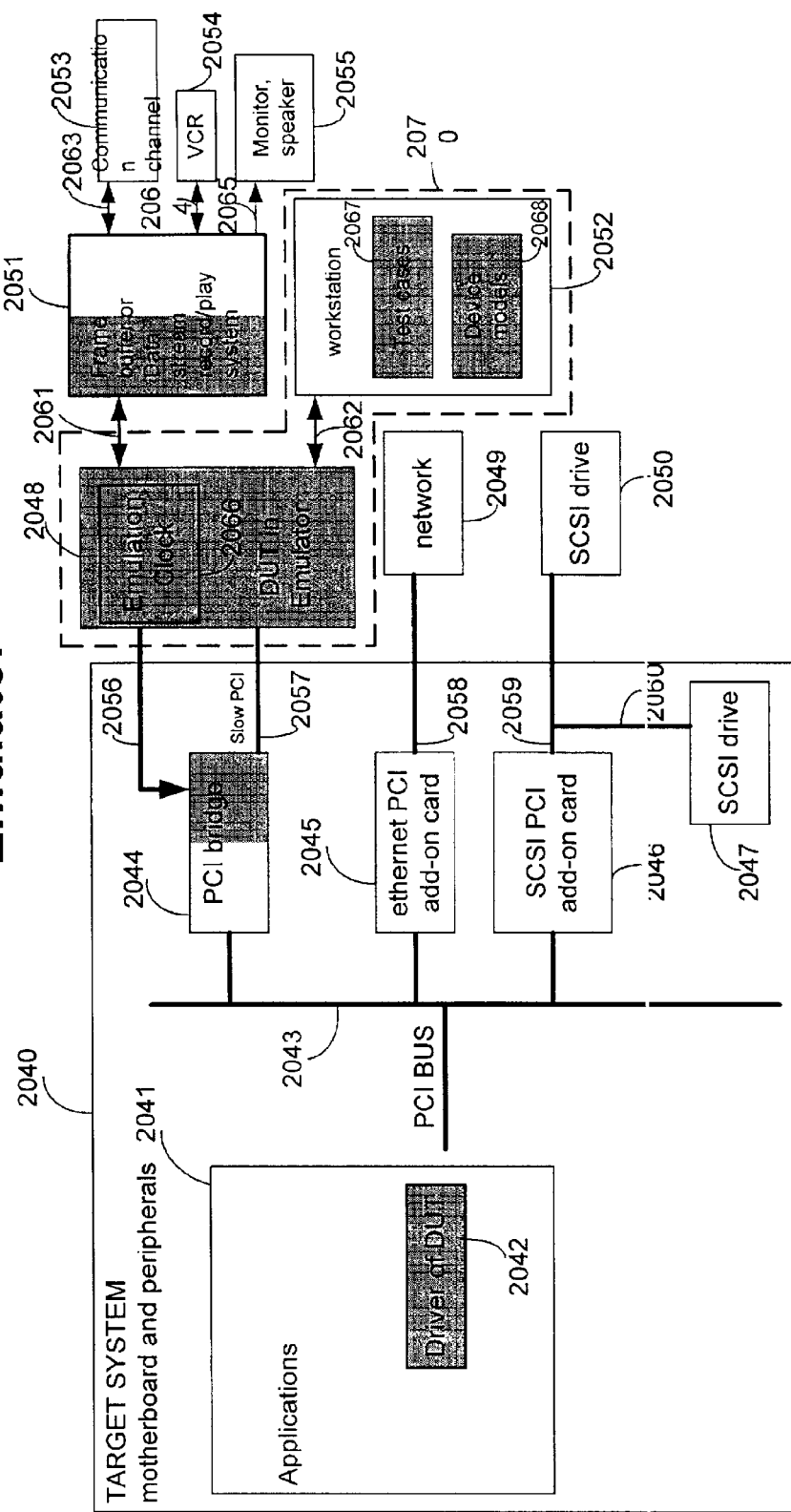
FIG. 66 shows a typical coverification system using an emulator where the device-under-test is programmed in the emulator.

FIG. 66 illustrates a conventional coverification tool with an emulator. Unlike the set-up illustrated in FIG. 64 and described above, the device-under-test is programmed in an emulator 2048 coupled to the target system 2040 and some peripheral devices and a test workstation 2052. The emulator 2048 includes an emulation clock 2066 and the device-under-test which was programmed in the emulator.

The emulator 2048 is coupled to the target system 2040 via a PCI bus bridge 2044 and PCI bus 2057 and control lines 2056. The target system 2040 includes a combination of the central computing system 2041 on the motherboard and several peripherals. The target system 2040 includes a central computing system 2041 which includes a CPU and memory, and operates under some operating system such as Microsoft Windows or Sun MicroSystem's Solaris to run a number of applications. The device driver 2042 for the device-under-test is included in the central computing system 2041 to enable communication between the operating system (and any applications) and the device-under-test in the emulator 2048. To communicate with the emulator 2048 as well as other devices which are part of this computing environment, the central computing system 2041 is coupled to the PCI bus 2043. Other peripherals in the target system 2040 include an Ethernet PCI add-on card 2045 used to couple the target system to a network 2049 via bus 2058, and a SCSI PCI add-on card 2046 coupled to SCSI drives 2047 and 2050 via buses 2060 and 2059.

The emulator 2048 is also coupled to the test workstation 2052 via bus 2062. The test workstation 2052 includes a CPU and memory to perform its functions. The test workstation 2052 may also include test cases 2061 and device models 2068 for other devices that are modeled but not physically coupled to the emulator 2048.

Finally, the emulator 2048 is coupled to some other peripheral devices such as a frame buffer or data stream record/play system 2051 via bus 2061. This frame buffer or data stream record/play system 2051 may also be coupled to a communication device or channel 2053 via bus 2063, a VCR 2054 via bus 2064, and a monitor and/or speaker 2055 via bus 2065.

As known to those ordinarily skilled in the art, the emulation clock operates at a speed much slower than the actual target system speed. Thus, that portion of FIG. 66 that is shaded is running at emulation speed while the other unshaded portions are running at actual target system speed.

As described above, this coverification tool with the emulator has several limitations. When using a logic analyzer or a sample-and-hold device to get internal state information of the device-under-test, the designer must compile his design so that the relevant signals he is interested in examining for debug purposes are provided on the output pins for sampling. If the designer wants to debug a different part of the design, he must make sure that that part has output signals that can be sampled by the logic analyzer or the sample-and-hold device or else he must re-compile his design in the emulator 2048 so that these signals can be presented on the output pins for sampling purposes. These recompile times may take days or weeks, which may be too lengthy of a delay for a time-sensitive design/development schedule. Furthermore, because this coverification tool uses signals, sophisticated circuitry must be provided to either convert these signals to data or to provide some signal-to-signal timing control. Moreover, the necessity of using numerous wires 2061 and 2062 necessary for each signal desired for sampling increases the debug set-up burden and time.

Simulation with Reconfigurable Computing Array

Figure 67:
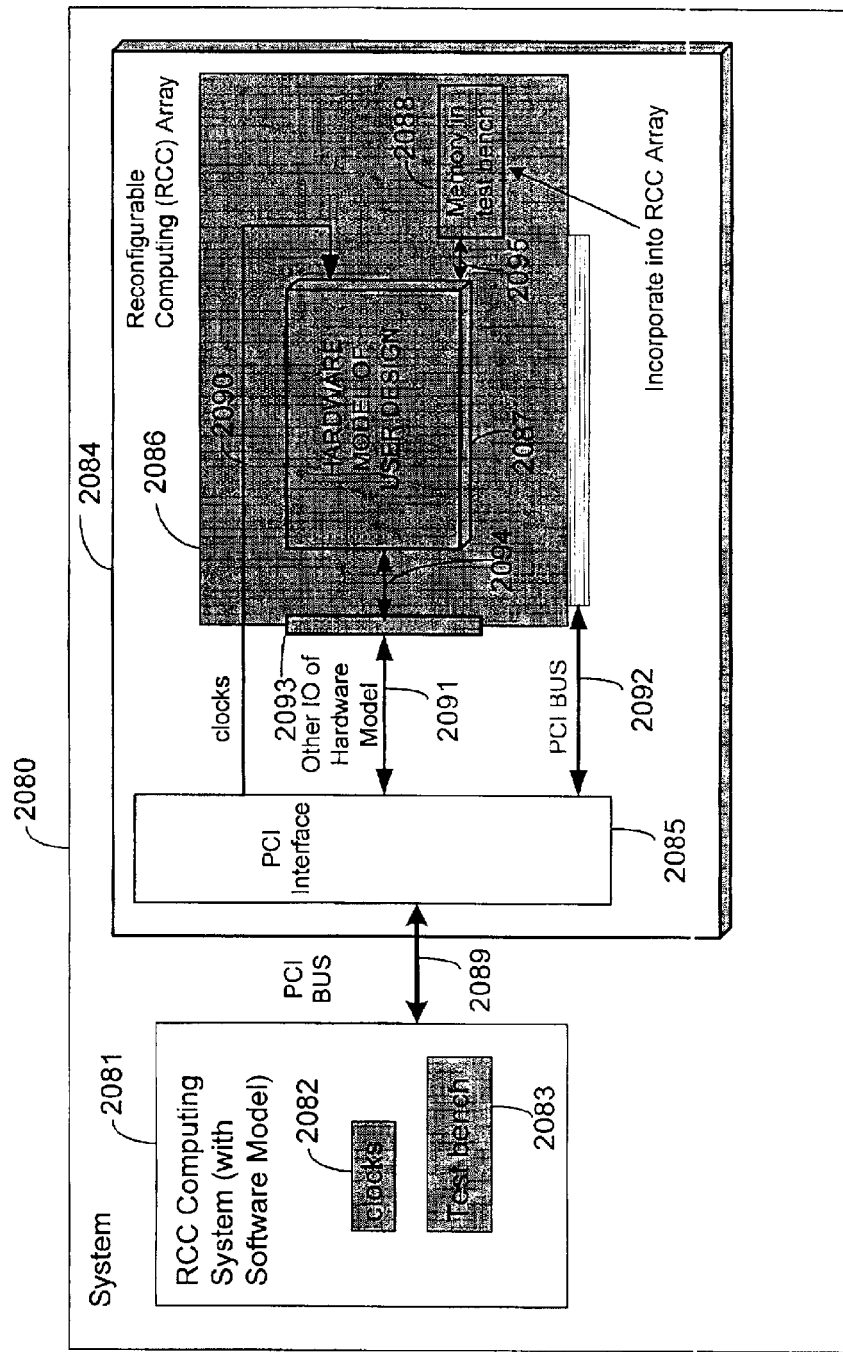
FIG. 67 shows a simulation system in accordance with one embodiment of the present invention.

As a brief review, FIG. 67 illustrates a high level configuration of the single-engine reconfigurable computing (RCC) array system of the present invention which was previously described above in this patent specification. This single-engine RCC system will be incorporated into the coverification system in accordance with one embodiment of the present invention.

In FIG. 67, the RCC array system 2080 includes a RCC computing system 2081, a reconfigurable computing (RCC) hardware array 2084, and a PCI bus 2089 coupling them together. Importantly, the RCC computing system 2081 includes the entire model of the user's design in software and the RCC hardware array 2084 includes a hardware model of the user's design. The RCC computing system 2081 includes the CPU, memory, an operating system, and the necessary software to run the single-engine RCC system 2080. A software clock 2082 is provided to enable the tight control of the software model in the RCC computing system 2081 and the hardware model in the RCC hardware array 2084. Test bench data 2083 are also stored in the RCC computing system 2081.

The RCC hardware array system 2084 includes a PCI interface 2085, a set of RCC hardware array boards 2086, and various buses for interface purposes. The set of RCC hardware array boards 2086 includes at least a portion of the user's design modeled in hardware (i.e., hardware model 2087) and memory 2088 for the test bench data. In one embodiment, various portions of this hardware model are distributed among a plurality of reconfigurable logic elements (e.g., FPGA chips) during configuration time. As more reconfigurable logic elements or chips are used, more boards may be needed. In one embodiment, four reconfigurable logic elements are provided on a single board. In other embodiments, eight reconfigurable logic elements are provided on a single board. The capacity and capabilities of the reconfigurable logic elements in the four-chip boards can differ significantly from that of the reconfigurable logic elements in the eight-chip board.

Bus 2090 provides various clocks for the hardware model from the PCI interface 2085 to the hardware model 2087. Bus 2091 provides other I/O data between the PCI interface 2085 and the hardware model 2087 via connector 2093 and internal bus 2094. Bus 2092 functions as the PCI bus between the PCI interface 2085 and the hardware model 2087. Test bench data can also be stored in memory in the hardware model 2087. The hardware model 2087, as described above, includes other structures and functions other than the hardware model of the user's design that are needed to enable the hardware model to interface with the RCC computing system 2081.

This RCC system 2080 may be provided in a single workstation or alternatively, coupled to a network of workstations where each workstation is provided access to the RCC system 2080 on a time-shared basis. In effect, the RCC array system 2080 serves as a simulation server having a simulation scheduler and state swapping mechanism. The server allows each user at a workstation to access the RCC hardware array 2084 for high speed acceleration and hardware state swapping purposes. After the acceleration and state swapping, each user can locally simulate the user design in software while releasing control of the RCC hardware array 2084 to other users at other workstations. This network model will also be used for the coverification system described below.

The RCC array system 2080 provides designers with the power and flexibility of simulating an entire design, accelerating part of the test points during selected cycles via the hardware model in the reconfigurable computing array, and obtaining internal state information of virtually any part of his design at any time. Indeed, the single-engine reconfigurable computing array (RCC) system, which can be loosely described as a hardware-accelerated simulator, can be used to perform the following tasks in a single debug session: (1) simulation alone, (2) simulation with hardware acceleration where the user can start, stop, assert values, and inspect internal states of the design at any time, (3) post-simulation analyses, and (4) in-circuit emulation. Because both the software model and the hardware model are under the strict control of a single engine via a software clock, the hardware model in the reconfigurable computing array is tightly coupled to the software simulation model. This allows the designer to debug cycle-by-cycle as well as accelerate and decelerate the hardware model through a number of cycles to obtain valuable internal state information. Moreover, because this simulation system handles data instead of signals, no complex signal-to-data conversion/timing circuitry is needed. Furthermore, the hardware model in the reconfigurable computing array does not need to be re-compiled if the designer wishes to examine a different set of nodes, unlike the typical emulation system. For further details, review the description above.

Coverification System without External I/O

One embodiment of the present invention is a coverification system which uses no actual and physical external I/O devices and target applications. Thus, a coverification system in accordance with one embodiment of the present invention can incorporate the RCC system, along with other functionality to debug the software portion and hardware portion of a user's design without using any actual target system or I/O devices. The target system and external I/O devices are, instead, modeled in software in the RCC computing system.

Figure 68:
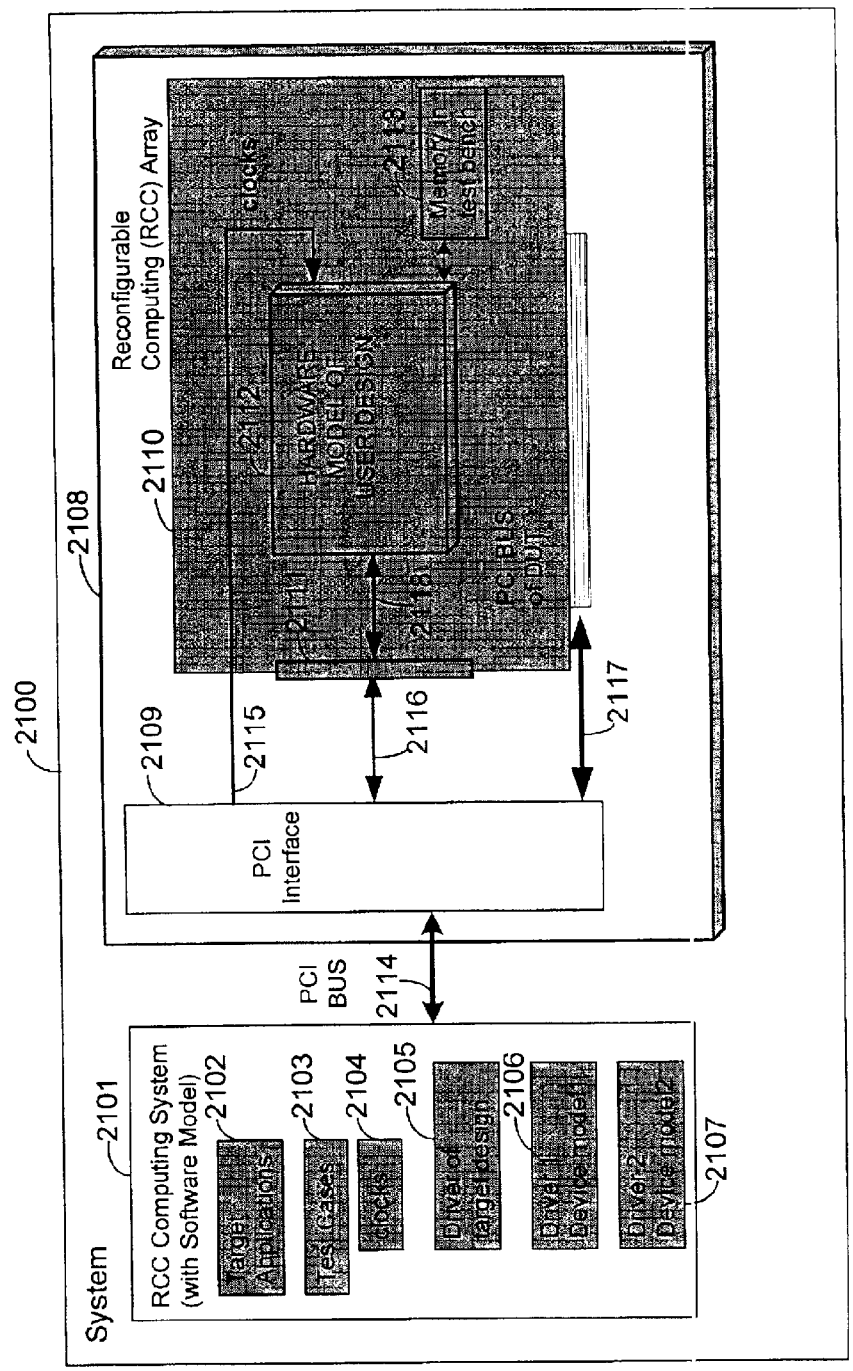
FIG. 68 shows a coverification system without external I/O devices in accordance with one embodiment of the present invention, where the RCC computing system contains a software model of the various I/O devices and the target system.

Referring to FIG. 68, the coverification system 2100 includes a RCC computing system 2101, the RCC hardware array 2108, and a PCI bus 2114 coupling them together. Importantly, the RCC computing system 2101 includes the entire model of the user's design in software and the reconfigurable computing array 2108 includes a hardware model of the user's design. The RCC computing system 2101 includes the CPU, memory, an operating system, and the necessary software to run the single-engine coverification system 2100. A software clock 2104 is provided to enable the tight control of the software model in the RCC computing system 2101 and the hardware model in the reconfigurable computing array 2108. Test cases 2103 are also stored in the RCC computing system 2101.

In accordance with one embodiment of the present invention, the RCC computing system 2101 also includes the target applications 2102, a driver 2105 of the hardware model of the user's design, a model of a device (e.g., a video card) and its driver in software labeled as 2106, and a model of another device (e.g., a monitor) and its driver also in software labeled as 2107. Essentially, the RCC computing system 2101 contains as many device models and drivers as necessary to convey to the software model and the hardware model of the user's design that an actual target system and other I/O devices are part of this computing environment.

The RCC hardware array 2108 includes a PCI interface 2109, a set of RCC hardware array boards 2110, and various buses for interface purposes. The set of RCC hardware array boards 2110 includes at least a portion of the user's design modeled in hardware 2112 and memory 2113 for the test bench data. As described above, each board contains a plurality of reconfigurable logic elements or chips.

Bus 2115 provides various clocks for the hardware model from the PCI interface 2109 to the hardware model 2112. Bus 2116 provides other I/O data between the PCI interface 2109 and the hardware model 2112 via connector 2111 and internal bus 2118. Bus 2117 functions as the PCI bus between the PCI interface 2109 and the hardware model 2112. Test bench data can also be stored in memory in the hardware model 2113. The hardware model, as described above, includes other structures and functions other than the hardware model of the user's design that are needed to enable the hardware model to interface with the RCC computing system 2101.

To compare the coverification system of FIG. 68 to the conventional emulator-based coverification system, FIG. 66 shows the emulator 2048 coupled to the target system 2040, some I/O devices (e.g., frame buffer or data stream record/play system 2051), and a workstation 2052. This emulator configuration provides numerous problems and set-up issues for the designer. The emulator needs a logic analyzer or a sample-and-hold device to measure internal states of the user design modeled in the emulator. Because the logic analyzer and the sample-and-hold device needs signals, complex signal-to-data conversion circuitry is required. Additionally, complex signal-to-signal timing control circuitry is also required. The numerous wires needed for every signal that will be used to measure the internal states of the emulator further burden the user during set-up. During the debug session, the user must re-compile the emulator each time he wants to examine a different set of internal logic circuitry so that the appropriate signals from that logic circuitry are provided as outputs for measurement and recording by the logic analyzer or the sample-and-hold device. The long re-compilation time is too costly.

In the coverification system of the present invention in which no external I/O devices are coupled, the target system and other I/O devices are modeled in software so that an actual physical target system and I/O devices are not physically necessary. Because the RCC computing system 2101 processes data, no complex signal-to-data conversion circuitry or signal-to-signal timing control circuitry are needed. The number of wires are also not tied to the number of signals and hence, set-up is relatively simple. Furthermore, debugging a different portion of the logic circuitry in the hardware model of the user design does not require re-compilation because the coverification system processes data and not signals. Because the RCC computing system controls the RCC hardware array with the software-controlled clock (i.e., software clock and clock edge detection circuitry), starting and stopping the hardware model is facilitated. Reading data from the hardware model is also easy because the model of the entire user design is in software and the software clock enables synchronization. Thus, the user can debug by software simulation alone, accelerate part or all of the design in hardware, step through various desired test points cycle-by-cycle, inspect internal states of the software and hardware model (i.e., register and combinational logic states). For example, the user can simulate the design with some test bench data, then download internal state information to the hardware model, accelerate the design with various test bench data with hardware model, inspect the resulting internal state values of the hardware model by register/combinational logic regeneration and loading values from the hardware model to the software model, and the user can finally simulate other parts of the user design in software using the results of the hardware model-accelerated process.

As described above, a workstation, however, is still needed for debug session control purposes. In a network configuration, a workstation may be remotely coupled to the coverification system to access debug data remotely. In a non-network configuration, a workstation may be locally coupled to the coverification system or in some other embodiments, the workstation may incorporate the coverification system internally so that debug data can be accessed locally.

Coverification System with External I/O

In FIG. 68, the various I/O devices and target applications were modeled in the RCC computing system 2101. However, when too many I/O devices and target applications are running in the RCC computing system 2101, the overall speed slows down. With only a single CPU in the RCC computing system 2101, more time is necessary to process the various data from all the device models and target applications. To increase the data throughput, actual I/O devices and target applications (instead of software models of these I/O devices and target applications) can be physically coupled to the coverification system.

One embodiment of the present invention is a coverification system that uses actual and physical external I/O devices and target applications. Thus, a coverification system can incorporate the RCC system along with other functionality to debug the software portion and hardware portion of a user's design while using the actual target system and/or I/O devices. For testing, the coverification system can use both test bench data from software and stimuli from the external interface (e.g., target system and external I/O devices). Test bench data can be used to not only provide test data to pin-outs of the user design, but also test data to internal nodes in the user design. Actual I/O signals from external I/O devices (or target system) can only be directed to pin-outs of the user design. Thus, one main distinction between test data from an external interface (e.g., target system or external I/O device) and test bench processes in software is that test bench data can be used to test the user design with stimulus applied to pin-outs and internal nodes, whereas actual data from the target system or external I/O device can only be applied to the user design via its pin-outs (or nodes in the user design that represent pin-outs). In the following discussion, the structure of the coverification system and its configuration with respect to a target system and the external I/O devices will be presented.

As a comparison to the system configuration of FIG. 66, the coverification system in accordance with one embodiment of the present invention replaces the structure and functionality of the items in the dotted line 2070. In other words, while FIG. 66 shows the emulator and the workstation within the confines of the dotted line 2070, one embodiment of the present invention includes the coverification system 2140 (and its associated workstation) as shown in FIG. 69 as coverification system 2140 within the dotted line 2070.

Figure 69:
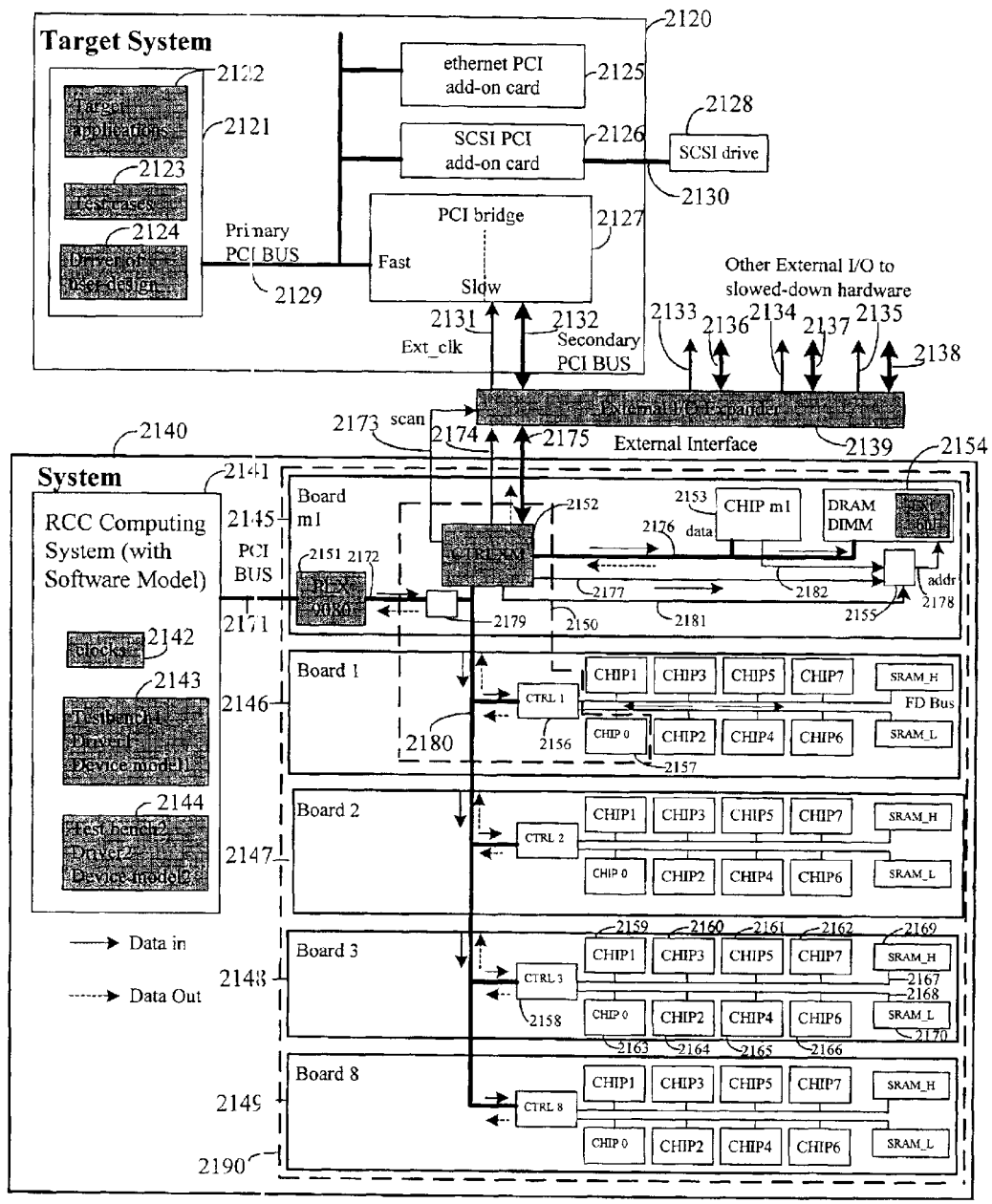
FIG. 69 shows a coverification system with actual external I/O devices and the target system in accordance with another embodiment of the present invention.

Referring to FIG. 69, the coverification system configuration in accordance with one embodiment of the present invention includes a target system 2120, a coverification system 2140, some optional I/O devices, and a control/data bus 2131 and 2132 for coupling them together. The target system 2120 includes a central computing system 2121, which includes a CPU and memory, and operates under some operating system such as Microsoft Windows or Sun MicroSystem's Solaris to run a number of applications 2122 and test cases 2123. The device driver 2124 for the hardware model of the user's design is included in the central computing system 2121 to enable communication between the operating system (and any applications) and the user's design. To communicate with the coverification system as well as other devices which are part of this computing environment, the central computing system 2121 is coupled to the PCI bus 2129. Other peripherals in the target system 2120 include an Ethernet PCI add-on card 2125 used to couple the target system to a network, a SCSI PCI add-on card 2126 coupled to SCSI drive 2128 via bus 2130, and a PCI bus bridge 2127.

The coverification system 2140 includes a RCC computing system 2141, a RCC hardware array 2190, an external interface 2139 in the form of an external I/O expander, and a PCI bus 2171 coupling the RCC computing system 2141 and the RCC hardware array 2190 together. The RCC computing system 2141 includes the CPU, memory, an operating system, and the necessary software to run the single-engine coverification system 2140. Importantly, the RCC computing system 2141 includes the entire model of the user's design in software and the RCC hardware array 2190 includes a hardware model of the user's design.

As discussed above, the single-engine of the coverification system derives its power and flexibility from a main software kernel which resides in the main memory of the RCC computing system 2141 and controls the overall operation and execution of the coverification system 2140. So long as any test bench processes are active or any signals from the external world are presented to the coverification system, the kernel evaluates active test bench components, evaluates clock components, detects clock edges to update register and memories as well as propagating combinational logic data, and advances the simulation time. This main software kernel provides for the tightly coupled nature of the RCC computing system 2141 and the RCC hardware array 2190.

The software kernel generates a software clock signal from a software clock source 2142 that is provided to the RCC hardware array 2190 and the external world. The clock source 2142 can generate multiple clocks at different frequencies depending on the destination of these software clocks. Generally, the software clock ensures that the registers in the hardware model of the user's design evaluate in synchronization with the system clock and without any hold-time violations. The software model can detect clock edges in software that affect hardware model register values. Accordingly, a clock detection mechanism ensures that a clock edge detection in the main software model can be translated to clock detection the hardware model. For a more detailed discussion of software clocks and the clock-edge detection logic, refer to FIGS. 17–19 and accompanying text in the patent specification.

In accordance with one embodiment of the present invention, the RCC computing system 2141 may also include one or more models of a number of I/O devices, despite the fact that other actual physical I/O devices can be coupled to the coverification system. For example, the RCC computing system 2141 may include a model of a device (e.g., a speaker) along with its driver and test bench data in software labeled as 2143, and a model of another device (e.g., a graphics accelerator) along with its driver and test bench data in software labeled as 2144. The user decides which devices (and their respective drivers and test bench data) will be modeled and incorporated into the RCC computing system 2141 and which devices will be actually coupled to the coverification system.

The coverification system contains a control logic that provides traffic control between: (1) the RCC computing system 2141 and the RCC hardware array 2190, and (2) the external interface (which are coupled to the target system and the external I/O devices) and the RCC hardware array 2190. Some data passes between the RCC hardware array 2190 and the RCC computing system 2141 because some I/O devices may be modeled in the RCC computing system. Furthermore, the RCC computing system 2141 has the model of the entire design in software, including that portion of the user design modeled in the RCC hardware array 2190. As a result, the RCC computing system 2141 must also have access to all data that passes between the external interface and the RCC hardware array 2190. The control logic ensures that the RCC computing system 2141 has access to these data. The control logic will be described in greater detail below.

The RCC hardware array 2190 includes a number of array boards. In this particular embodiment shown in FIG. 69, the hardware array 2190 includes boards 2145–2149. Boards 2146–2149 contain the bulk of the configured hardware model. Board 2145 (or board m1) contains a reconfigurable computing element (e.g., FPGA chip) 2153, which the coverification system can use to configure at least a portion of the hardware model, and an external I/O controller 2152 which directs traffic and data between the external interface (target system and I/O devices) and the coverification system 2140. Board 2145, via the external I/O controller, allows the RCC computing system 2141 to have access to all data transported between the external world (i.e., target system and I/O devices) and the RCC hardware array 2190. This access is important because the RCC computing system 2141 in the coverification system contains a model of the entire user design in software and the RCC computing system 2141 can also control the functionality of the RCC hardware array 2190.

If stimulus from an external I/O device is provided to the hardware model, the software model must also have access to this stimulus as well so that the user of this coverification system can selectively control the next debug step, which may include inspecting internal state values of his design as a result of this applied stimulus. As discussed above with respect to the board layout and interconnection scheme, the first and last board are included in the hardware array 2190.

Thus, board 1 (labeled as board 2146) and board 8 (labeled as board 2149) are included in an eight-board hardware array (excluding board m1). Other than these boards 2145–2149, board m2 (not shown in FIG. 69, but see FIG. 74) may also be provided having chip m2. This board m2 is similar to board m1 except that board m2 does not have any external interface and can be used for expansion purposes if additional boards are necessary.

The contents of these boards will now be discussed. Board 2145 (board m1) includes a PCI controller 2151, an external I/O controller 2152, data chip (m1) 2153, memory 2154, and multiplexer 2155. In one embodiment, this PCI controller is a PLX 9080. The PCI controller 2151 is coupled to the RCC computing system 2141 via bus 2171 and a tri-state buffer 2179 via bus 2172.

The main traffic controller in the coverification system between the external world (target system 2120 and I/O devices) and the RCC computing system 2141 is an external I/O controller 2152 (also known as "CTRLXM" in FIGS. 69, 71, and 73), which is coupled to the RCC computing system 2141, the other boards 2146–2149 in the RCC hardware array, the target system 2120, and the actual external I/O devices. Of course, the main traffic controller between the RCC computing system 2141 and the RCC hardware array 2190 has always been the combination of the individual internal I/O controllers (e.g., I/O controllers 2156 and 2158) in each array board 2146–2149 and the PCI controller 2151, as described above. In one embodiment, these individual internal I/O controllers, such as controllers 2156 and 2158, are the FPGA I/O controllers described and illustrated above in such exemplary figures as FIG. 22 (unit 700) and FIG. 56 (unit 1200).

The external I/O controller 2152 is coupled to the tri-state buffer 2179 to allow the external I/O controller to interface with the RCC computing system 2141. In one embodiment, the tri-state buffer 2179 allows data from the RCC computing system 2141 to pass to the local bus 2180 while preventing data from the local bus to pass to the RCC computing system 2141 in some instances, and allows data to pass from the local bus 2180 to the RCC computing system 2141 in other instances.

The external I/O controller 2152 is also coupled to chip (m1) 2153 and memory/external buffer 2154 via data bus 2176. In one embodiment, chip (m1) 2153 is a reconfigurable computing element, such as an FPGA chip, that can be used to configure at least a portion of the hardware model of the user design (or all of the hardware model, if the user design is small enough). External buffer 2154 is a DRAM DIMM in one embodiment and can be used by chip 2153 for a variety of purposes. The external buffer 2154 provides a lot of memory capacity, more than the individual SRAM memory devices coupled locally to each reconfigurable logic element (e.g., reconfigurable logic element 2157). This large memory capacity allows the RCC computing system to store large chunks of data such as test bench data, embedded code for microcontrollers (if the user design is a microcontroller), and a large look-up table in one memory device. The external buffer 2154 can also be used to store data necessary for the hardware modeling, as described above. In essence, this external buffer 2154 can partly function like the other high or low bank SRAM memory devices described and illustrated above in, for example, FIG. 56 (SRAM 1205 and 1206) but with more memory. External buffer 2154 can also be used by the coverification system to store data received from the target system 2120 and the external I/O devices so that these data can later be retrieved by the RCC computing system 2141. Chip m1 2153 and external buffer 2154 also contain the memory mapping logic described in the patent specification herein under the section called "Memory Simulation."

To access the desired data in the external buffer 2154, both the chip 2153 and the RCC computing system 2141 (via the external I/O controller 2152) can deliver the address for the desired data. The chip 2153 provides the address on address bus 2182 and the external I/O controller 2152 provides the address on address bus 2177. These address buses 2182 and 2177 are inputs to a multiplexer 2155, which provides the selected address on output line 2178 coupled to the external buffer 2154. The select signal for the multiplexer 2155 is provided by the external I/O controller 2152 via line 2181.

The external I/O controller 2152 is also coupled to the other boards 2146–2149 via bus 2180. In one embodiment, bus 2180 is the local bus described and illustrated above in such exemplary figures as FIG. 22 (local bus 708) and FIG. 56 (local bus 1210). In this embodiment, only five boards (including board 2145 (board m1)) are used. The actual number of boards is determined by the complexity and magnitude of the user's design that will be modeled in hardware. A hardware model of a user design that is of medium complexity requires less boards than a hardware model of a user design that is of higher complexity.

To enable scalability, the boards 2146–2149 are substantially identical to each other except for some inter-board interconnect lines. These interconnect lines enable one portion of the hardware model of the user's design in one chip (e.g., chip 2157 in board 2146) to communicate with another part of the hardware model in the same user's design that is physically located in another chip (e.g., chip 2161 in board 2148). Briefly refer to FIG. 74 for the interconnect structure for this coverification system, as well as FIGS. 8 and 36–44 and their accompanying descriptions in this patent specification.

Board 2148 is a representative board. Board 2148 is the third board in this four-board layout (excluding board 2145 (board m1)). Accordingly, it is not an end-board that needs appropriate terminations for the interconnect lines. Board 2148 includes an internal I/O controller 2158, several reconfigurable logic elements (e.g., FPGA chips) 2159–2166, high bank FD bus 2167, low bank FD bus 2168, high bank memory 2169, and low bank memory 2170. As stated above, the internal I/O controller 2158 is, in one embodiment, the FPGA I/O controller described and illustrated above in such exemplary figures as FIG. 22 (unit 700) and FIG. 56 (unit 1200). Similarly, the high and low bank memory devices 2169 and 2170 are the SRAM memory devices described and illustrated above in, for example, FIG. 56 (SRAM 1205 and 1206). The high and low bank FD buses 2167 and 2168 are, in one embodiment, the FD bus or FPGA bus described and illustrated above in such exemplary figures as FIG. 22 (FPGA bus 718 and 719), FIG. 56 (FD bus 1212 and 1213), and FIG. 57 (FD bus 1282).

To couple the coverification system 2140 to the target system 2120 and other I/O devices, an external interface 2139 in the form of an external I/O expander is provided. On the target system side, the external I/O expander 2139 is coupled to the PCI bridge 2127 via secondary PCI bus 2132 and a control line 2131, which is used to deliver the software clock. On the I/O device side, the external I/O expander 2139 is coupled to various I/O devices via buses 2136–2138 for pin-out data and control lines 2133–2135 for the software clock. The number of I/O devices that can be coupled to the I/O expander 2139 is determined by the user. In any event, as many data buses and software clock control lines are provided in the external I/O expander 2139 as are necessary to couple as many I/O devices to the coverification system 2140 to run a successful debug session.

On the coverification system 2140 side, the external I/O expander 2139 is coupled to the external I/O controller 2152 via data bus 2175, software clock control line 2174, and scan control line 2173. Data bus 2175 is used to pass pin-out data between the external world (target system 2120 and external I/O devices) and the coverification system 2140. Software clock control line 2174 is used to deliver the software clock data from the RCC computing system 2141 to the external world.

The software clock present on control lines 2174 and 2131 is generated by the main software kernel in the RCC computing system 2141. The RCC computing system 2141 delivers a software clock to external I/O expander 2139 via the PCI bus 2171, PCI controller 2151, bus 2171, tri-state buffer 2179, local bus 2180, external I/O controller 2152, and control line 2174. From the external I/O expander 2139, the software clock is provided as the clock input to the target system 2120 (via the PCI bridge 2127), and other external I/O devices via control lines 2133–2135. Because the software clock functions as the main clock source, the target system 2120 and the I/O devices run at a slower speed. However, the data provided to the target system 2120 and the external I/O devices are synchronized to the software clock speed like the software model in the RCC computing system 2141 and the hardware model in the RCC hardware array 2190. Similarly, data from the target system 2120 and the external I/O devices are delivered to the coverification system 2140 in synchronization with the software clock.

Thus, I/O data passed between the external interface and the coverification system are synchronized with the software clock. Essentially, the software clock synchronizes the operation of the external I/O devices and the target system with that of the coverification system (in the RCC computing system and the RCC hardware array) whenever data passes between them. The software clock is used for both data-in operations and data-out operations. For data-in operations, as a pointer (to be discussed later) latches the software clock from the RCC computing system 2141 to the external interface, other pointers will latch these I/O data in from the external interface to selected internal nodes in the hardware model of the RCC hardware array 2190. One by one, the pointers will latch these I/O data in during this cycle when the software clock was delivered to the external interface. When all data have been latched in, the RCC computing system can generate another software clock again to latch in more data at another software clock cycle, if desired. For data-out operations, the RCC computing system can deliver the software clock to the external interface and subsequently control the gating of data from the internal nodes of the hardware model in the RCC hardware array 2190 to the external interface with the aid of pointers. Again, one by one, the pointers will gate data from the internal nodes to the external interface. If more data needs to be delivered to the external interface, the RCC computing system can generate another software clock cycle and then activate selected pointers to gate data out to the external interface. The generation of the software clock is strictly controlled and thus allows the coverification system to synchronize data delivery and data evaluation between the coverification system and any external I/O devices are coupled to the external interface.

Scan control line 2173 is used to allow the coverification system 2140 to scan the data buses 2132, 2136, 2137, and 2138 for any data that may be present. The logic in the external I/O controller 2151 supporting the scan signal is a pointer logic where various inputs are provided as outputs for a specific time period before moving on to the next input via a MOVE signal. This logic is analogous to the scheme shown in FIG. 11. In effect, the scan signal functions like a select signal for a multiplexer except that it selects the various inputs to the multiplexer in round robin order. Thus, in one time period, the scan signal on scan control line 2173 samples data bus 2132 for data that may be coming from the target system 2120. At the next time period, the scan signal on scan control line 2173 samples data bus 2136 for data that may be coming an external I/O device that may be coupled there. At the next time period, data bus 2137 is sampled, and so on, so that the coverification system 2140 can receive and process all pin-out data that originated from the target system 2120 or the external I/O devices during this debug session. Any data that is received by the coverification system 2140 from sampling the data buses 2132, 2136, 2137, and 2138 are transported to the external buffer 2154 via the external I/O controller 2152.

Note that the configuration illustrated in FIG. 69 assumes that the target system 2120 contains the primary CPU and the user design is some peripheral device, such as a video controller, network adapter, graphics adapter, mouse, or some other support device, card, or logic. Thus, the target system 2120 contains the target applications (including the operating system) coupled to the primary PCI bus 2129, and the coverification system 2140 contains the user design and is coupled to the secondary PCI bus 2132. The configuration may be quite different depending on the subject of the user design. For example, if the user design was a CPU, the target application would run in the RCC computing system 2141 of the coverification system 2140 while the target system 2120 would no longer contain the central computing system 2121. Indeed, the bus 2132 would now be a primary PCI bus and bus 2129 would be a secondary PCI bus. In effect, instead of the user design being one of the peripheral devices supporting the central computing system 2121, the user design is now the main computing center and all other peripheral devices are supporting the user design.

The control logic for transporting data between the external interface (external I/O expander 2139) and the coverification system 2140 is found in each board 2145–2149. The primary portion of the control logic is found in the external I/O controller 2152 but other portions are found in the various internal I/O controllers (e.g., 2156 and 2158) and the reconfigurable logic elements (e.g., FPGA chips 2159 and 2165). For instructional purposes, it is necessary only to show some portion of this control logic instead of the same repetitive logic structure for all chips in all boards. The portion of the coverification system 2140 within the dotted line 2150 of FIG. 69 contains one subset of the control logic. This control logic will now be discussed in greater detail with respect to FIGS. 70–73.

Figure 70:
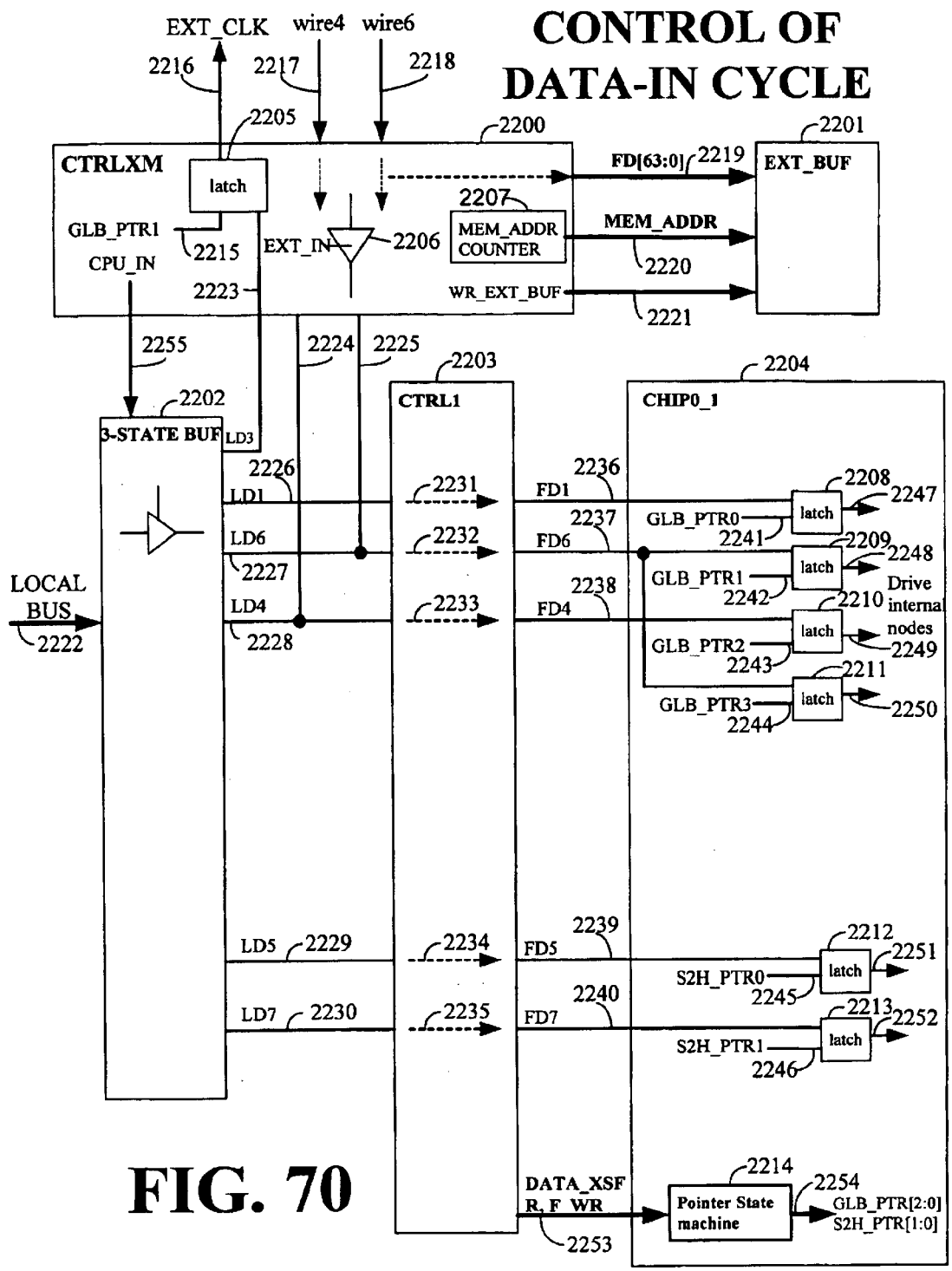
FIG. 70 shows a more detailed logic diagram of the data-in portion of the control logic in accordance with one embodiment of the present invention.
Figure 71:
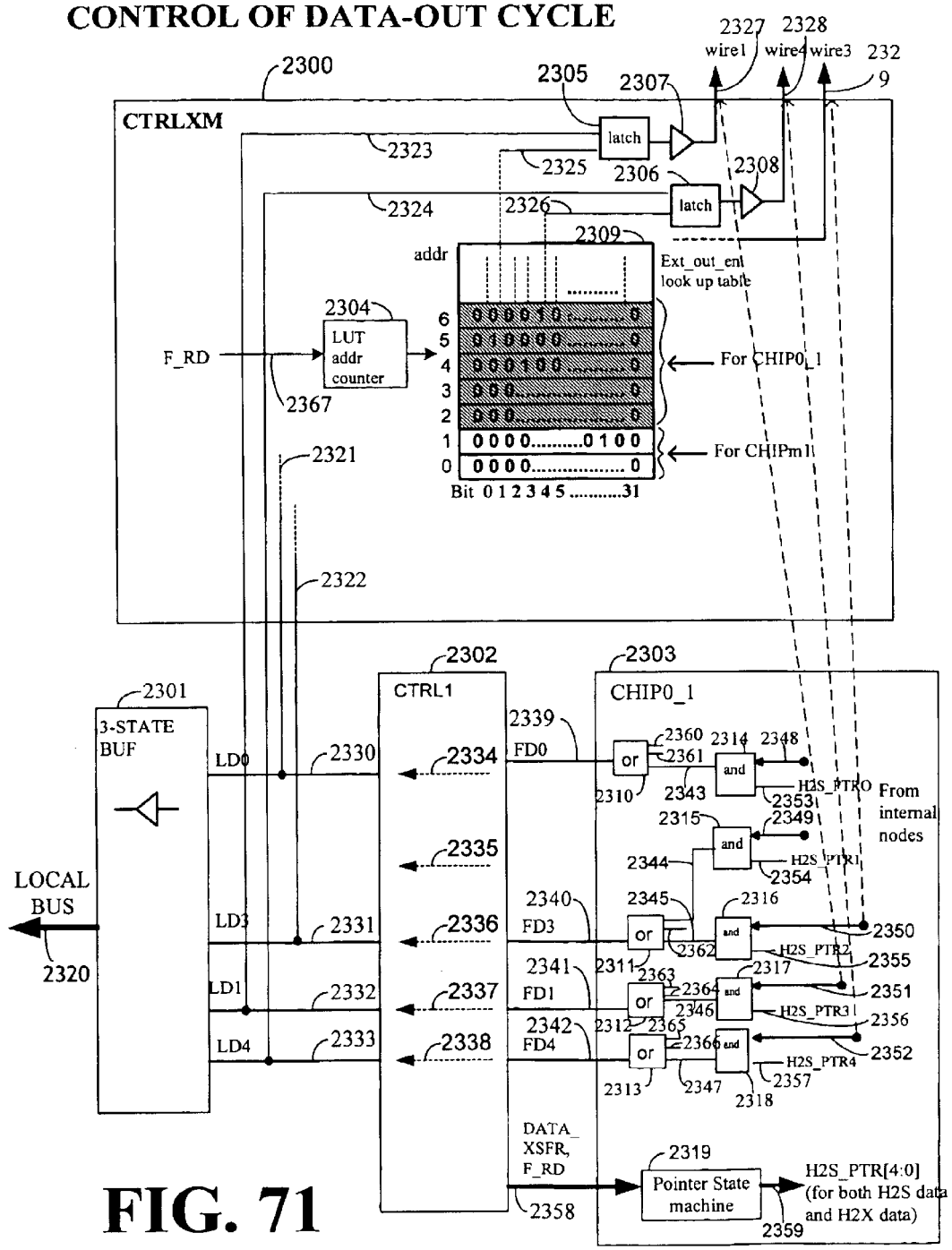
FIG. 71 shows a more detailed logic diagram of the data-out portion of the control logic in accordance with one embodiment of the present invention.
Figure 72:
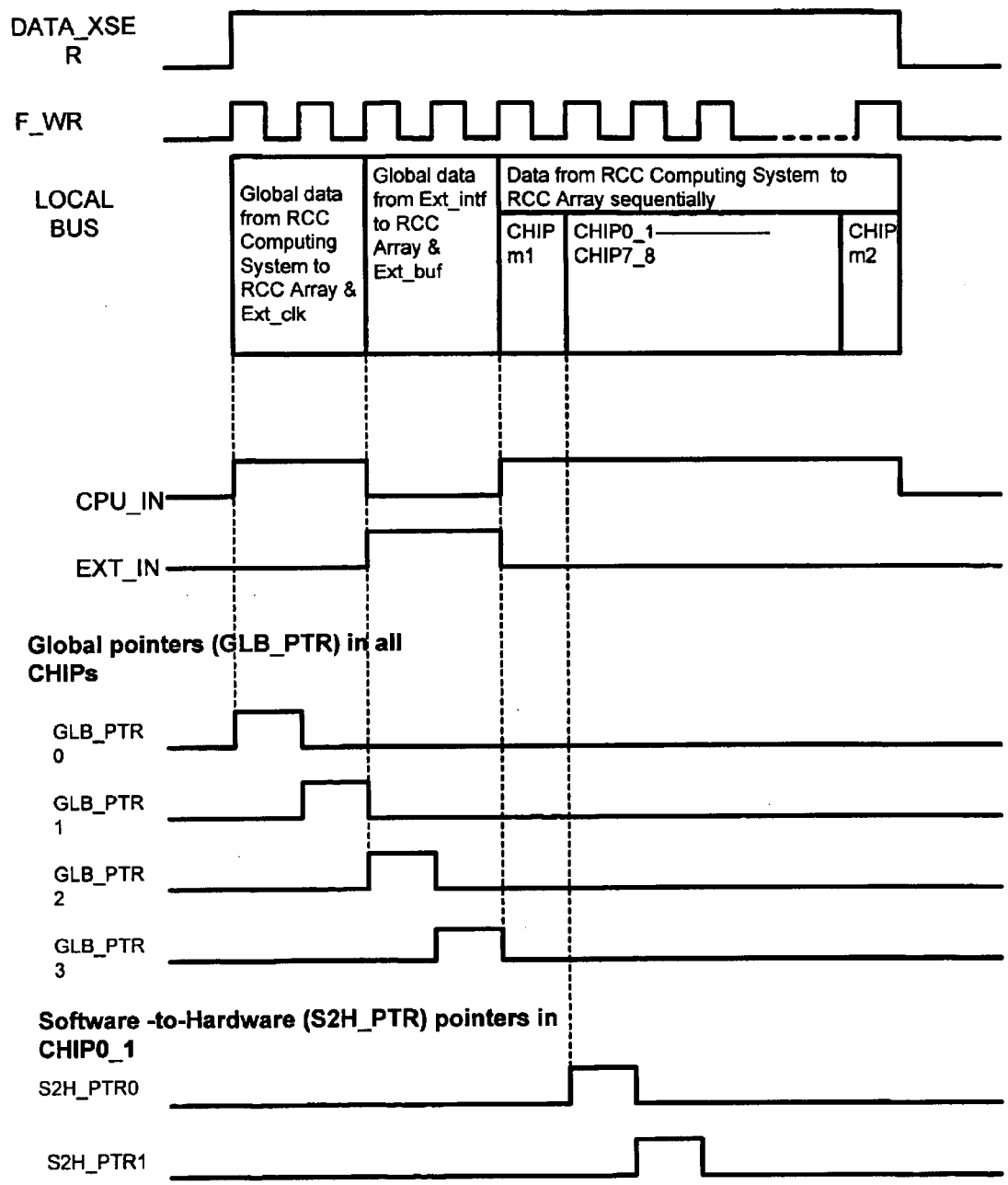
FIG. 72 shows the timing diagram of the data-in portion of the control logic.
Figure 73:
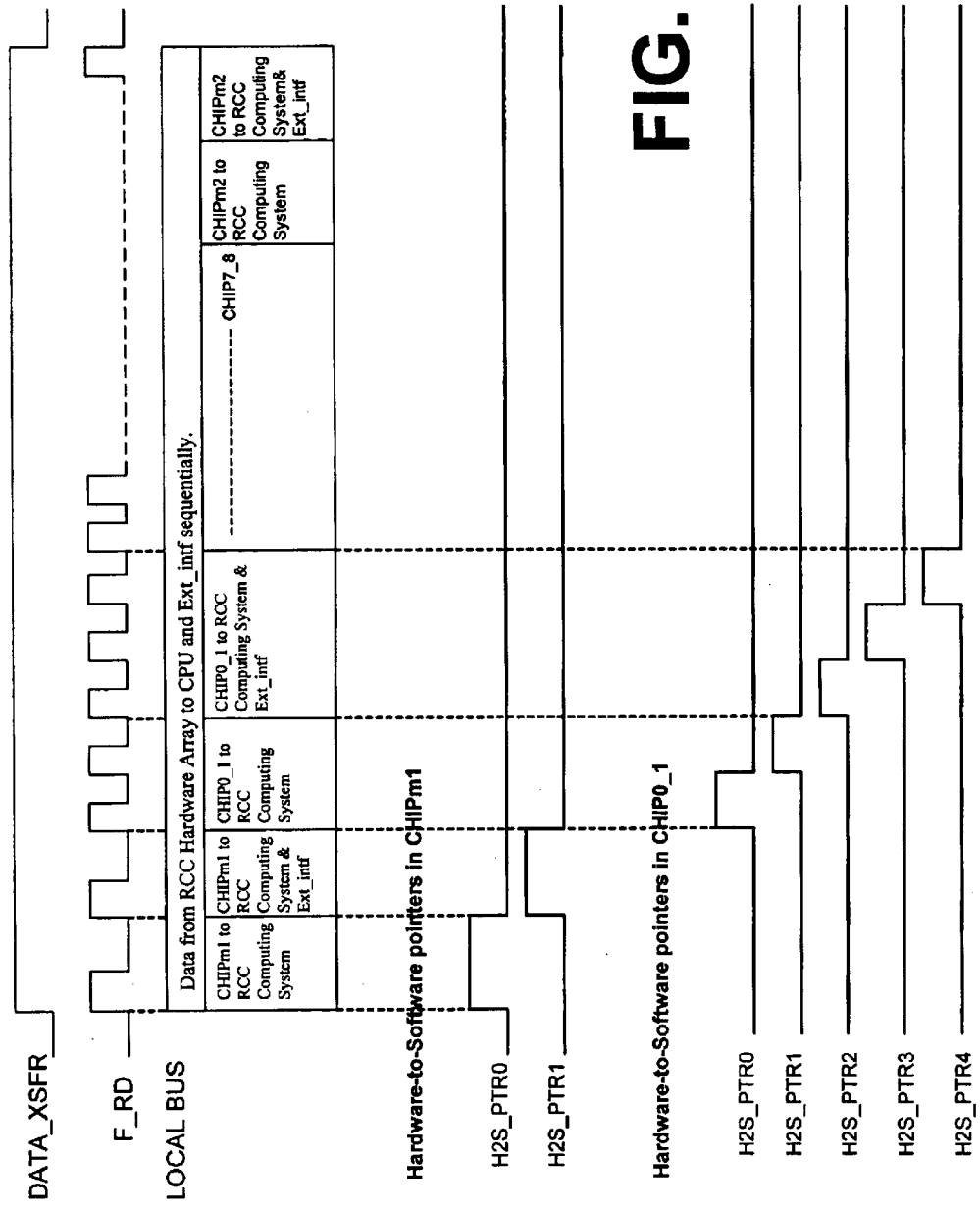
FIG. 73 shows the timing diagram of the data-out portion of the control logic.

The components in this particular subset of the control logic include the external I/O controller 2152, the tri-state buffer 2179, internal I/O controller 2156 (CTRL 1), the reconfigurable logic element 2157 (chip0_1, which indicates chip 0 of board 1), and parts of various buses and control lines which are coupled to these components. Specifically, FIG. 70 illustrates that portion of the control logic that is used for data-in cycles, where the data from the external interface (external I/O expander 2139) and the RCC computing system 2141 are delivered to the RCC hardware array 2190. FIG. 72 illustrates the timing diagram of the data-in cycles. FIG. 71 illustrates that portion of the control logic that is used for data-out cycles, where data from the RCC hardware array 2190 are delivered to the RCC computing system 2141 and the external interface (external I/O expander 2139). FIG. 73 illustrates the timing diagram of the data-out cycles.

Data-in

The data-in control logic in accordance with one embodiment of the present invention is responsible for handling the data delivered from either the RCC computing system or the external interface to the RCC hardware array. One particular subset 2150 (see FIG. 69) of the data-in control logic is shown in FIG. 70 and includes the external I/O controller 2200, tri-state buffer 2202, internal I/O controller 2203, reconfigurable logic element 2204, and various buses and control lines to allow data transport therebetween. The external buffer 2201 is also shown for this data-in embodiment. This subset illustrates the logic necessary for data-in operations, where the data from the external interface and the RCC computing system are delivered to the RCC hardware array. The data-in control logic of FIG. 70 and the data-in timing diagram of FIG. 72 will be discussed together.

Two types of data cycles are used in this data-in embodiment of the present invention—a global cycle and a software-to-hardware (S2H) cycle. The global cycle is used for any data that is directed to all the chips in the RCC hardware array such as clocks, resets, and some other S2H data directed at many different nodes in the RCC hardware array. For these latter "global" S2H data, it is more feasible to send these data out via the global cycles than the sequential S2H data.

The software-to-hardware cycle is used to send data from the test bench processes in the RCC computing system to the RCC hardware array sequentially from one chip to another in all the boards. Because the hardware model of the user design is distributed across several boards, the test bench data must be provided to every chip for data evaluation. Thus, the data is delivered sequentially to each internal node in each chip, one internal node at a time. The sequential delivery allows a particular data designated for a particular internal node to be processed by all the chips in the RCC hardware array since the hardware model is distributed among a plurality of chips.

For this data evaluation, the coverification provides two address spaces—S2H and CLK. As described above, the S2H and CLK space are the primary input from the kernel to the hardware model. The hardware model holds substantially all the register components and the combinational components of the user's circuit design. Furthermore, the software clock is modeled in software and provided in the CLK I/O address space to interface with the hardware model. The kernel advances simulation time, looks for active test-bench components, and evaluates clock components. When any clock edge is detected by the kernel, registers and memories are updated and values through combinational components are propagated. Thus, any changes in values in these spaces will trigger the hardware model to change logic states if the hardware acceleration mode is selected.

During data transfer, the DATA_XSFR signal is at logic "1." During this time, the local bus 2222–2230 will be used by the coverification system to transport data with the following data cycles: (1) global data from the RCC computing system to the RCC hardware array and the CLK space; (2) global data from the external interface to the RCC hardware array and the external buffer; and (3) S2H data from the RCC computing system to the RCC hardware array, one chip at a time in each board. Thus, the first two data cycles are part of the global cycle and the last data cycle is part of the S2H cycle.

For the first part of the data-in global cycle where the global data from the RCC computing system is sent to the RCC hardware array, the external I/O controller 2200 enables a CPU_IN signal to logic "1" on line 2255. Line 2255 is coupled to an enable input of the tri-state buffer 2202. With logic "1" on line 2255, the tri-state buffer 2202 allows data on the local bus 2222 to pass to the local buses 2223–2230 on the other side of the tri-state buffer 2202. In this particular example, local buses 2223, 2224, 2225, 2226, 2227, 2228, 2229, and 2230 correspond to LD3, LD4 (from the external I/O controller 2200), LD6 (from the external I/O controller 2200), LD1, LD6, LD4, LD5, and LD7, respectively.

The global data travels from these local bus lines to bus lines 2231–2235 in the internal I/O controller 2203 and then to the FD bus lines 2236–2240. In this example, the FD bus lines 2236, 2237, 2238, 2239, and 2240 correspond to FD bus lines FD1, FD6, FD4, FD5, and FD7, respectively.

These FD bus lines 2236–2240 are coupled to the inputs to latches 2208–2213 in the reconfigurable logic element 2204. In this example, the reconfigurable logic element corresponds to chip0_1 (i.e., chip 0 in board 1). Also, FD bus line 2236 is coupled to latch 2208, FD bus line 2237 is coupled to latches 2209 and 2211, FD bus line 2238 is coupled to latch 2210, FD bus line 2239 is coupled to latch 2212, and FD bus line 2240 is coupled to latch 2213.

The enable inputs for each of these latches 2208–2213 are coupled to several global pointers and software-to-hardware (S2H) pointers. The enable inputs to latches 2208–2211 are coupled to the global pointers and the enable inputs to latches 2212–2213 are coupled to S2H pointers. Some exemplary global pointers include GLB_PTR0 on line 2241, GLB_PTR1 on line 2242, GLB_PTR2 on line 2243, and GLB_PTR3 on line 2244. Some exemplary S2H pointers include S2H_PTR0 on line 2245 and S2H_PTR1 on line 2246. Because the enable inputs to these latches are coupled to these pointers, the respective latches cannot latch data to their intended destination nodes in the hardware model of the user design without the proper pointer signals.

These global and S2H pointer signals are generated by a data-in pointer state machine 2214 on output 2254. The data-in pointer state machine 2214 is controlled by the DATA_XSFR and F_WR signals on line 2253. The internal I/O controller 2203 generates the DATA_XSFR and F_WR signals on line 2253. The DATA_XSFR is always at logic "1" whenever data transfer between the RCC hardware array and either the RCC computing system or the external interface is desired. The F_WR signal, in contrast to the F_RD signal, is at logic "1" whenever a write to the RCC hardware array is desired. A read via the F_RD signal requires the delivery of data from the RCC hardware array to either the RCC computing system and the external interface. If both the DATA_XSFR and F_WR signals are at logic "1," the data-in pointer state machine can generate the proper global or S2H pointer signals at the proper programmed sequence.

The outputs 2247–2252 of these latches are coupled to various internal nodes in the hardware model of the user design. Some of these internal nodes correspond to input pin-outs of the user design. The user design has other internal nodes that are normally not accessible via pin-outs but these non-pin-out internal nodes are for other debugging purposes to provide flexibility for the designer who desires to apply stimuli to various internal nodes in the user design, regardless of whether they are input pin-outs or not. For stimuli applied by the external interface to the elaborate hardware model of the user design, the data-in logic and those internal nodes corresponding to input pin-outs are implicated. For example, if the user design is a CRTC 6845 video controller, some input pin-outs may be as follows:

LPSTB—a light pen strobe pin
~RESET—low level signal to reset the 6845 controller
RS—register select
E—enable
CLK—clock
~CS—Chip select Other input pin-outs are also available in this video controller. Based on the number of input pin-outs that interface to the outside world, the number of nodes and hence, the number of latches and pointers can be readily determined. Some hardware model configured in the RCC hardware array may have, for example, thirty separate latches associated with each of GLB_PTR0, GLB_PTR1, GLB_PTR2, GLB_PTR3, S2H_PTR0, and S2H_PTR1 for a total of 180 latches (=30×6). In other designs, more global pointers such as GLB_PTR4 to GLB_PTR30 may be used as necessary. Similarly, more S2H pointers such as S2H_PTR2 to S2H_PTR30 may be used as necessary. These pointers and their corresponding latches are based on the requirements of the hardware model of each user design.

Returning to FIGS. 70 and 72, the data on the FD bus lines make their way to these internal nodes only if the latches are enabled with the proper global pointer or S2H pointer signal. Otherwise, these internal nodes are not driven by any data on the FD bus. When F_WR is at logic "1" during the first half of the CPU_IN=1 time period, GLB_PTR0 is at logic "1" to drive the data on FD1 to the corresponding internal node via line 2247. If other latches exist that depend on GLB_PTR0 for enabling, these latches will also latch data to their corresponding internal nodes. In the second half of the CPU_IN=1 time period, F_WR goes to logic "1" again which triggers GLB_PTR1 to rise to logic "1." This drives the data on FD6 to the internal node coupled to line 2248. This also sends the software clock signal on line 2223 to be latched to line 2216 by latch 2205 and GLB_PTR1 signal on enable line 2215. This software clock is delivered to the external clock inputs to the target system and other external I/O devices. Since GLB_PTR0 and GLB_PTR1 are used only for the first part of the data-in global cycle, CPU_IN returns to logic "0" and this completes the delivery of global data from the RCC computing system to the RCC hardware array.

The second part of the data-in global cycle will now be discussed, where global data from the external interface are delivered to the RCC hardware array and the external buffer. Again, the various input pin-out signals from either the target system or the external I/O devices that are directed at the user design must be provided to the hardware model and the software model. These data can be delivered to the hardware model by using the appropriate pointers and latched to drive the internal nodes. These data are also delivered to the software model by first storing them in the external buffer 2201 for later retrieval by the RCC computing system to update the internal states of the software model.

CPU_IN is now at logic "0" and EXT_IN is at logic "1." Accordingly, the tri-state buffer 2206 in the external I/O controller 2200 is enabled to let the data on such PCI bus lines as bus lines 2217 and 2218. These PCI bus lines are also coupled to FD bus lines 2219 for storage in the external buffer 2201. In the first half of the time period when the EXT_IN signal is at logic "1," GLB_PTR2 is at logic "1." This latches the data on FD4 (via bus lines 2217, 2224, and local bus line 2228 (LD4)) to be latched to the internal node in the hardware model coupled to line 2249.

During the second half of the time period when the EXT_IN signal is at logic "1," GLB_PTR3 is at logic "1." This latches the data on FD6 (via bus lines 2218, 2225, and local bus line 2227 (LD6)) to be latched to the internal node in the hardware model coupled to line 2250.

As stated above, these data from the target system or some other external I/O devices are also delivered to the software model by first storing them in the external buffer 2201 for later retrieval by the RCC computing system to update the internal states of the software model. These data on bus lines 2217 and 2218 are provided on FD bus FD[63:0] 2219 to external buffer 2201. The particular memory address each data is stored in the external buffer 2201 is provided by memory address counter 2207 via bus 2220 to the external buffer 2201. To enable such storage, the WR_EXT_BUF signal is provided to the external buffer 2201 via line 2221. Before the external buffer 2201 is full, the RCC computing system will read the contents of the external buffer 2201 so that appropriate updates can be made to the software model. Any data that was delivered to the various internal nodes of the hardware model in the RCC hardware array will probably result in some internal state changes in the hardware model. Because the RCC computing system has the model of the entire user design in software, these internal state changes in the hardware model should also be reflected in the software model. This concludes the data-in global cycle.

The S2H cycle will now be discussed. The S2H cycle is used to deliver test bench data from the RCC computing system to the RCC hardware array, and then move that data sequentially from one chip to the next for each board. The CPU_IN signal goes to logic "1" while the EXT_IN signal goes to logic "0" indicating that the data transfer is between the RCC computing system and the RCC hardware array. The external interface is not involved. The CPU_IN signal also enables the tri-state buffer 2202 to allow data to pass from the local bus 2222 to the internal I/O controller 2203.

In the beginning of the CPU_IN=1 time period, S2H_PTR0 goes to logic "1" which latches the data on FD5 (via local bus 2222, local bus line 2229, bus line 2234, and FD bus 2239) to be latched to the internal node in the hardware model coupled to line 2251. In the second part of the CPU_IN=1 time period, S2H_PTR1 goes to logic "1" which latches the data on FD7 (via local bus 2222, local bus line 2230, bus line 2235, and FD bus 2240) to be latched to the internal node in the hardware model coupled to line 2252. During the sequential data evaluation, the data from the RCC computing system is delivered to chip m1 first, then chip0_1 (i.e., chip 0 on board 1), chip1_1 (i.e., chip 1 on board 1), until the last chip on the last board, chip7_8 (i.e., chip 7 on board 8). If chip m2 is available, the data is also moved into this chip as well.

At the end of this data transfer, the DATA_XSFR returns to logic "0." Note that the I/O data from the external interface is treated as global data and handles during global cycles. This concludes the discussion of the data-in control logic and the data-in cycles.

Data-out

The data-out control logic embodiment of the present invention will now be discussed. The data-out control logic in accordance with embodiment of the present invention is responsible for handling the data delivered from the RCC hardware array to the RCC computing system and the external interface. During the course of processing data in response to stimuli (external or otherwise), the hardware model generates certain output data that the target application(s) or some I/O devices may need. These output data may be substantive data, address, control information, or other relevant information that another application or device may need for its own processing. These output data to the RCC computing system (which may have models of other external I/O devices in software), the target system, or external I/O devices are provided on various internal nodes. As discussed above with respect to the data-in logic, some of these internal nodes correspond to output pin-outs of the user design. The user design has other internal nodes that are normally not accessible via pin-outs but these non-pin-out internal nodes are for other debugging purposes to provide flexibility for the designer who desires to read and analyze stimuli responses at various internal nodes in the user design, regardless of whether they are output pin-outs or not. For stimuli applied to the external interface or the RCC computing system (which may have models of other I/O devices in software) from the elaborate hardware model of the user design, the data-out logic and those internal nodes corresponding to output pin-outs are implicated.

For example, if the user design is a CRTC 6845 video controller, some output pin-outs may be as follows:

MA0–MA13—memory address
D0–D7—data bus
DE—display enable
CURSOR—cursor position
VS—vertical synchronization
HS—horizontal synchronization Other output pin-outs are also available in this video controller. Based on the number of output pin-outs that interface to the outside world, the number of nodes and hence, the number of gating logic and pointers can be readily determined. Thus, the output pin-outs MA0–MA13 on the video controller provide the memory addresses for the video RAM. The VS output pin-out provides the signal for the vertical synchronization, and thus causes a vertical retrace on the monitor. The output pin-outs D0–D7 are the eight terminals which form the bi-directional data bus for accessing the internal 6845 registers by the CPU in the target system. These output pin-outs correspond to certain internal nodes in the hardware model. Of course, the number and nature of these internal nodes vary depending on the user design.

The data from these output pin-out internal nodes must be provided to the RCC computing system because the RCC computing system contains a model of the entire user design in software and any event that occurs in the hardware model must be communicated to the software model so that corresponding changes may be made. In this way, the software model will have information consistent with that in the hardware model. Additionally, the RCC computing system may have device models of I/O devices that the user or designer decided to model in software rather than connect an actual device to one of the ports on the external I/O expander. For example, the user may have decided that it is easier and more effective to model the monitor or speaker in software rather than plug an actual monitor or speaker in one of the external I/O expander ports. Furthermore, the data from these internal nodes in the hardware model must be provided to the target system and any other external I/O devices. In order for data in these output pin-out internal nodes to be delivered to the RCC computing system as well as the target system and other external I/O devices, the data-out control logic in accordance with one embodiment of the present invention is provided in the coverification system.

The data-out control logic employ data-out cycles that involve the transport of data from the RCC hardware array 2190 to the RCC computing system 2141 and the external interface (external I/O expander 2139). In FIG. 69, the control logic for transporting data between the external interface (external I/O expander 2139) and the coverification system 2140 is found in each board 2145–2149. The primary portion of the control logic is found in the external I/O controller 2152 but other portions are found in the various internal I/O controllers (e.g., 2156 and 2158) and the reconfigurable logic elements (e.g., FPGA chips 2159 and 2165). Again, for instructional purposes, it is necessary only to show some portion of this control logic instead of the same repetitive logic structure for all chips in all boards. The portion of the coverification system 2140 within the dotted line 2150 of FIG. 69 contains one subset of the control logic. This control logic will now be discussed in greater detail with respect to FIGS. 71 and 73. FIG. 71 illustrates that portion of the control logic that is used for data-out cycles. FIG. 73 illustrates the timing diagram of the data-out cycles.

One particular subset of the data-out control logic is shown in FIG. 71 and includes the external I/O controller 2300, tri-state buffer 2301, internal I/O controller 2302, a reconfigurable logic element 2303, and various buses and control lines to allow data transport therebetween. This subset illustrates the logic necessary for data-out operations, where the data from the external interface and the RCC computing system are delivered to the RCC hardware array. The data-out control logic of FIG. 71 and the data-out timing diagram of FIG. 73 will be discussed together.

In contrast to the two cycle types of the data-in cycles, the data-out cycle includes only one type of cycle. The data-out control logic requires that the data from the RCC hardware model be sequentially delivered to: (1) RCC computing system, and then (2) the RCC computing system and the external interface (to the target system and the external I/O devices). Specifically, the data-out cycle requires that data from the internal nodes of the hardware model in the RCC hardware array be delivered to the RCC computing system first, and then to the RCC computing system and the external interface second in each chip, one chip at a time in each board and one board at a time.

Like the data-in control logic, pointers will be used to select (or gate) data from the internal nodes to the RCC computing system and the external interface. In one embodiment illustrated in FIGS. 71 and 73, a data-out pointer state machine 2319 generates five pointers H2S_PTR[4:0] on bus 2359 for both the hardware-to-software data and hardware-to-external interface data. The data-out pointer state machine 2319 is controlled by the DATA_XSFR and F_RD signals on line 2358. The internal I/O controller 2302 generates the DATA_XSFR and F_RD signals on line 2358. The DATA_XSFR is always at logic "1" whenever data transfer between the RCC hardware array and either the RCC computing system or the external interface is desired. The F_RD signal, in contrast to the F_WR signal, is at logic "1" whenever a read from the RCC hardware array is desired. If both the DATA_XSFR and F_RD signals are at logic "1," the data-out pointer state machine 2319 can generate the proper H2S pointer signals at the proper programmed sequence. Other embodiments may employ more pointer (or less pointers) as necessary for the user design.

These H2S pointer signals are provided to a gating logic. One set of inputs 2353–2357 to the gating logic is directed to several AND gates 2314–2318. The other set of inputs 2348–2352 are coupled to the internal nodes of the hardware model. Thus, AND gate 2314 has input 2348 from an internal node and input 2353 from H2S_PTR0; AND gate 2315 has input 2349 from an internal node and input 2354 from H2S_PTR1; AND gate 2316 has input 2350 from an internal node and input 2355 from H2S_PTR2; AND gate 2317 has input 2351 from an internal node and input 2356 from H2S_PTR3; and AND gate 2318 has input 2352 from an internal node and input 2357 from H2S_PTR4. Without the proper H2S_PTR pointer signal, the internal nodes cannot be driven to either the RCC computing system or the external interface.

The respective outputs 2343–2347 of these AND gates 2314–2318 are coupled to OR gates 2310–2313. Thus, AND gate output 2343 is coupled to the input of OR gate 2310; AND gate output 2344 is coupled to the input of OR gate 2311; AND gate output 2345 is coupled to the input of OR gate 2311; AND gate output 2346 is coupled to the input of OR gate 2312; and AND gate output 2347 is coupled to the input of OR gate 2313. Note that the output 2344 of AND gate 2315 is not coupled to an unshared OR gate; rather, output 2344 is coupled to OR gate 2311, which is also coupled to output 2345 of AND gate 2316. The other inputs 2360–2366 to OR gates 2310–2313 can be coupled to the outputs of other AND gates (not shown), which are themselves coupled to other internal nodes and H2S_PTR pointers. The use of these OR gates and their particular inputs are based on the user design and the configured hardware model. Thus, in other designs, more pointers may be used and output 2344 from AND gate 2315 is coupled to a different OR gate, not OR gate 2311.

The outputs 2339–2342 of OR gates 2310–2313 are coupled to FD bus lines FD0, FD3, FD1, and FD4. In this particular example of the user design, only four output pin-out signals will be delivered to the RCC computing system and the external interface. Thus, FD0 is coupled to the output of OR gate 2310; FD3 is coupled to the output of OR gate 2311; FD1 is coupled to the output of OR gate 2312; and FD4 is coupled to the output of OR gate 2313. These FD bus lines are coupled to local bus lines 2330–2333 via internal lines 2334–2338 in the internal I/O controller 2302. In this embodiment, local bus line 2330 is LD0, local bus line 2331 is LD3, local bus line 2332 is LD1, and local bus line 2333 is LD4.

To enable the data on these local bus lines 2330–2333 to be delivered to the RCC computing system, these local bus lines are coupled to the tri-state buffer 2301. In its normal state, the tri-state buffer 2301 allows data to pass from the local bus lines 2330–2333 to the local bus 2320. In contrast, during data-in, data is allowed to pass from the RCC computing system to the RCC hardware array only when the CPU_IN signal is provided to the tri-state buffer 2301.

To enable the data on these local bus lines 2330–2333 to be delivered to the external interface, lines 2321–2324 are provided. Line 2321 is coupled to line 2330 and some latch (not shown) in the external I/O controller 2300; line 2322 is coupled to line 2331 and some latch (not shown) in the external I/O controller 2300; line 2323 is coupled to line 2332 and latch 2305 in the external I/O controller 2300; and line 2324 is coupled to line 2333 and latch 2306 in the external I/O controller 2300.

Each output of these latches 2305 and 2306 is coupled to a buffer and then to the external interface, which is then coupled to the appropriate output pin-outs of the target system or the external I/O devices. Thus, the output of latch 2305 is coupled to buffer 2307 and line 2327. Also, the output of latch 2306 is coupled to buffer 2308 and line 2328. Another output of another latch (not shown) can be coupled to line 2329. In this example, lines 2327–2329 correspond to wire1, wire4, and wire3, respectively, of the target system or some external I/O device. Ultimately, during a data transfer from the hardware model to the external interface, the hardware model of the user design is configured so that the internal node coupled to line 2350 corresponds to wire3 on line 2329, the internal node coupled to line 2351 corresponds to wire1 on line 2327, and the internal node coupled to line 2352 corresponds to wire4 on line 2328. Similarly, wire3 corresponds to LD3 on line 2331, wire1 corresponds to LD1 on line 2332, and wire4 corresponds to LD4 on line 2333.

A look-up table 2309 is coupled to the enable inputs to these latches 2305 and 2306. The look-up table 2309 is controlled by the F_RD signal on line 2367 which triggers the operation of the look-up table address counter 2304. At each counter increment, the pointer enables a particular row in the look-up table 2309. If an entry (or bit) in that particular row is at logic "1," a LUT output line that is coupled to that particular entry in the look-up table 2309 will enable its corresponding latch and drive the data into the external interface and ultimately, to the desired destination in the target system or some external I/O device. For example, LUT output line 2325 is coupled to the enable input to latch 2305 and LUT output line 2326 is coupled to the enable input to latch 2306.

In this example, rows 0–3 of the look-up table 2309 are programmed for enabling the latch(es) corresponding to the output pin-out wire(s) for the internal nodes in chip m1. Similarly, rows 4–6 are programmed for enabling the latch (es) corresponding to the output pin-out wire(s) for the internal nodes in chip0_1 (i.e., chip 0 in board 1). In row 4, bit 3 is at logic "1." In row 5, bit 1 is at logic "1." In row 6, bit 4 is at logic "1." All other entries or bit positions are at logic "0." For any given bit position (or column) in the look-up table, only one entry is at logic "1" because a single output pin-out wire cannot drive multiple I/O devices. In other words, a output pin-out internal node in the hardware model can provide data to only a single wire coupled to the external interface.

As mentioned above, the data-out control logic requires that the data in each reconfigurable logic element in each chip in the RCC hardware model be sequentially delivered to: (1) the RCC computing system, and then (2) the RCC computing system and the external interface (to the target system and the external I/O devices) together. The RCC computing system needs these data because it has models of some I/O devices in software and for those data that are not intended for one of these modeled I/O devices, the RCC computing system needs to monitor them so that its internal states are consistent with that of the hardware model in the RCC hardware array. In this example illustrated in FIGS. 71 and 73, only seven internal nodes will be driven for output to the RCC computing system and the external interface. Two of those internal nodes are in chip m1 and the other five internal nodes are in chip0_1 (i.e., chip 0 in board 1). Of course, other internal nodes in these and other chips may be required for this particular user a design but FIGS. 71 and 73 will only illustrate these seven nodes only.

During data transfer, the DATA_XSFR signal is at logic "1." During this time, the local bus 2330–2333 will be used by the coverification system to transport data from each chip in each board in the RCC hardware array sequentially to both the RCC computing system and the external interface. The DATA_XSFR and F_RD signals control the operation of the data-out pointer state machine for generating the proper pointer signals H2S_PTR[4:0] to the appropriate gates for the output pin-out internal nodes. The F_RD signal also controls the look-up table address counter 2304 for delivery of the internal node data to the external interface.

The internal nodes in chip m1 will be handled first. When F_RD rises to logic "1" at the beginning of the data transfer cycle, H2S_PTR0 in chip m1 goes to logic "1." This drives the data in those internal nodes in chip m1 that rely on H2S_PTR0 to the RCC computing system via tri-state buffer 2301 and local bus 2320. The look-up table address counter 2304 counts and points to row 0 of look-up table 2309 to latch in the appropriate data in chip m1 to the external interface. When the F_RD signal goes to logic "1" again, the data at the internal nodes that can be driven by H2S_PTR1 are delivered to the RCC computing system and the external interface. H2S_PTR1 goes to logic "1" and in response to the second F_RD signal, the look-up table address counter 2304 counts and points to row 1 of look-up table 2309 to latch in the appropriate data in chip m1 to the external interface.

The five internal nodes in reconfigurable logic element 2303 (i.e., chip 0_1, or chip 0 in board 1) will now be handled. In this example, data from the two internal nodes associated with H2S_PTR0 and H2S_PTR1 will be delivered to the RCC computing system only. Data from the three internal nodes associated with H2S_PTR2, H2S_PTR3, and H2S_PTR4 will be delivered to the RCC computing system and the external interface.

When F_RD rises to logic "1", H2S_PTR0 in chip 2303 goes to logic "1." This drives the data in those internal nodes in chip 2303 that rely on H2S_PTR0 to the RCC computing system via tri-state buffer 2301 and local bus 2320. In this example, the internal node coupled to line 2348 relies on H2S_PTR0 on line 2353. When the F_RD signal goes to logic "1" again, the data at the internal nodes that can be driven by H2S_PTR1 are delivered to the RCC computing system. Here, the internal node coupled to line 2349 is affected. This data is driven to LD3 on line 2331 and 2322.

When the F_RD signal goes to logic "1" again, H2S_PTR2 goes to logic "1" and the data at internal node that is coupled to line 2350 is provided on LD3. This data is provided to both the RCC computing system and the external interface. The tri-state buffer 2301 allows the data to pass to the local bus 2320 and then into the RCC computing system. As for the external interface, this data is driven to LD3 on line 2331 and 2322 by the enabling H2S_PFR2 signal. In response to the F_RD signal, the look-up table address counter 2304 counts and points to row 4 of look-up table 2309 to latch in the appropriate data from this internal node coupled to line 2350 to line 2329 (wire3) at the external interface.

When the F_RD signal goes to logic "1" again, H2S_PTR3 goes to logic "1" and the data at internal node that is coupled to line 2351 is provided on LD1. This data is provided to both the RCC computing system and the external interface. The tri-state buffer 2301 allows the data to pass to the local bus 2320 and then into the RCC computing system. As for the external interface, this data is driven to LD1 on line 2332 and 2323 by the enabling H2S_PTR3 signal. In response to the F_RD signal, the look-up table address counter 2304 counts and points to row 5 of look-up table 2309 to latch in the appropriate data from this internal node coupled to line 2351 to line 2327 (wire1) at the external interface.

When the F_RD signal goes to logic "1" again, H2S_PTR4 goes to logic "1" and the data at internal node that is coupled to line 2352 is provided on LD4. This data is provided to both the RCC computing system and the external interface. The tri-state buffer 2301 allows the data to pass to the local bus 2320 and then into the RCC computing system. As for the external interface, this data is driven to LD4 on line 2333 and 2324 by the enabling H2S_PTR4 signal. In response to the F_RD signal, the look-up table address counter 2304 counts and points to row 6 of look-up table 2309 to latch in the appropriate data from this internal node coupled to line 2352 to line 2328 (wire4) at the external interface.

This process of driving data at the internal nodes of chip m1 to the RCC computing system first and then to both the RCC computing system and the external interface continues for the other chips sequentially. First, the internal nodes of chip m1 were driven. Second, the internal nodes of chip0_1 (chip 2303) were driven. Next, the internal nodes, if any, of chip1_1 will be driven. This continues until the last nodes in the last chips in the last board are driven. Thus, the internal nodes, if any, of chip7_8 will be driven. Finally, the internal nodes, if any, of chip m2 will be driven.

Although FIG. 71 shows the data-out control logic for driving internal nodes in chip 2303 only, other chips may also have internal nodes that may need to be driven to the RCC computing system and the external interface. Regardless of the number of internal nodes, the data-out logic will drive the data from the internal nodes in one chip to the RCC computing system and then at another cycle, drive a different set of internal nodes in the same chip to the RCC computing system and the external interface together. The data-out control logic then moves on to the next chip and performs the same two-step operation of driving data designated for the RCC computing system first and then driving data designated for the external interface to both the RCC computing system and the external interface. Even if the data is intended for the external interface, the RCC computing system must have knowledge of that data because the RCC computing system has a model of the entire user design in software that must have internal state information that is consistent with that of the hardware model in the RCC hardware array.

Board Layout

Figure 74:
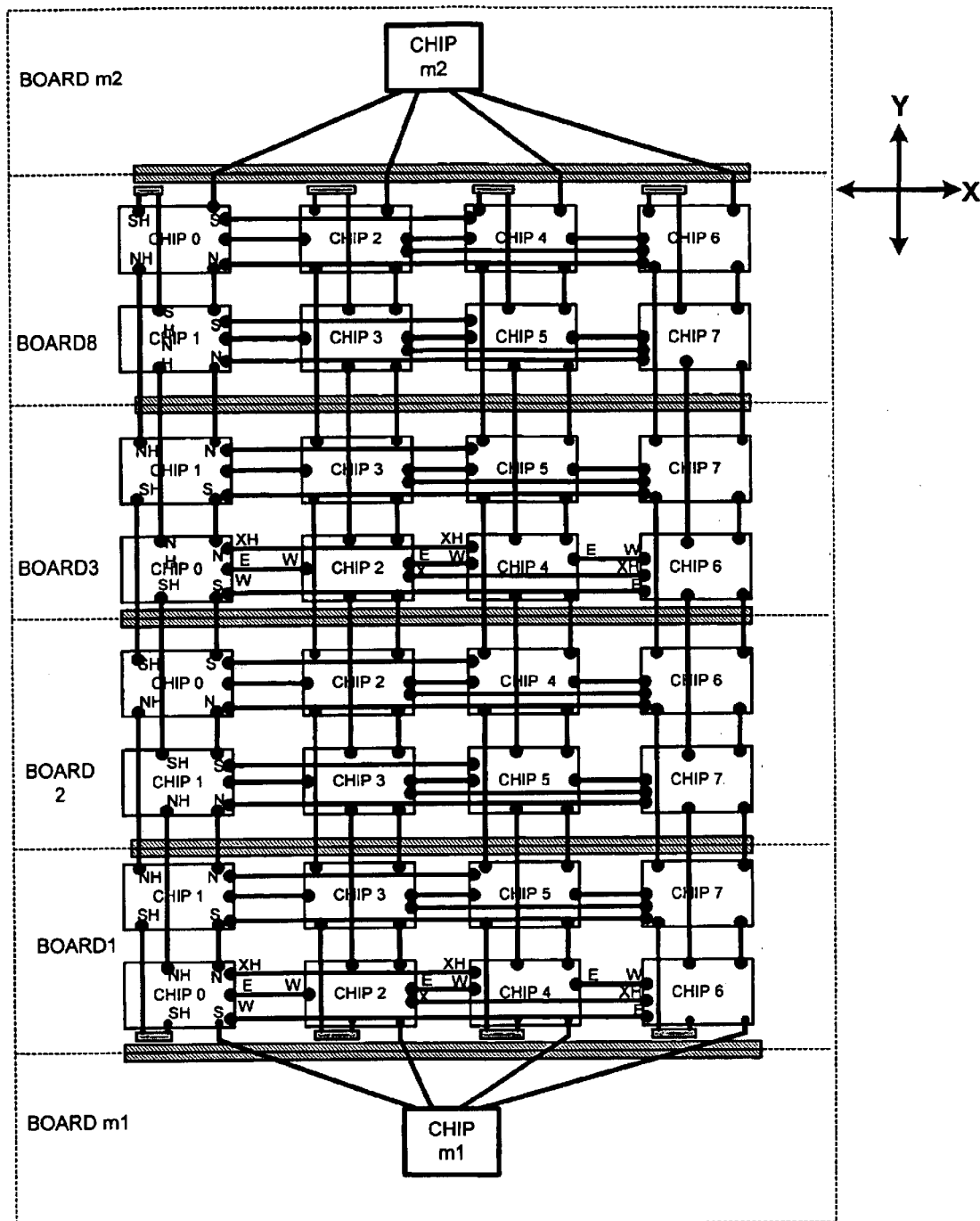
FIG. 74 shows a board layout of the RCC hardware array in accordance with one embodiment of the present invention.

The board layout of the coverification system in accordance with one embodiment of the present invention will now be discussed with respect to FIG. 74. The boards are installed in the RCC hardware array. The board layout is similar to that illustrated in FIGS. 8 and 36–44 and described in the accompanying text.

The RCC hardware array includes six boards, in one embodiment. Board m1 is coupled to board1 and board m2 is coupled to board8. The coupling and arrangement of board1, board2, board3, and board8 have been described above with respect to FIGS. 8 and 36–44.

Board m1 contains chip m1. The interconnect structure of board m1 with respect to the other boards is such that chip m1 is coupled to the South interconnects to chip 0, chip 2, chip 4, and chip 6 of board1. Analogously, board m2 contains chip m2. The interconnect structure of board m2 with respect to the other boards is such that chip m2 is coupled to the South interconnects to chip 0, chip 2, chip 4, and chip 6 of board8.

X. Examples

To illustrate the operation of one embodiment of the present invention, a hypothetical user circuit design will be used. In structured register transfer level (RTL) HDL code, the exemplary user circuit design is as follows:

```
module register (clock, reset, d, q);
    input clock, d, reset;
    output q;
    reg q;
    always@(posedge clock or negedge reset)
        if(~reset)
            q = 0;
        else
            q = d;
endmodule
module example;
    wire d1, d2, d3;
    wire q1, q2, q3;
    reg sigin;
    wire sigout;
    reg clk, reset;
    register reg1 (clk, reset, d1, q1);
    register reg2 (clk, reset, d2, q2);
    register reg3 (clk, reset, d3, q3);
    assign d1 = sigin ^ q3;
    assign d2 = q1 ^ q3;
    assign d3 = q2 ^ q3;
    assign signout = q3;
    // a clock generator
    always
    begin
        clk = 0;
        #5;
        clk = 1;
        #5;
    end
    // a signal generator
    always
    begins
        #10;
        sigin = $random;
    end
    // initialization
    initial
    begin
        reset = 0;
        sigin = 0;
        #1;
        reset = 1;
        #5;
        $monitor($time, " %b, %b," sigin, sigout);
        #1000 $finish;
    end
end module
```

This code is reproduced in FIG. 26. The particular functional details of this circuit design are not necessary to understand the present invention. The reader should understand, however, that the user generates this HDL code to design a circuit for simulation. The circuit represented by this code performs some function as designed by the user to respond to input signals and generates an output.

Figure 27:
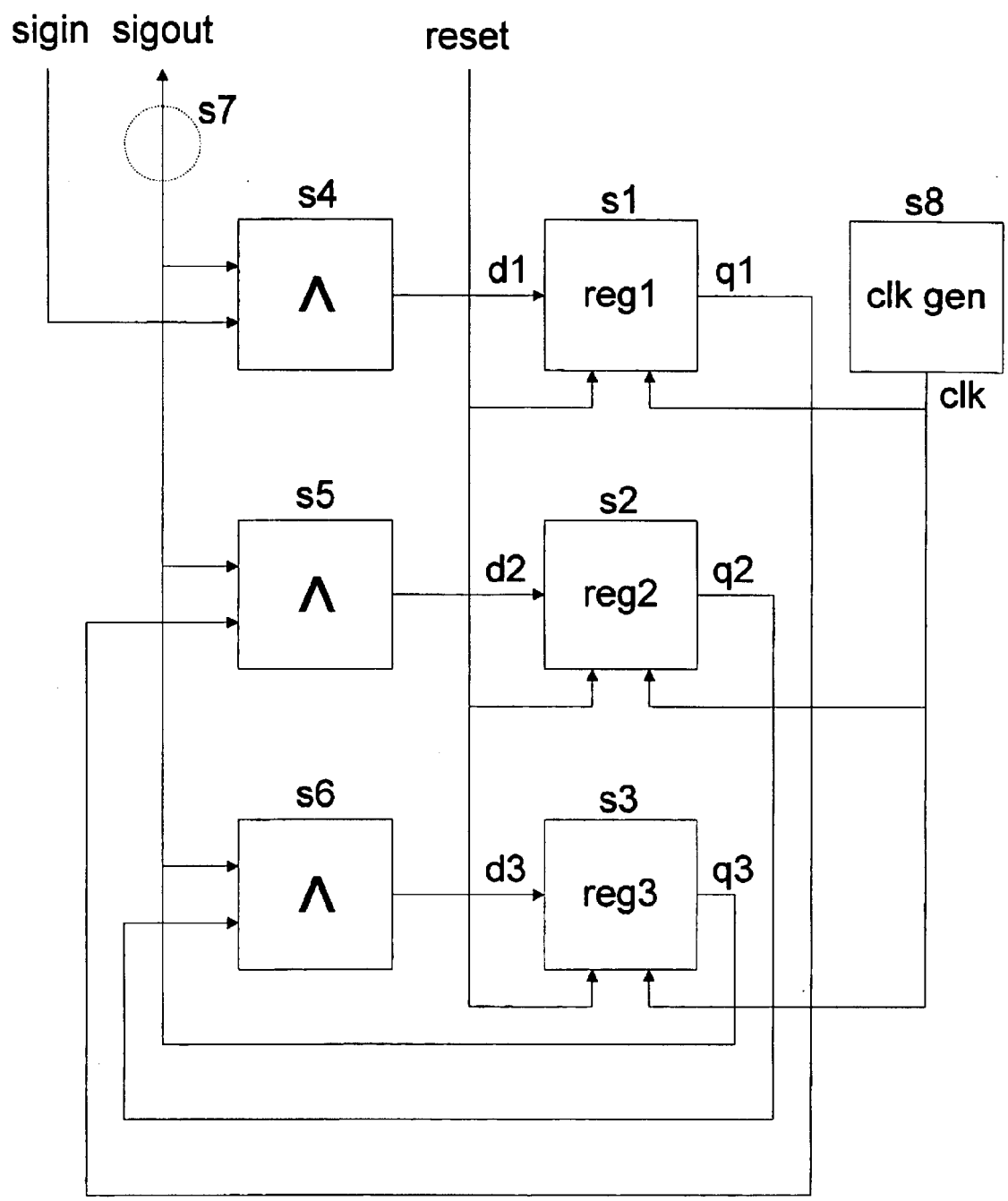
FIG. 27 shows a circuit diagram that symbolically represent the circuit design of the HDL code in FIG. 26.

FIG. 27 shows the circuit diagram of the HDL code discussed with respect to FIG. 26. In most cases, the user may actually generate a circuit diagram of this nature before representing it in HDL form. Some schematic capture tools allow pictorial circuit diagrams to be entered and, after processing, these tools generate the usable code.

As shown in FIG. 28, the Simulation system performs component type analysis. The HDL code, originally presented in FIG. 26 as representing a user's particular circuit design, has now been analyzed. The first few lines of the code beginning with "module register (clock, reset, d, q);" and ending with "endmodule" and further identified by reference number 900 is a register definition section.

The next few lines of code, reference number 907, represent some wire interconnection information. Wire variables in HDL, as known to those ordinarily skilled in the art, are used to represent physical connections between structural entities such as gates. Because HDL is primarily used to model digital circuits, wire variables are necessary variables. Usually, "q" (e.g., q1, q2, q3) represents output wire lines and "d" (e.g., d1, d2, d3) represents input wire lines.

Reference number 908 shows "sigin" which is a test-bench output. Register number 909 shows "sigout" which is a test-bench input.

Reference number 901 shows register components S1, S2, and S3. Reference number 902 shows combinational components S4, S5, S6, and S7. Note that combinational components S4–S7 has output variables d1, d2, and d3 which are inputs to the register components S1–S3. Reference number 903 shows clock component S8.

The next series of code line numbers show test-bench components. Reference number 904 shows test-bench component (driver) S9. Reference number 905 shows test-bench components (initialization) S10 and S11. Reference number 906 shows test-bench component (monitor) S12.

The component type analysis is summarize in the following table:

| Component | Type |
|---|---|
| S1 | Register |
| S2 | Register |
| S3 | Register |
| S4 | Combinational |
| S5 | Combinational |
| S6 | Combinational |
| S7 | Combinational |
| S8 | Clock |
| S9 | Test-bench (driver) |
| S10 | Test-bench (initialization) |
| S11 | Test-bench (initialization) |
| S12 | Test-bench (monitor) |

Based on the component type analysis, the system generates a software model for the entire circuit and a hardware model for the register and combinational components. S1–S3 are register components and S4–S7 are combinational components. These components will be modeled in hardware to allow the user of the SEmulation system to either simulate the entire circuit in software, or simulate in software and selectively accelerate in hardware. In either case, the user has control of the simulation and hardware acceleration modes. Additionally, the user can emulate the circuit with a target system while still retaining software control to start, stop, inspect values, and assert input values cycle by cycle.

Figure 29:
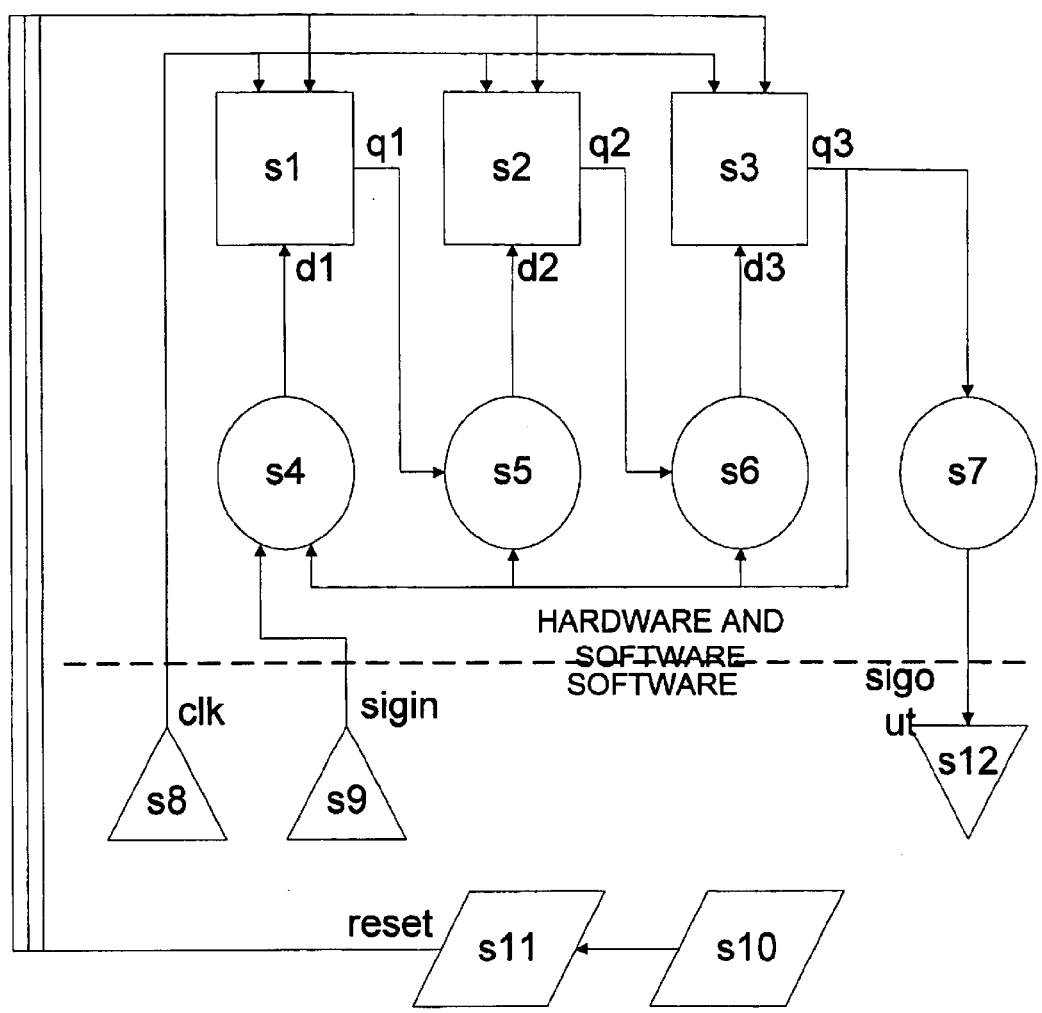
FIG. 29 shows a signal network analysis of a structured RTL HDL code based on the user's custom circuit design shown in FIG. 26.

FIG. 29 shows a signal network analysis of the same structured RTL level HDL code. As illustrated, S8, S9, S10, and S11 are modeled or provided in software. S9 is essentially the test-bench process that generates the sigin signals and S12 is essentially the test-bench monitor process that receives the sigout signals. In this example, S9 generates a random sigin to simulate the circuit's. However, registers S1 to S3 and combinational components S4 to S7 are modeled in hardware and software.

For the software/hardware boundary, the system allocates memory space for the various residence signals (i.e., q1, q2, q3, CLK, sigin, sigout) that will be used to interface the software model to the hardware model. The memory space allocation is as follows in the table below:

| Signal | Memory Address Space |
|---|---|
| q1 | REG |
| q2 | REG |
| q3 | REG |
| clk | CLK |
| sigin | S2H |
| sigout | H2S |

Figure 30:
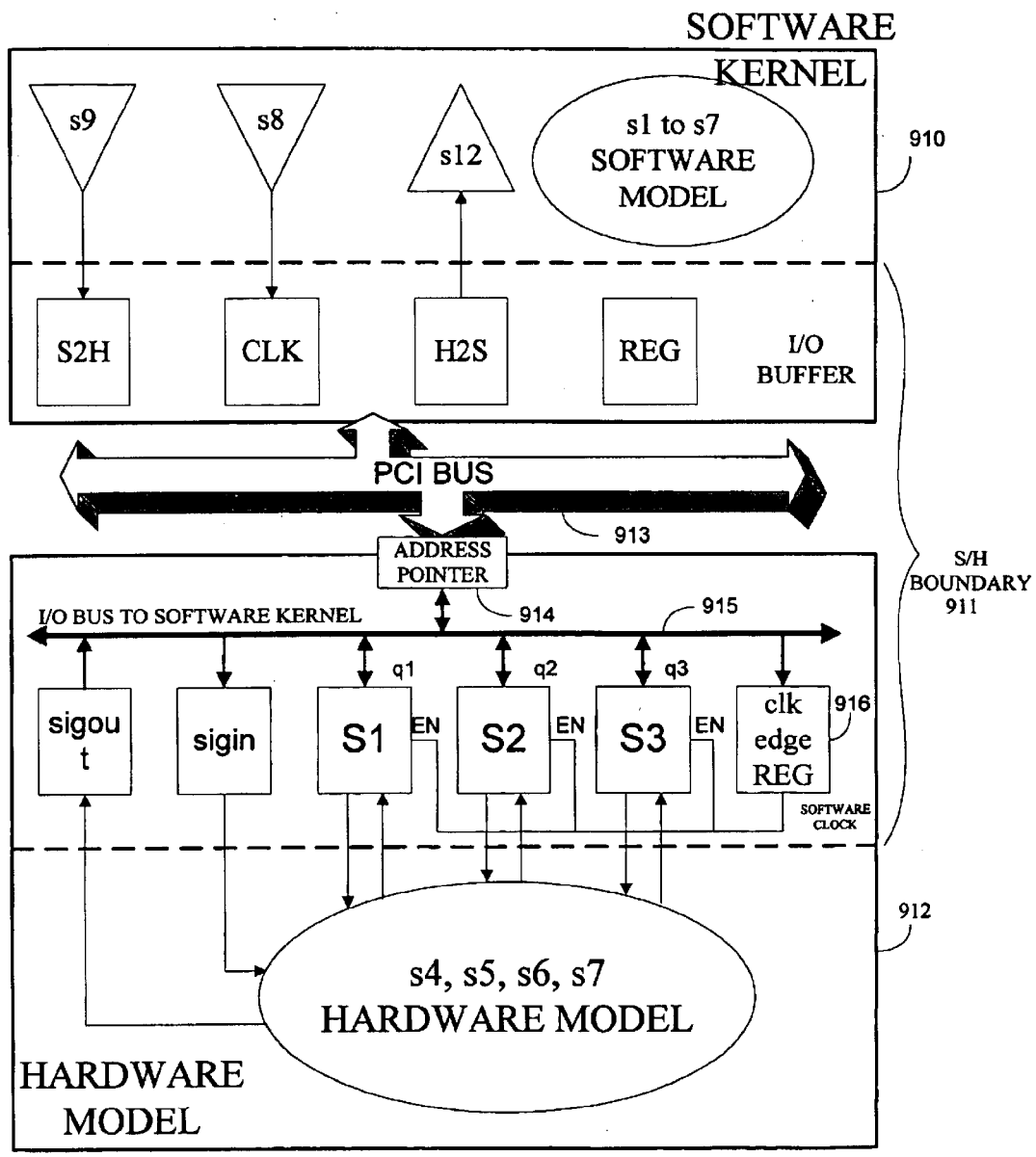
FIG. 30 shows the software/hardware partition result for the same hypothetical example.

FIG. 30 shows the software/hardware partition result for this example circuit design. FIG. 30 is a more realizable illustration of the software/hardware partition. The software side 910 is coupled to the hardware side 912 through the software/hardware boundary 911 and the PCI bus 913.

The software side 910 contains and is controlled by the software kernel. In general, the kernel is the main control loop that controls the operation of the overall SEmulation system. So long as any test-bench processes are active, the kernel evaluates active test-bench components, evaluates clock components, detects clock edges to update registers and memories as well as propagate combinational logic data, and advances the simulation time. Even though the kernel resides in the software side, some of its operations or statements can be executed in hardware because a hardware model exists for those statements and operations. Thus, the software controls both the software and hardware models.

The software side 910 includes the entire model of the user's circuit, including S1–S12. The software/hardware boundary portion in the software side includes I/O buffers or address spaces S2H, CLK, H2S, and REG. Note that driver test-bench process S9 is coupled to the S2H address space, monitor test-bench process S12 is coupled to the H2S address space, and the clock generator S8 is coupled to the CLK address space. The register S1–S3 output signals q1–q3 will be assigned to REG space.

The hardware model 912 has a model of the combinational components S4–S7, which resides in the pure hardware side. On the software/hardware boundary portion of the hardware model 912, sigout, sigin, register outputs q1–q3, and the software clock 916 are implemented.

In addition to the model of the user's custom circuit design, the system generates software clocks and address pointers. The software clock provides signals to the enable inputs to registers S1–S3. As discussed above, software clocks in accordance with the present invention eliminate race conditions and hold-time violation issues. When a clock edge is detected in software by the primary clock, the detection logic triggers a corresponding detection logic in hardware. In time, the clock edge register 916 generates an enable signal to the register enable inputs to gate in any data residing in the input to the register.

Address pointer 914 is also shown for illustrative and conceptual purposes. Address pointers are actually implemented in each FPGA chip and allow the data to be selectively and sequentially transferred to its destination.

The combinational components S4–S7 are also coupled to register components S1–S3, the sigin, and the sigout. These signals travel on the I/O bus 915 to and from the PCI bus 913.

Figure 31:
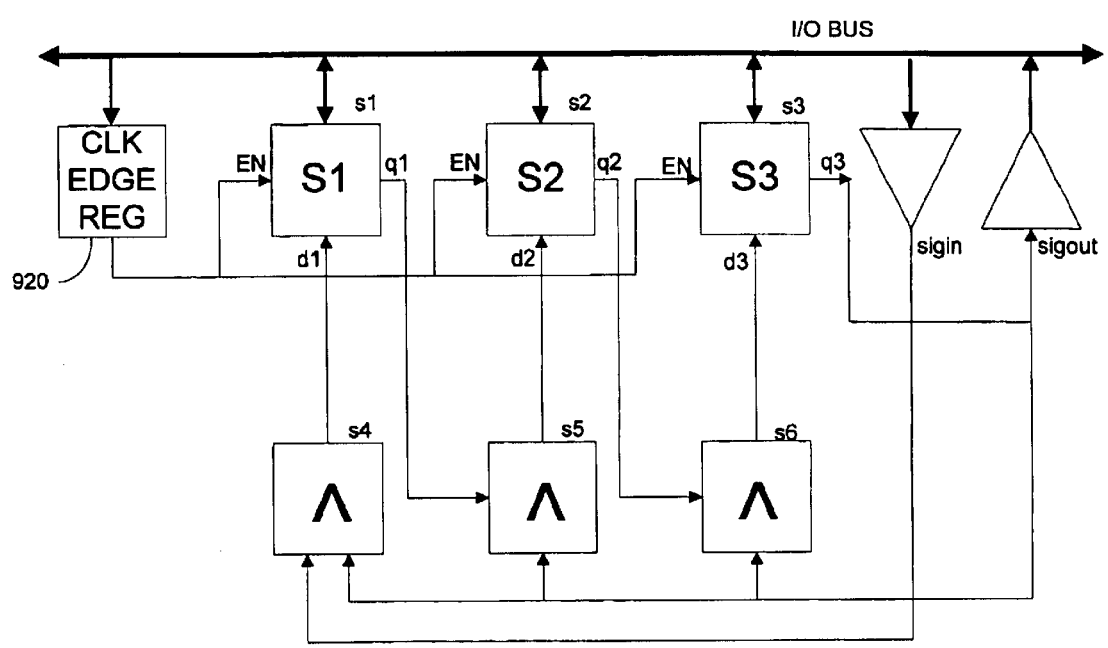
FIG. 31 shows a hardware model for the same hypothetical example.

Prior to the mapping, placement, and routing steps, a complete hardware model is shown in FIG. 31, excluding the address pointers. The system has not mapped the model to specific chips yet. Registers S1–S3 are provided coupled to the I/O bus and the combinational components S4–S6. Combinational component S7 (not shown in FIG. 31) is just the output q3 of the register S3. The sigin, sigout, and software clock 920 are also modeled.

Figure 32:
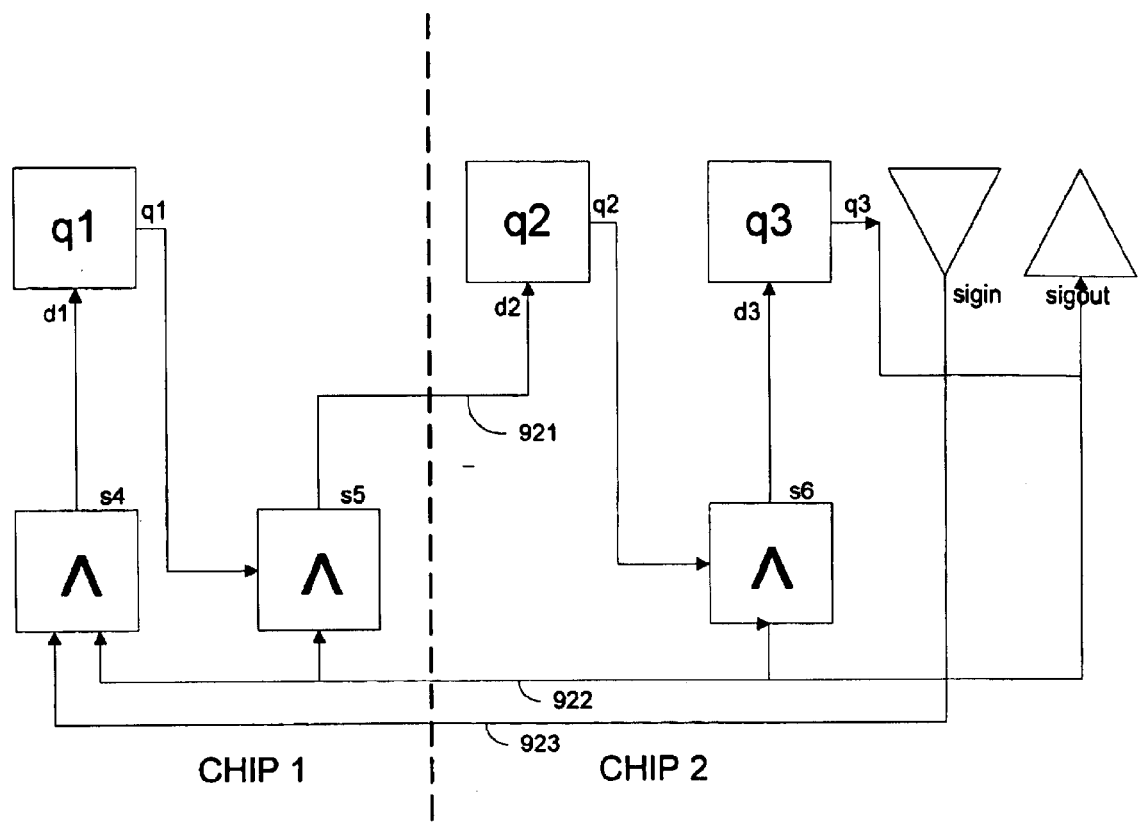
FIG. 32 shows one particular hardware model-to-chip partition result for the same hypothetical example of a user's custom circuit design.

Once the hardware model has been determined, the system can then map, place, and route the model into one or more chips. This particular example can actually be implemented on a single Altera FLEX 10K chip, but for pedagogic purposes, this example will assume that two chips will be required to implement this hardware model. FIG. 32 shows one particular hardware model-to-chip partition result for this example.

In FIG. 32, the complete model (except for the I/O and clock edge register) is shown with the chip boundary represented by the dotted line. This result is produced by the SEmulation system's compiler before the final configuration file is generated. Thus, the hardware model requires at least three wires between these two chips for wire lines 921, 922, and 923. To minimize the number of pins/wires needed between these two chips (chip 1 and chip 2), either another model-to-chip partition should be generated or a multiplexing scheme should be used.

Figure 33:
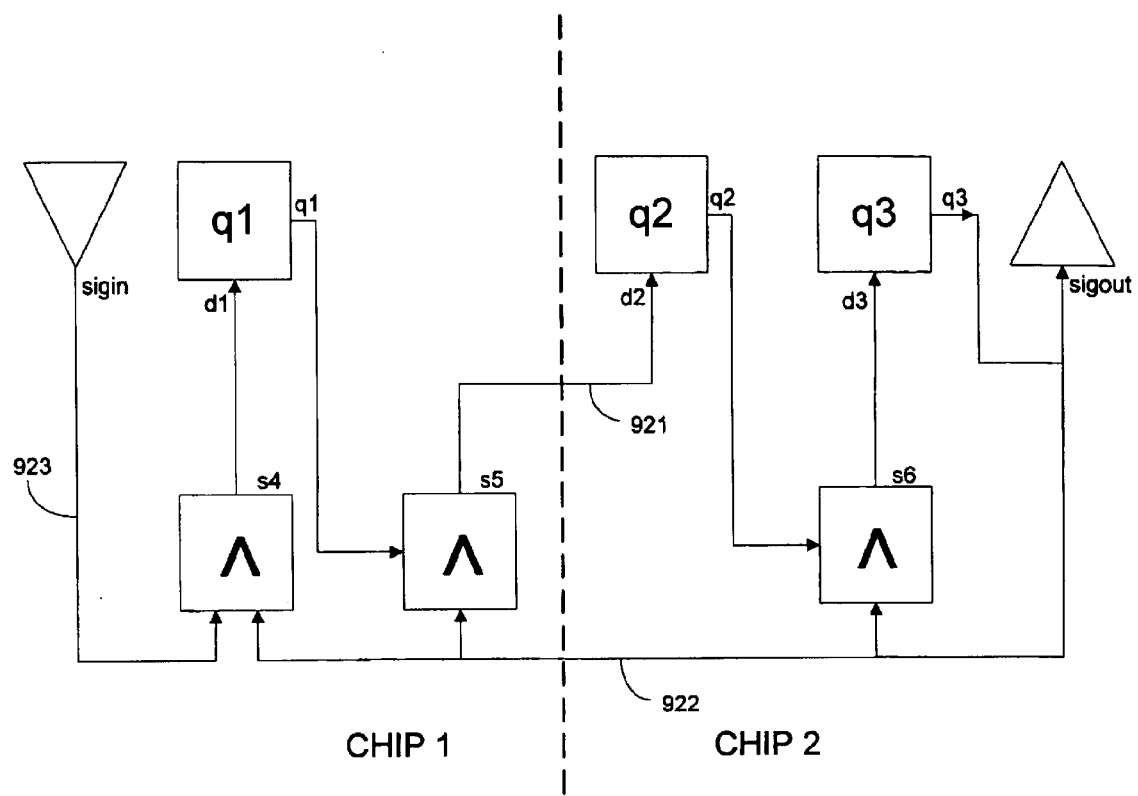
FIG. 33 shows another particular hardware model-to-chip partition result for the same hypothetical example of a user's custom circuit design.

Analyzing this particular partition result shown in FIG. 32, the number of wires between these two chips can be reduced to two by moving the sigin wire line 923 from chip 2 to chip 1. Indeed, FIG. 33 illustrates this partition. Although the particular partition in FIG. 33 appears to be a better partition than the partition in FIG. 32 based solely on the number of wires, this example will assume that the SEmulator system has selected the partition of FIG. 32 after the mapping, placement, and routing operations have been performed. The partition result of FIG. 32 will be used as the basis for generating the configuration file.

Figure 34:
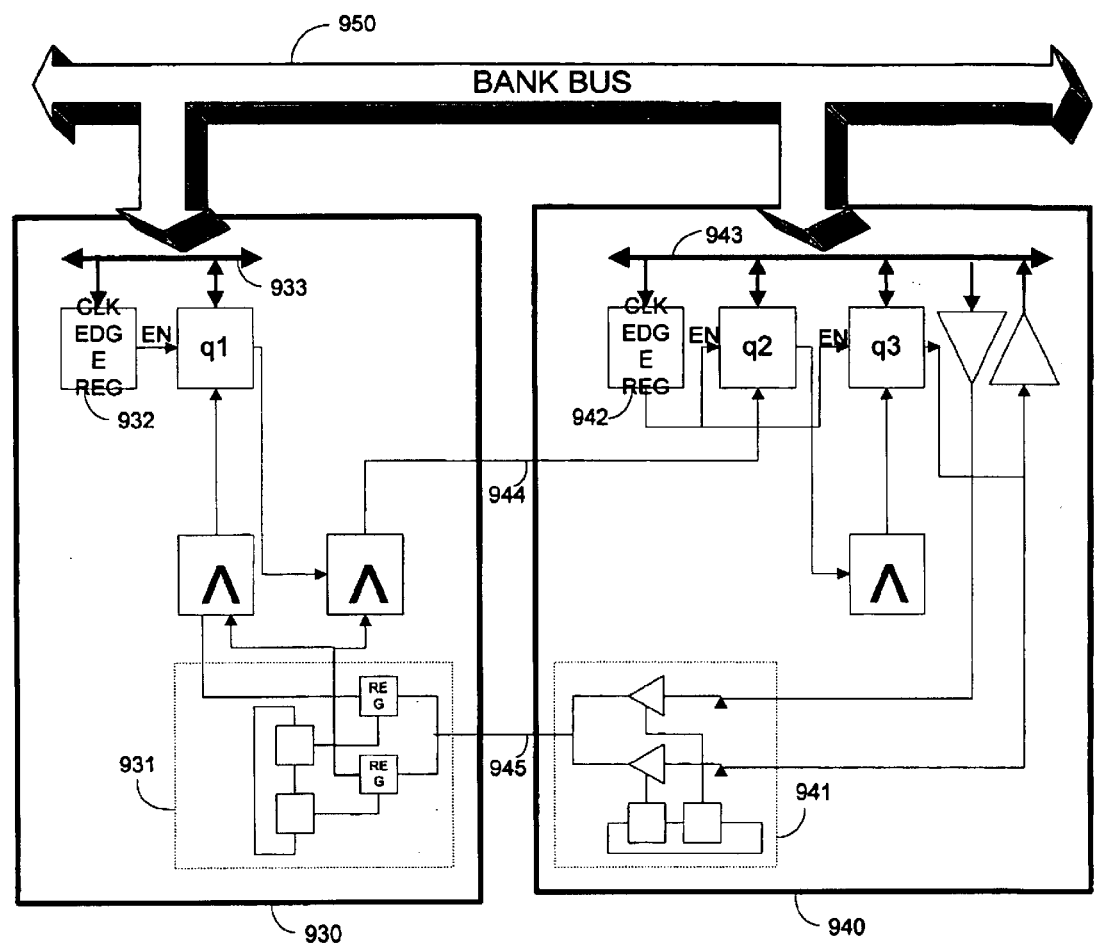
FIG. 34 shows the logic patching operation for the same hypothetical example of a user's custom circuit design.

FIG. 34 shows the logic patching operation for the same hypothetical example, in which the final realization in two chips is shown. The system used the partition result of FIG. 32 to generate the configuration files. The address pointers are not shown, however, for simplicity purposes. Two FPGA chips 930 and 940 are shown. Chip 930 includes, among other elements, a partitioned portion of the user's circuit design, a TDM unit 931 (receiver side), the software clock 932, and I/O bus 933. Chip 940 includes, among other elements, a partitioned portion of the user's circuit design, a TDM unit 941 for the transmission side, the software clock 942, and I/O bus 943. The TDM units 931 and 941 were discussed with respect to FIGS. 9(A), 9(B), and 9(C).

These chips 930 and 940 have two interconnect wires 944 and 945 that couple the hardware model together. These two interconnect wires are part of the interconnections shown in FIG. 8. Referring to FIG. 8, one such interconnection is interconnection 611 located between chip F32 and F33. In one embodiment, the maximum number of wires/pins for each interconnection is 44. In FIG. 34, the modeled circuit needs only two wires/pins between chips 930 and 940.

These chips 930 and 940 are coupled to the bank bus 950. Because only two chips are implemented, both chips are in the same bank or each is residing in a different bank. Optimally, one chip is coupled to one bank bus and the other chip is coupled to another bank bus to ensure that the throughput at the FPGA interface is the same as the throughput at the PCI interface.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. One skilled in the art will readily appreciate that other applications may be substituted for those set forth herein without departing from the spirit and scope of the present invention. Accordingly, the invention should only be limited by the claims included below.

What is claimed is:

1. A verification system controlled by a master clock for verifying the proper operation of a user circuit design, comprising:

reception logic for receiving input data to be evaluated within an evaluation time;

evaluation logic for modeling the user circuit design in reconfigurable hardware logic and evaluating the input data during the evaluation time; and clock generation logic for generating a plurality of asynchronous clocks for use by the evaluation logic and controlling the phase relationship among the plurality of asynchronous clocks.

2. The system of claim 1, wherein the reconfigurable hardware logic in the evaluation logic includes at least one reconfigurable hardware logic chip.

3. The system of claim 2, wherein the reconfigurable hardware logic chip includes at least one field programmable gate array (FPGA) chip.

4. The system of claim 3, wherein the clock generation logic includes:

a plurality of clock generation slices for generating a plurality of clocks, where each clock generation slice generates a clock in response to a trigger signal; and a clock scheduler for generating the trigger signal to the plurality of clock generation slices so that the generation of the clocks by the plurality of clock generation slices is scheduled in accordance with the desired phase relationships among the plurality of clocks.

5. The system of claim 4, wherein the clock scheduler further comprises:

toggle point logic for determining a next toggle point among the plurality of clocks; and trigger logic for generating the trigger signal for the clock associated with the next toggle point.

6. The system of claim 4, wherein each of the plurality of clock generation slices further comprises:

toggle generation logic for toggling a logic state of the clock associated with the clock generation slice in response to a toggle signal; and toggle signal generation logic for generating the toggle signal if the time duration from the current time to the next toggle point among the plurality of clock generation slices is the lowest.

7. The system of claim 1, further comprising:

a target system for receiving a first data from the evaluation logic and delivering a second data to the evaluation logic, wherein the target system is controlled by the plurality of asynchronous clocks generated by the clock generation logic.

8. A clock generation logic system for generating a plurality of asynchronous clocks, comprising:

a plurality of clock generation slices for generating a plurality of clocks, where each clock generation slice generates a clock in response to a trigger signal; and a clock scheduler for generating the trigger signal to the plurality of clock generation slices so that the generation of the clocks by the plurality of clock generation slices is scheduled in accordance with the desired phase relationships among the plurality of clocks.

9. The system of claim 8, wherein the clock scheduler further comprises:

toggle point logic for determining a next toggle point among the plurality of clocks; and trigger logic for generating the trigger signal for the clock associated with the next toggle point.

10. The system of claim 8, wherein each of the plurality of clock generation slices further comprises:

toggle generation logic for toggling a logic state of the clock associated with the clock generation slice in response to a toggle signal; and toggle signal generation logic for generating the toggle signal if the time duration from the current time to the next toggle point among the plurality of clock generation slices is the lowest.

11. A method of verifying the proper operation of a user design, comprising steps:

providing a hardware model of the user design among a plurality of reconfigurable chips;

generating a plurality of asynchronous clocks for driving the hardware model;

providing input data to the hardware model for evaluation during an evaluation period; and controlling the phase relationship among the plurality of asynchronous clocks during the evaluation period.

12. The method of claim 11, wherein the step of controlling further comprises steps:

determining a current time;

determining a next toggle point from among the plurality of asynchronous clocks from the current time; and toggling the clock associated with the next toggle point.

13. The method of claim 12, further comprising step:

updating the current time with the time associated with this next toggle point; and determining a new next toggle point from among the plurality of asynchronous clocks from the updated current time.

14. The method of claim 12, wherein the step of determining the next toggle point further comprises:

determining a time duration from the current time to the next toggle point for each of the plurality of asynchronous clocks; and selecting the lowest time duration from among the time durations of the plurality of asynchronous clocks.

15. A method of generating a plurality of asynchronous clocks, where each clock includes a plurality of toggle points and a toggle point represents a point in time where the logic state of the clock changes, comprising steps:

determining a first current time;

determining a first time duration from the first current time to each clock's next toggle point;

comparing each clock's respective first time durations;

selecting the clock associated with the lowest value among the first time durations; and toggling the logic state of the selected clock.

16. The method of claim 15, further comprising steps:

updating the first current time with a second current time where the second current time is the time associated with this next toggle point; and determining an adjusted time duration from the updated current time to each clock's next toggle point.

17. The method of claim 16, wherein the step of determining the adjusted time duration includes:

determining a differential time duration from the first current time to the second current time; and subtracting the differential time duration from each unselected clock's respective first time duration to generate the adjusted time duration.

18. The method of claim 17, further comprising steps:

determining a second next toggle point for the selected clock; and determining a second time duration from the second current time to the second next toggle point.

19. The method of claim 18, further comprising steps:

comparing the adjusted time duration of each of the nonselected clocks and the second time duration of the selected clock; and selecting the clock associated with the lowest of any of the adjusted time durations and the second time duration.

20. The method of claim 19, further comprising step:

toggling the logic state of the selected clock.

* * * * *